United States Patent
Hunt et al.

(10) Patent No.: US 10,276,382 B2
(45) Date of Patent: Apr. 30, 2019

(54) SEMICONDUCTOR DEVICE PACKAGES AND STACKED PACKAGE ASSEMBLIES INCLUDING HIGH DENSITY INTERCONNECTIONS

(71) Applicant: Advanced Semiconductor Engineering, Inc., Kaohsiung (TW)

(72) Inventors: John Richard Hunt, Kaohsiung (TW); William T. Chen, Kaohsiung (TW); Chih-Pin Hung, Kaohsiung (TW); Chen-Chao Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/615,665

(22) Filed: Jun. 6, 2017

(65) Prior Publication Data

US 2018/0047571 A1    Feb. 15, 2018

Related U.S. Application Data

(60) Provisional application No. 62/424,901, filed on Nov. 21, 2016, provisional application No. 62/373,803, filed on Aug. 11, 2016.

(51) Int. Cl.
 *H01L 21/00* (2006.01)
 *H01L 21/108* (2006.01)
 (Continued)

(52) U.S. Cl.
 CPC ............ *H01L 21/108* (2013.01); *H01L 21/56* (2013.01); *H01L 21/561* (2013.01);
 (Continued)

(58) Field of Classification Search
 CPC ......... H01L 24/18; H01L 24/42; H01L 24/19; H01L 23/49838; H01L 23/481; H01L 23/49822
 See application file for complete search history.

(56) References Cited

U.S. PATENT DOCUMENTS

| 7,579,681 | B2 * | 8/2009 | Chia | ................... H01L 23/3114 |
|---|---|---|---|---|
| | | | | 257/678 |
| 7,977,783 | B1 * | 7/2011 | Park | ....................... H01L 24/11 |
| | | | | 257/692 |

(Continued)

OTHER PUBLICATIONS

Liu et al., "Next Generation Panel-Scale RDL with Ultra Small Photo Vias and Ultra-fine Embedded Trenches for Low Cost 2.5D Interposers and High Density Fan-Out WLPs," 2016 IEEE 66th Electronic Components and Technology Conference, (2016) pp. 1515-1521.

*Primary Examiner* — Nicholas J Tobergte
(74) *Attorney, Agent, or Firm* — Foley & Lardner LLP; Cliff Z. Liu

(57) ABSTRACT

A semiconductor device package includes an electronic device and a redistribution stack. The redistribution stack includes a dielectric layer disposed over an active surface of the electronic device and defining an opening exposing at least a portion of a contact pad of the electronic device. The redistribution stack also includes a redistribution layer disposed over the dielectric layer and including a trace. A first portion of the trace extends over the dielectric layer along a longitudinal direction adjacent to the opening, and a second portion of the trace is disposed in the opening and extends between the first portion of the trace and the exposed portion of the contact pad. The second portion of the trace has a maximum width along a transverse direction orthogonal to the longitudinal direction, and the maximum width of the (Continued)

second portion of the trace is no greater than about 3 times of a width of the first portion of the trace.

46 Claims, 143 Drawing Sheets

(51) Int. Cl.
| | |
|---|---|
| H01L 21/768 | (2006.01) |
| H01L 23/04 | (2006.01) |
| H01L 23/48 | (2006.01) |
| H01L 23/485 | (2006.01) |
| H01L 23/528 | (2006.01) |
| H01L 23/00 | (2006.01) |
| H01L 25/065 | (2006.01) |
| H01L 27/108 | (2006.01) |
| H01L 23/16 | (2006.01) |
| H01L 21/56 | (2006.01) |
| H01L 21/683 | (2006.01) |
| H01L 23/538 | (2006.01) |
| H01L 23/31 | (2006.01) |

(52) U.S. Cl.
CPC .... *H01L 21/6835* (2013.01); *H01L 21/76801* (2013.01); *H01L 23/04* (2013.01); *H01L 23/16* (2013.01); *H01L 23/48* (2013.01); *H01L 23/485* (2013.01); *H01L 23/5283* (2013.01); *H01L 23/5389* (2013.01); *H01L 24/19* (2013.01); *H01L 24/20* (2013.01); *H01L 24/45* (2013.01); *H01L 24/96* (2013.01); *H01L 24/97* (2013.01); *H01L 25/0657* (2013.01); *H01L 27/10829* (2013.01); *H01L 21/568* (2013.01); *H01L 23/3128* (2013.01); *H01L 24/13* (2013.01); *H01L 24/16* (2013.01); *H01L 24/73* (2013.01); *H01L 24/81* (2013.01); *H01L 24/92* (2013.01); *H01L 2221/68345* (2013.01); *H01L 2221/68359* (2013.01); *H01L 2221/68372* (2013.01); *H01L 2224/0401* (2013.01); *H01L 2224/04105* (2013.01); *H01L 2224/12105* (2013.01); *H01L 2224/131* (2013.01); *H01L 2224/13147* (2013.01); *H01L 2224/16227* (2013.01); *H01L 2224/16235* (2013.01); *H01L 2224/16237* (2013.01); *H01L 2224/24137* (2013.01); *H01L 2224/24195* (2013.01); *H01L 2224/73253* (2013.01); *H01L 2224/73267* (2013.01); *H01L 2224/81005* (2013.01); *H01L 2224/92244* (2013.01); *H01L 2224/96* (2013.01); *H01L 2224/97* (2013.01); *H01L 2225/1023* (2013.01); *H01L 2225/1035* (2013.01); *H01L 2225/1041* (2013.01); *H01L 2225/1058* (2013.01); *H01L 2924/15192* (2013.01); *H01L 2924/15311* (2013.01); *H01L 2924/18161* (2013.01); *H01L 2924/18162* (2013.01)

(56) References Cited

U.S. PATENT DOCUMENTS

| | | | |
|---|---|---|---|
| 8,178,975 B2* | 5/2012 | Yang | H01L 23/3114 257/773 |
| 8,884,422 B2 | 11/2014 | Goh et al. | |
| 8,941,222 B2 | 1/2015 | Hunt | |
| 2005/0248037 A1 | 11/2005 | Hung et al. | |
| 2007/0152327 A1* | 7/2007 | Chia | H01L 23/3114 257/723 |
| 2010/0237506 A1 | 9/2010 | Brunnbauer et al. | |
| 2011/0248399 A1 | 10/2011 | Pendse | |
| 2012/0175731 A1* | 7/2012 | Chen | H01L 27/016 257/531 |
| 2014/0001643 A1* | 1/2014 | Kong | H01L 23/49822 257/774 |
| 2014/0191390 A1 | 7/2014 | Chuang et al. | |
| 2016/0276277 A1 | 9/2016 | Syu et al. | |

* cited by examiner

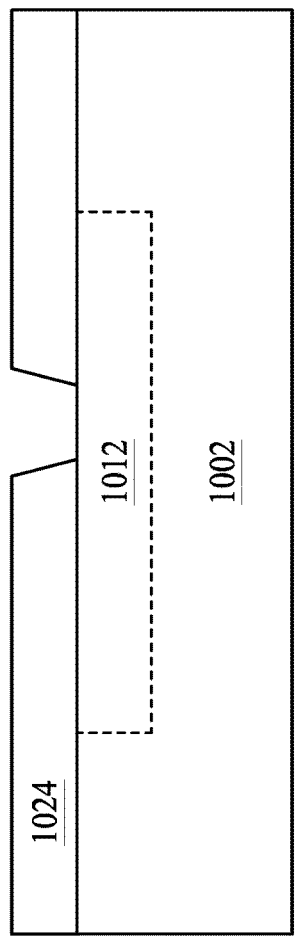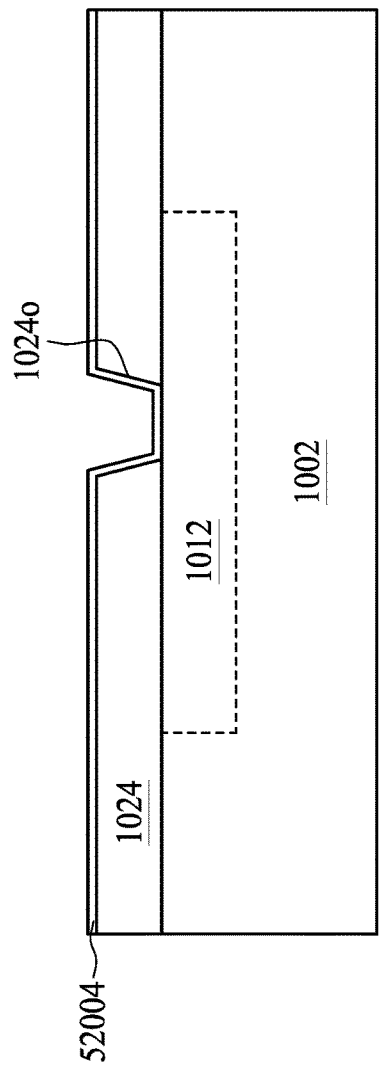

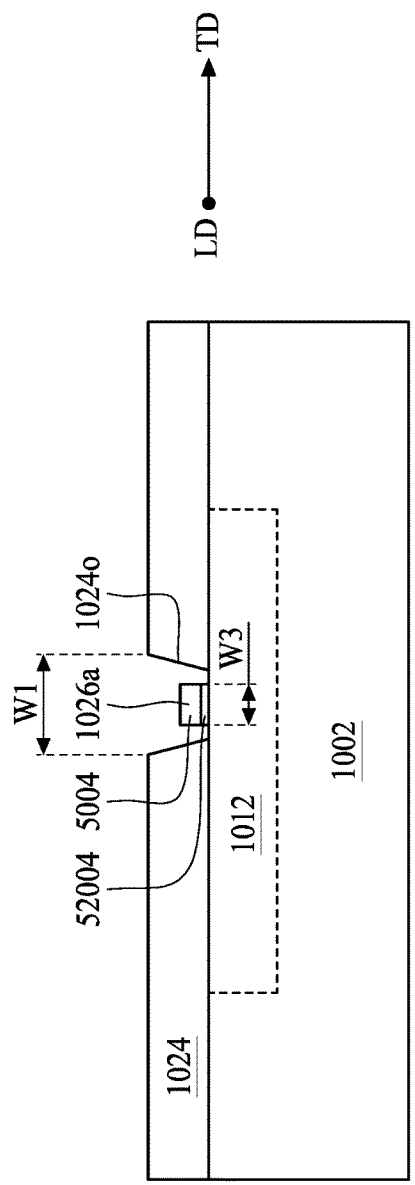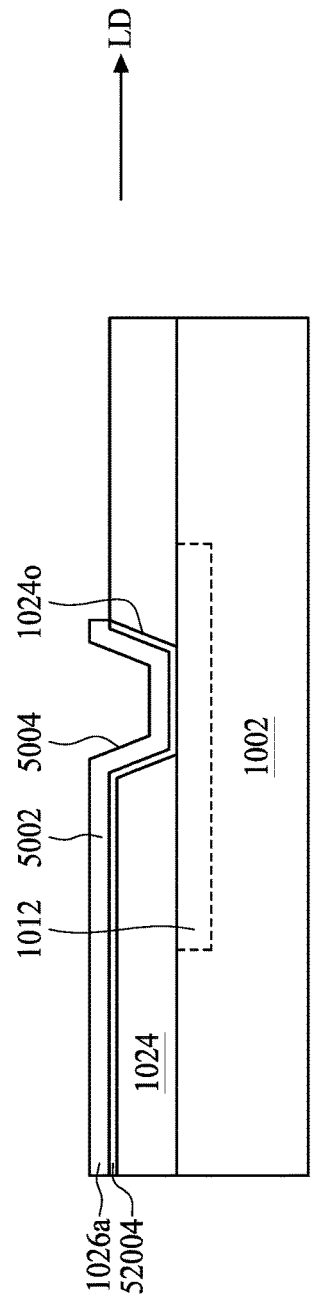

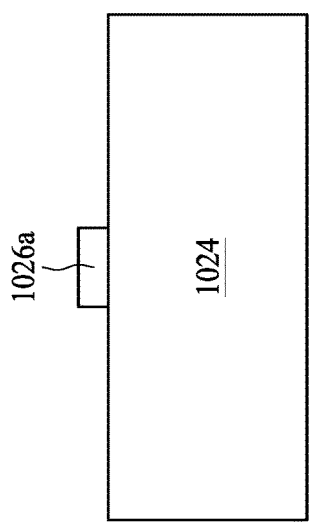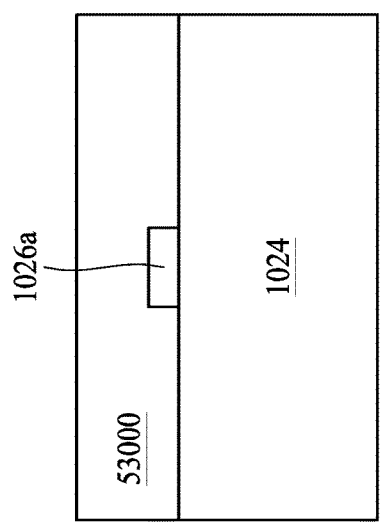

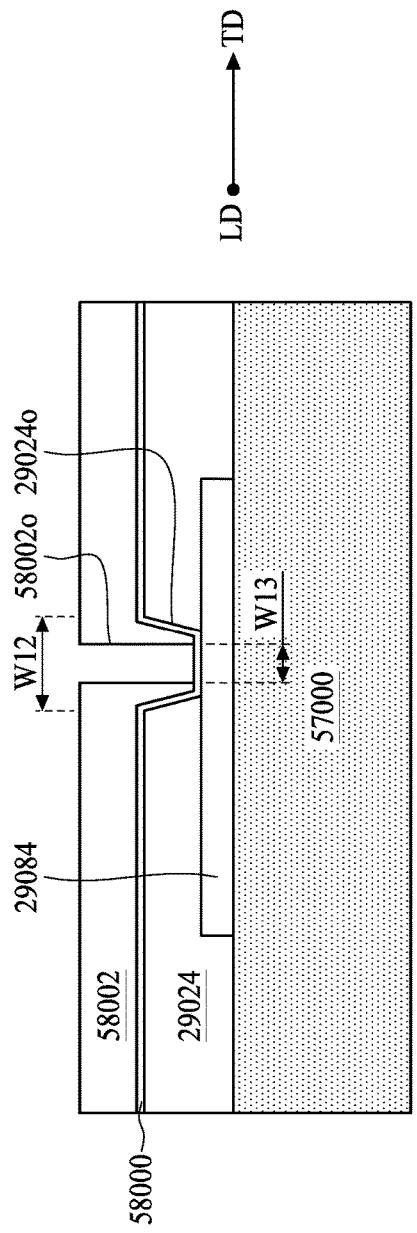
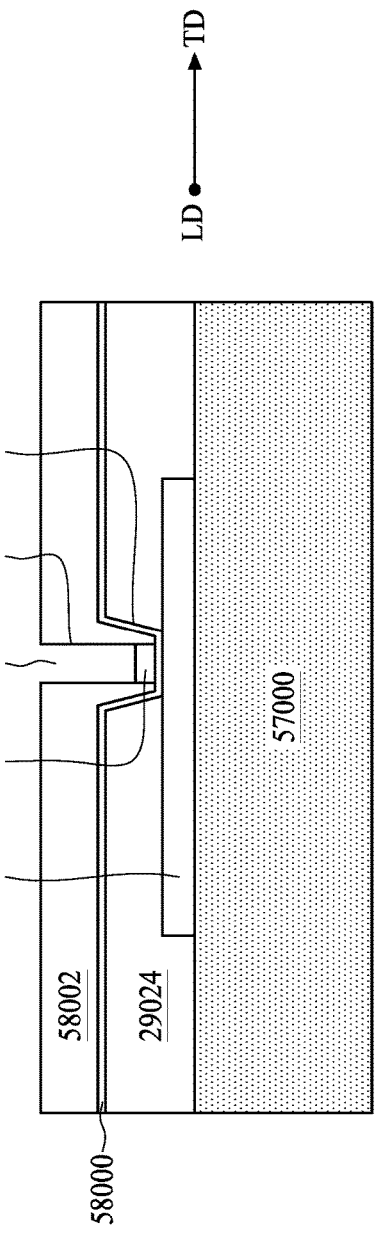
FIG. 58C
FIG. 58D

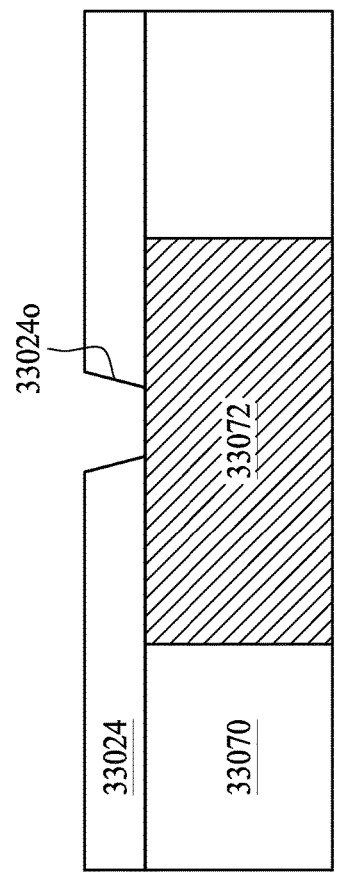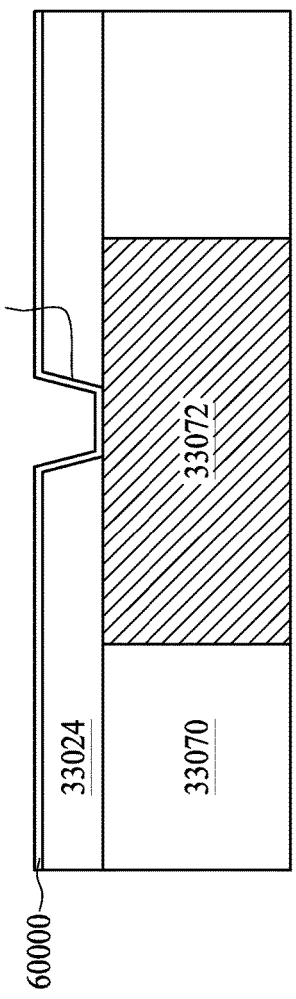

SEMICONDUCTOR DEVICE PACKAGES AND STACKED PACKAGE ASSEMBLIES INCLUDING HIGH DENSITY INTERCONNECTIONS

CROSS-REFERENCE TO RELATED APPLICATION

This application claims the benefit of U.S. Provisional Application No. 62/424,901 filed Nov. 21, 2016, and claims the benefit of U.S. Provisional Application No. 62/373,803 filed Aug. 11, 2016, the contents of which are incorporated herein by reference in their entireties.

BACKGROUND

1. Field of the Disclosure

The present disclosure relates to high density interconnections in semiconductor device packages and stacked package assemblies.

2. Description of the Related Art

To address a trend towards miniaturization and increased functionality, a semiconductor device package can integrate multiple electronic devices within the package, where the electronic devices are interconnected through redistribution layers (RDLs). As more functionality is incorporated into electronic devices, a number of requisite device-to-device interconnections within a semiconductor device package has dramatically increased. The increased number of device-to-device interconnections places considerable constraint on an available routing area for traces of RDLs. To provide interconnections, RDLs can include relatively large capture pads having dimensions larger than a width of traces. These capture pads occupy valuable footprint area and impede against a high density of traces which can be routed between adjacent capture pads.

It is against this background that a need arose to develop embodiments of this disclosure.

SUMMARY

In one aspect according to some embodiments, a semiconductor device package includes: (1) an electronic device including an active surface and a contact pad adjacent to the active surface; and (2) a redistribution stack including (a) a dielectric layer disposed over the active surface and defining an opening exposing at least a portion of the contact pad; and (b) an RDL disposed over the dielectric layer and including a trace. The trace includes a first portion extending over the dielectric layer along a longitudinal direction adjacent to the opening, and a second portion disposed in the opening and extending between the first portion of the trace and the exposed portion of the contact pad. The second portion of the trace has a maximum width along a transverse direction orthogonal to the longitudinal direction, and the maximum width of the second portion of the trace is no greater than about 3 times of a width of the first portion of the trace.

In another aspect according to some embodiments, a semiconductor device package includes: (1) an electronic device including an active surface and a contact pad adjacent to the active surface; (2) a package body encapsulating portions of the electronic device, wherein the package body includes a front surface and a back surface opposite to the front surface; (3) a conductive post extending between the contact pad of the electronic device and the front surface of the package body; and (4) a redistribution stack including (a) a dielectric layer disposed over the front surface of the package body and defining an opening exposing at least a portion of a terminal end of the conductive post; and (b) an RDL disposed over the dielectric layer and including a trace. The trace includes a first portion extending over the dielectric layer, and a second portion disposed in the opening and extending between the first portion of the trace and the exposed portion of the terminal end of the conductive post. The first portion of the trace extends over the dielectric layer along a longitudinal direction adjacent to the opening, the second portion of the trace has a maximum width along a transverse direction orthogonal to the longitudinal direction, and the maximum width of the second portion of the trace is no greater than about 3 times of a width of the first portion of the trace.

In another aspect according to some embodiments, a semiconductor device package includes: (1) a package body including a front surface and a back surface opposite to the front surface; and (2) a redistribution stack adjacent to the front surface of the package body and including (a) a first RDL including a first trace; (b) a dielectric layer disposed over the first RDL; and (c) a second RDL including a second trace extending over the dielectric layer and electrically connected to the first trace through the dielectric layer. A width of the first trace is substantially uniform along at least a length of the first trace overlapping the second trace disposed over the first trace.

In another aspect according to some embodiments, a semiconductor device package includes: (1) a package body including a front surface and a back surface opposite to the front surface; and (2) a redistribution stack adjacent to the front surface of the package body and including (a) an RDL including a trace; (b) a dielectric layer disposed over the RDL; and (c) an under bump metallization (UBM) disposed over the dielectric layer and electrically connected to the trace through the dielectric layer. A portion of the trace overlaps a projection area of the UBM onto the RDL, and the trace extends along a longitudinal direction adjacent to the projection area. The overlapping portion of the trace has a maximum width along a transverse direction orthogonal to the longitudinal direction, the UBM has a maximum width along the transverse direction, and the maximum width of the overlapping portion of the trace is no greater than about ⅓ of the maximum width of the UBM.

In a further aspect according to some embodiments, a semiconductor device package includes: (1) a package body including a front surface and a back surface opposite to the front surface; and (2) a redistribution stack disposed adjacent to the front surface of the package body and including (a) a dielectric layer; (b) a conductive pad at least partially embedded in the dielectric layer; and (c) an RDL including a trace extending over the dielectric layer and electrically connected to the conductive pad through an opening in the dielectric layer. The opening in the dielectric layer exposes a portion of the conductive pad. The trace includes a first portion extending over the dielectric layer along a longitudinal direction adjacent to the opening, and a second portion disposed in the opening and extending between the first portion of the trace and the exposed portion of the conductive pad. The second portion of the trace has a maximum width along a transverse direction orthogonal to the longitudinal direction, and the maximum width of the second portion of the trace is no greater than about 3 times of a width of the first portion of the trace.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings. In the drawings, like reference numbers denote similar components, unless the context clearly dictates otherwise.

FIG. 2 is a top view, FIG. 3 is a cross-sectional view taken along line A-A of FIG. 2, and FIG. 4 is a cross-sectional view taken along line B-B of FIG. 2.

FIG. 5 is a top view, FIG. 6 is a cross-sectional view taken along line C-C of FIG. 5, and FIG. 7 is a cross-sectional view taken along line D-D of FIG. 5.

FIG. 9 is a top view, FIG. 10 is a cross-sectional view taken along line E-E of FIG. 9, and FIG. 11 is a cross-sectional view taken along line F-F of FIG. 9.

FIG. 12 is a top view, FIG. 13 is a magnified top view of a selected region of FIG. 12 (shown by a dashed box in FIG. 12), FIG. 14 is a cross-sectional view taken along line G-G of FIG. 13, and FIG. 15 is a cross-sectional view taken along line H-H of FIG. 13.

FIG. 19 is a top view, and FIG. 20 is a cross-sectional view taken along line I-I of FIG. 19.

FIG. 21 is a top view, FIG. 22 is a cross-sectional view taken along line J-J of FIG. 21, and FIG. 23 is a cross-sectional view taken along line K-K of FIG. 21.

FIG. 26 is a top view, FIG. 27 is a cross-sectional view taken along line L-L of FIG. 26, and FIG. 28 is a cross-sectional view taken along line M-M of FIG. 26.

FIG. 30 is a top view, FIG. 31 is a cross-sectional view taken along line N-N of FIG. 30, and FIG. 32 is a cross-sectional view taken along line O-O of FIG. 30.

FIG. 52A, FIG. 52B, FIG. 52C, FIG. 52D, FIG. 52E, FIG. 52F, FIG. 52G, FIG. 52H, FIG. 52I, and FIG. 52J show a sequence of stages of forming a high density contact pad-to-RDL interconnection according to some embodiments of this disclosure.

FIG. 53A, FIG. 53B, FIG. 53C, FIG. 53D, FIG. 53E, FIG. 53F, FIG. 53G, and FIG. 53H show a sequence of stages of forming a high density RDL-to-RDL interconnection according to some embodiments of this disclosure.

FIG. 58A, FIG. 58B, FIG. 58C, FIG. 58D, FIG. 58E, and FIG. 58F show a sequence of stages of forming a high density conductive pad-to-RDL interconnection according to some embodiments of this disclosure.

FIG. 60A, FIG. 60B, FIG. 60C, FIG. 60D, FIG. 60E, and FIG. 60F show a sequence of stages of forming a high density conductive via-to-RDL interconnection according to some embodiments of this disclosure.

DETAILED DESCRIPTION

Some embodiments of this disclosure are directed to high density interconnections in semiconductor device packages, using RDLs which omit capture pads. In some embodiments, a semiconductor device package includes multiple electronic devices, which can include one or more active devices, one or more passive devices, or a combination thereof. Within the semiconductor device package, high density interconnections using RDLs provide a high density of signal, power, and ground traces connecting the electronic devices within the package as well as a high density of traces providing connections external to the package. For example, the RDLs provide a high density of device-to-device interconnections (e.g., die-to-die or die-to-passive device interconnections). In some embodiments, high density interconnections are attained through one or more of the following interconnection structures: contact pad-to-RDL interconnections; RDL-to-RDL interconnections; RDL-to-UBM interconnections; conductive post-to-RDL interconnections; and conductive pad-to-RDL interconnections. In some embodiments, high density interconnections are attained through traces extending into or through dielectric openings with capture pads omitted.

Some embodiments of this disclosure are directed to high density interconnections in a variety of semiconductor device packages, including high density interconnections in wafer-level semiconductor device packages (e.g., wafer-level chip scale packages (WLCSPs)) and high density interconnections in fan-out or fan-in semiconductor device packages, and the formation of such interconnections in wafer-level packaging processes and fan-out or fan-in packaging processes (e.g., using wafers or panels, for example, round, rectangular, or square panels).

Figure 1:
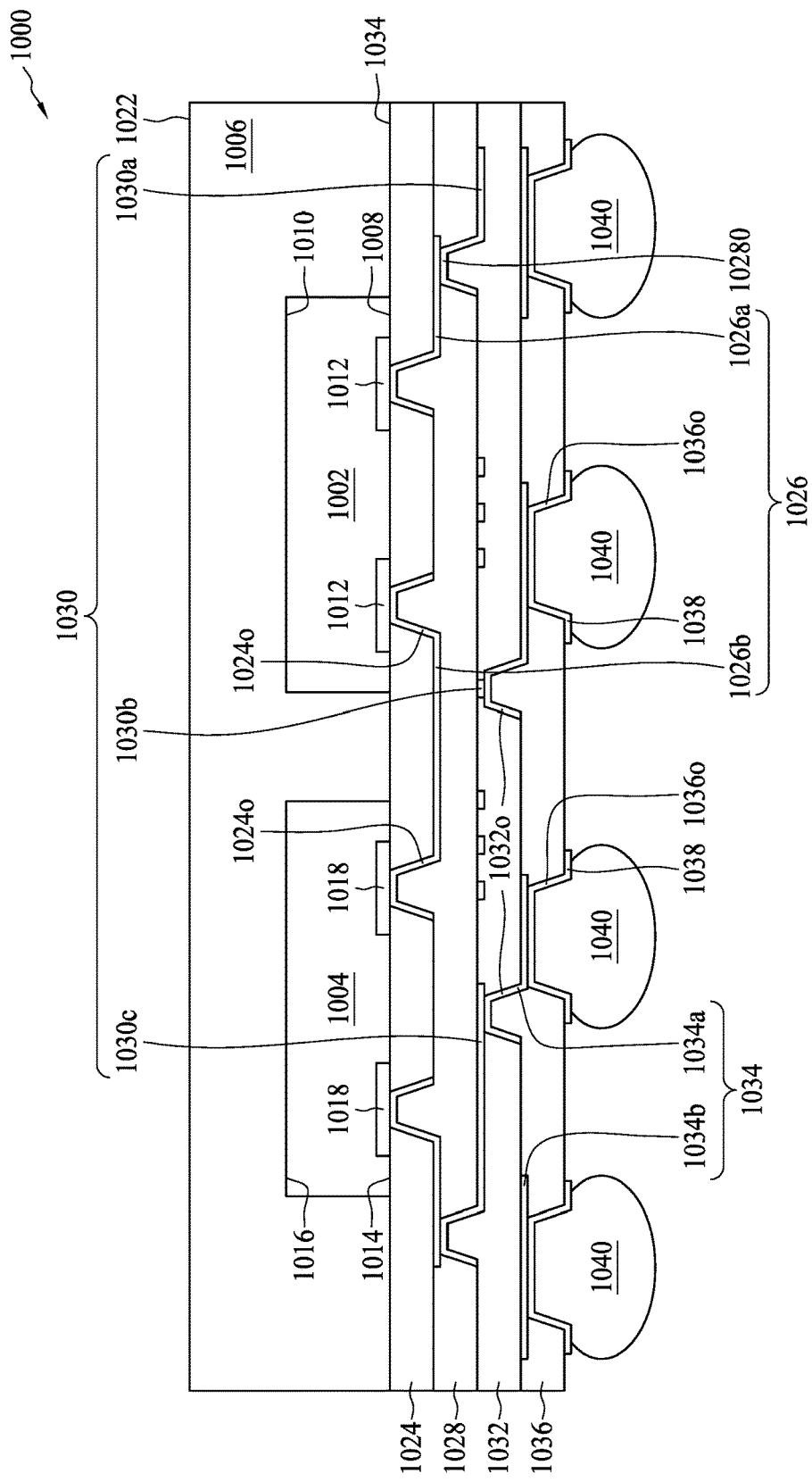
FIG. 1 shows a cross-sectional view of a semiconductor device package according to some embodiments of this disclosure.

Referring to FIG. 1, a cross-sectional view is shown of a semiconductor device package 1000 according to some embodiments of this disclosure. The semiconductor device package 1000 includes multiple electronic devices, including an electronic device 1002 and an electronic device 1004. As illustrated, each of the electronic devices 1002 and 1004 is an active device corresponding to a semiconductor die or chip, although it is contemplated that the electronic devices 1002 and 1004, in general, can be any active devices, any passive devices, or a combination thereof. The electronic device 1002 includes an active surface 1008, a back surface 1010 opposite to the active surface 1008, and contact pads 1012 adjacent to the active surface 1008. The contact pads 1012 provide input and output electrical connections for an integrated circuit within the electronic device 1002. Similarly, the electronic device 1004 includes an active surface 1014, a back surface 1016 opposite to the active surface 1014, and contact pads 1018 adjacent to the active surface 1014, and where the contact pads 1018 provide input and output electrical connections for an integrated circuit within the electronic device 1004. While the two electronic devices 1002 and 1004 are shown in the cross-sectional view of the semiconductor device package 1000, it is contemplated that a single electronic device or more than two electronic devices can be included in the semiconductor device package 1000 of other embodiments.

As shown in FIG. 1, the semiconductor device package 1000 also includes a package body 1006 that covers or encapsulates portions of the electronic device 1002 and portions of the electronic device 1004. The package body 1006 can provide mechanical stability as well as protection against oxidation, humidity, and other environmental conditions. Referring to FIG. 1, the package body 1006 covers the back surfaces 1010 and 1016 and lateral sides of the electronic devices 1002 and 1004, with their active surfaces 1008 and 1014 at least partially exposed from or uncovered by the package body 1006. The package body 1006 includes a front surface 1020 and a back surface 1022 opposite to the front surface 1020. The package body 1006 can be formed from, or can include, a molding material. The molding material can include, for example, a Novolac-based resin, an epoxy-based resin, a silicone-based resin, or another suitable encapsulant. Suitable fillers can also be included, such as powdered silica. The molding material can be a pre-impregnated material, such as a pre-impregnated dielectric material. Through implementation of high density interconnections within the semiconductor device package 1000, the electronic devices 1002 and 1004 encapsulated by the package body 1006 can be disposed in close proximity, or can be "brick-walled" so as to be nearly abutting with a narrow gap between the electronic devices 1002 and 1004 filled with a molding material.

The semiconductor device package 1000 also includes a redistribution stack of one or more RDLs and one or more dielectric layers disposed over the active surfaces 1008 and 1014 of the electronic devices 1002 and 1004 and the front surface 1020 of the package body 1006. As illustrated, a dielectric layer 1024 is disposed over the electronic devices 1002 and 1004 and the package body 1006, an RDL 1026 is disposed over the dielectric layer 1024, a dielectric layer 1028 is disposed over the RDL 1026, an RDL 1030 is disposed over the dielectric layer 1028, a dielectric layer 1032 is disposed over the RDL 1030, an RDL 1034 is disposed over the dielectric layer 1032, and a dielectric layer 1036 is disposed over the RDL 1034.

The RDL 1026 is a patterned conductive layer that includes multiple traces, including traces 1026a and 1026b, and at least some of the traces of the RDL 1026 extend into openings 1024o in the dielectric layer 1024 to electrically connect to the contact pads 1012 and 1018 of the electronic devices 1002 and 1004. At least some of the traces of the RDL 1026, such as the trace 1026b, extend between the contact pads 1012 and 1018 of the electronic devices 1002 and 1004 to provide device-to-device interconnections, although it is noted that device-to-device interconnections are also provided by electrical pathways routed through the RDL 1030 and the RDL 1034. Some embodiments of this disclosure are directed to improved contact pad-to-RDL interconnections (e.g., between the trace 1026a and the contact pad 1012 and between the trace 1026b and the contact pads 1012 and 1018), and further details of such contact pad-to-RDL interconnections are provided below.

The RDL 1030 is a patterned conductive layer that includes multiple traces, including traces 1030a, 1030b, and 1030c, and at least some of the traces of the RDL 1030 extend into openings 1028o in the dielectric layer 1028 to electrically connect to the traces of the RDL 1026. Some embodiments of this disclosure are directed to improved RDL-to-RDL interconnections (e.g., between the trace 1026a and the trace 1030a), and further details of such RDL-to-RDL interconnections are provided below.

The RDL 1034 is a patterned conductive layer that includes multiple traces, including traces 1034a and 1034b, and at least some of the traces of the RDL 1034 extend into openings 1032o in the dielectric layer 1032 to electrically connect to the traces of the RDL 1030. Some embodiments of this disclosure are directed to improved RDL-to-RDL interconnections (e.g., between the trace 1030c and the trace 1034a), and further details of such RDL-to-RDL interconnections are provided below. In addition, at least some of the traces of the RDL 1034 extend through and are exposed by openings 1036o in the dielectric layer 1036, and the redistribution stack also includes UBMs 1038 which are disposed over the dielectric layer 1036 and extend into the openings 1036o in the dielectric layer 1036 to electrically connect to the traces of the RDL 1034. Some embodiments of this disclosure are directed to improved RDL-to-UBM interconnections (e.g., between the trace 1034a and the UBM 1038), and further details of such RDL-to-UBM interconnections are provided below.

The RDLs 1026, 1030, and 1034 can be formed from, or can include, copper, a copper alloy, or another metal, another metal alloy, or another combination of metals or other conductive materials. The RDLs 1026, 1030, and 1034 can be formed from a same conductive material or different conductive materials. While the three RDLs 1026, 1030, and 1034 are shown in FIG. 1, it is contemplated that less than three or more than three RDLs can be included in the semiconductor device package 1000 of other embodiments. The dielectric layers 1024, 1028, 1032, and 1036 can be formed from, or can include, a dielectric material that is polymeric or non-polymeric. For example, at least one of the dielectric layers 1024, 1028, 1032, and 1036 can be formed from polyimide, polybenzoxazole, a benzocyclobutene-based polymer, or a combination thereof. For certain embodiments, at least one of the dielectric layers 1024, 1028, 1032, and 1036 can be formed from a dielectric material that is photoimageable or photoactive, or from a printable dielectric material. The dielectric layers 1024, 1028, 1032, and 1036 can be formed from a same dielectric material or different dielectric materials. While the four dielectric layers 1024, 1028, 1032, and 1036 are shown in FIG. 1, it is contemplated that less than four or more than four dielectric layers can be included in the semiconductor device package 1000 of other embodiments.

As illustrated, the semiconductor device package 1000 provides a two-dimensional fan-out configuration in which the RDLs 1026, 1030, and 1034 extend laterally beyond lateral peripheries of the electronic devices 1002 and 1004. For example, the semiconductor device package 1000 includes electrical contacts 1040, such as in the form of conductive bumps, disposed over the UBMs 1038, and at least some of the electrical contacts 1040 and their corresponding UBMs 1038 are disposed at least partially outside the lateral peripheries of the electronic devices 1002 and 1004 and adjacent to a lateral periphery of the package body 1006. The electrical contacts 1040 allow the semiconductor device package 1000 to be electrically connected to devices external to the semiconductor device package 1000 through the RDLs 1026, 1030, and 1034. The electrical contacts 1040 can be formed from, or can include, solder or another conductive material.

Figure 2:
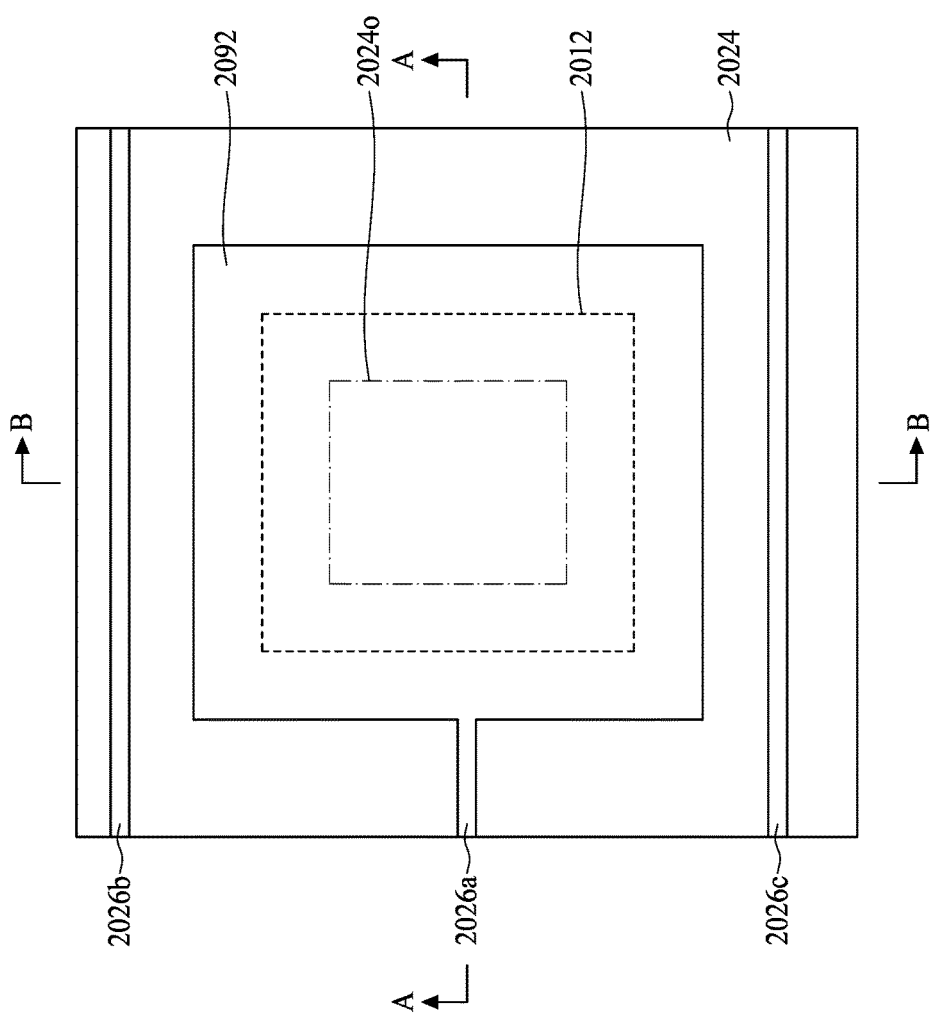
FIG. 2, FIG. 3, and FIG. 4 show a comparison structure of a contact pad-to-RDL interconnection, where
Figure 3:
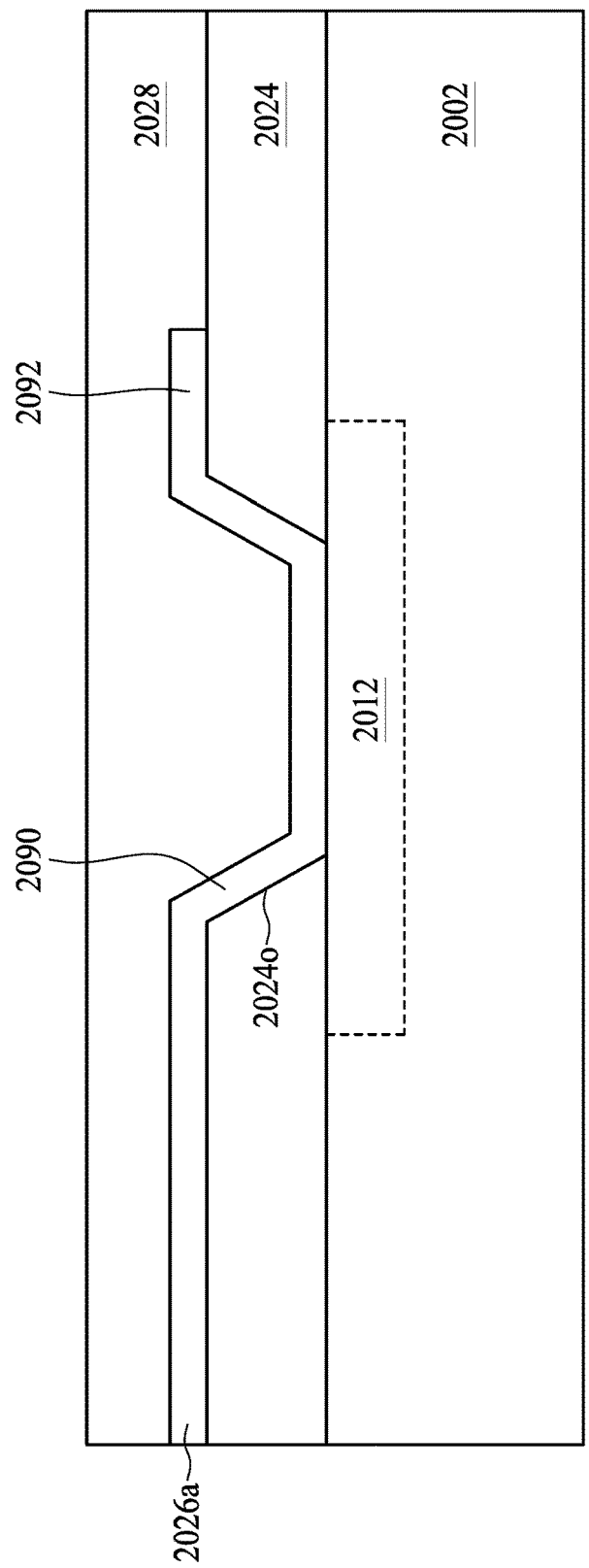
Figure 4:
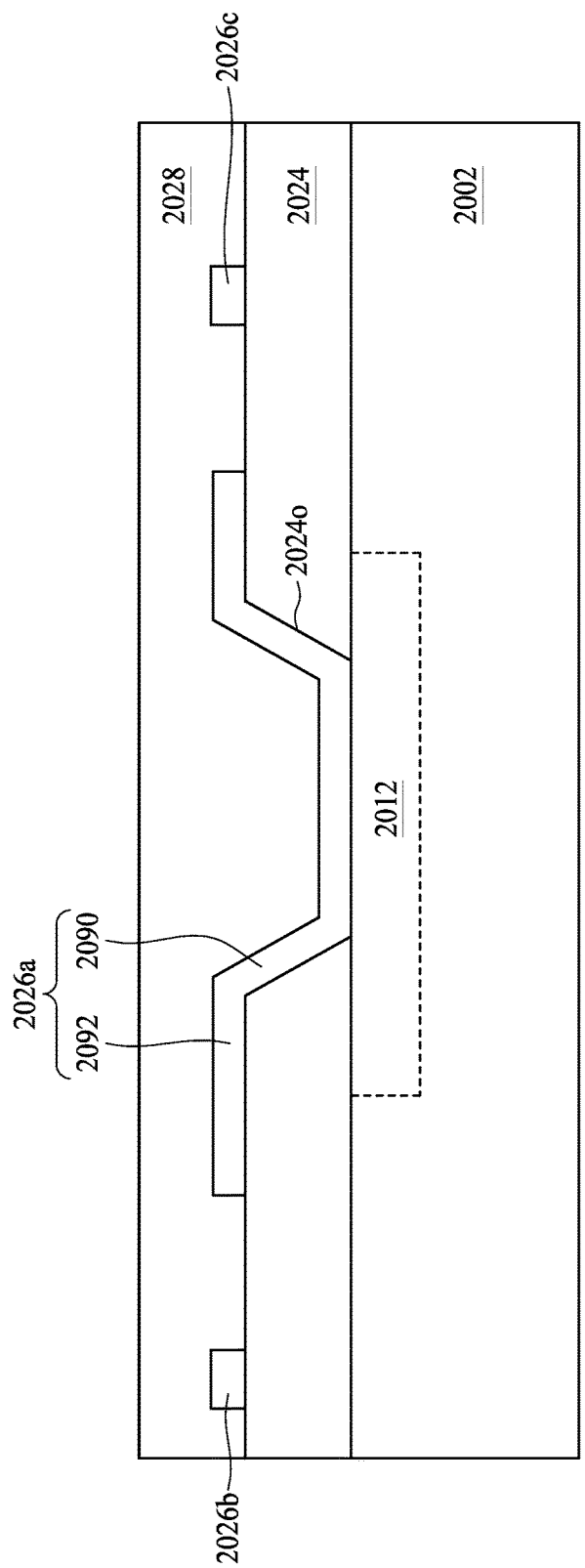

As noted above, the semiconductor device package 1000 includes high density interconnections of traces of the RDL 1026 to the contact pads 1012 and 1018 of the electronic devices 1002 and 1004. By way of comparison, FIG. 2, FIG. 3, and FIG. 4 show a comparison structure of a contact pad-to-RDL interconnection, where FIG. 2 is a top view, FIG. 3 is a cross-sectional view taken along line A-A of FIG. 2, and FIG. 4 is a cross-sectional view taken along line B-B of FIG. 2. As illustrated, traces 2026a, 2026b, and 2026c extend over a dielectric layer 2024 which is disposed over an electronic device 2002 including a contact pad 2012, and a dielectric layer 2028 is disposed over the traces 2026a, 2026b, and 2026c. The trace 2026a is electrically connected to the contact pad 2012 through a relatively large via opening 2024o that is formed in the dielectric layer 2024. Specifically, the trace 2026a terminates in a via 2090 and a capture pad 2092, where the via 2090 extends into the via opening 2024o, and the capture pad 2092 surrounds the via 2090. As illustrated, the via 2090 and the capture pad 2092 have dimensions larger than a width of a remaining portion of the trace 2026a, and extend over an entirety of the contact pad 2012 and beyond a lateral periphery of the contact pad 2012. Process registration capability for forming the comparison structure specify the capture pad 2092 to be relatively large to ensure that the trace 2026a overlaps the contact pad 2012 and did not miss the contact pad 2012, which would result in an "open" or "near open" connection. Also, material resolution and concomitant light exposure process capability specify the via opening 2024o to be relatively large to form angled sidewalls for a reliable electrical connection to the contact pad 2012 and mitigate against gaps in sidewall metallization. The relatively large via 2090 and the relatively large capture pad 2092 occupy valuable footprint area, and, since a requisite distance should be maintained between the capture pad 2092 and the adjacent traces 2026b and 2026c for process alignment, the relatively large capture pad 2092 impedes against a higher density of traces over the electronic device 2002. As illustrated, the adjacent traces 2026b and 2026c are confined to be disposed outside of the lateral periphery of the contact pad 2012, without extending over the contact pad 2012.

Figure 5:
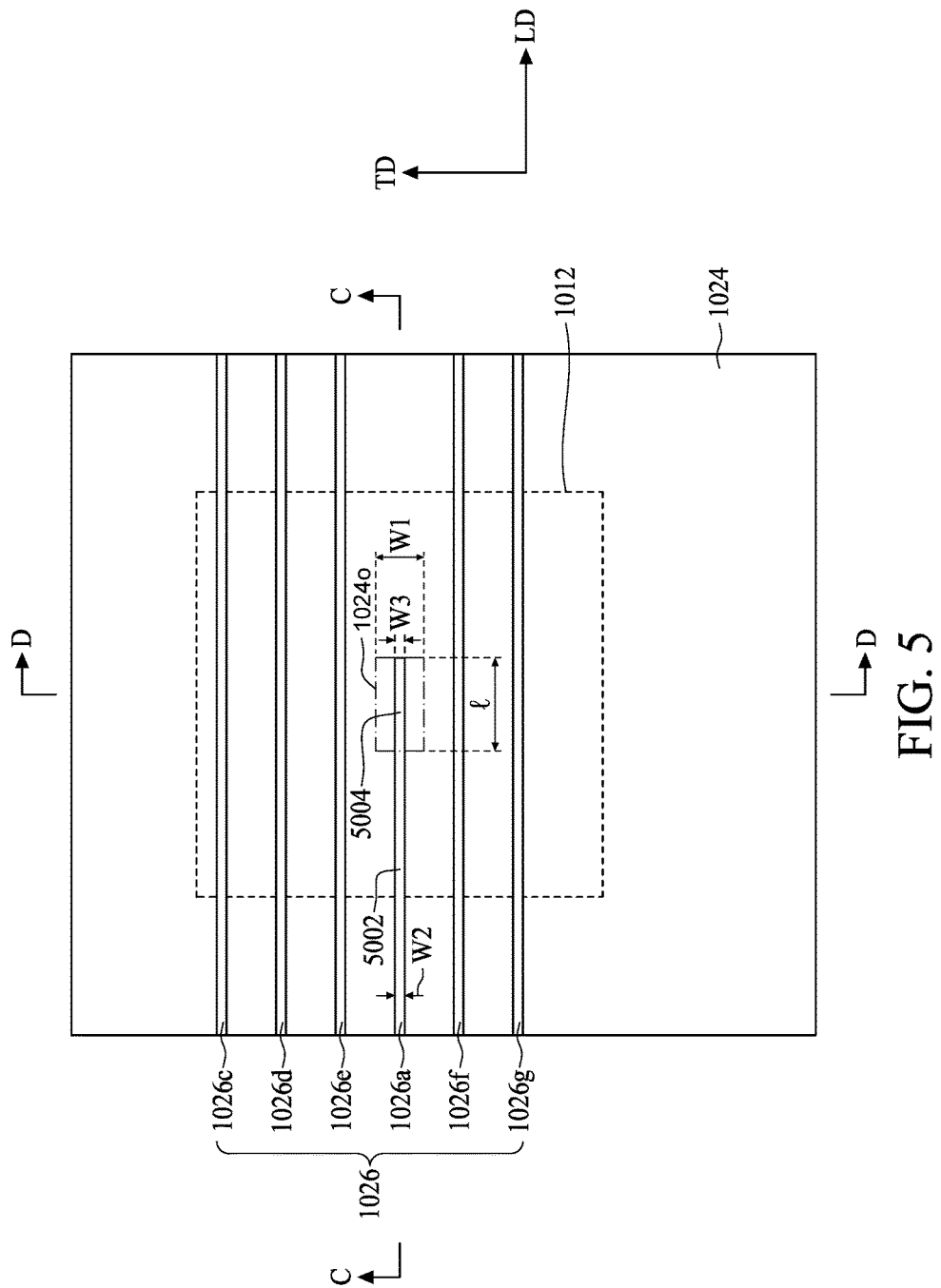
FIG. 5, FIG. 6, and FIG. 7 show a structure of a high density contact pad-to-RDL interconnection according to some embodiments, where
Figure 6:
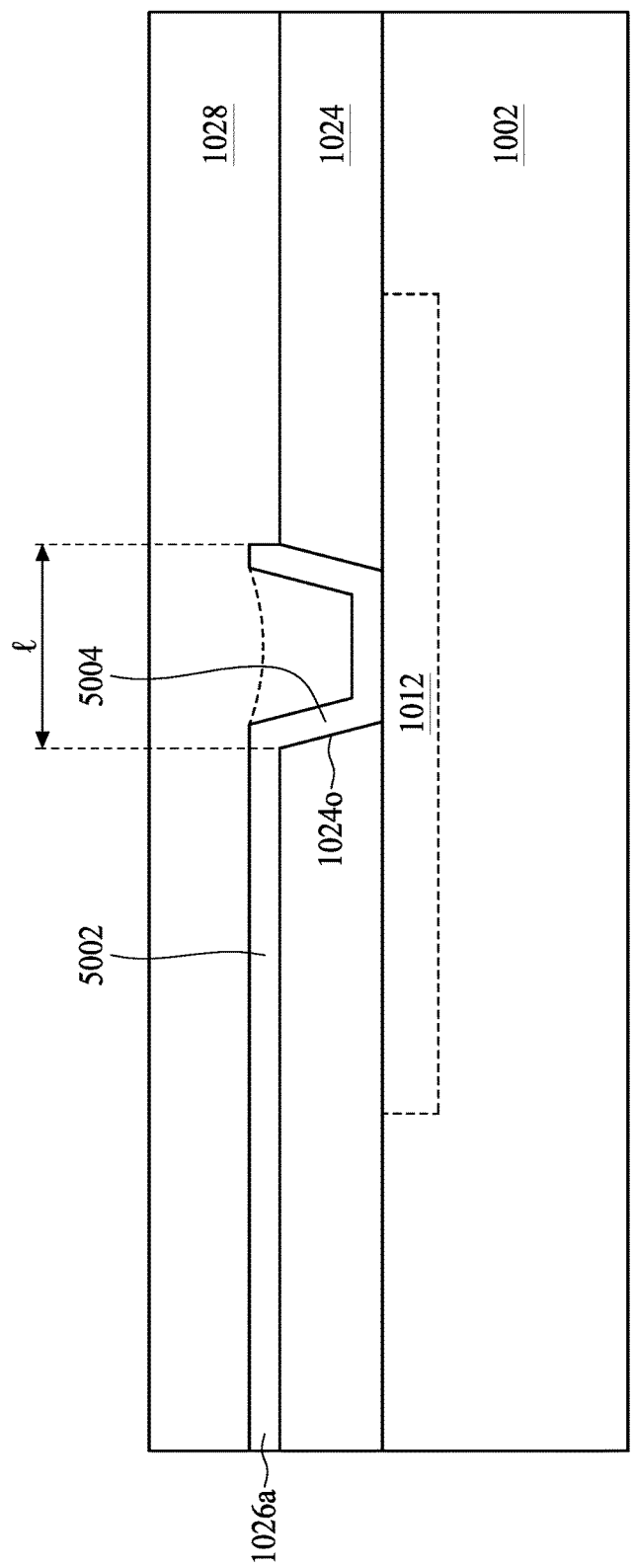
Figure 7:
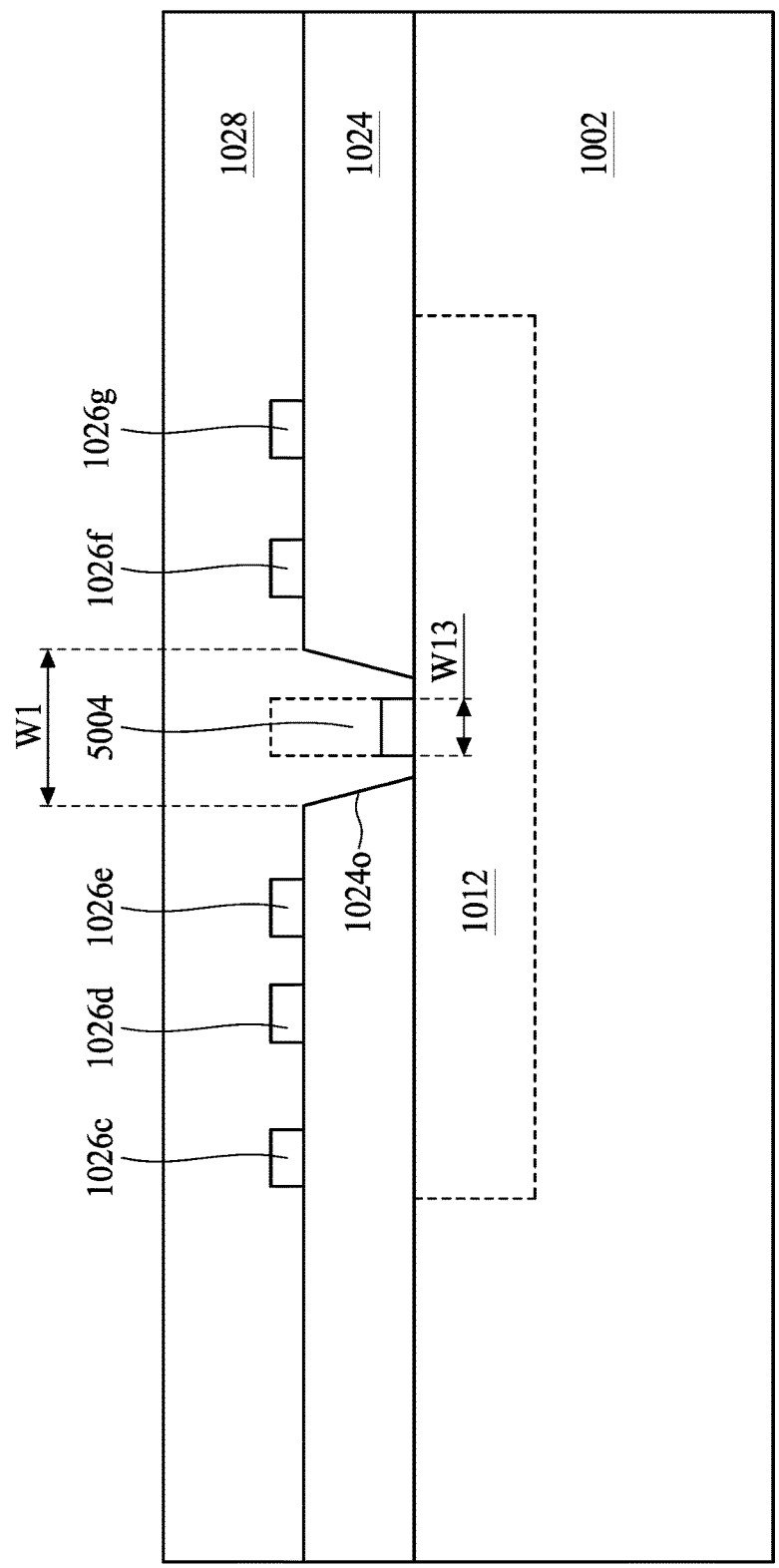

FIG. 5, FIG. 6, and FIG. 7 show a structure of a high density contact pad-to-RDL interconnection included in the semiconductor device package 1000 according to some embodiments, where FIG. 5 is a top view, FIG. 6 is a cross-sectional view taken along line C-C of FIG. 5, and FIG. 7 is a cross-sectional view taken along line D-D of FIG. 5. As illustrated, the trace 1026a along with traces 1026c, 1026d, 1026e, 1026f, and 1026g of the RDL 1026 extend over the dielectric layer 1024 which is disposed over the electronic device 1002 including the contact pad 1012, and the dielectric layer 1028 is disposed over the traces 1026a, 1026c, 1026d, 1026e, 1026f, and 1026g. The opening 1024o formed in the dielectric layer 1024 exposes a portion of the contact pad 1012, and the trace 1026a is electrically connected to the contact pad 1012 through the opening 1024o. The opening 1024o is relatively small compared to dimensions of the contact pad 1012. For example, the contact pad 1012 can have dimensions of about 40 µm by about 40 µm, and the opening 1024o can have a maximum length l along a longitudinal direction LD of about 8 µm to about 15 µm, about 8 µm to about 12 µm, or about 10 µm, and a maximum width w1 along a transverse direction TD orthogonal to the longitudinal direction LD of about 2 µm to about 10 µm, about 6 µm to about 10 µm, or about 8 µm. It should be understood that dimensions of the contact pad 1012 and the opening 1024o can be varied (e.g., increased or decreased) relative to these stated example values. The maximum length l of the opening 1024o can be greater than the maximum width w1 of the opening 1024o. For example, a ratio of the maximum length l to the maximum width w1 can be about 1.1 or greater, about 1.3 or greater, about 1.5 or greater, about 1.8 or greater, about 2 or greater, or about 3 or greater. The trace 1026a includes a portion 5002 extending over the dielectric layer 1024 along the longitudinal direction LD adjacent to the opening 1024o, and a portion 5004 in the opening 1024o and extending between the portion 5002 and the exposed portion of the contact pad 1012. The portion 5004 of the trace 1026a in the opening 1024o has a maximum width w3 along the transverse direction TD, and the maximum width w3 of the portion 5004 is no greater than about 3 times of a width w2 of the remaining portion 5002 of the trace 1026a, such as no greater than about 2.8 times, no greater than about 2.5 times, no greater than about 2.3 times, no greater than about 2 times, no greater than about 1.8 times, or no greater than about 1.5 times of the width w2 of the remaining portion 5002 of trace 1026a. In some embodiments, the maximum width w3 of the portion 5004 of the trace 1026a in the opening 1024o is substantially the same as the width w2 of the remaining portion 5002 of trace 1026a. In some embodiments, the trace 1026a has a substantially uniform width along at least a length of the trace 1026a extending over the contact pad 1012. In some embodiments, a projection area of the portion 5004 of the trace 1026a onto the contact pad 1012 (e.g., an area of about w3×l) is no greater than about 10% of a total area of the contact pad 1012, such as no greater than about 8%, no greater than about 6%, no greater than about 4%, or no greater than about 2% of the total area of the contact pad 1012. In some embodiments, a total projection area of the trace 1026a onto the contact pad 1012 (e.g., a sum of the projection area of the portion 5004 and a projection area of the remaining portion 5002) is no greater than about 15% of the total area of the contact pad 1012, such as no greater than about 13%, no greater than about 10%, no greater than about 8%, or no greater than about 5% of the total area of the contact pad 1012.

Referring to FIG. 5 and FIG. 7, the maximum width w3 of the portion 5004 of the trace 1026a in the opening 1024o is no greater than or less than the maximum width w1 of the opening 1024o. As illustrated, the portion 5004 of the trace 1026a is disposed between and spaced from opposing sidewalls of the dielectric layer 1024 forming the opening 1024o. In some embodiments, the maximum width w3 of the portion 5004 is no greater than about 9/10, no greater than about 4/5, no greater than about 7/10, no greater than about 3/5, no greater than about 1/2, no greater than about 2/5, or no greater than about 1/3 of the maximum width w1 of the opening 1024o.

As shown in FIG. 6 and FIG. 7, the portion 5004 of the trace 1026a in the opening 1024o is a conformal structure extending into and partially filling the opening 1024o. In other embodiments, the portion 5004 of the trace 1026a in the opening 1024o can be a metal-filled structure (e.g., a copper-filled structure) having a thickness in the opening 1024*o* that is about the same as or greater than a thickness of the dielectric layer 1024, as shown by dashed lines in FIG. 6 and FIG. 7. During manufacturing, the trace 1026*a* can be formed by a plating process, and the plating process of forming a metal-filled structure can be similar to that for a conformal structure, with a difference in a chemical composition of a plating solution. A further enhancement can involve reverse pulse plating, where an applied potential is reversed briefly during short plating cycles to de-plate any higher points or protrusions formed during a part of a plating cycle. This results in more throwing power; namely, openings are plated preferentially as opposed to surface features.

Improved process registration capability as well as improved material resolution and light exposure process capability allow reliable electrical connections to be formed at reduced dimensions. Since the trace 1026*a* is electrically connected to the contact pad 1012 while omitting a relatively large via and a relatively large capture pad, such a contact pad-to-RDL interconnection conserves valuable footprint area, and promotes a higher density of traces over the electronic device 1002. As illustrated in FIG. 5 and FIG. 7, in addition to the trace 1026*a*, the RDL 1026 includes at least two additional traces extending over the dielectric layer 1024 and overlapping the contact pad 1012 disposed below the additional traces, such as at least three additional traces, at least four additional traces, or at least five additional traces. Specifically, the traces 1026*c*, 1026*d*, 1026*e*, 1026*f*, and 1026*g* of the RDL 1026 extend over the dielectric layer 1024 and over the contact pad 1012.

Figure 8:
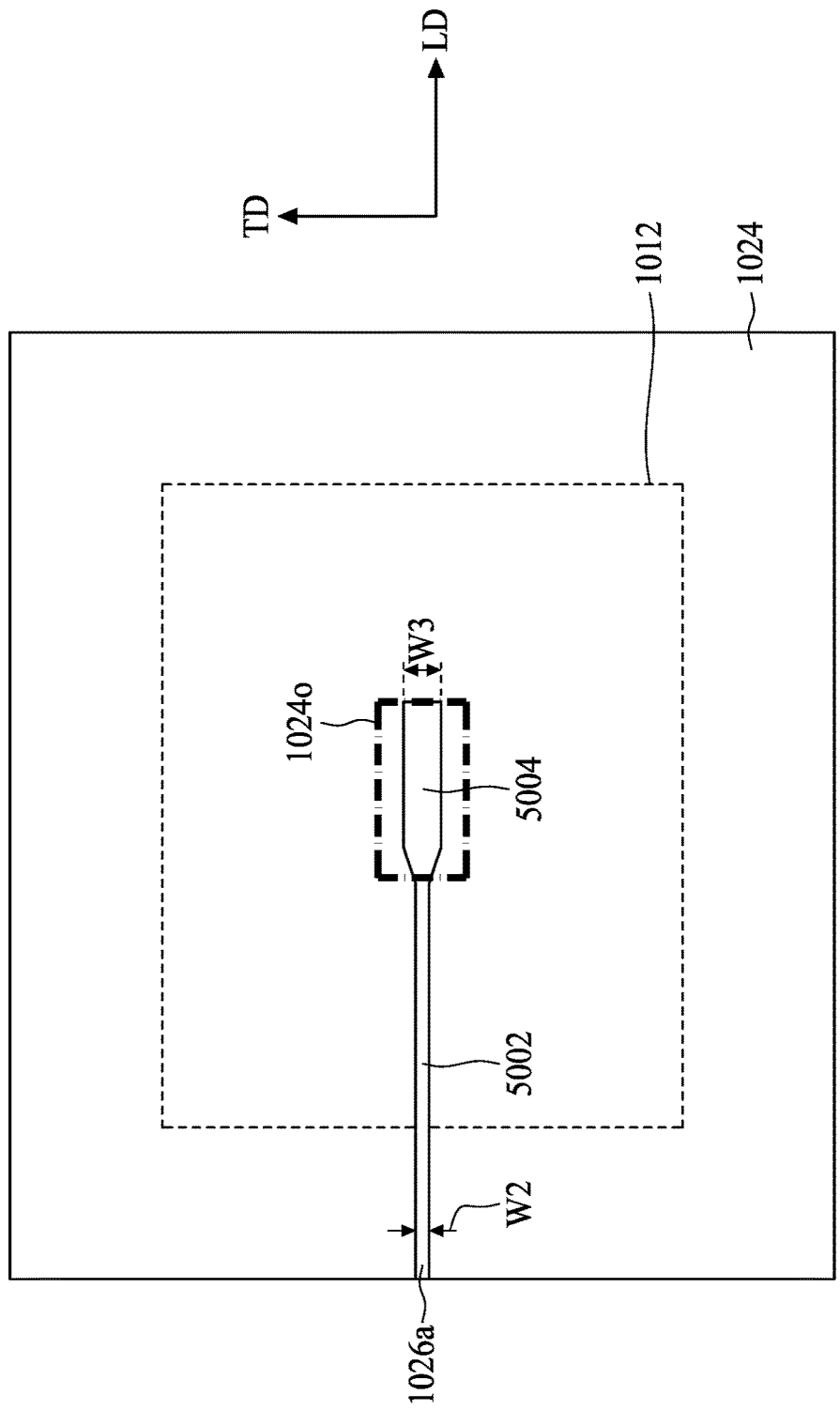
FIG. 8 shows a top view of a structure of a high density contact pad-to-RDL interconnection according to some embodiments.

To enhance an electrical connection to the contact pad 1012, the trace 1026*a* can have a varying width, in which the width of the trace 1026*a* is greater in a region of the opening 1024*o* to ensure an interconnection, and the width of the trace 1026*a* tapers in a direction away from the opening 1024*o*. FIG. 8 shows a top view of a structure of a high density contact pad-to-RDL interconnection included in the semiconductor device package 1000 according to some embodiments. As illustrated, the portion 5004 of the trace 1026*a* in the opening 1024*o* of the dielectric layer 1024 has the maximum width w3 along the transverse direction TD, and the maximum width w3 of the portion 5004 is greater than the width w2 of the remaining portion 5002 of the trace 1026*a*, such as at least about 1.1 times greater, at least about 1.2 times greater, at least about 1.3 times greater, or at least about 1.4 times greater. In some embodiments, the maximum width w3 of the portion 5004 of the trace 1026*a* is greater than the width w2 of the remaining portion 5002 of the trace 1026*a*, while remaining no greater than about 3 times of the width w2 of the remaining portion 5002 of the trace 1026*a*, such as no greater than about 2.8 times, no greater than about 2.5 times, no greater than about 2.3 times, no greater than about 2 times, no greater than about 1.8 times, or no greater than about 1.5 times of the width w2 of the remaining portion 5002 of trace 1026*a*.

A further benefit of high density contact pad-to-RDL interconnections is that a dimensional reduction also can be applied to the contact pads 1012 and 1018 of the electronic devices 1002 and 1004. In other words, a dimensional reduction of interconnections of traces to the contact pads 1012 and 1018 allows dimensions of the contact pads 1012 and 1018 themselves to be reduced, resulting in the electronic devices 1002 and 1004 having a higher contact pad density. For example, if the contact pads 1012 or 1018 have dimensions of about 40 µm by about 40 µm at a pitch between adjacent ones of the contact pads 1012 or 1018 of about 45 µm, implementation of high density interconnections can allow dimensions of the contact pads 1012 or 1018 to be reduced to about 5 µm by about 5 µm at a pitch of about 10 µm, thereby increasing linear pad density by about 4.5 times. With reduced dimensions of the contact pads 1012 or 1018, a projection area of traces onto the contact pads 1012 or 1018 can be increased. For example, and referring to FIG. 5, a projection area of the portion 5004 of the trace 1026*a* onto the contact pad 1012 of reduced dimension can be greater than about 10% of the total area of the contact pad 1012, such as up to about 50%, up to about 40%, up to about 30%, or up to about 20% of the total area of the contact pad 1012, and a total projection area of the trace 1026*a* onto the contact pad 1012 can be greater than about 15% of the total area of the contact pad 1012, such as up to about 60%, up to about 55%, up to about 50%, or up to about 45% of the total area of the contact pad 1012.

Although the above explanation of a high density contact pad-to-RDL interconnection has referred to the interconnection between the contact pad 1012 and the trace 1026*a* of the semiconductor device package 1000, it should be understood that interconnections between additional traces of the RDL 1026 and the contact pads 1012 and 1018 of the electronic devices 1002 and 1004 can be similarly implemented. In addition to connections of RDLs with contact pads of semiconductor dies, high density interconnections also can be applied to connections to passive devices and other components, such as interposer components (active or passive, and with or without conductive vias), inserts, and other embedded devices.

Figure 9:
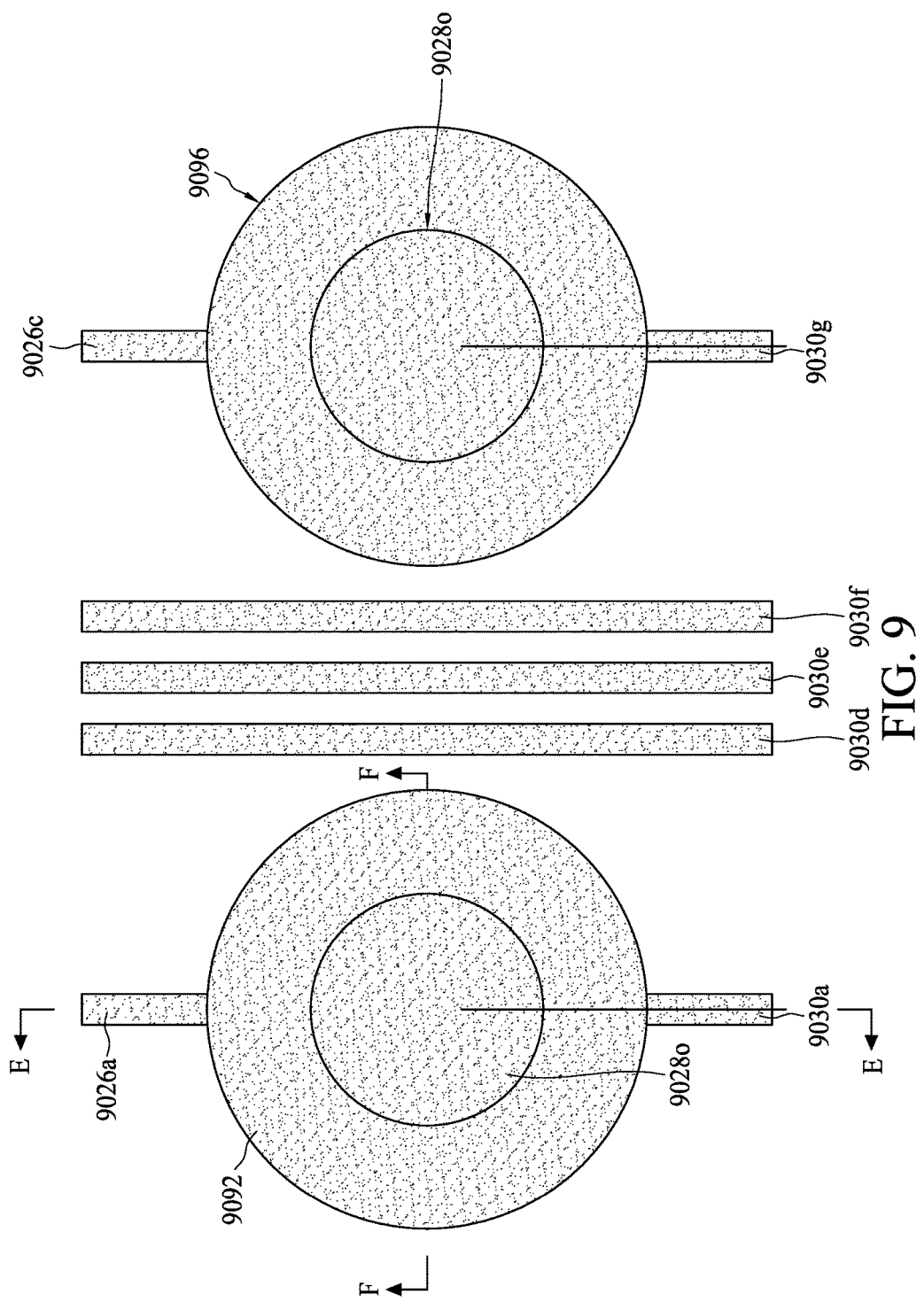
FIG. 9, FIG. 10, and FIG. 11 show a comparison structure of an RDL-to-RDL interconnection, where
Figure 10:
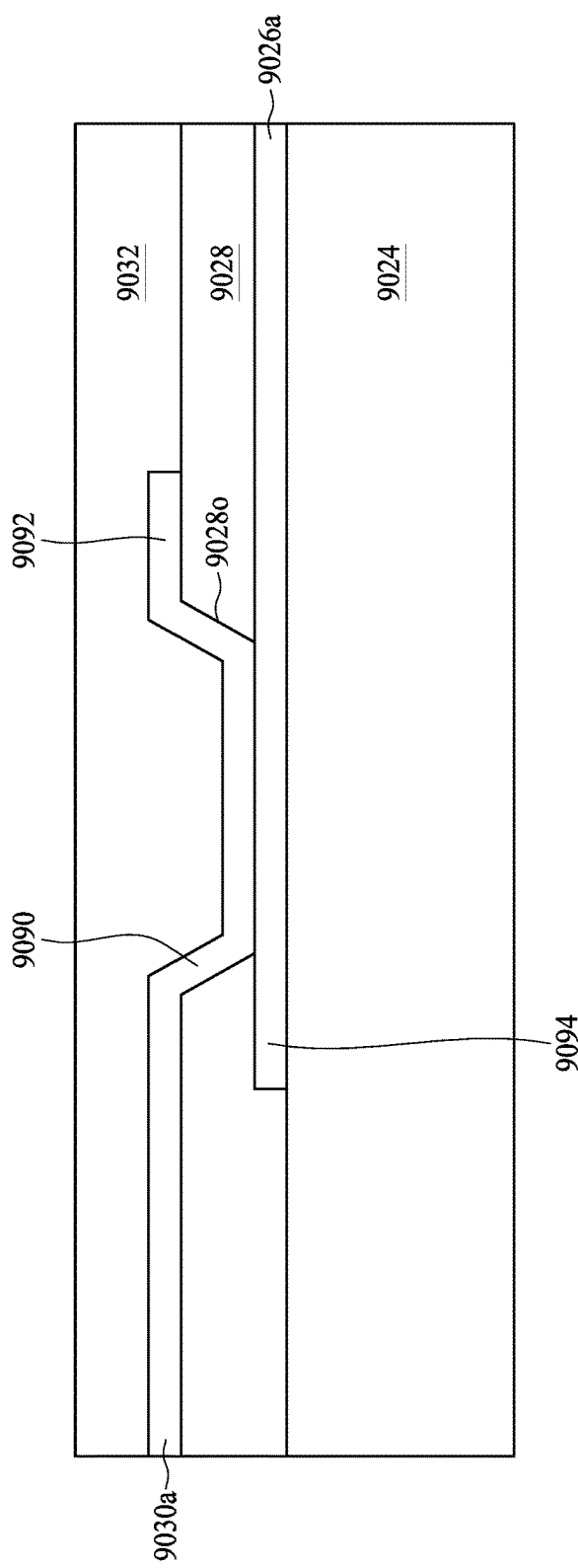
Figure 11:
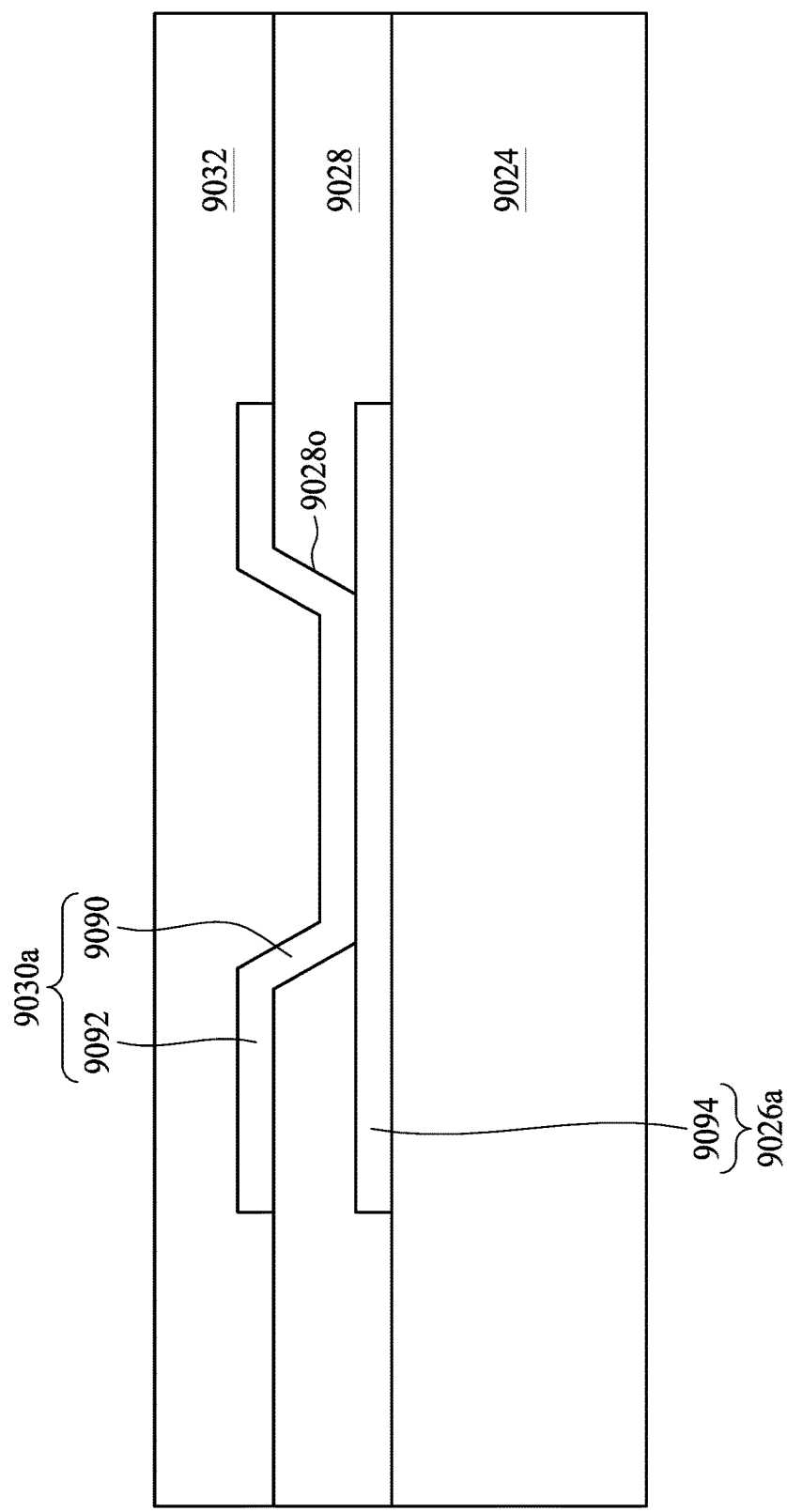

As noted above, the semiconductor device package 1000 includes high density interconnections between traces of the RDL 1026 and traces of the RDL 1030 and between traces of the RDL 1030 and traces of the RDL 1034. By way of comparison, FIG. 9, FIG. 10, and FIG. 11 show a comparison structure of an RDL-to-RDL interconnection, where FIG. 9 is a top view, FIG. 10 is a cross-sectional view taken along line E-E of FIG. 9, and FIG. 11 is a cross-sectional view taken along line F-F of FIG. 9. As illustrated, traces 9026*a* and 9026*c* extend over a dielectric layer 9024, a dielectric layer 9028 is disposed over the traces 9026*a* and 9026*c*, traces 9030*a*, 9030*d*, 9030*e*, 9030*f*, and 9030*g* extend over the dielectric layer 9028, and a dielectric layer 9032 is disposed over the traces 9030*a*, 9030*d*, 9030*e*, 9030*f*, and 9030*g*. The trace 9030*a* is electrically connected to the trace 9026*a* through a relatively large via opening 9028*o* that is formed in the dielectric layer 9028. Specifically, the trace 9026*a* terminates in a capture pad 9094, and the trace 9030*a* terminates in a via 9090 and a capture pad 9092, where the via 9090 extends into the via opening 9028*o* towards the capture pad 9094 of the trace 9026*a*, and the capture pad 9092 surrounds the via 9090. As illustrated, the via 9090 and the capture pads 9092 and 9094 have dimensions larger than a width of remaining portions of the traces 9026*a* and 9030*a*. Process registration capability for forming the comparison structure specify the capture pads 9092 and 9094 to be relatively large to ensure that the trace 9030*a* overlaps the trace 9026*a* and did not miss the trace 9026*a*, which would result in an "open" or "near open" connection. Also, material resolution and concomitant light exposure process capability specify the via opening 9028*o* to be relatively large to form angled sidewalls for a reliable electrical connection to the trace 9026*a* and mitigate against gaps in sidewall metallization. The trace 9030*g* is electrically connected to the trace 9026*c* through a similar interconnection including a capture pad 9096 of the trace 9030*g*. The relatively large via 9090 and the relatively large capture pads 9092, 9094, and 9096 occupy valuable footprint area, and, since a requisite distance should be maintained between the capture pads 9092 and 909*b* and the adjacent traces 9030*d*, 9030*e*, and 9030*f* for process alignment, the relatively large capture pads 9092 and 9096 impede against a higher density of traces that can extend between the capture pads 9092 and 9096. Similarly, the relatively large capture pad 9094 of the trace 9026*a* impedes against a higher density of traces that can extend between the capture pad 9094 and an adjacent capture pad of the trace 9026*c*.

Figure 12:
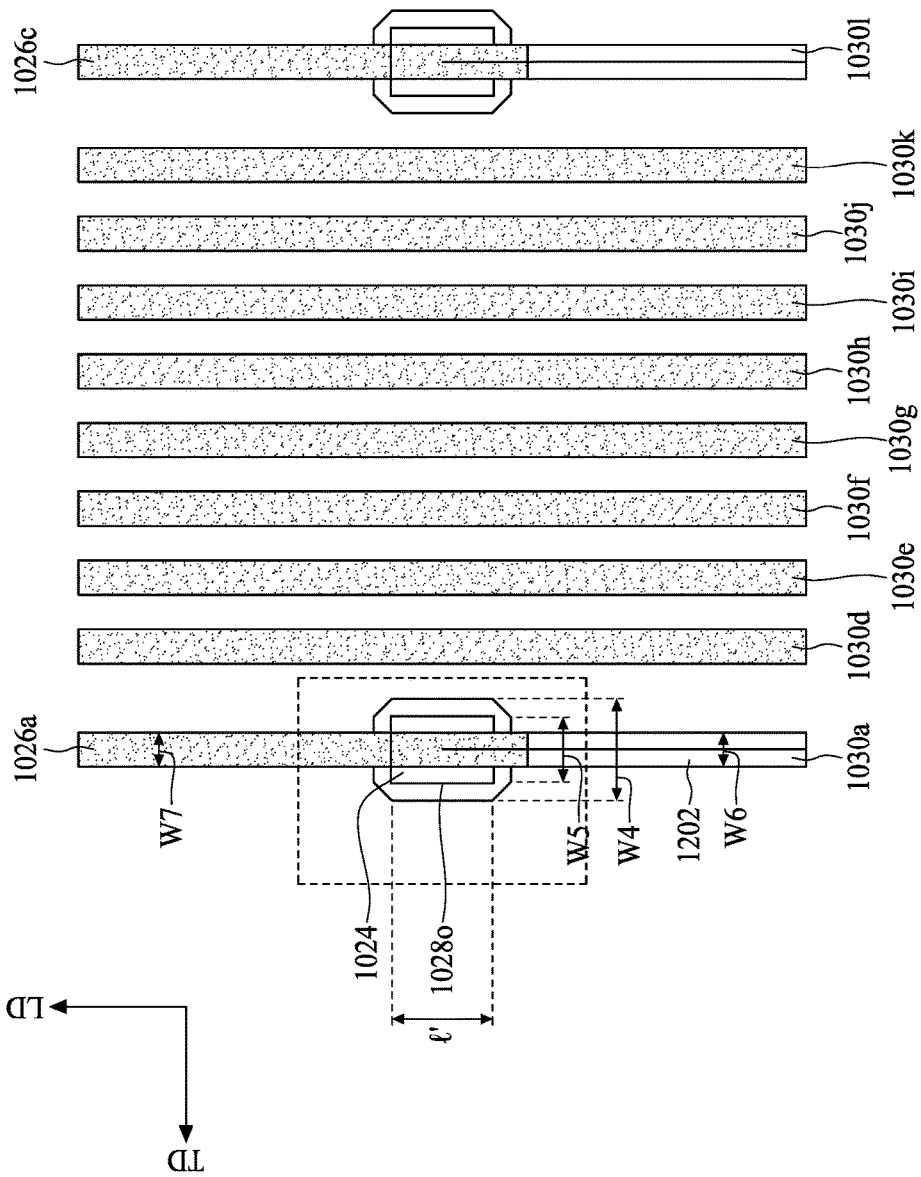
FIG. 12, FIG. 13, FIG. 14, and FIG. 15 show a structure of a high density RDL-to-RDL interconnection according to some embodiments, where
Figure 13:
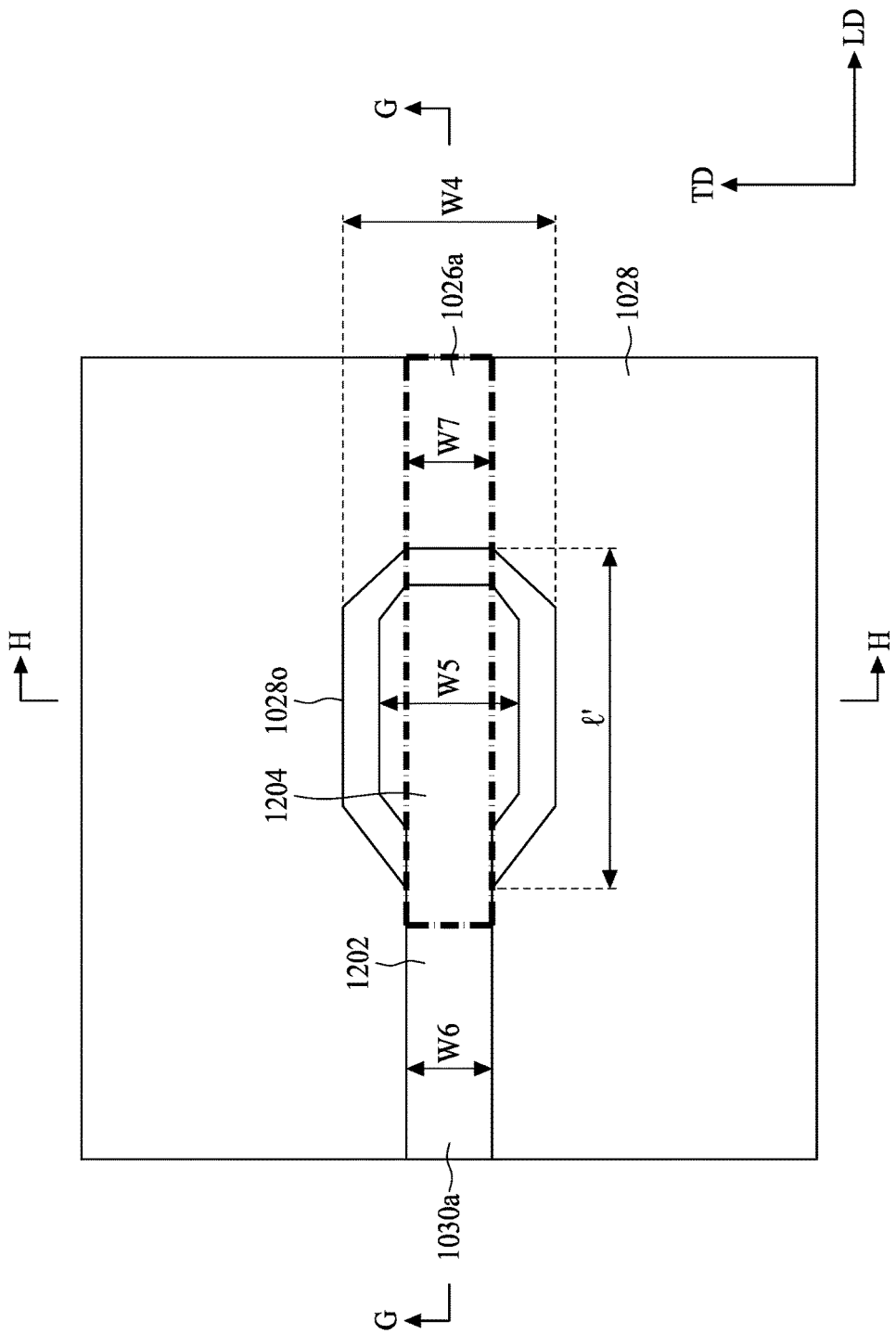
Figure 14:
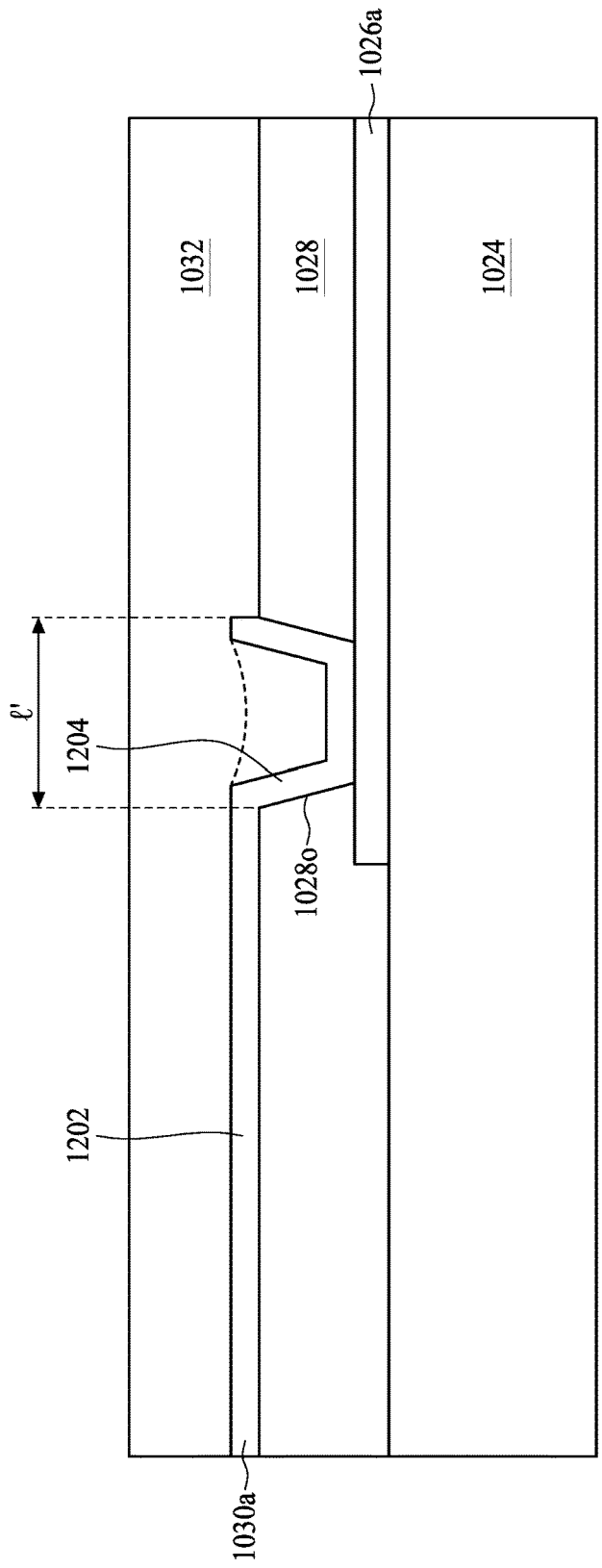
Figure 15:
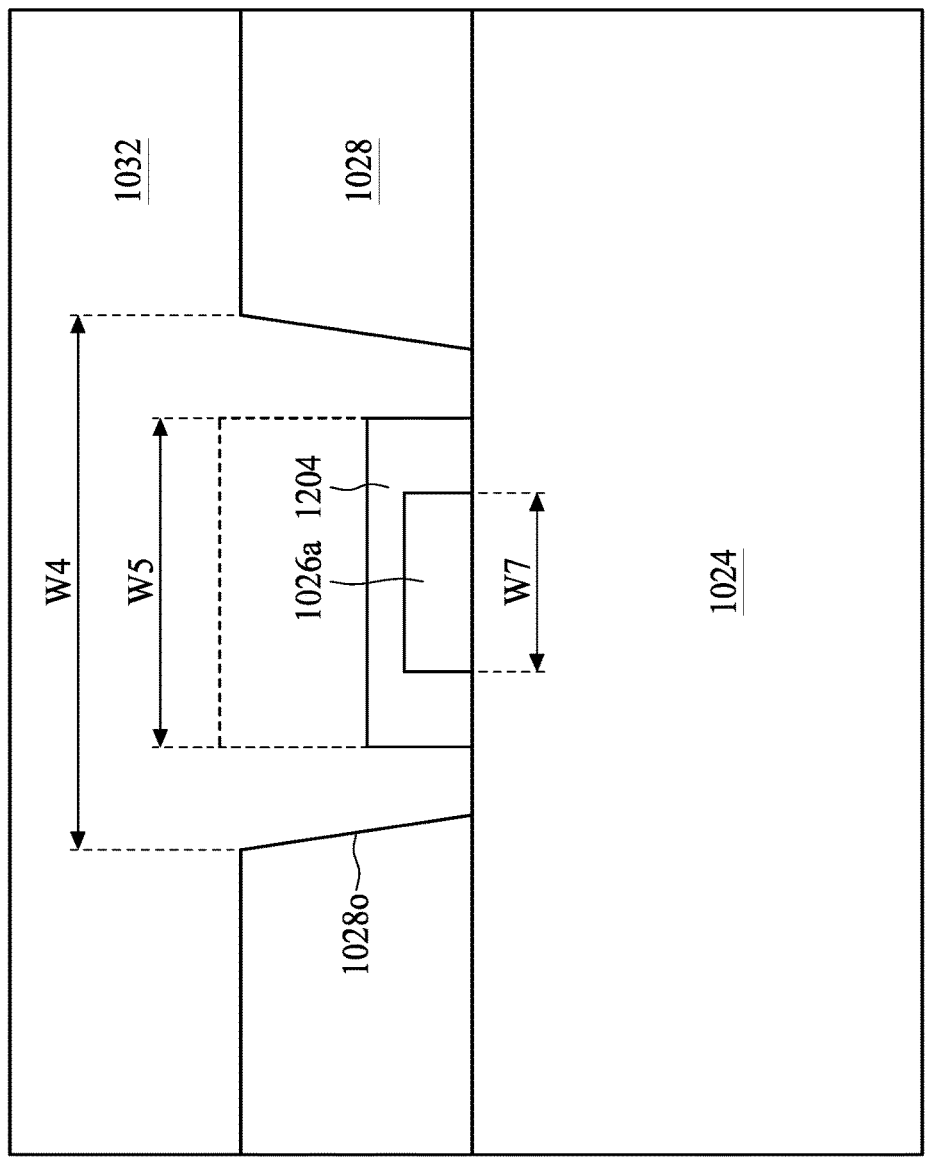

FIG. 12, FIG. 13, FIG. 14, and FIG. 15 show a structure of a high density RDL-to-RDL interconnection included in the semiconductor device package 1000 according to some embodiments, where FIG. 12 is a top view, FIG. 13 is a magnified top view of a selected region of FIG. 12 (shown by a dashed box in FIG. 12), FIG. 14 is a cross-sectional view taken along line G-G of FIG. 13, and FIG. 15 is a cross-sectional view taken along line H-H of FIG. 13. As illustrated, the trace 1026*a* along with a trace 1026*c* extend over the dielectric layer 1024, the dielectric layer 1028 is disposed over the traces 1026*a* and 1026*c*, the trace 1030*a* along with traces 1030*d*, 1030*e*, 1030*f*, 1030*g*, 1030*h*, 1030*i*, 1030*j*, 1030*k*, and 1030*l* extend over the dielectric layer 1028, and the dielectric layer 1032 is disposed over the traces 1030*a*, 1030*d*, 1030*e*, 1030*f*, 1030*g*, 1030*h*, 1030*i*, 1030*j*, 1030*k*, and 1030*l*. The opening 1028*o* formed in the dielectric layer 1028 exposes a portion of the trace 1026*a*, and the trace 1030*a* is electrically connected to the trace 1026*a* through the opening 1028*o*. The opening 1028*o* is relatively small compared to a via opening of a comparison interconnection structure. For example, the opening 1028*o* can have a maximum length l' along a longitudinal direction LD of about 8 µm to about 15 µm, about 8 µm to about 12 µm, or about 10 µm, and a maximum width w4 along a transverse direction TD orthogonal to the longitudinal direction LD of about 2 µm to about 10 µm, about 6 µm to about 10 µm, or about 8 µm. It should be understood that dimensions of the opening 1028*o* can be varied (e.g., increased or decreased) relative to these stated example values. The maximum length l' of the opening 1028*o* can be greater than the maximum width w4 of the opening 1028*o*. For example, a ratio of the maximum length l' to the maximum width w4 can be about 1.1 or greater, about 1.3 or greater, about 1.5 or greater, about 1.8 or greater, about 2 or greater, or about 3 or greater. The trace 1030*a* includes a portion 1202 extending over the dielectric layer 1028 along the longitudinal direction LD adjacent to the opening 1028*o*, and a portion 1204 in the opening 1028*o* and extending between the portion 1202 and the exposed portion of the trace 1026*a*. To enhance an electrical connection to the trace 1026*a*, the trace 1030*a* can have a varying width, in which the width of the trace 1030*a* is greater in a region of the opening 1028*o* to ensure an interconnection, and the width of the trace 1030*a* tapers in a direction away from the opening 1028*o*. As illustrated, the portion 1204 of the trace 1030*a* in the opening 1028*o* has a maximum width w5 along the transverse direction TD, the remaining portion 1202 of the trace 1030*a* has a width w6, and the maximum width w5 of the portion 1204 is greater than the width w6 of the remaining portion 1202 of the trace 1030*a*, such as at least about 1.1 times greater, at least about 1.2 times greater, at least about 1.3 times greater, or at least about 1.4 times greater. In some embodiments, the maximum width w5 of the portion 1204 of the trace 1030*a* is greater than the width w6 of the remaining portion 1202 of the trace 1030*a*, while remaining no greater than about 3 times of the width w6 of the remaining portion 1202 of the trace 1030*a*, such as no greater than about 2.8 times, no greater than about 2.5 times, no greater than about 2.3 times, no greater than about 2 times, no greater than about 1.8 times, or no greater than about 1.5 times of the width w6 of the remaining portion 1202 of trace 1030*a*. Referring to FIG. 13 and FIG. 15, the portion 1204 of the trace 1030*a* in the opening 1028*o* covers a top surface and opposing side surfaces of the exposed portion of the trace 1026*a* in the opening 1028*o*.

The trace 1026*a* omits a capture pad, and the trace 1026*a* has a substantially uniform width along at least a length of the exposed portion of the trace 1026*a* overlapping the trace 1030*a* disposed above the trace 1026*a*. As illustrated, the trace 1026*a* has a width w7, which is substantially uniform along the length of the trace 1026*a*, and is substantially the same as the width w6 of the remaining portion 1202 of the trace 1030*a*. To enhance an electrical connection to the trace 1030*a*, it is also contemplated that the trace 1026*a* can have a varying width, in which the width of the trace 1026*a* is greater in a region of the opening 1028*o* to ensure an interconnection, and the width of the trace 1026*a* tapers in a direction away from the opening 1028*o*.

Referring to FIG. 12, FIG. 13, and FIG. 15, the maximum width w5 of the portion 1204 of the trace 1030*a* in the opening 1028*o* is no greater than or less than the maximum width w4 of the opening 1028*o*. As illustrated, the portion 1204 of the trace 1030*a* is disposed between and spaced from opposing sidewalls of the dielectric layer 1028 forming the opening 1028*o*. In some embodiments, the maximum width w5 of the portion 1204 is no greater than about 9/10, no greater than about 4/5, no greater than about 7/10, no greater than about 3/5, no greater than about 1/2, no greater than about 2/5, or no greater than about 1/3 of the maximum width w4 of the opening 1028*o*.

As shown in FIG. 14 and FIG. 15, the portion 1204 of the trace 1030*a* in the opening 1028*o* is a conformal structure extending into and partially filling the opening 1028*o*. In other embodiments, the portion 1204 of the trace 1030*a* in the opening 1028*o* can be a metal-filled structure (e.g., a copper-filled structure) having a thickness in the opening 1028*o* that is about the same as or greater than a thickness of the dielectric layer 1028, as shown by dashed lines in FIG. 14 and FIG. 15.

Improved process registration capability as well as improved material resolution and light exposure process capability allow reliable electrical connections to be formed at reduced dimensions. Since the trace 1030*a* is electrically connected to the trace 1026*a* while omitting a relatively large via and relatively large capture pads, such an RDL-to-RDL interconnection conserves valuable footprint area, and promotes a higher density of traces extending over the dielectric layer 1024 and over the dielectric layer 1028. As illustrated in FIG. 12, the trace 1030*l* is electrically connected to the trace 1026*c* through a similar high density interconnection omitting capture pads. In addition to the traces 1030*a* and 1030*l*, the RDL 1030 includes multiple additional traces extending over the dielectric layer 1028 and between the interconnection of the trace 1030*a* and the trace 1026*a* and the interconnection of the trace 1030*l* and the trace 1026*c*. Specifically, the traces 1030*d*, 1030*e*, 1030*f*, 1030*g*, 1030*h*, 1030*i*, 1030*j*, and 1030*k* of the RDL 1030 extend over the dielectric layer 1028 and between the interconnections. Similarly, the high density interconnections promote a higher density of traces of the RDL 1026 that can extend over the dielectric layer 1024 and between the interconnections.

Figure 16:
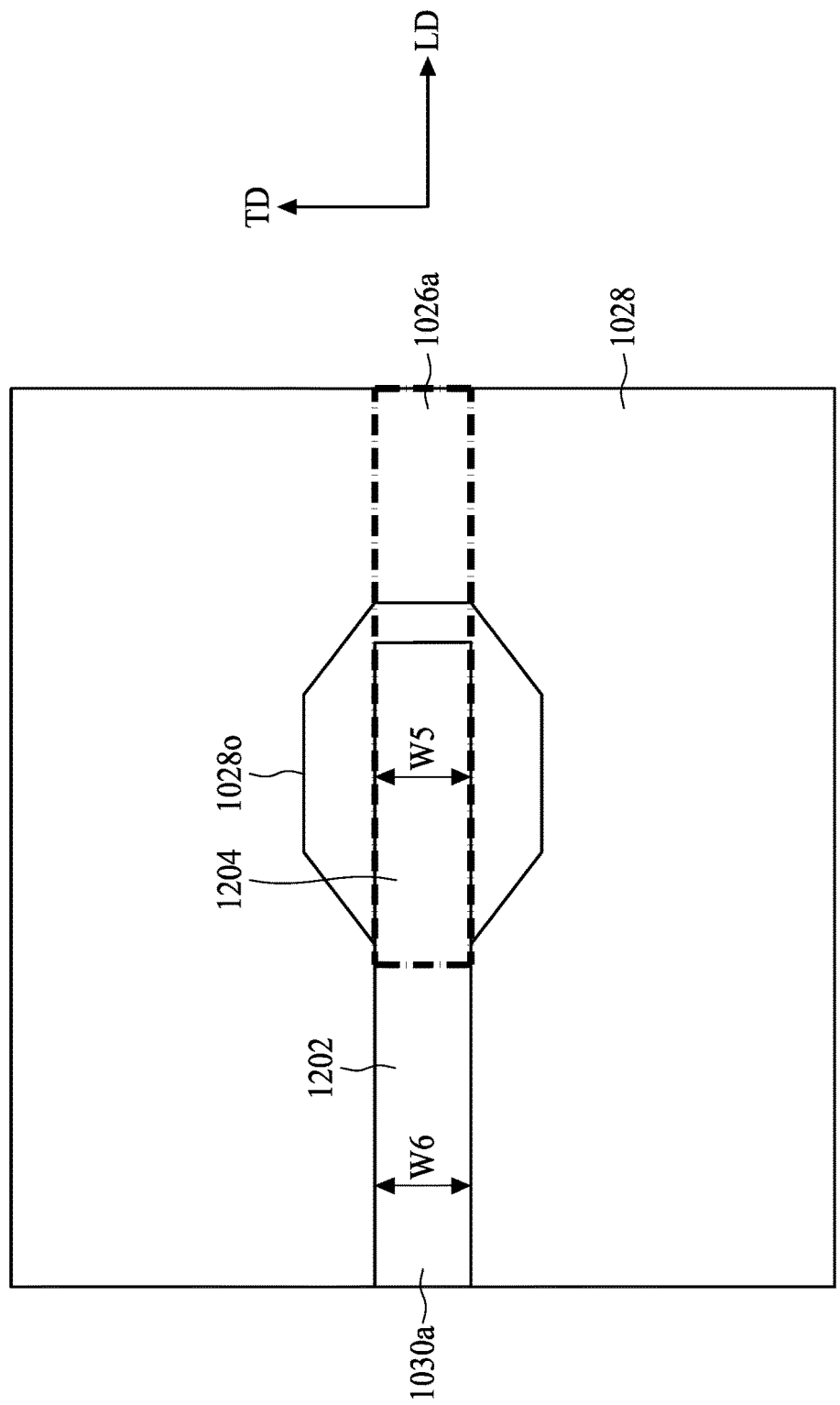
FIG. 16 shows a top view of a structure of a high density RDL-to-RDL interconnection according to some embodiments.

Although the trace 1030*a* has been explained for some embodiments as having a varying width, it is also contemplated that the trace 1030*a* can have a substantially uniform width along a length of the trace 1030*a*. FIG. 16 shows a top view of a structure of a high density RDL-to-RDL interconnection included in the semiconductor device package 1000 according to some embodiments. As illustrated, the portion 1204 of the trace 1030*a* in the opening 1028*o* of the dielectric layer 1028 has the maximum width w5 along the transverse direction TD, and the maximum width w5 of the portion 1204 is substantially the same as the width w6 of the remaining portion 1202 of the trace 1030*a*.

Figure 17:
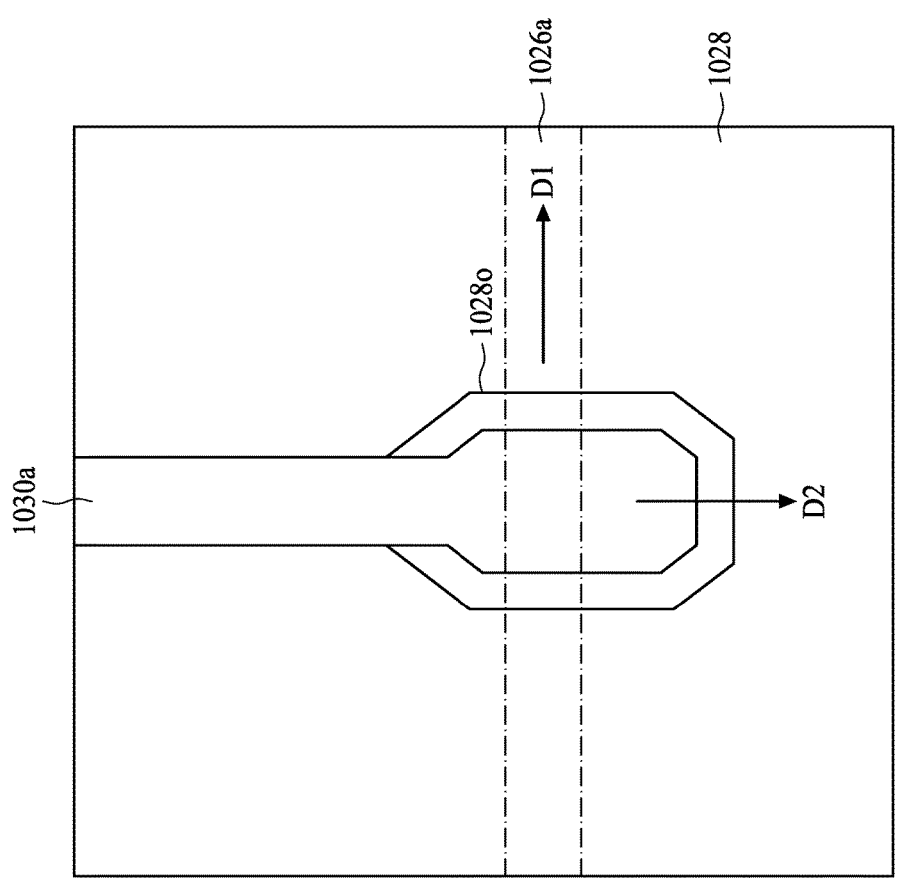
FIG. 17 shows a top view of a structure of a high density RDL-to-RDL interconnection according to some embodiments.
Figure 18:
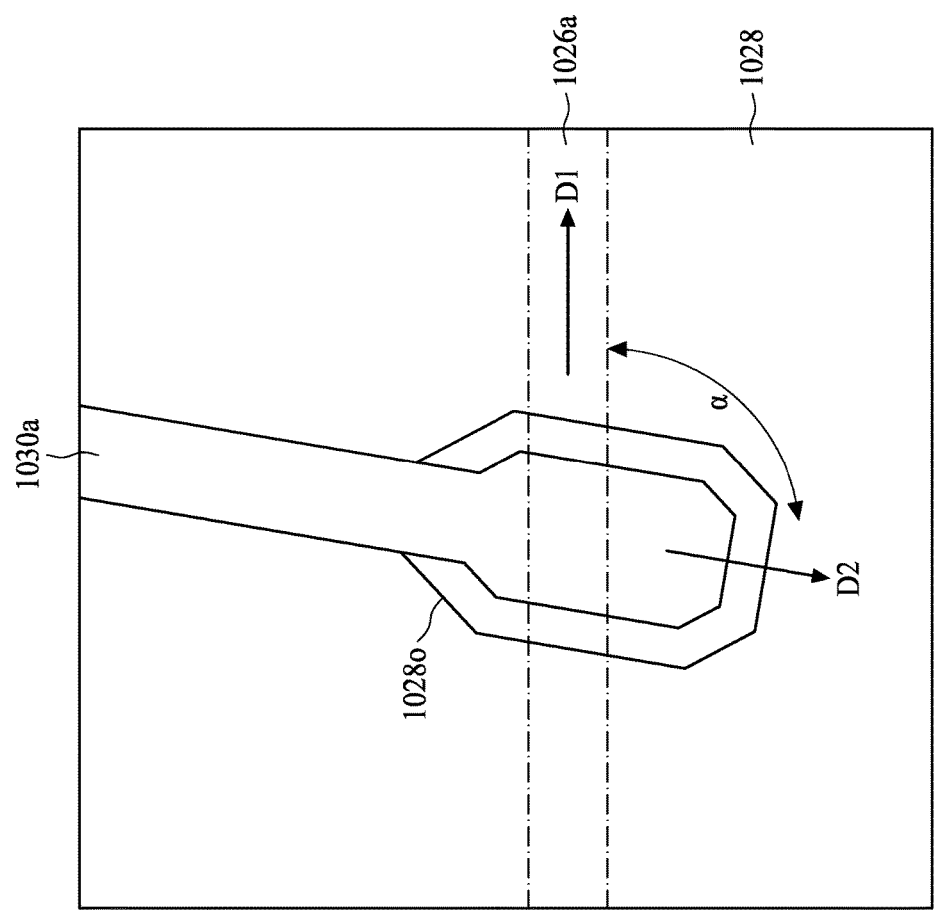
FIG. 18 shows a top view of a structure of a high density RDL-to-RDL interconnection according to some embodiments.

Also, although FIG. 16 shows the traces 1026*a* and 1030*a* as substantially aligned and of substantially the same width, connecting traces, in general, can be oriented at varying intersecting angles and can have different widths as long as a requisite overlapping area is maintained to promote adequate adhesion and electrical connection. FIG. 17 shows a top view of a structure of a high density RDL-to-RDL interconnection according to some embodiments. As illustrated, the trace 1026*a* extends along a first direction D1 adjacent to the opening 1028*o*, and the trace 1030*a* extends over the dielectric layer 1028 along a second direction D2 adjacent to the opening 1028*o*, where the second direction D2 is substantially perpendicular to the first direction D1. More generally, an intersecting angle of connecting traces can be other than substantially parallel or substantially perpendicular. FIG. 18 shows a top view of a structure of a high density RDL-to-RDL interconnection according to some embodiments. As illustrated, the trace 1030*a* extends over the dielectric layer 1028 along the second direction D2 adjacent to the opening 1028*o*, and the trace 1026*a* extends along the first direction D1 adjacent to the opening 1028*o*, where the second direction D2 forms an intersecting angle α with respect to the first direction D1, and where the intersecting angle α can be in a range of 0° to 360°. In some embodiments, the intersecting angle α is different from 0° and different from 180°.

Moreover, although the above explanation of a high density RDL-to-RDL interconnection has referred to the interconnection between the trace 1030*a* and the trace 1026*a* of the semiconductor device package 1000, it should be understood that additional interconnections between traces of the RDLs 1026, 1030, and 1034 can be similarly implemented. Although some embodiments of RDL-to-RDL interconnections are shown as connections between two RDLs, it is noted that connections, in general, can be attained between any number of RDLs, such as two or more, three or more, or four or more.

Figure 19:
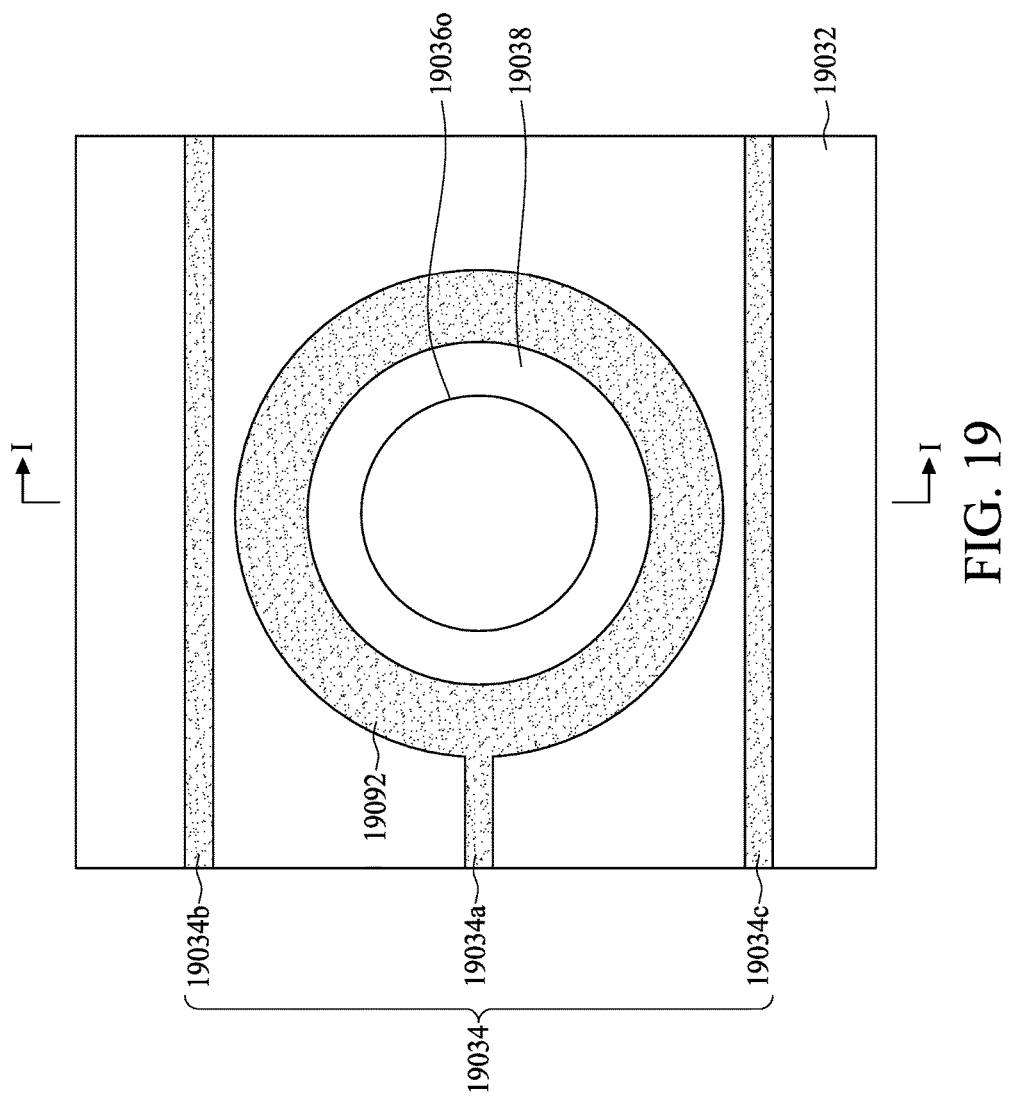
FIG. 19 and FIG. 20 show a comparison structure of an RDL-to-UBM interconnection, where
Figure 20:
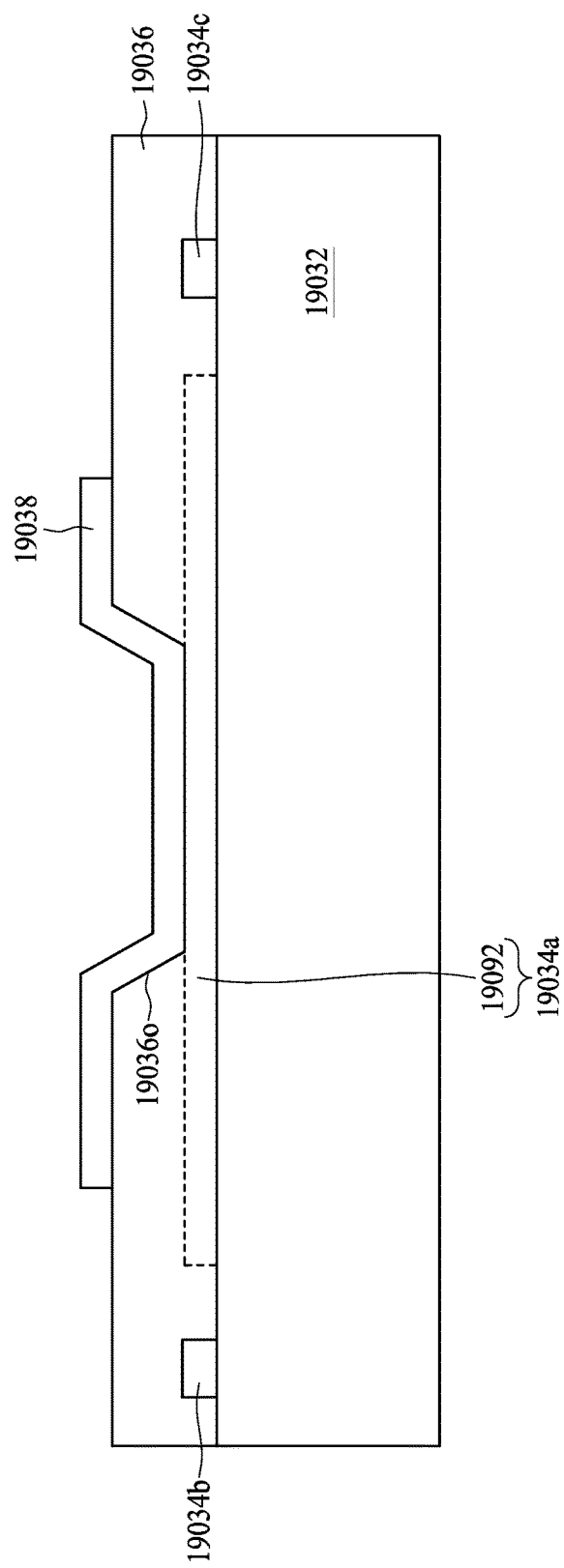

As noted above, the semiconductor device package 1000 includes high density interconnections of traces of the RDL 1034 to the UBMs 1038. By way of comparison, FIG. 19 and FIG. 20 show a comparison structure of an RDL-to-UBM interconnection, where FIG. 19 is a top view, and FIG. 20 is a cross-sectional view taken along line I-I of FIG. 19. As illustrated, traces 19034*a*, 19034*b*, and 19034*c* of an RDL 19034 extend over a dielectric layer 19032, a dielectric layer 19036 is disposed over the traces 19034*a*, 19034*b*, and 19034*c*, and an UBM 19038 is disposed over the dielectric layer 19036. The UBM 19038 is electrically connected to the trace 19034*a* through a relatively large via opening 19036*o* that is formed in the dielectric layer 19036. Specifically, the trace 19034*a* terminates in a capture pad 19092, where the via opening 19036*o* exposes a portion of the capture pad 19092, and the UBM 19038 extends into the via opening 19036*o* to electrically connect to the capture pad 19092. As illustrated, the via opening 19036*o* and the capture pad 19092 have dimensions larger than a width of a remaining portion of the trace 19034*a*, and the capture pad 19092 extends beyond a lateral periphery of the UBM 19038 and beyond a projection area of the UBM 19038 onto the RDL 10934. Process registration capability for forming the comparison structure specify the capture pad 19092 to be relatively large to ensure that the UBM 19038 overlaps the trace 19034*a* and did not miss the trace 19034*a*, which would result in an "open" or "near open" connection. Also, material resolution and concomitant light exposure process capability specify the via opening 19036*o* to be relatively large to form angled sidewalls for a reliable electrical connection to the trace 19034*a* and mitigate against gaps in sidewall metallization. The relatively large via opening 19036*o* and the relatively large capture pad 19092 occupy valuable footprint area, and, since a requisite distance should be maintained between the capture pad 19092 and the adjacent traces 19034*b* and 19034*c* for process alignment, the relatively large capture pad 19092 impedes against a higher density of traces extending over the dielectric layer 19032. As illustrated, the adjacent traces 19034*b* and 19034*c* are confined to be disposed outside of the lateral periphery of the UBM 19038 and outside of the projection area of the UBM 19038 onto the RDL 10934.

Figure 21:
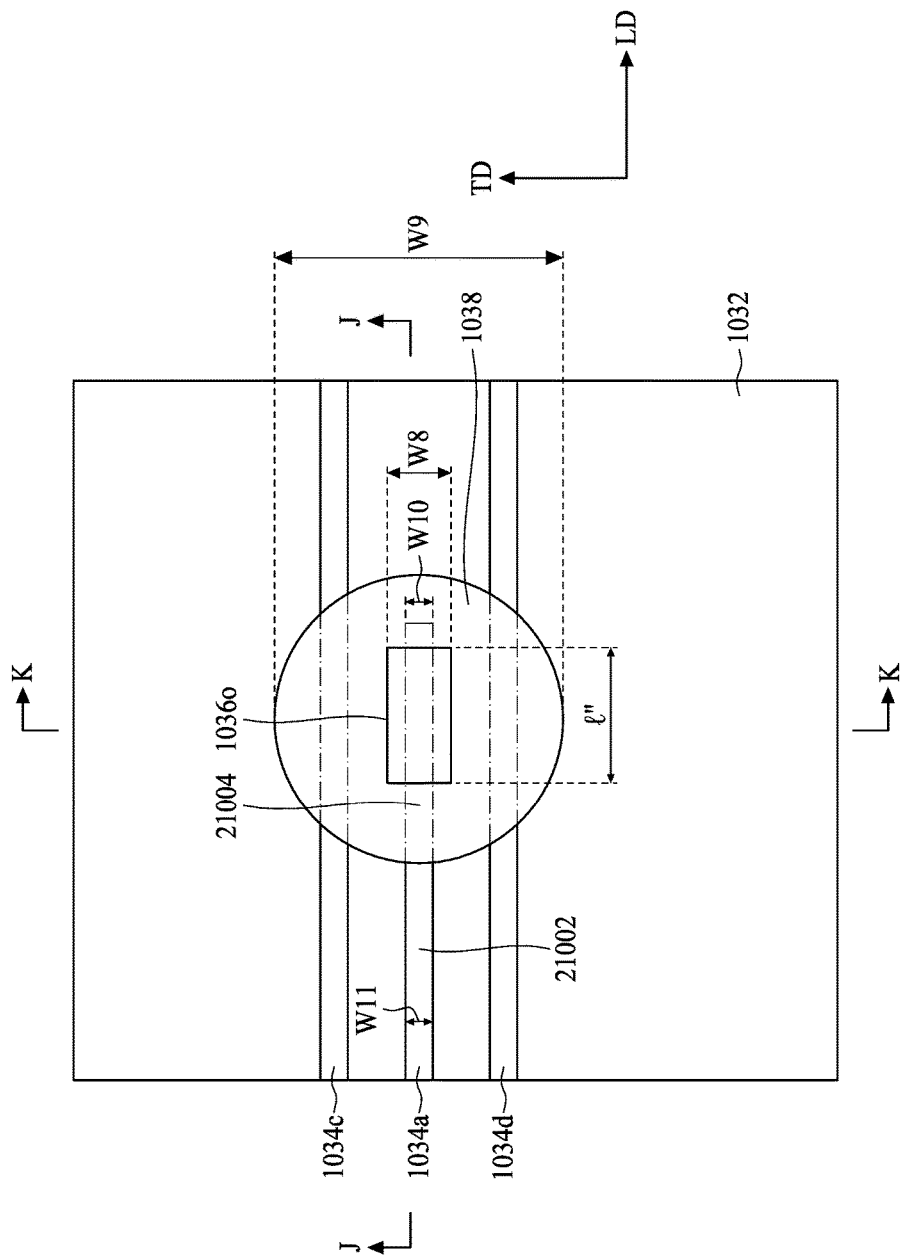
FIG. 21, FIG. 22, and FIG. 23 show a structure of a high density RDL-to-UBM interconnection according to some embodiments, where
Figure 22:
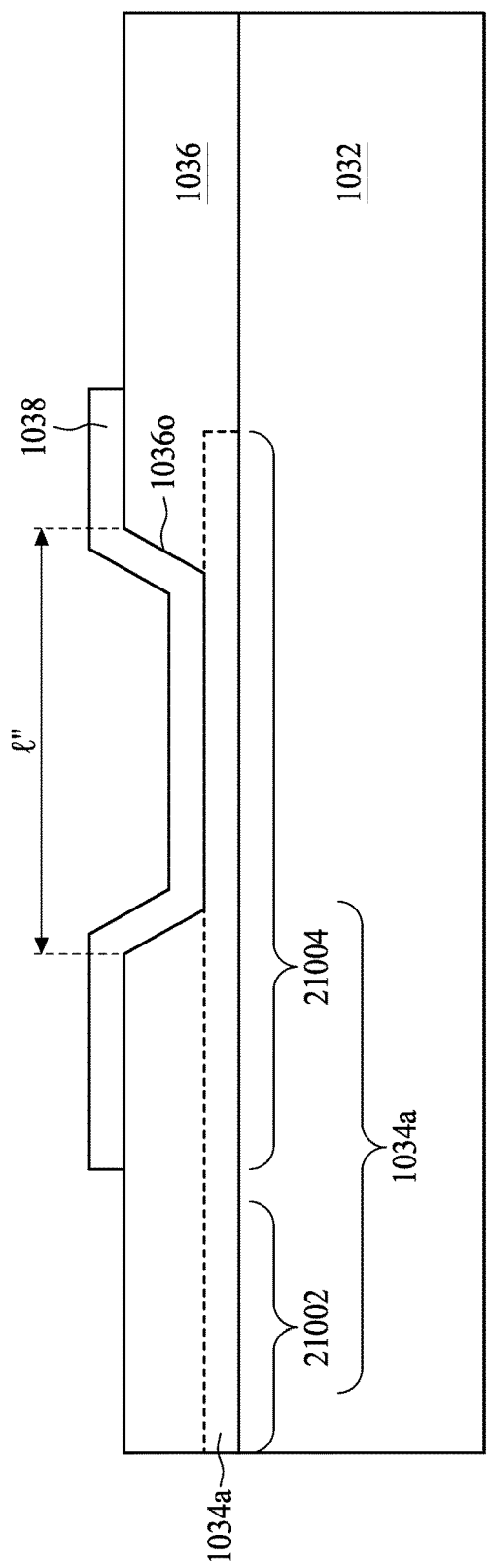
Figure 23:
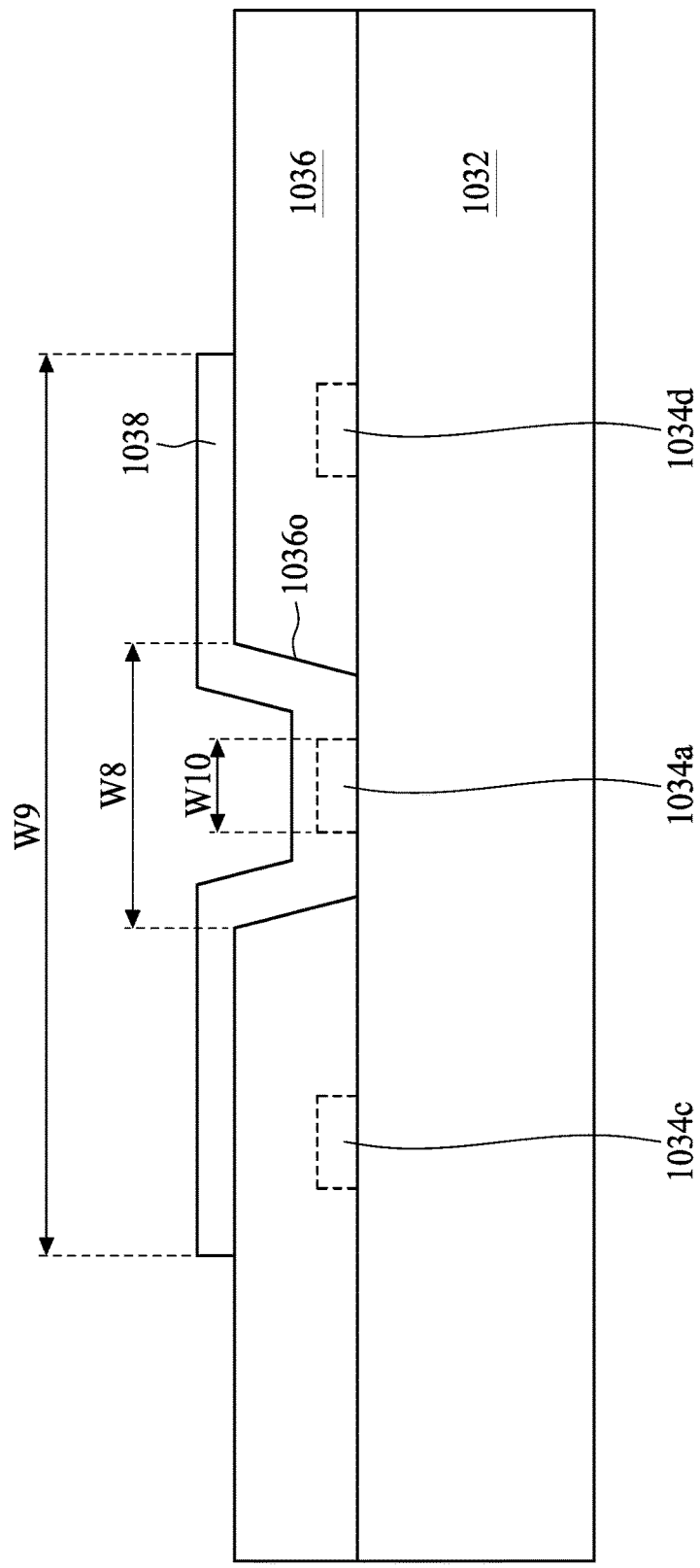

FIG. 21, FIG. 22, and FIG. 23 show a structure of a high density RDL-to-UBM interconnection included in the semiconductor device package 1000 according to some embodiments, where FIG. 21 is a top view, FIG. 22 is a cross-sectional view taken along line J-J of FIG. 21, and FIG. 23 is a cross-sectional view taken along line K-K of FIG. 21. As illustrated, the trace 1034*a* along with traces 1034*c* and 1034*d* of the RDL 1034 extend over the dielectric layer 1032, a dielectric layer 1036 is disposed over the traces 1034*a*, 1034*c*, and 1034*d*, and an UBM 1038 is disposed over the dielectric layer 1036. The opening 1036*o* formed in the dielectric layer 1036 exposes a portion of the trace 1034*a*, and the UBM 1038 is electrically connected to the trace 1034*a* through the opening 1036*o*. The opening 1036*o* is relatively small compared to dimensions of the UBM 1038. For example, the opening 1036*o* can have a maximum length l" along a longitudinal direction LD of about 8 μm to about 15 μm, about 8 μm to about 12 μm, or about 10 μm, and a maximum width w8 along a transverse direction TD orthogonal to the longitudinal direction LD of about 2 μm to about 10 μm, about 6 μm to about 10 μm, or about 8 μm. It should be understood that dimensions of the opening 1036*o* can be varied (e.g., increased or decreased) relative to these stated example values. The maximum length l" of the opening 1036*o* can be greater than the maximum width w8 of the opening 1036*o*. For example, a ratio of the maximum length l" to the maximum width w8 can be about 1.1 or greater, about 1.3 or greater, about 1.5 or greater, about 1.8 or greater, about 2 or greater, or about 3 or greater. The trace 1034*a* extends along the longitudinal direction LD adjacent to a projection area of the UBM 1038 onto the RDL 1034 and the dielectric layer 1032, and the trace 1034*a* includes a portion 21004 that overlaps the projection area of the UBM 1038 (shown by dashed lines in FIG. 21). The UBM 1038 has a maximum width w9 along the transverse direction TD, and a maximum width w10 of the overlapping portion 21004 of the trace 1034*a* is no greater than about ⅓ of the maximum width w9 of the UBM 1038, such as no greater than about ¼, no greater than about ⅕, or no greater than about ⅙ of the maximum width w9 of the UBM 1038.

The trace 1034*a* omits a capture pad, and the trace 1034*a* has a substantially uniform width along at least a length of the overlapping portion 21004 of the trace 1034*a* disposed below the UBM 1038. As illustrated, the maximum width w10 of the overlapping portion 21004 of the trace 1034*a* is substantially the same as a width w11 of a remaining portion 21002 of the trace 1034a disposed outside of the projection area of the UBM 1038.

Improved process registration capability as well as improved material resolution and light exposure process capability allow reliable electrical connections to be formed at reduced dimensions. Since the trace 1034a is electrically connected to the UBM 1038 while omitting a relatively large via opening and a relatively large capture pad, such an RDL-to-UBM interconnection conserves valuable footprint area, and promotes a higher density of traces extending over the dielectric layer 1032. As illustrated in FIG. 21 and FIG. 23, in addition to the trace 1034a, the RDL 1034 includes at least two additional traces extending over the dielectric layer 1032 and extending below the UBM 1038 and within the projection area of the UBM 1038, such as at least three additional traces, at least four additional traces, or at least five additional traces. Specifically, the traces 1034c and 1034d of the RDL 1034 extend below the UBM 1038 and within the projection area of the UBM 1038.

Figure 24:
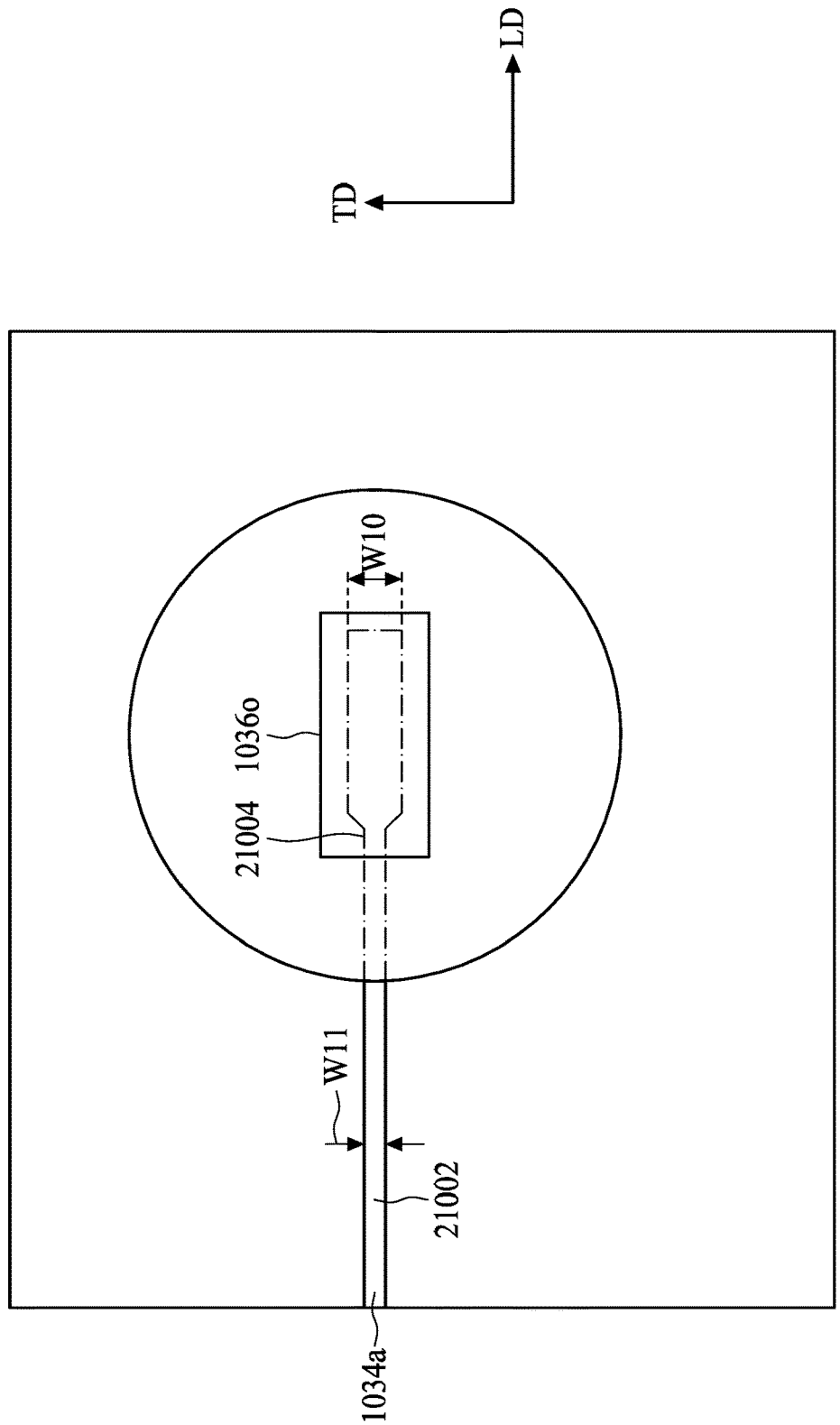
FIG. 24 shows a top view of a structure of a high density RDL-to-UBM interconnection according to some embodiments.

To enhance an electrical connection to the UBM 1038, the trace 1034a can have a varying width, in which the width of the trace 1034a is greater in a region of the opening 1036o to ensure an interconnection, and the width of the trace 1034a tapers in a direction away from the opening 1036o. FIG. 24 shows a top view of a structure of a high density RDL-to-UBM interconnection included in the semiconductor device package 1000 according to some embodiments. As illustrated, the overlapping portion 21004 of the trace 1034a in the region of the opening 1036o has the maximum width w10 along the transverse direction TD, and the maximum width w10 of the overlapping portion 21004 is greater than the width w11 of the remaining portion 21002 of the trace 1034a, such as at least about 1.1 times greater, at least about 1.2 times greater, at least about 1.3 times greater, or at least about 1.4 times greater. In some embodiments, the maximum width w10 of the overlapping portion 21004 of the trace 1034a is greater than the width w11 of the remaining portion 21002 of the trace 1034a, while remaining no greater than about 3 times of the width w11 of the remaining portion 21002 of the trace 1034a, such as no greater than about 2.8 times, no greater than about 2.5 times, no greater than about 2.3 times, no greater than about 2 times, no greater than about 1.8 times, or no greater than about 1.5 times of the width w11 of the remaining portion 21002 of trace 1034a.

Although the above explanation of a high density RDL-to-UBM interconnection has referred to the interconnection between the trace 1034a and the UBM 1038 of the semiconductor device package 1000, it should be understood that interconnections between additional traces of the RDL 1034 and the UBMs 1038 can be similarly implemented.

Figure 1A:
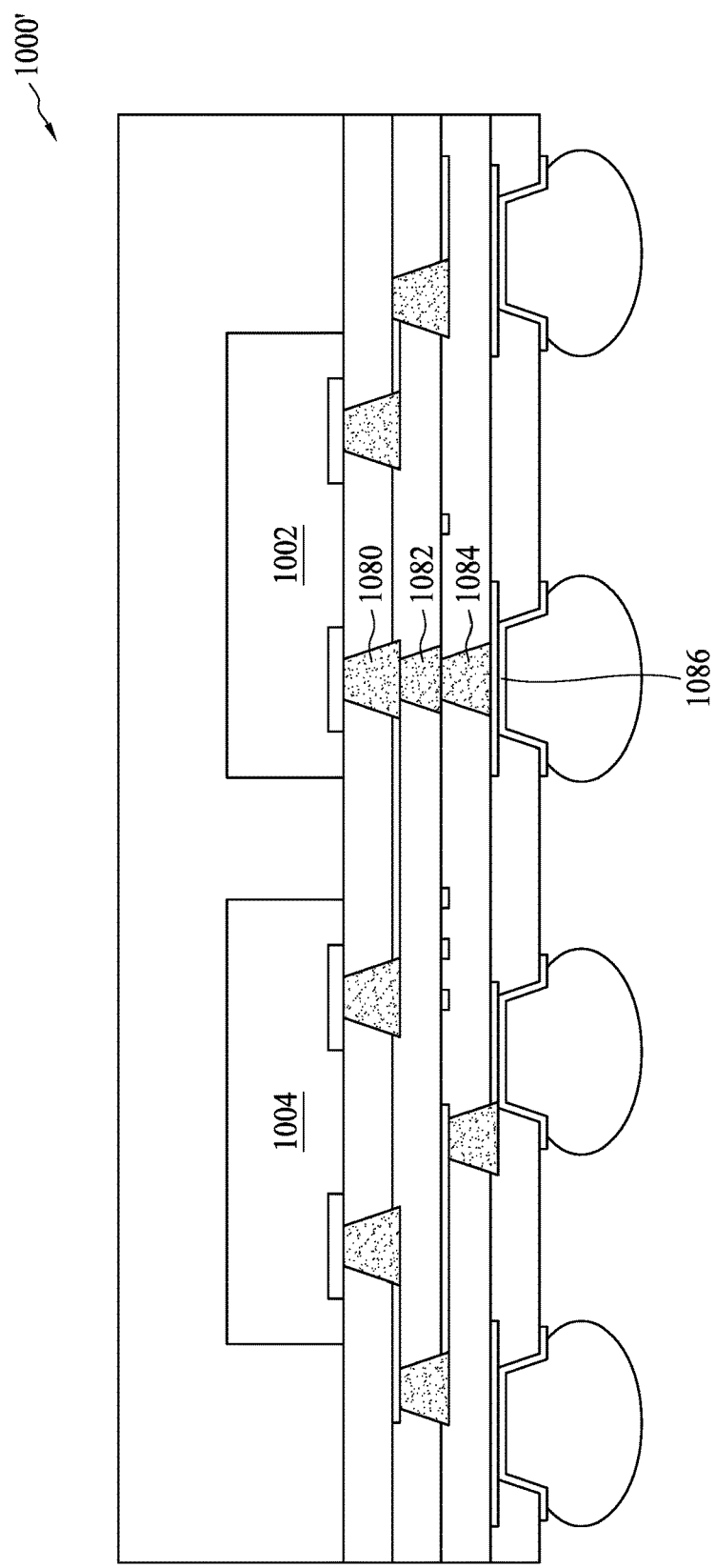
FIG. 1A shows a cross-sectional view of a semiconductor device package according to some embodiments of this disclosure.

Referring back to FIG. 1, at least some high density interconnections across different layers of the semiconductor device package 1000 can be substantially aligned over one another. For example, an RDL-to-RDL interconnection can be substantially aligned or stacked over a contact pad-to-RDL interconnection, or one RDL-to-RDL interconnection can be substantially aligned or stacked over another RDL-to-RDL interconnection, or an RDL-to-UBM interconnection can be substantially aligned or stacked over an RDL-to-RDL interconnection, or a combination of two or more of such aligned interconnections may be present. Such alignment of high density interconnections across different layers of the semiconductor device package 1000 can allow more efficient routing of signals in a substantially vertical direction, and can provide a higher overall density of signal routing circuitry within the semiconductor device package 1000. Such alignment of high density interconnections also can allow more efficient delivery of power to either, or both, of the electronic devices 1002 and 1004. FIG. 1A shows a cross-sectional view of a semiconductor device package 1000' according to some embodiments of this disclosure. The semiconductor device package 1000' is similarly implemented as the semiconductor device package 1000, except that a contact pad-to-RDL interconnection 1080, RDL-to-RDL interconnections 1082 and 1084, and an RDL-to-UBM interconnection 1086 are substantially aligned or stacked over another. Contact pad-to-RDL interconnections, including the interconnection 1080, and RDL-to-RDL interconnections, including the interconnections 1082 and 1084, are shown as metal-filled structures, although other implementations as conformal structures are also encompassed by this disclosure.

Figure 25:
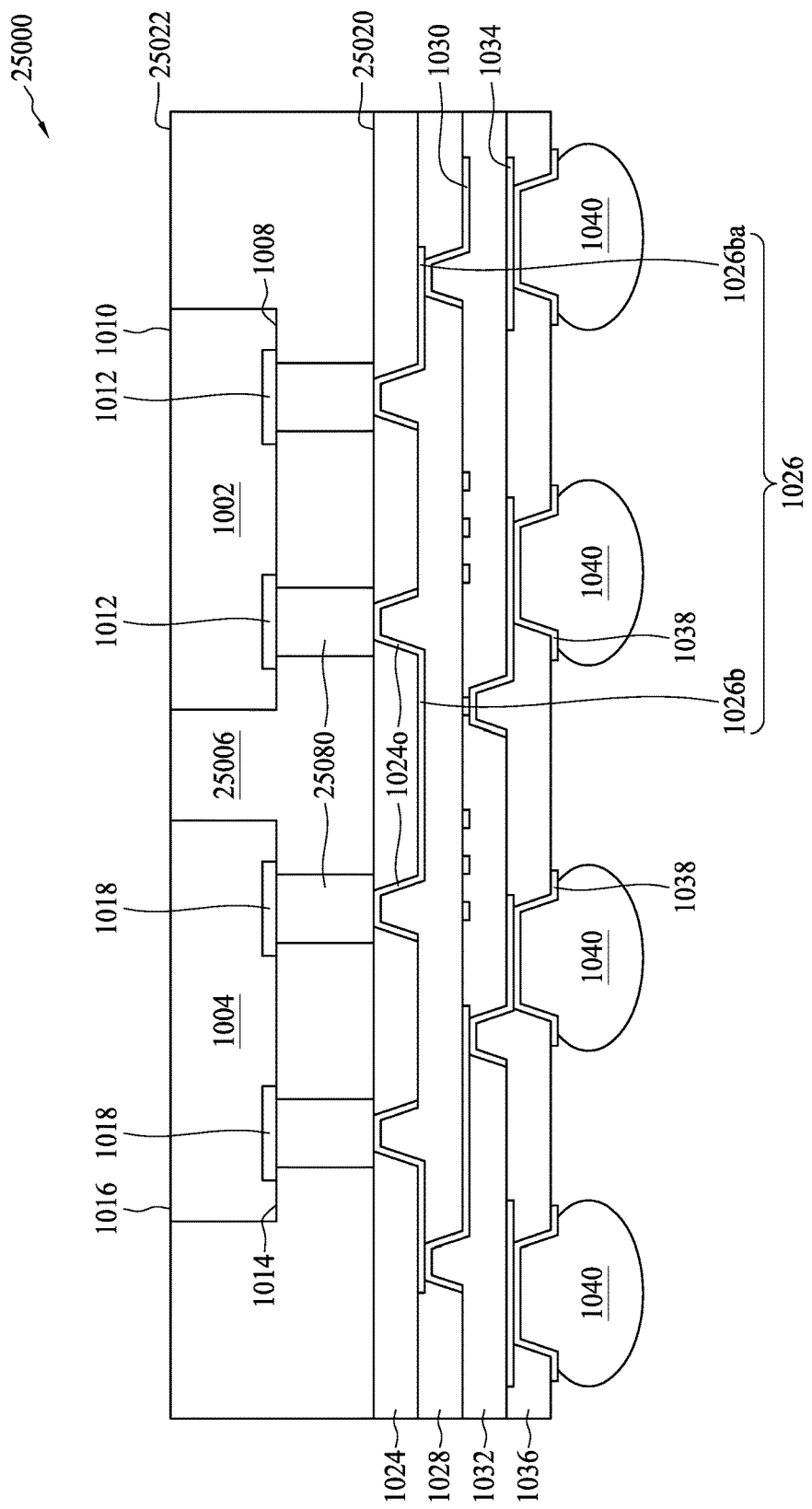
FIG. 25 shows a cross-sectional view of a semiconductor device package according to some embodiments of this disclosure.

Attention next turns to FIG. 25, which shows a cross-sectional view of a semiconductor device package 25000 according to some embodiments of this disclosure. Certain components of the semiconductor device package 25000 and interconnections between the components can be similarly implemented as explained above for the semiconductor device package 1000, and repetition of detailed explanation is omitted. For example, the semiconductor device package 25000 also includes a redistribution stack of one or more RDLs 1026, 1030, and 1034 and one or more dielectric layers 1024, 1028, 1032, and 1036 disposed over active surfaces 1008 and 1014 of electronic devices 1002 and 1004 and a front surface 25020 of a package body 25006. As illustrated, the semiconductor device package 25000 provides a two-dimensional fan-out configuration in which the RDLs 1026, 1030, and 1034 extend laterally beyond lateral peripheries of the electronic devices 1002 and 1004. For example, the semiconductor device package 25000 includes electrical contacts 1040, such as in the form of conductive bumps, disposed over UBMs 1038, and at least some of the electrical contacts 1040 and their corresponding UBMs 1038 are disposed at least partially outside the lateral peripheries of the electronic devices 1002 and 1004 and adjacent to a lateral periphery of the package body 25006. Interconnections between traces of the RDLs 1026, 1030, and 1034 can be implemented as high density interconnections as explained in the foregoing with reference to FIG. 12, FIG. 13, FIG. 14, FIG. 15, FIG. 16, FIG. 17, and FIG. 18, and interconnections between traces of the RDL 1034 and the UBMs 1038 can be implemented as high density interconnections as explained in the foregoing with reference to FIG. 21, FIG. 22, FIG. 23, and FIG. 24.

As illustrated in FIG. 25, the electronic devices 1002 and 1004 are disposed adjacent to a back surface 25022 of the package body 25006 with their back surfaces 1010 and 1016 exposed from the package body 25006, and the semiconductor device package 25000 includes conductive posts 25080 disposed over the electronic devices 1002 and 1004 and extending between respective contact pads 1012 and 1018 of the electronic devices 1002 and 1004 and the front surface 25020 of the package body 25006. At least a portion of a terminal end of each conductive post 25080 is exposed from the front surface 25020 of the package body 25006. The conductive posts 25080 can be formed from, or can include, copper, a copper alloy, or another metal, another metal alloy, or another combination of metals or other conductive materials. The RDL 1026 is a patterned conductive layer that includes multiple traces, including traces 1026a and 1026b, and at least some of the traces of the RDL 1026 extend into openings 1024o in the dielectric layer 1024 to electrically connect to the electronic devices 1002 and 1004 through the conductive posts 25080. At least some of the traces of the RDL 1026, such as the trace 1026b, extend between conductive posts 25080 respectively disposed over the electronic devices 1002 and 1004 to provide device-to-device interconnections, although it is noted that device-to-device interconnections are also provided by electrical pathways routed through the RDL 1030 and the RDL 1034. Some embodiments of this disclosure are directed to improved conductive post-to-RDL interconnections (e.g., between the trace 1026a and the conductive post 25080), and further details of such conductive post-to-RDL interconnections are provided below. At least some high density interconnections across different layers of the semiconductor device package 25000 can be substantially aligned over one another to allow more efficient routing of signals and provide a higher overall density of signal routing circuitry within the semiconductor device package 25000.

Figure 26:
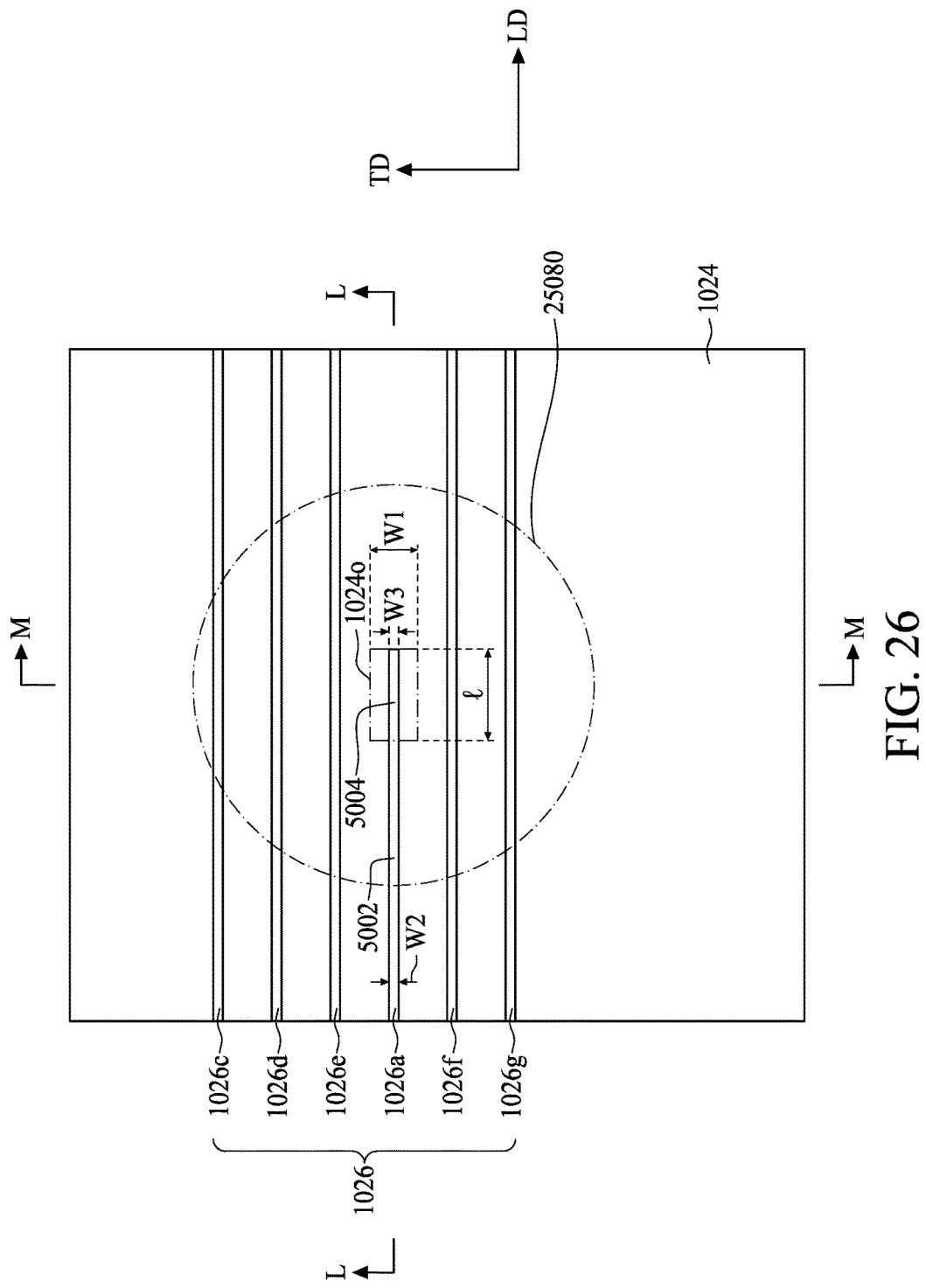
FIG. 26, FIG. 27, and FIG. 28 show a structure of a high density conductive post-to-RDL interconnection according to some embodiments, where
Figure 27:
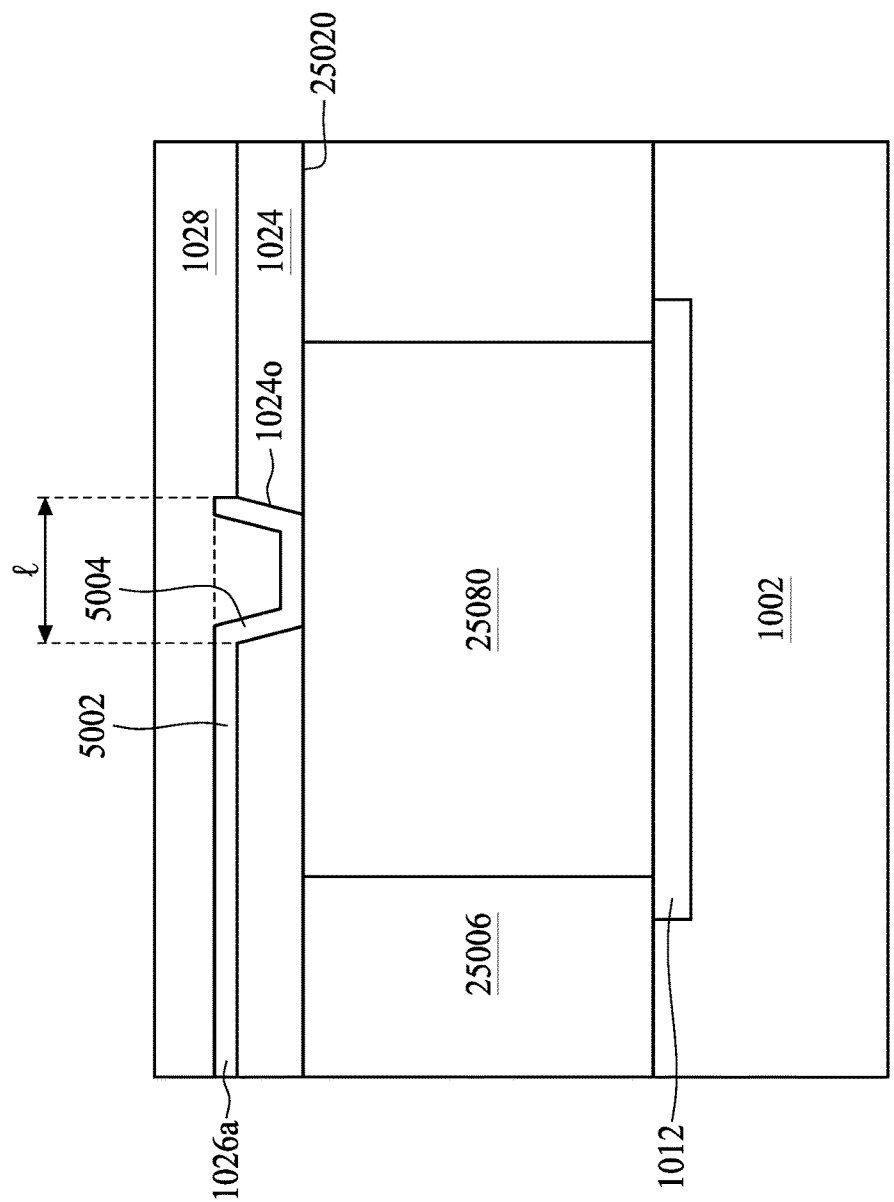
Figure 28:
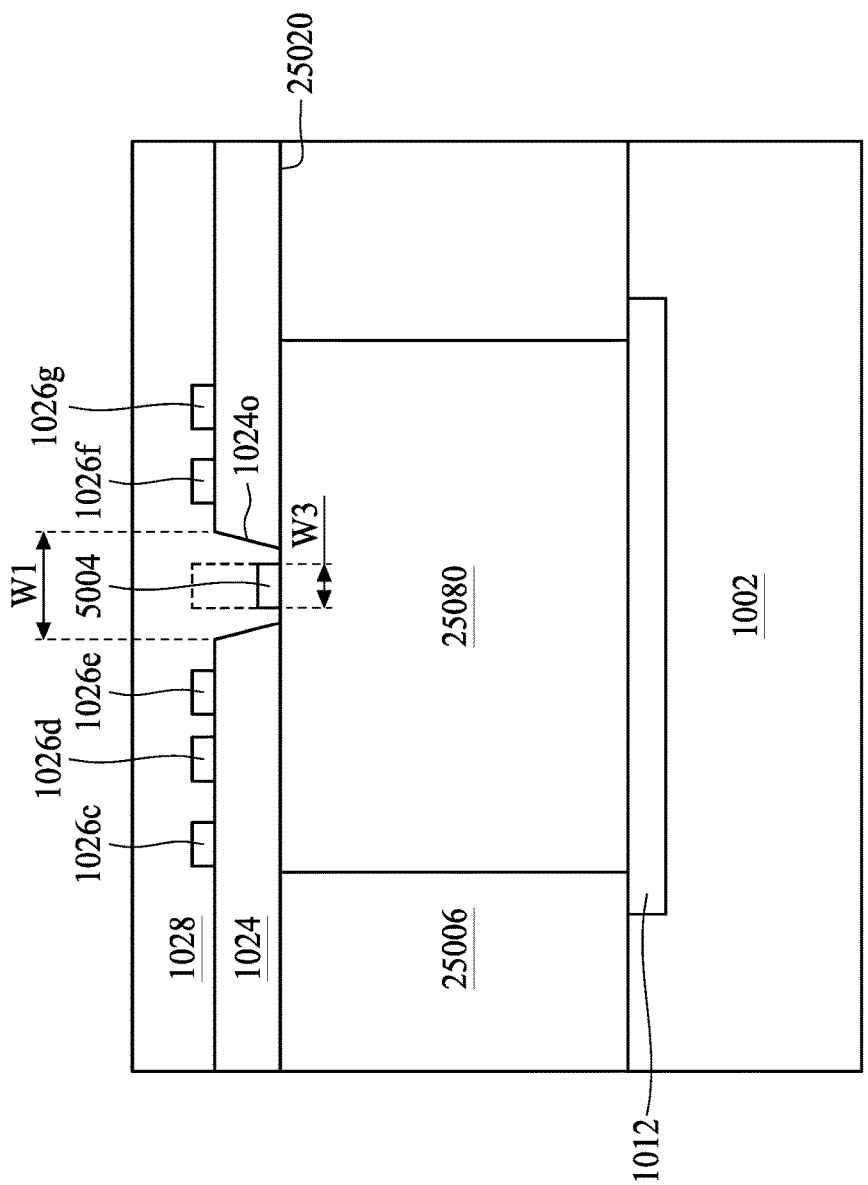

FIG. 26, FIG. 27, and FIG. 28 show a structure of a high density conductive post-to-RDL interconnection included in the semiconductor device package 25000 according to some embodiments, where FIG. 26 is a top view, FIG. 27 is a cross-sectional view taken along line L-L of FIG. 26, and FIG. 28 is a cross-sectional view taken along line M-M of FIG. 26. As illustrated, the trace 1026a along with traces 1026c, 1026d, 1026e, 1026f, and 1026g of the RDL 1026 extend over the dielectric layer 1024 which is disposed over the electronic device 1002 including the contact pad 1012, the conductive post 25080 extends through the package body 25006 and between the contact pad 1012 and the front surface 25020 of the package body 25006, and the dielectric layer 1028 is disposed over the traces 1026a, 1026c, 1026d, 1026e, 1026f, and 1026g. The opening 1024o formed in the dielectric layer 1024 exposes a portion of the terminal end of the conductive post 25080, and the trace 1026a is electrically connected to the conductive post 25080 through the opening 1024o. The opening 1024o is relatively small compared to dimensions of the conductive post 25080. For example, a lateral periphery of the conductive post 25080 can be generally circular in shape and can have a diameter of about 40 µm to about 50 µm, and the opening 1024o can have a maximum length l along a longitudinal direction LD of about 8 µm to about 15 µm, about 8 µm to about 12 µm, or about 10 µm, and a maximum width w1 along a transverse direction TD orthogonal to the longitudinal direction LD of about 2 µm to about 10 µm, about 6 µm to about 10 µm, or about 8 µm. It should be understood that dimensions of the conductive post 25080 and the opening 1024o can be varied (e.g., increased or decreased) relative to these stated example values. The maximum length l of the opening 1024o can be greater than the maximum width w1 of the opening 1024o. For example, a ratio of the maximum length l to the maximum width w1 can be about 1.1 or greater, about 1.3 or greater, about 1.5 or greater, about 1.8 or greater, about 2 or greater, or about 3 or greater. The trace 1026a includes a portion 5002 extending over the dielectric layer 1024 along the longitudinal direction LD adjacent to the opening 1024o, and a portion 5004 in the opening 1024o and extending between the portion 5002 and the exposed portion of the conductive post 25080. The portion 5004 of the trace 1026a in the opening 1024o has a maximum width w3 along the transverse direction TD, and the maximum width w3 of the portion 5004 is no greater than about 3 times of a width w2 of the remaining portion 5002 of the trace 1026a, such as no greater than about 2.8 times, no greater than about 2.5 times, no greater than about 2.3 times, no greater than about 2 times, no greater than about 1.8 times, or no greater than about 1.5 times of the width w2 of the remaining portion 5002 of trace 1026a. In some embodiments, the maximum width w3 of the portion 5004 of the trace 1026a in the opening 1024o is substantially the same as the width w2 of the remaining portion 5002 of trace 1026a. In some embodiments, the trace 1026a has a substantially uniform width along at least a length of the trace 1026a extending over the conductive post 25080. In some embodiments, a projection area of the portion 5004 of the trace 1026a onto the terminal end of the conductive post 25080 (e.g., an area of about w3×l) is no greater than about 10% of a total area of the terminal end of the conductive post 25080, such as no greater than about 8%, no greater than about 6%, no greater than about 4%, or no greater than about 2% of the total area of the terminal end of the conductive post 25080. In some embodiments, a total projection area of the trace 1026a onto the terminal end of conductive post 25080 (e.g., a sum of the projection area of the portion 5004 and a projection area of the remaining portion 5002) is no greater than about 15% of the total area of the terminal end of the conductive post 25080, such as no greater than about 13%, no greater than about 10%, no greater than about 8%, or no greater than about 5% of the total area of the terminal end of the conductive post 25080.

Referring to FIG. 26 and FIG. 28, the maximum width w3 of the portion 5004 of the trace 1026a in the opening 1024o is no greater than or less than the maximum width w1 of the opening 1024o. As illustrated, the portion 5004 of the trace 1026a is disposed between and spaced from opposing sidewalls of the dielectric layer 1024 forming the opening 1024o. In some embodiments, the maximum width w3 of the portion 5004 is no greater than about 9/10, no greater than about 4/5, no greater than about 7/10, no greater than about 3/5, no greater than about 1/2, no greater than about 2/5, or no greater than about 1/3 of the maximum width w1 of the opening 1024o.

As shown in FIG. 27 and FIG. 28, the portion 5004 of the trace 1026a in the opening 1024o is a conformal structure extending into and partially filling the opening 1024o. In other embodiments, the portion 5004 of the trace 1026a in the opening 1024o can be a metal-filled structure (e.g., a copper-filled structure) having a thickness in the opening 1024o that is about the same as or greater than a thickness of the dielectric layer 1024, as shown by dashed lines in FIG. 27 and FIG. 28.

Since the trace 1026a is electrically connected to the conductive post 25080 while omitting a relatively large via and a relatively large capture pad, such a conductive post-to-RDL interconnection conserves valuable footprint area, and promotes a higher density of traces over the electronic device 1002. As illustrated in FIG. 26 and FIG. 28, in addition to the trace 1026a, the RDL 1026 includes at least two additional traces extending over the dielectric layer 1024 and overlapping the conductive post 25080 disposed below the additional traces, such as at least three additional traces, at least four additional traces, or at least five additional traces. Specifically, the traces 1026c, 1026d, 1026e, 1026f, and 1026g of the RDL 1026 extend over the dielectric layer 1024 and over the conductive post 25080.

To enhance an electrical connection to the conductive post 25080, the trace 1026a can have a varying width, in which the width of the trace 1026a is greater in a region of the opening 1024o to ensure an interconnection, and the width of the trace 1026a tapers in a direction away from the opening 1024o. Such a varying width of the trace 1026a can be similarly implemented as explained in the foregoing with reference to FIG. 8.

A further benefit of high density conductive post-to-RDL interconnections is that a dimensional reduction also can be applied to the conductive posts 25080 of the electronic devices 1002 and 1004. In other words, a dimensional reduction of interconnections of traces to the conductive posts 25080 allows dimensions of the conductive posts 25080 themselves to be reduced. With reduced dimensions of the conductive posts 25080, a projection area of traces onto the conductive posts 25080 can be increased. For example, and referring to FIG. 26, a projection area of the portion 5004 of the trace 1026a onto the terminal end of the conductive post 25080 of reduced dimension can be greater than about 10% of the total area of the terminal end of the conductive post 25080, such as up to about 50%, up to about 40%, up to about 30%, or up to about 20% of the total area of the terminal end of the conductive post 25080, and a total projection area of the trace 1026a onto the terminal end of the conductive post 25080 can be greater than about 15% of the total area of the terminal end of the conductive post 25080, such as up to about 60%, up to about 55%, up to about 50%, or up to about 45% of the total area of the terminal end of the conductive post 25080.

Although the above explanation of a high density conductive post-to-RDL interconnection has referred to the interconnection between the trace 1026a and the conductive post 25080 disposed over the electronic device 1002, it should be understood that interconnections between additional traces of the RDL 1026 and the conductive posts 25080 disposed over the electronic devices 1002 and 1004 can be similarly implemented.

Figure 29:
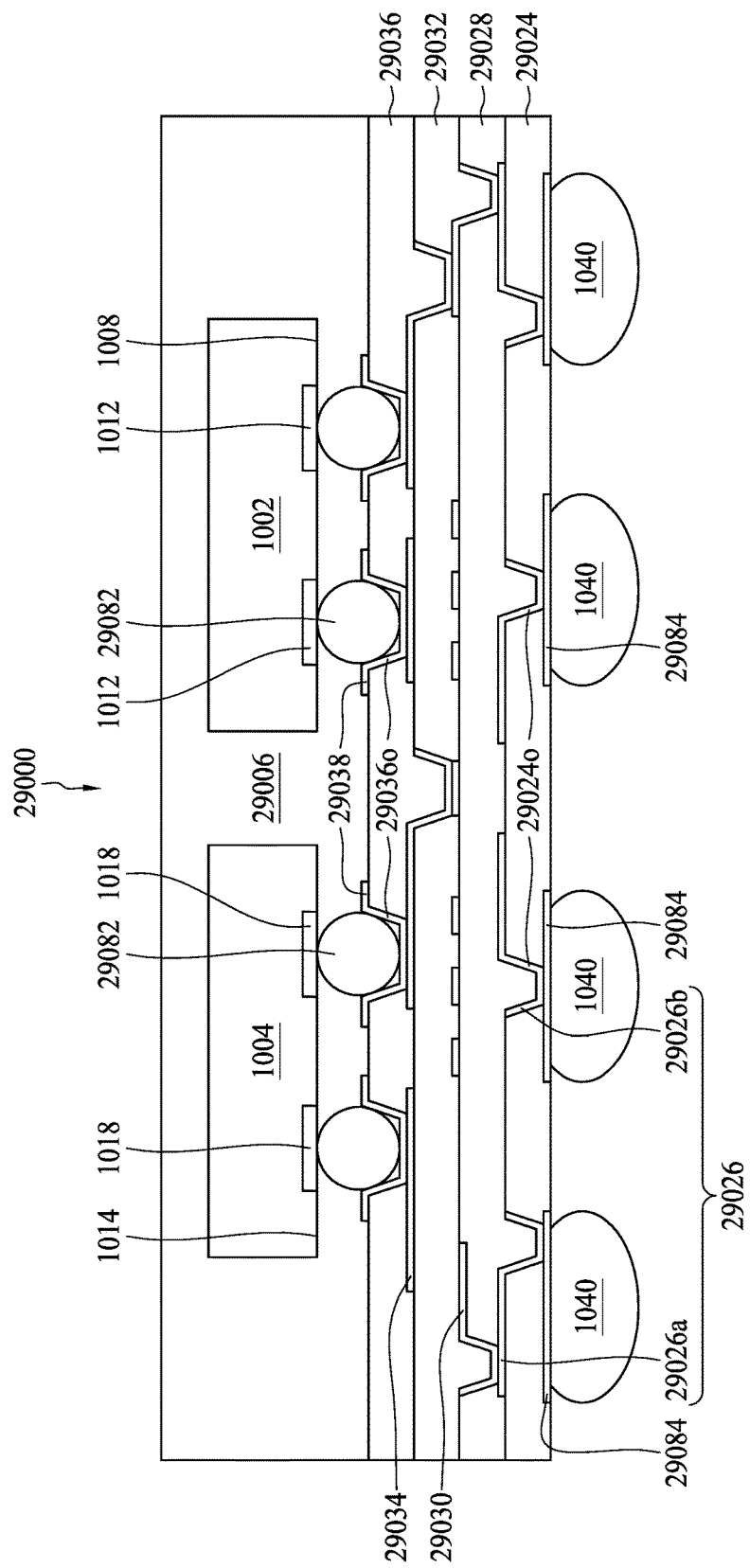
FIG. 29 shows a cross-sectional view of a semiconductor device package according to some embodiments of this disclosure.

Attention next turns to FIG. 29, which shows a cross-sectional view of a semiconductor device package 29000 according to some embodiments of this disclosure. Certain components of the semiconductor device package 29000 and interconnections between the components can be similarly implemented as explained above for the semiconductor device packages 1000 and 25000, and repetition of detailed explanation is omitted. For example, the semiconductor device package 29000 also includes a redistribution stack of one or more RDLs 29026, 29030, and 29034 and one or more dielectric layers 29024, 29028, 29032, and 29036. Interconnections between traces of the RDLs 29026, 29030, and 29034 can be implemented as high density interconnections as explained in the foregoing with reference to FIG. 12, FIG. 13, FIG. 14, FIG. 15, FIG. 16, FIG. 17, and FIG. 18.

As illustrated, the semiconductor device package 29000 includes electronic devices 1002 and 1004, which are disposed over the redistribution stack of the RDLs 29026, 29030, and 29034 and the dielectric layers 29024, 29028, 29032, and 29036, and are electrically connected to the redistribution stack by, for example, flip-chip mounting. Specifically, at least some traces of the RDL 29034 extend through and are exposed by openings 29036o in the dielectric layer 29036, and the redistribution stack includes UBMs 29038 which are disposed over the dielectric layer 29036 and extend into the openings 29036o in the dielectric layer 29036 to electrically connect to the traces of the RDL 29034. The electronic devices 1002 and 1004 are disposed with their active surfaces 1008 and 1014 adjacent to and facing towards the UBMs 29038, and the semiconductor device package 29000 includes connectors 29082 extending between respective contact pads 1012 and 1018 of the electronic devices 1002 and 1004 and respective UBMs 29038. The connectors 29082 can be, for example, conductive bumps formed from, or including, solder or another conductive material, or conductive posts formed from, or including, copper, a copper alloy, or another metal, another metal alloy, or another combination of metals or other conductive materials. The semiconductor device package 29000 also includes a package body 29006 that covers or encapsulates the electronic devices 1002 and 1004, and is disposed over the redistribution stack of the RDLs 29026, 29030, and 29034 and the dielectric layers 29024, 29028, 29032, and 29036. Interconnections between traces of the RDL 29034 and the UBMs 29038 can be implemented as high density interconnections as explained in the foregoing with reference to FIG. 21, FIG. 22, FIG. 23, and FIG. 24.

As illustrated, the semiconductor device package 29000 provides a two-dimensional fan-out configuration in which the RDLs 29026, 29030, and 29034 extend laterally beyond lateral peripheries of the electronic devices 1002 and 1004. The RDL 29026 is a patterned conductive layer that includes multiple traces, including traces 29026a and 29026b, and at least some of the traces of the RDL 29026 extend into openings 29024o in the dielectric layer 29024 to electrically connect to conductive pads 29084 that are at least partially embedded in the dielectric layer 29024. The semiconductor device package 29000 includes electrical contacts 1040, such as in the form of conductive bumps, disposed over the conductive pads 29084, and at least some of the electrical contacts 1040 and their corresponding conductive pads 29084 are disposed at least partially outside the lateral peripheries of the electronic devices 1002 and 1004 and adjacent to a lateral periphery of the semiconductor device package 29000. Some embodiments of this disclosure are directed to improved conductive pad-to-RDL interconnections (e.g., between the trace 29026a and the conductive pad 29084), and further details of such conductive pad-to-RDL interconnections are provided below. At least some high density interconnections across different layers of the semiconductor device package 29000 can be substantially aligned over one another to allow more efficient routing of signals and provide a higher overall density of signal routing circuitry within the semiconductor device package 29000.

Figure 30:
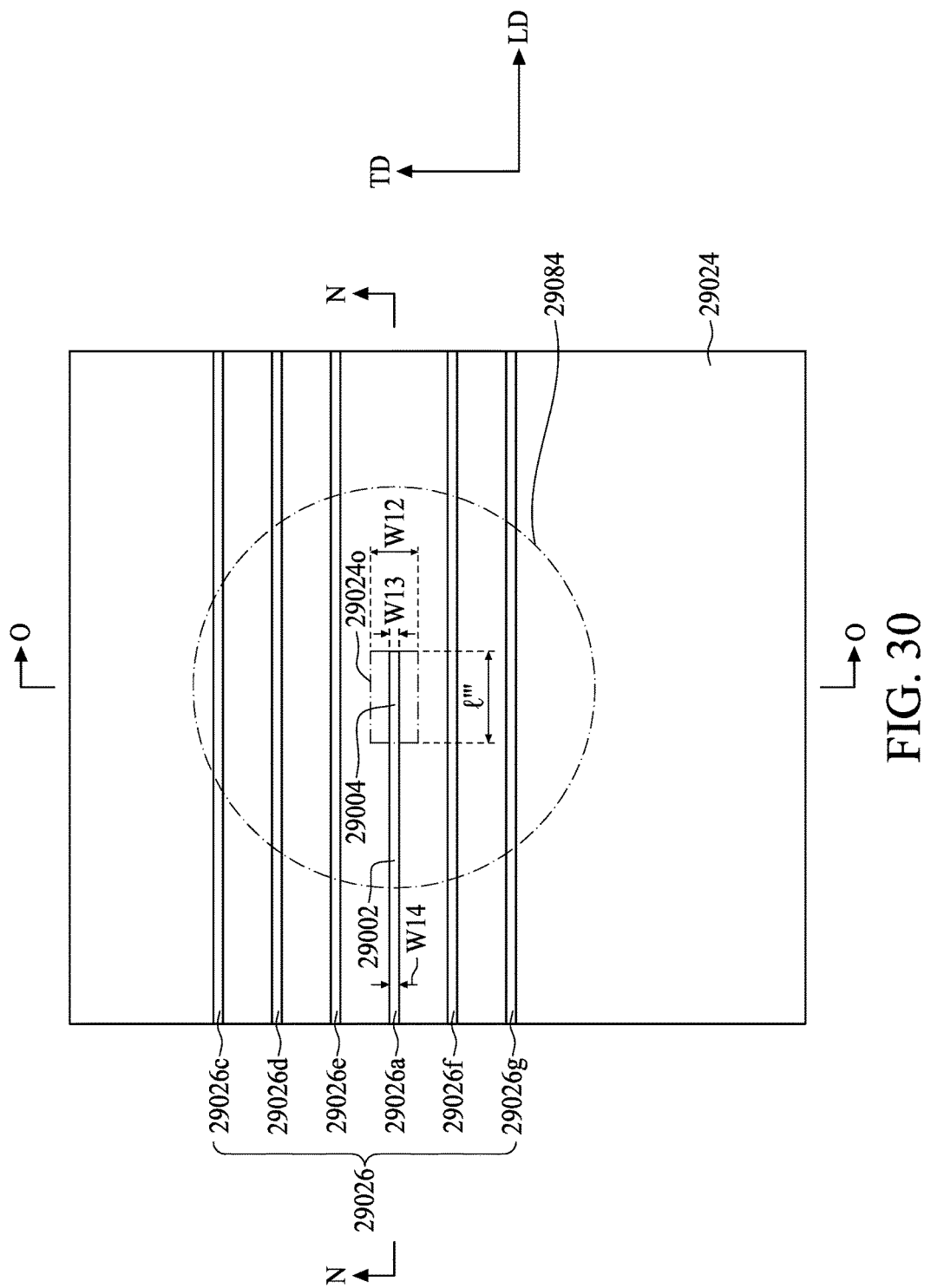
FIG. 30, FIG. 31, and FIG. 32 show a structure of a high density conductive pad-to-RDL interconnection according to some embodiments, where
Figure 31:
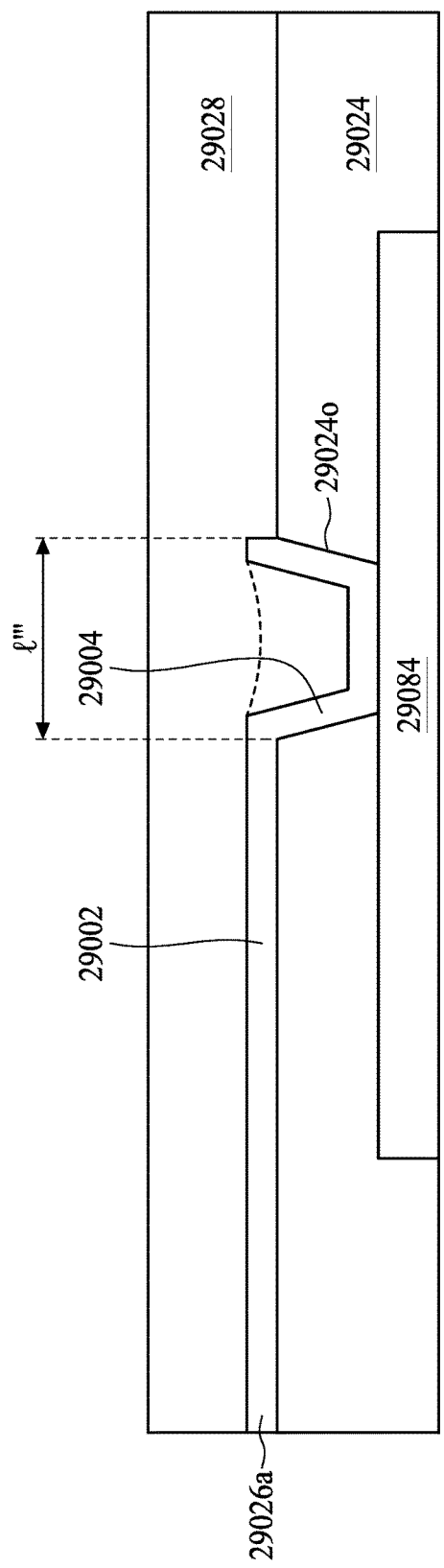
Figure 32:
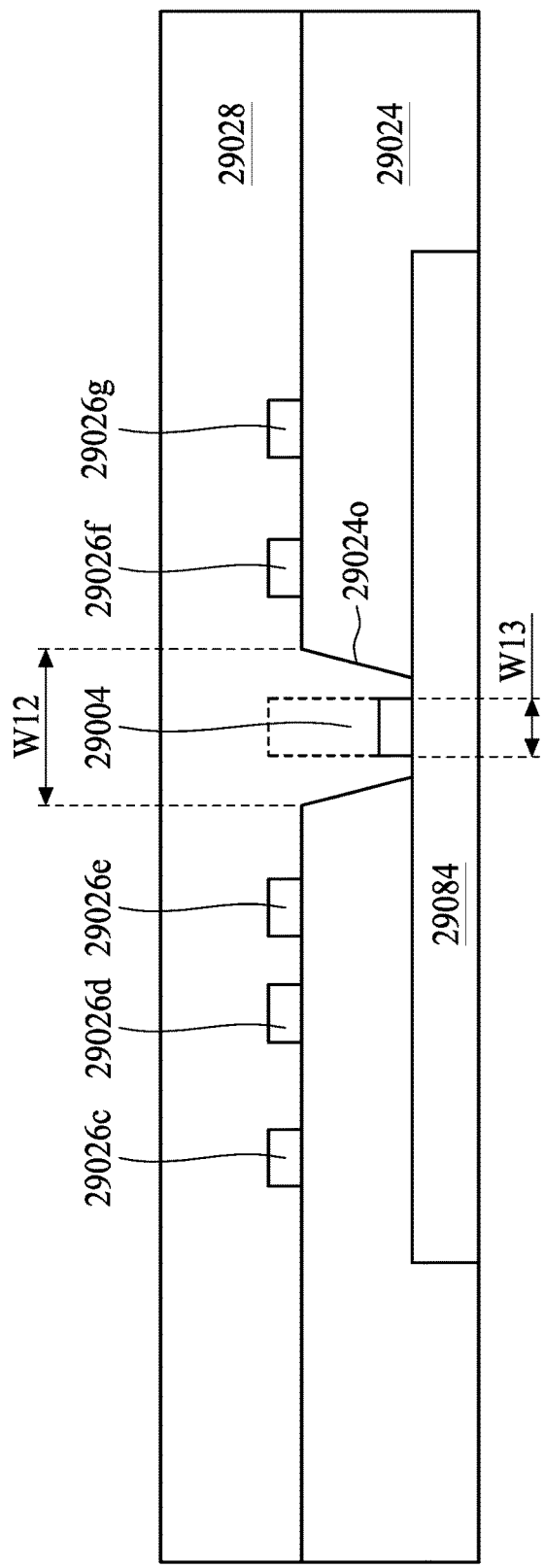

FIG. 30, FIG. 31, and FIG. 32 show a structure of a high density conductive pad-to-RDL interconnection included in the semiconductor device package 29000 according to some embodiments, where FIG. 30 is a top view, FIG. 31 is a cross-sectional view taken along line N-N of FIG. 30, and FIG. 32 is a cross-sectional view taken along line O-O of FIG. 30. As illustrated, the trace 29026a along with traces 29026c, 29026d, 29026e, 29026f, and 29026g of the RDL 29026 extend over the dielectric layer 29024 which is disposed over the conductive pad 29084, and the dielectric layer 29028 is disposed over the traces 29026a, 29026c, 29026d, 29026e, 29026f, and 29026g. The opening 29024o formed in the dielectric layer 29024 exposes a portion of the conductive pad 29084, and the trace 29026a is electrically connected to the conductive pad 29084 through the opening 29024o. The opening 29024o is relatively small compared to dimensions of the conductive pad 29084. For example, a lateral periphery of the conductive pad 29084 can be generally circular in shape and can have a diameter of about 50 µm to about 150 µm, and the opening 29024o can have a maximum length l''' along a longitudinal direction LD of about 8 µm to about 15 µm, about 8 µm to about 12 µm, or about 10 µm, and a maximum width w12 along a transverse direction TD orthogonal to the longitudinal direction LD of about 2 µm to about 10 µm, about 6 µm to about 10 µm, or about 8 µm. It should be understood that dimensions of the conductive pad 29084 and the opening 29024o can be varied (e.g., increased or decreased) relative to these stated example values. The maximum length l''' of the opening 29024o can be greater than the maximum width w12 of the opening 29024*o*. For example, a ratio of the maximum length l''' to the maximum width w12 can be about 1.1 or greater, about 1.3 or greater, about 1.5 or greater, about 1.8 or greater, about 2 or greater, or about 3 or greater. The trace 29026*a* includes a portion 29002 extending over the dielectric layer 29024 along the longitudinal direction LD adjacent to the opening 29024*o*, and a portion 29004 in the opening 29024*o* and extending between the portion 29002 and the exposed portion of the conductive pad 29084. The portion 29004 of the trace 29026*a* in the opening 29024*o* has a maximum width w13 along the transverse direction TD, and the maximum width w13 of the portion 29004 is no greater than about 3 times of a width w14 of the remaining portion 29002 of the trace 29026*a*, such as no greater than about 2.8 times, no greater than about 2.5 times, no greater than about 2.3 times, no greater than about 2 times, no greater than about 1.8 times, or no greater than about 1.5 times of the width w14 of the remaining portion 29002 of trace 29026*a*. In some embodiments, the maximum width w13 of the portion 29004 of the trace 29026*a* in the opening 29024*o* is substantially the same as the width w14 of the remaining portion 29002 of trace 29026*a*. In some embodiments, the trace 29026*a* has a substantially uniform width along at least a length of the trace 29026*a* extending over the conductive pad 29084. In some embodiments, a projection area of the portion 29004 of the trace 29026*a* onto the conductive pad 29084 (e.g., an area of about w13×l''') is no greater than about 10% of a total area of the conductive pad 29084, such as no greater than about 8%, no greater than about 6%, no greater than about 4%, or no greater than about 2% of the total area of the conductive pad 29084. In some embodiments, a total projection area of the trace 29026*a* onto the conductive pad 29084 (e.g., a sum of the projection area of the portion 29004 and a projection area of the remaining portion 29002) is no greater than about 15% of the total area of the conductive pad 29084, such as no greater than about 13%, no greater than about 10%, no greater than about 8%, or no greater than about 5% of the total area of the conductive pad 29084.

Referring to FIG. 30 and FIG. 32, the maximum width w13 of the portion 29004 of the trace 29026*a* in the opening 29024*o* is no greater than or less than the maximum width w12 of the opening 29024*o*. As illustrated, the portion 29004 of the trace 29026*a* is disposed between and spaced from opposing sidewalls of the dielectric layer 29024 forming the opening 29024*o*. In some embodiments, the maximum width w13 of the portion 29004 is no greater than about 9/10, no greater than about 4/5, no greater than about 7/10, no greater than about 3/5, no greater than about 1/2, no greater than about 2/5, or no greater than about 1/3 of the maximum width w12 of the opening 29024*o*.

As shown in FIG. 31 and FIG. 32, the portion 29004 of the trace 29026*a* in the opening 29024*o* is a conformal structure extending into and partially filling the opening 29024*o*. In other embodiments, the portion 29004 of the trace 29026*a* in the opening 29024*o* can be a metal-filled structure (e.g., a copper-filled structure) having a thickness in the opening 29024*o* such that its top surface is about a same level as, or protrudes beyond, a top surface of the dielectric layer 29024, as shown by dashed lines in FIG. 31 and FIG. 32.

Since the trace 29026*a* is electrically connected to the conductive pad 29084 while omitting a relatively large via and a relatively large capture pad, such a conductive pad-to-RDL interconnection conserves valuable footprint area, and promotes a higher density of traces over the conductive pad 29084. As illustrated in FIG. 30 and FIG. 32, in addition to the trace 29026*a*, the RDL 29026 includes at least two additional traces extending over the dielectric layer 29024 and overlapping the conductive pad 29084 disposed below the additional traces, such as at least three additional traces, at least four additional traces, or at least five additional traces. Specifically, the traces 29026*c*, 29026*d*, 29026*e*, 29026*f*, and 29026*g* of the RDL 29026 extend over the dielectric layer 29024 and over the conductive pad 29084.

To enhance an electrical connection to the conductive pad 29084, the trace 29026*a* can have a varying width, in which the width of the trace 29026*a* is greater in a region of the opening 29024*o* to ensure an interconnection, and the width of the trace 29026*a* tapers in a direction away from the opening 29024*o*. Such a varying width of the trace 29026*a* can be similarly implemented as explained in the foregoing with reference to FIG. 8.

A further benefit of high density conductive pad-to-RDL interconnections is that a dimensional reduction also can be applied to the conductive pads 29084. In other words, a dimensional reduction of interconnections of traces to the conductive pads 29084 allows dimensions of the conductive pads 29084 themselves to be reduced. With reduced dimensions of the conductive pads 29084, a projection area of traces onto the conductive pads 29084 can be increased. For example, and referring to FIG. 30, a projection area of the portion 29004 of the trace 29026*a* onto the conductive pad 29084 of reduced dimension can be greater than about 10% of the total area of the conductive pad 29084, such as up to about 50%, up to about 40%, up to about 30%, or up to about 20% of the total area of the conductive pad 29084, and a total projection area of the trace 29026*a* onto the conductive pad 29084 can be greater than about 15% of the total area of the conductive pad 29084, such as up to about 60%, up to about 55%, up to about 50%, or up to about 45% of the total area of the conductive pad 29084.

Although the above explanation of a high density conductive pad-to-RDL interconnection has referred to the interconnection between the trace 29026*a* and the conductive pad 29084, it should be understood that interconnections between additional traces of the RDL 29026 and additional conductive pads 29084 can be similarly implemented.

Additional embodiments of this disclosure are directed to high density interconnections in three-dimensional semiconductor device packages, such as for stacked package assemblies or package-on-package (PoP) assemblies. In some embodiments, a stacked package assembly includes a semiconductor device package and an electronic component disposed over and electrically connected to the semiconductor device package. Within the semiconductor device package, high density interconnections using RDLs provide a high density of signal, power, and ground traces connecting electronic devices within the package as well as a high density of traces providing connections external to the package, including connections to the electronic component disposed over the package. For example, the RDLs provide a high density of device-to-device interconnections (e.g., die-to-die or die-to-passive device interconnections). In some embodiments, high density interconnections are attained through one or more of the following interconnection structures: contact pad-to-RDL interconnections; RDL-to-RDL interconnections; RDL-to-UBM interconnections; conductive post-to-RDL interconnections; conductive pad-to-RDL interconnections; and conductive via-to-RDL interconnections. In some embodiments, high density interconnections are attained through traces extending into or through dielectric openings with capture pads omitted.

Figure 33:
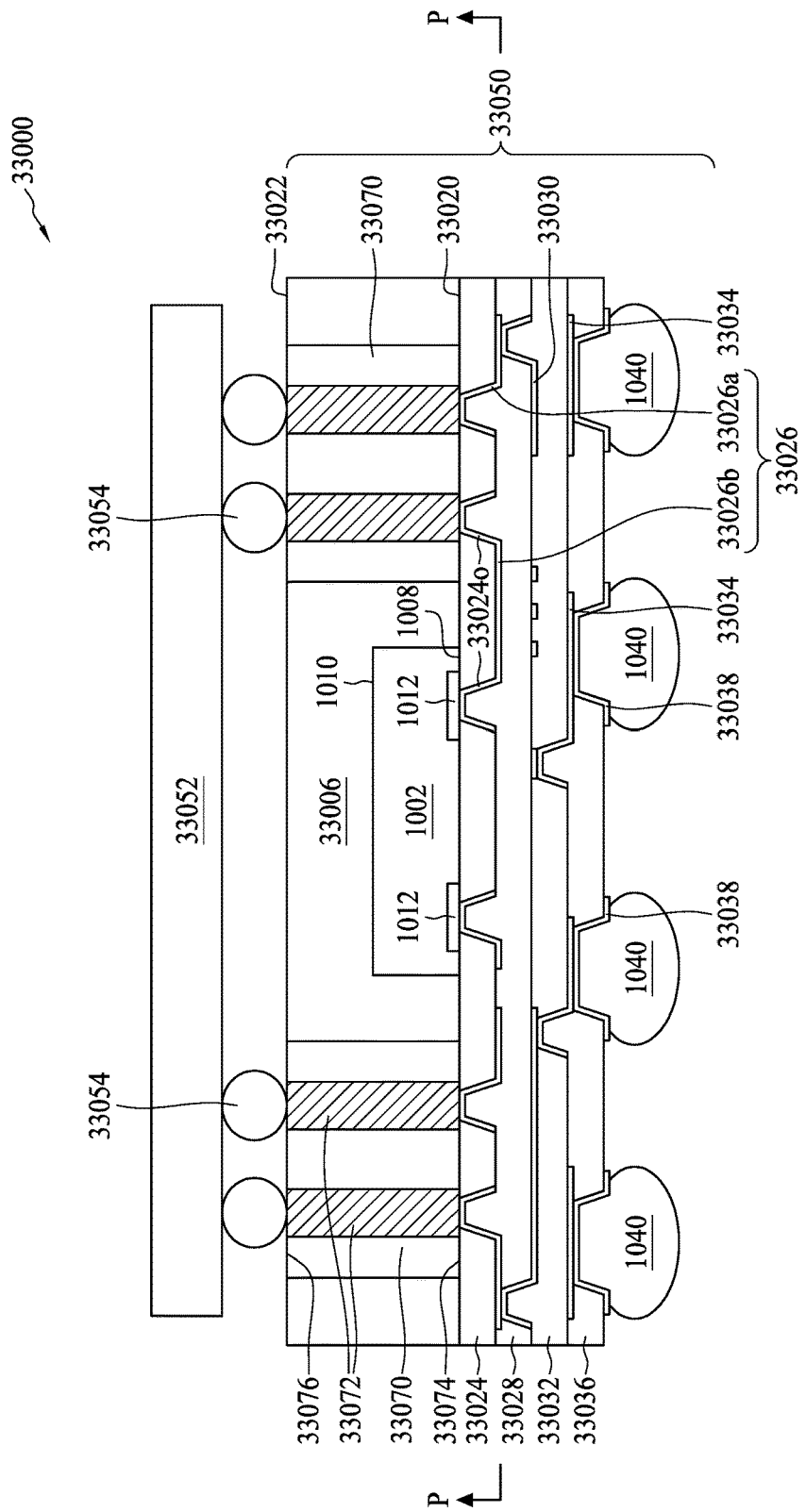
FIG. 33 shows a cross-sectional view of a stacked package assembly according to some embodiments of this disclosure.

Referring to FIG. 33, a cross-sectional view is shown of a stacked package assembly 33000 according to some embodiments of this disclosure. The stacked package assembly 33000 includes a semiconductor device package 33050 and an electronic component 33052 disposed over the semiconductor device package 33050. The electronic component 33052 is electrically connected to the semiconductor device package 33050 through connectors 33054, which can be, for example, conductive bumps formed from, or including, solder or another conductive material, or conductive posts formed from, or including, copper, a copper alloy, or another metal, another metal alloy, or another combination of metals or other conductive materials. The electronic component 33052 can be an active device, a passive device, or a combination thereof. For example, the electronic component 33052 can be, or can include, a memory die. It is also contemplated that the electronic component 33052 can be a semiconductor device package. Although FIG. 33 shows the electronic component 33052 as extending over the semiconductor device package 33050 in a bridging configuration through the connectors 33054, such a bridging configuration can be omitted in other embodiments, such as by including multiple electronic components laterally adjacent to one another and disposed over respective regions of the semiconductor device package 33050. Further, multiple electronic components can be stacked over one another and over the semiconductor device package 33050.

The semiconductor device package 33050 includes an electronic device 1002, which is an active device corresponding to a semiconductor die or chip, although it is contemplated that the electronic device 1002, in general, can be any active device, any passive device, or a combination thereof. The electronic device 1002 includes an active surface 1008, a back surface 1010 opposite to the active surface 1008, and contact pads 1012 adjacent to the active surface 1008. The contact pads 1012 provide input and output electrical connections for an integrated circuit within the electronic device 1002.

As shown in FIG. 33, the semiconductor device package 33050 also includes a package body 33006 that covers or encapsulates portions of the electronic device 1002. The package body 33006 can provide mechanical stability as well as protection against oxidation, humidity, and other environmental conditions. Referring to FIG. 33, the package body 33006 covers the back surface 1010 and lateral sides of the electronic device 1002, with its active surface 1008 at least partially exposed from or uncovered by the package body 33006. The package body 33006 includes a front surface 33020 and a back surface 33022 opposite to the front surface 33020. The package body 33006 can be formed from, or can include, a molding material. The molding material can include, for example, a Novolac-based resin, an epoxy-based resin, a silicone-based resin, or another suitable encapsulant. Suitable fillers can also be included, such as powdered silica. The molding material can be a pre-impregnated material, such as a pre-impregnated dielectric material.

Figure 34:
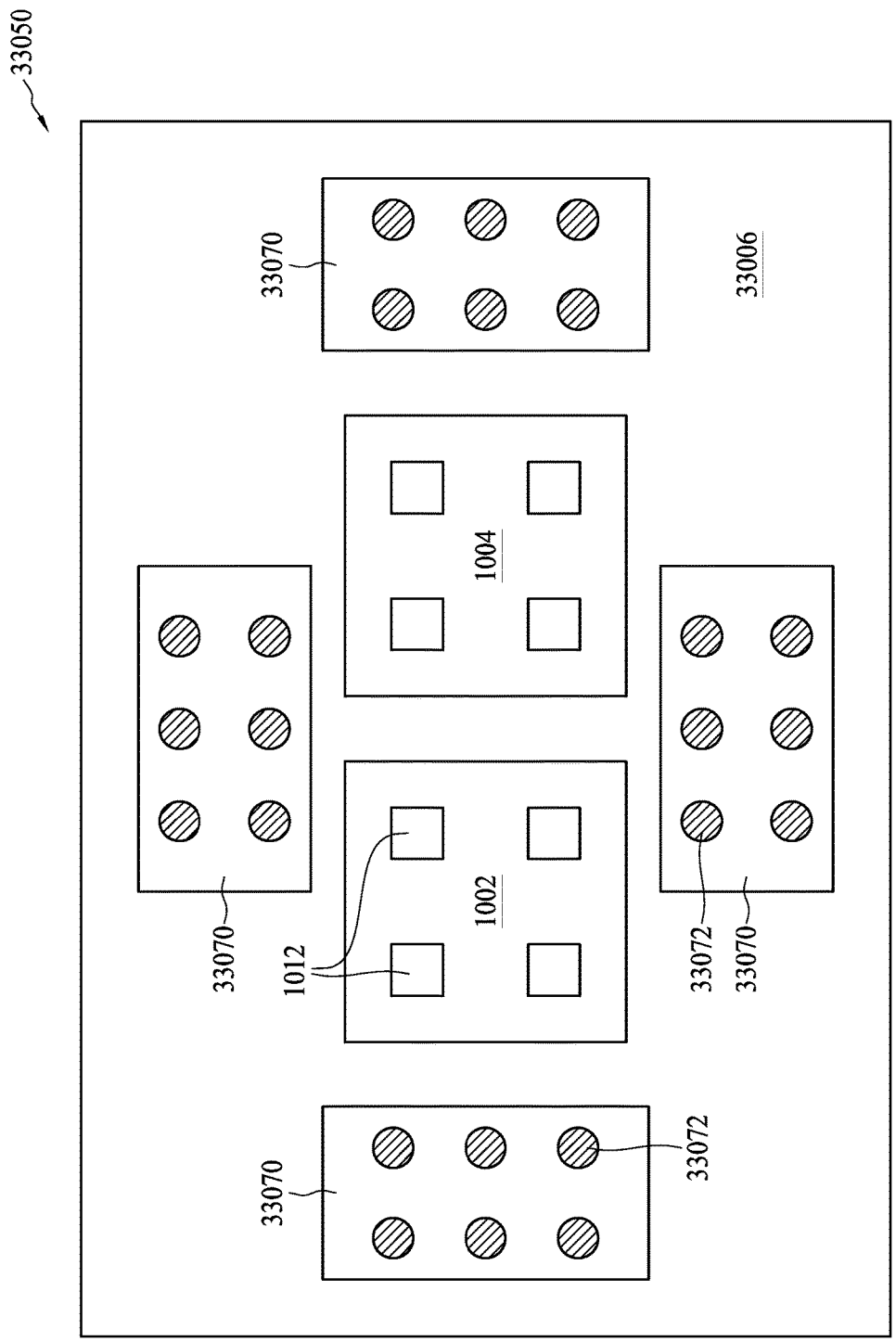
FIG. 34 is a cross-sectional view of a semiconductor device package taken along a plane P-P of FIG. 33, according to some embodiments of this disclosure.

The semiconductor device package 33050 also includes interposer components or inserts 33070. As illustrated, the interposer components 33070 are discrete components disposed adjacent to and at least partially surrounding the lateral sides of the electronic device 1002, as shown in FIG. 34. It is also contemplated that a contiguous interposer component that extends at least partially around the lateral sides of the electronic device 1002 can be included. Referring to FIG. 33, each interposer component 33070 includes a substrate that can be formed of, or can include, glass, silicon, a metal, a metal alloy, a polymer, or another suitable structural material. The interposer components 33070 in the semiconductor device package 33050 can be formed from a same structural material or from different structural materials. Each interposer component 33070 also includes conductive vias 33072 extending from a lower surface 33074 of the interposer component 33070 to an upper surface 33076 of the interposer component 33070. As illustrated, terminal ends of the conductive vias 33072 adjacent to the lower surface 33074 of the interposer component 33070 are at least partially exposed from the front surface 33020 of the package body 33006, and terminal ends of the conductive vias 33072 adjacent to the upper surface 33076 of the interposer component 33070 are at least partially exposed from the back surface 33022 of the package body 33006. The conductive vias 33072 can be formed from, or can include, a metal, a metal alloy, a conductive paste, or other conductive material or combination of conductive materials. The conductive vias 33072 in the semiconductor device package 33050 can be formed from a same conductive material or from different conductive materials. In some embodiments, a lateral periphery of each conductive via 33072 can be generally circular in shape and can have a diameter in a range from about 10 µm to about 50 µm, from about 10 µm to about 20 µm, or from about 20 µm to about 50 µm.

The semiconductor device package 33050 also includes a redistribution stack of one or more RDLs and one or more dielectric layers disposed over the active surface 1008 of the electronic device 1002, the lower surfaces 33074 of the interposer components 33070, and the front surface 33020 of the package body 33006. As illustrated, a dielectric layer 33024 is disposed over the electronic device 1002 and the package body 33006, an RDL 33026 is disposed over the dielectric layer 33024, a dielectric layer 33028 is disposed over the RDL 33026, an RDL 33030 is disposed over the dielectric layer 33028 and is electrically connected to the RDL 33026 through the dielectric layer 33028, a dielectric layer 33032 is disposed over the RDL 33030, an RDL 33034 is disposed over the dielectric layer 33032 and is electrically connected to the RDL 33030 through the dielectric layer 33032, a dielectric layer 33036 is disposed over the RDL 33034, and UBMs 33038 are disposed over the dielectric layer 33036 and are electrically connected to the RDL 33034 through the dielectric layer 33036. Certain components of the redistribution stack of the RDLs 33026, 33030, and 33034 and the dielectric layers 33024, 33028, 33032, and 33036 can be similarly implemented as explained above for the semiconductor device packages 1000, 25000, and 29000, and repetition of detailed explanation is omitted. Interconnections between traces of the RDL 33026 and the contact pads 1012 of the electronic device 1002 can be implemented as high density interconnections as explained in the foregoing with reference to FIG. 5, FIG. 6, FIG. 7, and FIG. 8, interconnections between traces of the RDLs 33026, 33030, and 33034 can be implemented as high density interconnections as explained in the foregoing with reference to FIG. 12, FIG. 13, FIG. 14, FIG. 15, FIG. 16, FIG. 17, and FIG. 18, and interconnections between traces of the RDL 33034 and the UBMs 33038 can be implemented as high density interconnections as explained in the foregoing with reference to FIG. 21, FIG. 22, FIG. 23, and FIG. 24.

Referring to FIG. 33, the RDL 33026 includes multiple traces, including traces 33026a and 33026b, and at some of the traces of the RDL 33026 extend into openings 33024o in the dielectric layer 33024 to electrically connect to the conductive vias 33072 of the interposer components 33070. At least some of the traces of the RDL 33026, such as the trace 33026*b*, extend between the contact pads 1012 of the electronic device 1002 and the conductive vias 33072 of the interposer components 33070 to provide device-to-interposer interconnections, although it is noted that device-to-interposer interconnections are also provided by electrical pathways routed through the RDL 33030 and the RDL 33034. Some embodiments of this disclosure are directed to improved conductive via-to-RDL interconnections (e.g., between the trace 33026*a* and the contact via 33072 and between the trace 33026*b* and the conductive via 33072), and further details of such conductive via-to-RDL interconnections are provided below. At least some high density interconnections across different layers of the semiconductor device package 33050 can be substantially aligned over one another to allow more efficient routing of signals and provide a higher overall density of signal routing circuitry within the semiconductor device package 33050.

The conductive vias 33072 in the interposer components 33070 extend a two-dimensional fan-out configuration to a three-dimensional fan-out configuration by providing electrical pathways from the electronic device 1002 to the electronic component 33052 through the connectors 33054. As illustrated, the connectors 33054 extend between the electronic component 33052 and the conductive vias 33072, and at least some of the connectors 33054 are disposed at least partially outside a lateral periphery of the electronic device 1002 and adjacent to a lateral periphery of the semiconductor device package 33050. It is noted that the connectors 33054, in general, can be laterally disposed within the lateral periphery of the electronic device 1002, outside of that periphery, or both, such that the semiconductor device package 33050 can have a three-dimensional fan-out configuration, a three-dimensional fan-in configuration, or a combination of a three-dimensional fan-out and a fan-in configuration.

Although the cross-sectional view of FIG. 33 shows the one electronic device 1002 in the semiconductor device package 33050, multiple electronic devices can be included in the semiconductor device package 33050. FIG. 34 is a top cross-sectional view of the semiconductor device package 33050 taken along a plane P-P of FIG. 33, according to some embodiments of this disclosure. The cross-sectional view shows multiple electronic devices, including the electronic device 1002 and an additional electronic device 1004, and also shows the interposer components 33070 as discrete components surrounding the electronic devices 1002 and 1004 and encapsulated in the package body 33006.

Figure 35:
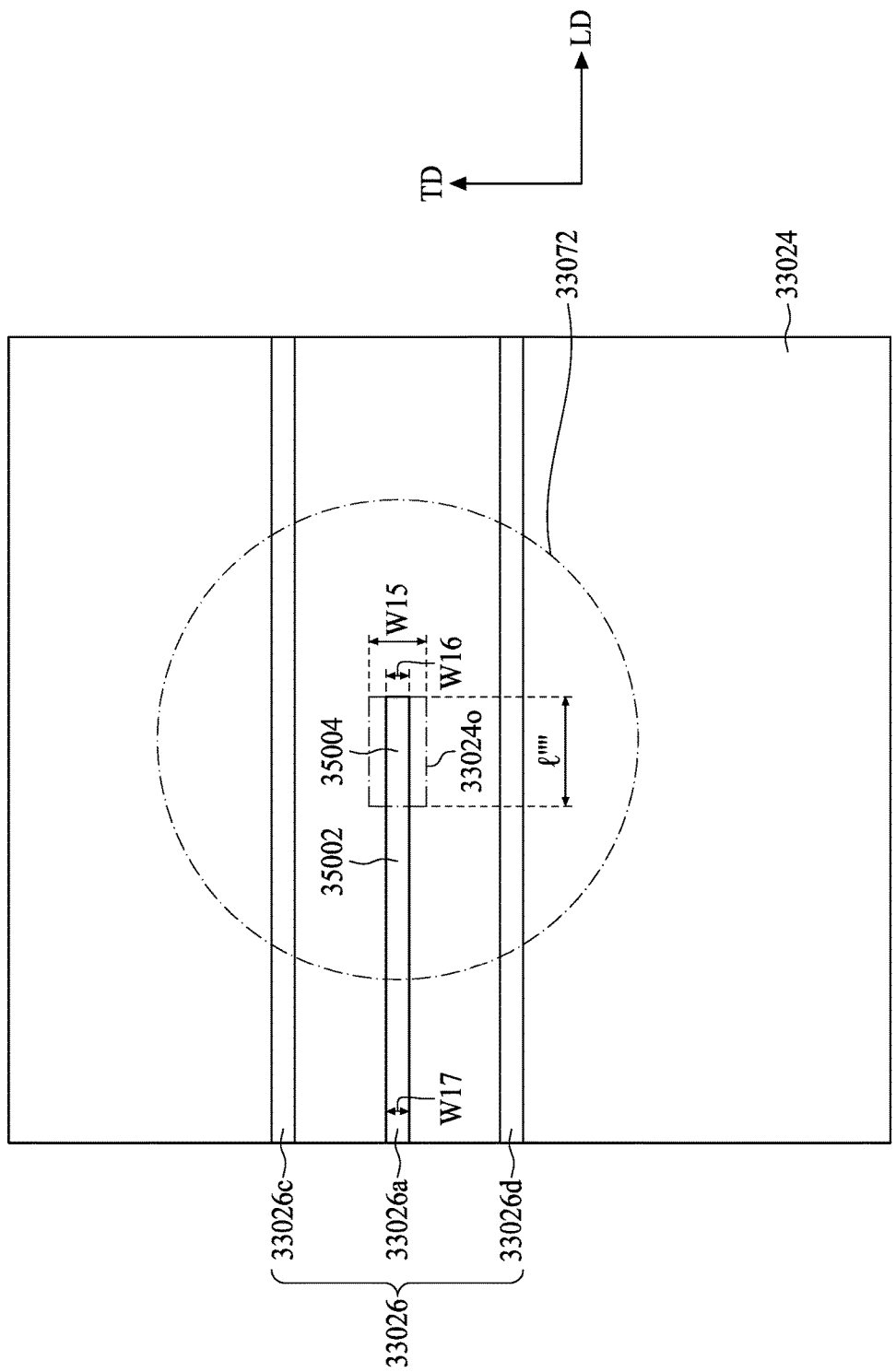
FIG. 35 shows a top view of a structure of a high density conductive via-to-RDL interconnection according to some embodiments.

FIG. 35 shows a top view of a structure of a high density conductive via-to-RDL interconnection included in the semiconductor device package 33050 according to some embodiments. As illustrated, the trace 33026*a* along with traces 33026*c* and 33026*d* of the RDL 33026 extend over the dielectric layer 33024 which is disposed over the conductive via 33072. The opening 33024*o* formed in the dielectric layer 33024 exposes a portion of a terminal end of the conductive via 33072, and the trace 33026*a* is electrically connected to the conductive via 33072 through the opening 33024*o*. For example, a lateral periphery of the conductive via 33072 can be generally circular in shape and can have a diameter of about 10 μm to about 50 μm, and the opening 33024*o* can have a maximum length l''' along a longitudinal direction LD of about 8 μm to about 15 μm, about 8 μm to about 12 μm, or about 10 μm, and a maximum width w15 along a transverse direction TD orthogonal to the longitudinal direction LD of about 2 μm to about 10 μm, about 6 μm to about 10 μm, or about 8 μm. It should be understood that dimensions of the conductive via 33072 and the opening 33024*o* can be varied (e.g., increased or decreased) relative to these stated example values. The maximum length l''' of the opening 33024*o* can be greater than the maximum width w15 of the opening 33024*o*. For example, a ratio of the maximum length l''' to the maximum width w15 can be about 1.1 or greater, about 1.3 or greater, about 1.5 or greater, about 1.8 or greater, about 2 or greater, or about 3 or greater. The trace 33026*a* includes a portion 35002 extending over the dielectric layer 33024 along the longitudinal direction LD adjacent to the opening 33024*o*, and a portion 35004 in the opening 33024*o* and extending between the portion 35002 and the exposed portion of the conductive via 33072. The portion 35004 of the trace 33026*a* in the opening 33024*o* has a maximum width w16 along the transverse direction TD, and the maximum width w16 of the portion 35004 is no greater than about 3 times of a width w17 of the remaining portion 35002 of the trace 33026*a*, such as no greater than about 2.8 times, no greater than about 2.5 times, no greater than about 2.3 times, no greater than about 2 times, no greater than about 1.8 times, or no greater than about 1.5 times of the width w17 of the remaining portion 35002 of trace 33026*a*. In some embodiments, the maximum width w16 of the portion 35004 of the trace 33026*a* in the opening 33024*o* is substantially the same as the width w17 of the remaining portion 35002 of trace 33026*a*. In some embodiments, the trace 33026*a* has a substantially uniform width along at least a length of the trace 33026*a* extending over the conductive via 33072. In some embodiments, a projection area of the portion 35004 of the trace 33026*a* onto the terminal end of the conductive via 33072 (e.g., an area of about w16×l''') is no greater than about 40% of a total area of the terminal end of the conductive via 33072, such as no greater than about 35%, no greater than about 30%, no greater than about 25%, or no greater than about 20% of the total area of the terminal end of the conductive via 33072.

Referring to FIG. 35, the maximum width w16 of the portion 35004 of the trace 33026*a* in the opening 33024*o* is no greater than or less than the maximum width w15 of the opening 33024*o*. As illustrated, the portion 35004 of the trace 33026*a* is disposed between and spaced from opposing sidewalls of the dielectric layer 33024 forming the opening 33024*o*. In some embodiments, the maximum width w16 of the portion 35004 is no greater than about 9/10, no greater than about 4/5, no greater than about 7/10, no greater than about 3/5, no greater than about 1/2, no greater than about 2/5, or no greater than about 1/3 of the maximum width w15 of the opening 33024*o*.

Since the trace 33026*a* is electrically connected to the conductive via 33072 while omitting a relatively large via and a relatively large capture pad, such a conductive via-to-RDL interconnection conserves valuable footprint area, and promotes a higher density of traces over the conductive via 33072. As illustrated in FIG. 35, in addition to the trace 33026*a*, the RDL 33026 includes at least one additional trace extending over the dielectric layer 33024 and overlapping the conductive via 33072 disposed below the additional trace, such as at least two additional traces, at least three additional traces, or at least four additional traces. Specifically, the traces 33026*c* and 33026*d* of the RDL 33026 extend over the dielectric layer 33024 and over the conductive via 33072.

To enhance an electrical connection to the conductive via 33072, the trace 33026*a* can have a varying width, in which the width of the trace 33026*a* is greater in a region of the opening 33024*o* to ensure an interconnection, and the width of the trace 33026*a* tapers in a direction away from the opening 33024*o*. Such a varying width of the trace 33026*a* can be similarly implemented as explained in the foregoing with reference to FIG. 8.

A further benefit of high density conductive via-to-RDL interconnections is that a dimensional reduction also can be applied to the conductive vias 33072 of the interposer components 33070. In other words, a dimensional reduction of interconnections of traces to the conductive vias 33072 allows dimensions of the conductive vias 33072 themselves to be reduced. With reduced dimensions of the conductive vias 33072, a projection area of traces onto the conductive vias 33072 can be increased. For example, and referring to FIG. 35, a projection area of the portion 35004 of the trace 33026*a* onto the terminal end of the conductive via 33072 of reduced dimension can be greater than about 40% of the total area of the terminal end of the conductive via 33072, such as up to about 65%, up to about 60%, up to about 55%, or up to about 50% of the total area of the terminal end of the conductive via 33072.

Although the above explanation of a high density conductive via-to-RDL interconnection has referred to the interconnection between the trace 33026*a* and the conductive via 33072, it should be understood that interconnections between additional traces of the RDL 33026 and additional conductive vias 33072 can be similarly implemented.

Figure 36:
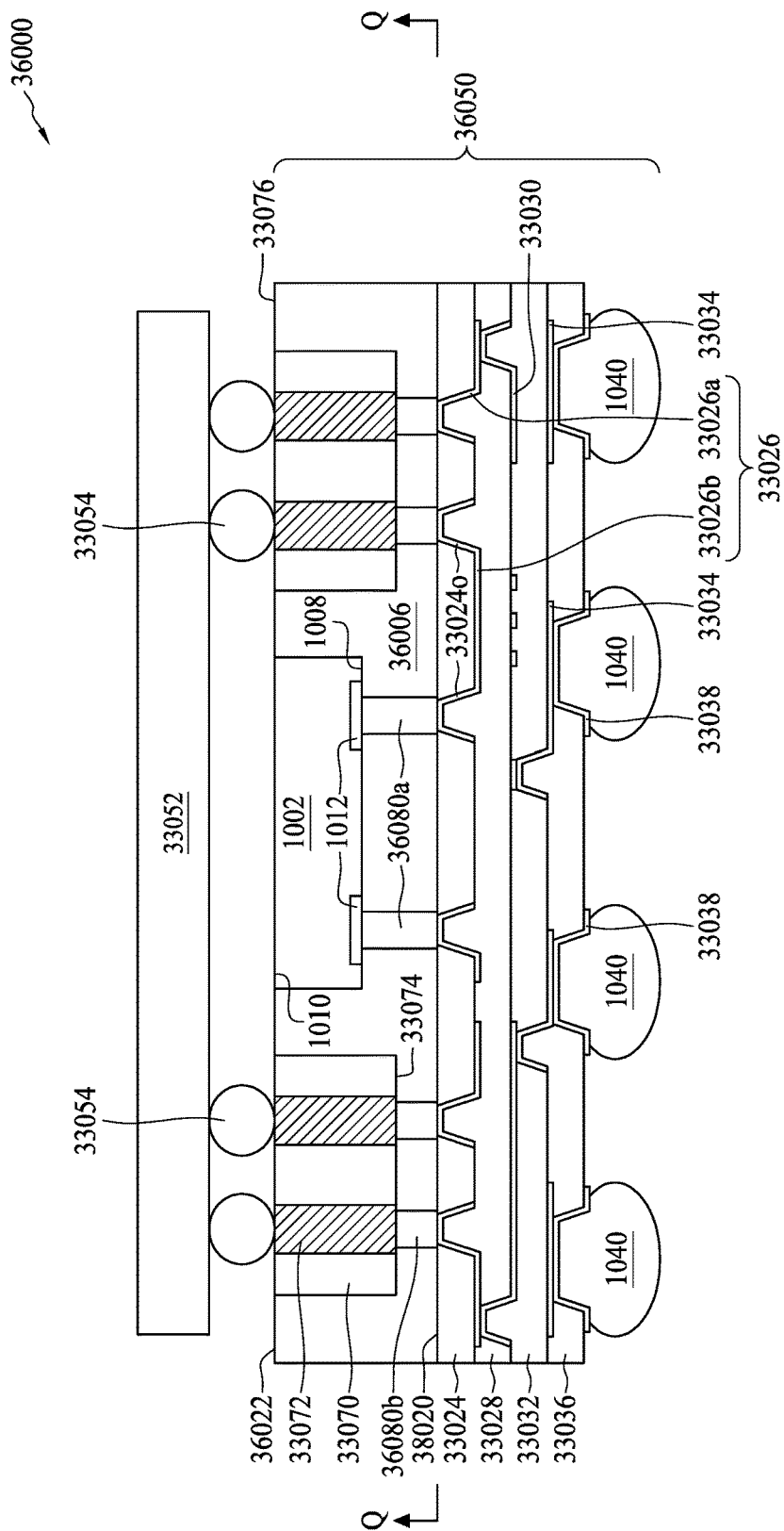
FIG. 36 shows a cross-sectional view of a stacked package assembly according to some embodiments of this disclosure.

Attention next turns to FIG. 36, which shows a cross-sectional view of a stacked package assembly 36000 according to some embodiments of this disclosure. The stacked package assembly 36000 includes a semiconductor device package 36050 and an electronic component 33052 disposed over the semiconductor device package 36050 and electrically connected to the semiconductor device package 36050 through connectors 33054. Certain components of the stacked package assembly 36000 and interconnections between the components can be similarly implemented as explained above for the stacked package assembly 33000, and repetition of detailed explanation is omitted. For example, the semiconductor device package 36050 also includes a redistribution stack of one or more RDLs 33026, 33030, and 33034 and one or more dielectric layers 33024, 33028, 33032, and 33036 disposed over an active surface 1008 of an electronic device 1002, lower surfaces 33074 of interposer components 33070, and a front surface 36020 of a package body 36006, and UBMs 33038 are disposed over the dielectric layer 33036 and are electrically connected to the RDL 33034 through the dielectric layer 33036. Interconnections between traces of the RDLs 33026, 33030, and 33034 can be implemented as high density interconnections as explained in the foregoing with reference to FIG. 12, FIG. 13, FIG. 14, FIG. 15, FIG. 16, FIG. 17, and FIG. 18, and interconnections between traces of the RDL 33034 and the UBMs 33038 can be implemented as high density interconnections as explained in the foregoing with reference to FIG. 21, FIG. 22, FIG. 23, and FIG. 24.

As illustrated, the electronic device 1002 and the interposer components 33070 are disposed adjacent to a back surface 36022 of the package body 36006 with their back surface 1010 and upper surfaces 33076 exposed from the package body 36006, and the semiconductor device package 36050 includes conductive posts 36080*a* disposed over the electronic device 1002 and extending between respective contact pads 1012 of the electronic device 1002 and the front surface 36020 of the package body 36006, as well as conductive posts 36080*b* disposed over the interposer components 33070 and extending between respective conductive vias 33072 of the interposer components 33070 and the front surface 36020 of the package body 36006. At least a portion of a terminal end of each conductive post 36080*a* or 36080*b* is exposed from the front surface 36020 of the package body 36006. The conductive posts 36080*a* and 36080*b* can be formed from, or can include, copper, a copper alloy, or another metal, another metal alloy, or another combination of metals or other conductive materials. The RDL 33026 is a patterned conductive layer that includes multiple traces, including traces 33026*a* and 33026*b*, and at some of the traces of the RDL 33026 extend into openings 33024*o* in the dielectric layer 33024 to electrically connect to the electronic device 1002 and interposer components 33070 through the conductive posts 36080*a* and 36080*b*. Interconnections between traces of the RDL 33026 and the conductive posts 36080*a* and 36080*b* can be implemented as high density interconnections as explained in the foregoing with reference to FIG. 26, FIG. 27, and FIG. 28. At least some high density interconnections across different layers of the semiconductor device package 36050 can be substantially aligned over one another to allow more efficient routing of signals and provide a higher overall density of signal routing circuitry within the semiconductor device package 36050.

Figure 37:
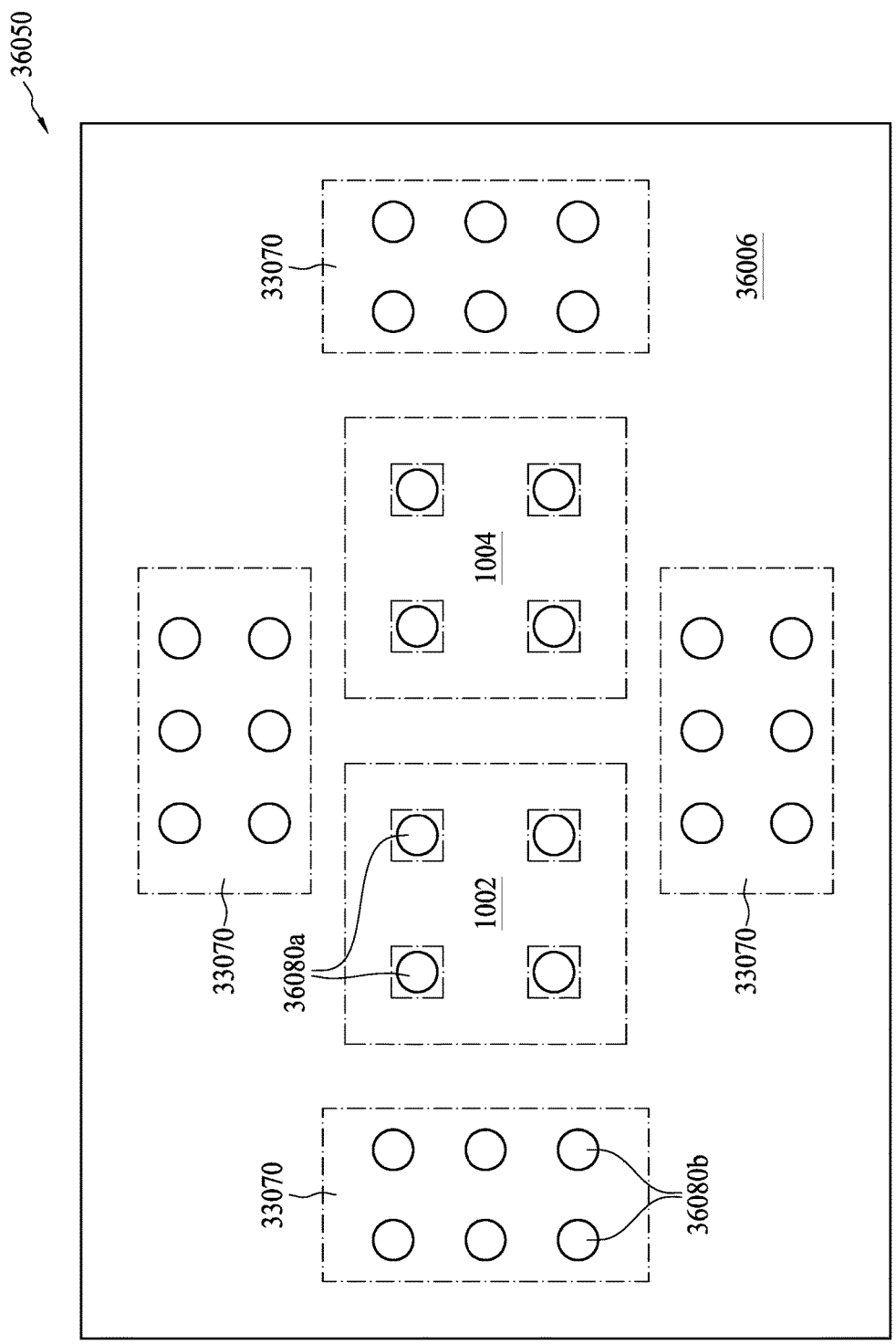
FIG. 37 is a cross-sectional view of a semiconductor device package taken along a plane Q-Q of FIG. 36, according to some embodiments of this disclosure.

Although the cross-sectional view of FIG. 36 shows the one electronic device 1002 in the semiconductor device package 36050, multiple electronic devices can be included in the semiconductor device package 36050. FIG. 37 is a top cross-sectional view of the semiconductor device package 36050 taken along a plane Q-Q of FIG. 36, according to some embodiments of this disclosure. The cross-sectional view shows multiple electronic devices, including the electronic device 1002 and an additional electronic device 1004, and also shows the interposer components 33070 as discrete components surrounding the electronic devices 1002 and 1004 and encapsulated in the package body 36006.

Figure 38:
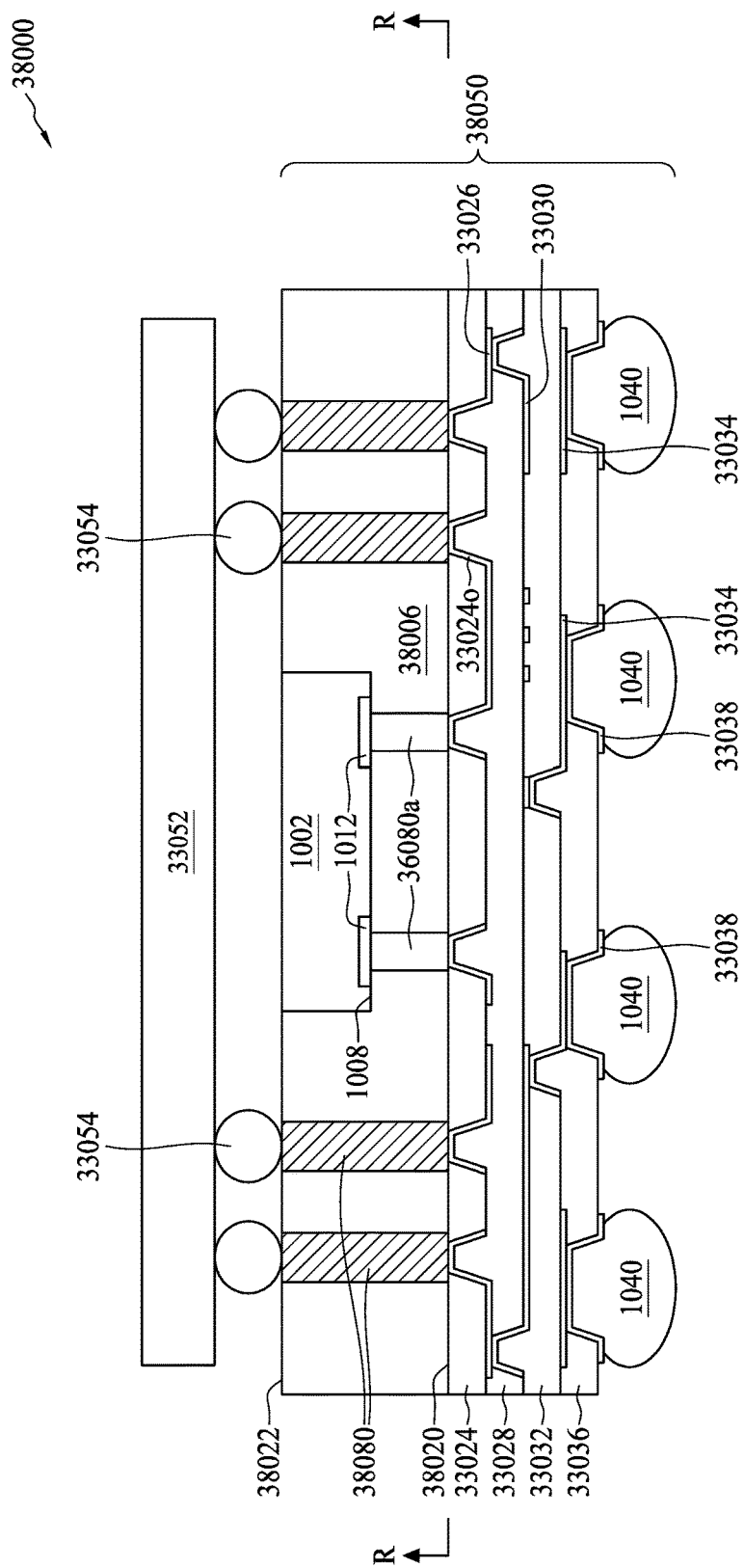
FIG. 38 shows a cross-sectional view of a stacked package assembly according to some embodiments of this disclosure.

Attention next turns to FIG. 38, which shows a cross-sectional view of a stacked package assembly 38000 according to some embodiments of this disclosure. The stacked package assembly 38000 includes a semiconductor device package 38050 and an electronic component 33052 disposed over the semiconductor device package 38050 and electrically connected to the semiconductor device package 38050 through connectors 33054. Certain components of the stacked package assembly 38000 and interconnections between the components can be similarly implemented as explained above for the stacked package assemblies 33000 and 36000, and repetition of detailed explanation is omitted. For example, the semiconductor device package 38050 also includes a redistribution stack of one or more RDLs 33026, 33030, and 33034 and one or more dielectric layers 33024, 33028, 33032, and 33036 disposed over an active surface 1008 of an electronic device 1002 and a front surface 38020 of a package body 38006, and UBMs 33038 are disposed over the dielectric layer 33036 and are electrically connected to the RDL 33034 through the dielectric layer 33036. Conductive posts 36080*a* are disposed over the electronic device 1002 and extend between respective contact pads 1012 of the electronic device 1002 and the front surface 38020 of the package body 38006. Interconnections between traces of the RDLs 33026, 33030, and 33034 can be implemented as high density interconnections as explained in the foregoing with reference to FIG. 12, FIG. 13, FIG. 14, FIG. 15, FIG. 16, FIG. 17, and FIG. 18, interconnections between traces of the RDL 33034 and the UBMs 33038 can be implemented as high density interconnections as explained in the foregoing with reference to FIG. 21, FIG. 22, FIG. 23, and FIG. 24, and interconnections between traces of the RDL 33026 and the conductive posts 36080*a* can be implemented as high density interconnections as explained in the foregoing with reference to FIG. 26, FIG. 27, and FIG. 28.

As illustrated in FIG. 38 and in place of interposer components, the semiconductor device package 38050 includes conductive posts 38080 extending between the front surface 38020 of the package body 38006 and a back surface 38022 of the package body 38006. At least a portion of a terminal end of each conductive post 38080 is exposed from the front surface 38020 of the package body 38006, and at least a portion of an opposite terminal end of each conductive post 38080 is exposed from the back surface 38022 of the package body 38006 and is electrically connected to the electronic component 33052 through a respective connector 33054. A lateral periphery of each conductive post 38080 can be generally circular in shape and can have a diameter of about 50 µm to about 100 µm. The conductive posts 38080 can be formed from, or can include, copper, a copper alloy, or another metal, another metal alloy, or another combination of metals or other conductive materials. The RDL 33026 is a patterned conductive layer that includes multiple traces, and at some of the traces of the RDL 33026 extend into openings 33024o in the dielectric layer 33024 to electrically connect to the conductive posts 38080. Interconnections between traces of the RDL 33026 and the conductive posts 38080 can be implemented as high density interconnections as explained in the foregoing with reference to FIG. 26, FIG. 27, and FIG. 28. At least some high density interconnections across different layers of the semiconductor device package 38050 can be substantially aligned over one another to allow more efficient routing of signals and provide a higher overall density of signal routing circuitry within the semiconductor device package 38050.

Figure 39:
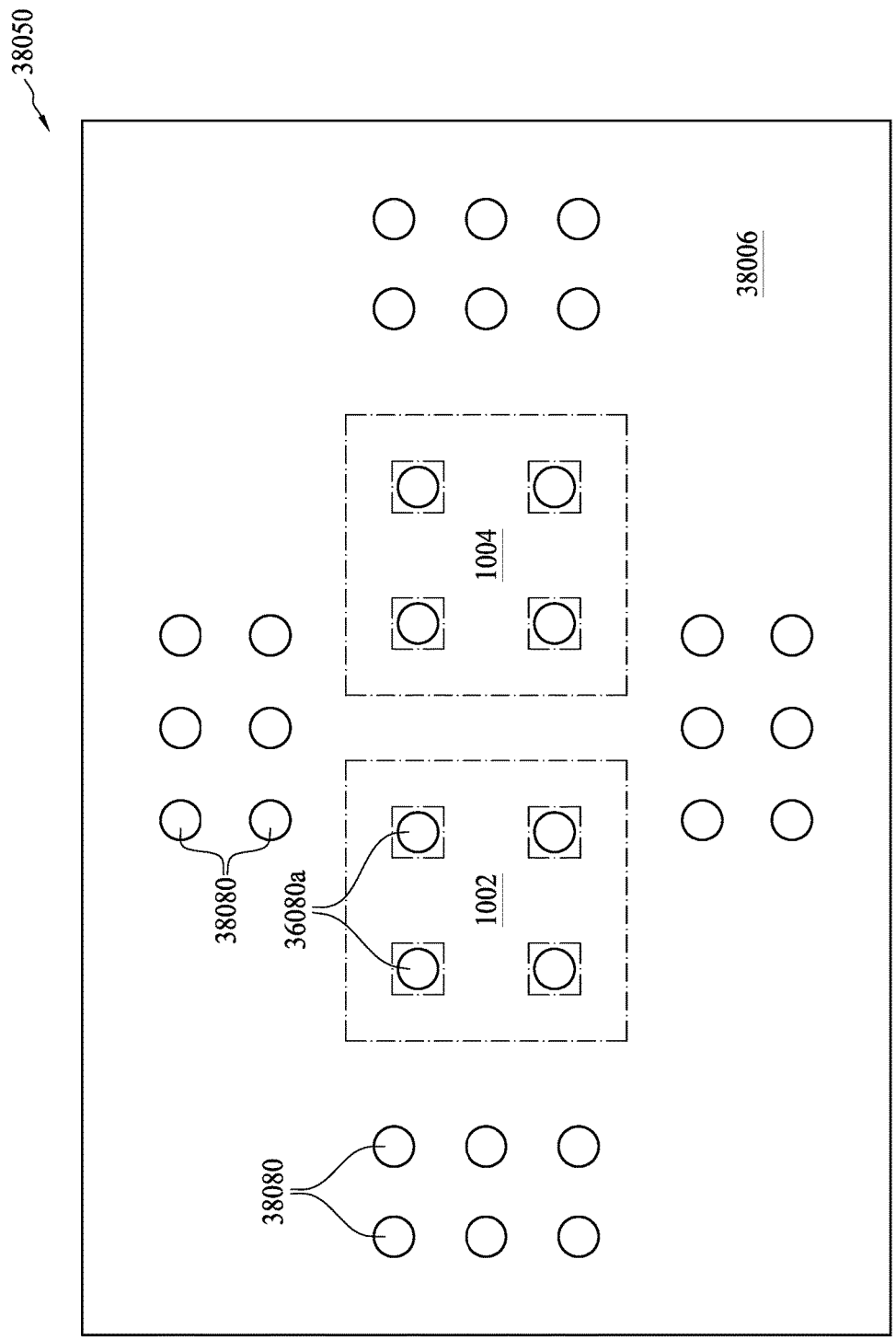
FIG. 39 is a cross-sectional view of a semiconductor device package taken along a plane R-R of FIG. 38, according to some embodiments of this disclosure.

Although the cross-sectional view of FIG. 38 shows the one electronic device 1002 in the semiconductor device package 38050, multiple electronic devices can be included in the semiconductor device package 38050. FIG. 39 is a top cross-sectional view of the semiconductor device package 38050 taken along a plane R-R of FIG. 38, according to some embodiments of this disclosure. The cross-sectional view shows multiple electronic devices, including the electronic device 1002 and an additional electronic device 1004, and also shows the conductive posts 38080 surrounding the electronic devices 1002 and 1004 and encapsulated in the package body 38006.

Figure 40:
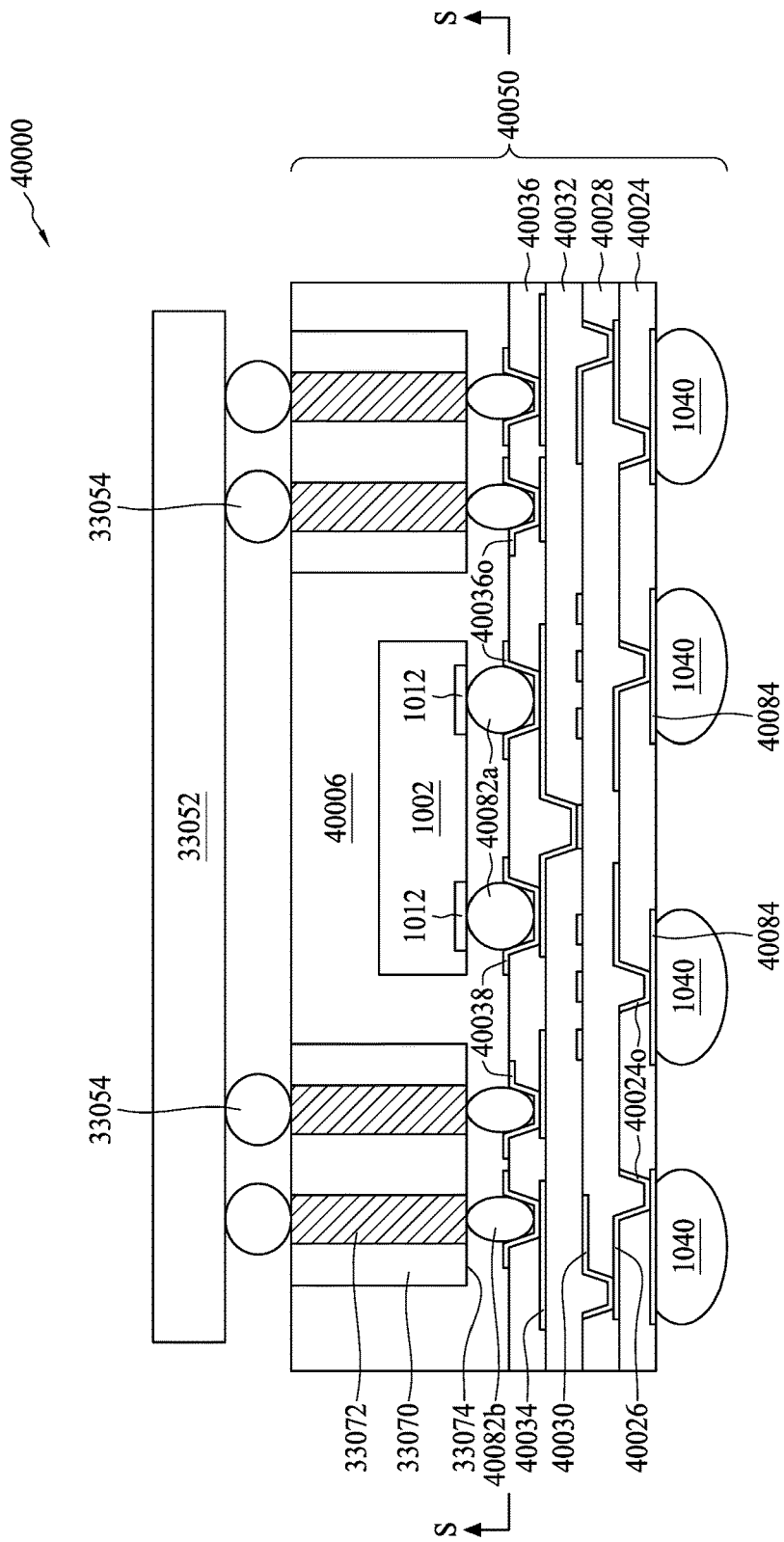
FIG. 40 shows a cross-sectional view of a stacked package assembly according to some embodiments of this disclosure.

Attention next turns to FIG. 40, which shows a cross-sectional view of a stacked package assembly 40000 according to some embodiments of this disclosure. The stacked package assembly 40000 includes a semiconductor device package 40050 and an electronic component 33052 disposed over the semiconductor device package 40050 and electrically connected to the semiconductor device package 40050 through connectors 33054. Certain components of the stacked package assembly 40000 and interconnections between the components can be similarly implemented as explained above for the stacked package assemblies 33000, 36000, and 38000, and repetition of detailed explanation is omitted. For example, the semiconductor device package 40050 also includes a redistribution stack of one or more RDLs 40026, 40030, and 40034 and one or more dielectric layers 40024, 40028, 40032, and 40036. Interconnections between traces of the RDLs 40026, 40030, and 40034 can be implemented as high density interconnections as explained in the foregoing with reference to FIG. 12, FIG. 13, FIG. 14, FIG. 15, FIG. 16, FIG. 17, and FIG. 18.

As illustrated in FIG. 40, the semiconductor device package 40050 includes an electronic device 1002 and interposer components 33070, which are disposed over the redistribution stack of the RDLs 40026, 40030, and 40034 and the dielectric layers 40024, 40028, 40032, and 40036, and are electrically connected to the redistribution stack by, for example, flip-chip mounting. Specifically, the redistribution stack includes UBMs 40038 which are disposed over the dielectric layer 40036 and extend into openings 40036o in the dielectric layer 40036 to electrically connect to traces of the RDL 40034. The electronic device 1002 and the interposer components 33070 are disposed with their active surface 1008 and lower surfaces 33074 adjacent to and facing towards the UBMs 40038, and the semiconductor device package 40050 includes connectors 40082a extending between respective contact pads 1012 of the electronic device 1002 and respective UBMs 40038, as well as connectors 40082b extending between respective conductive vias 33072 of the interposer components 33070 and respective UBMs 40038. The connectors 40082a and 40082b can be, for example, conductive bumps formed from, or including, solder or another conductive material, or conductive posts formed from, or including, copper, a copper alloy, or another metal, another metal alloy, or another combination of metals or other conductive materials. The semiconductor device package 40050 also includes a package body 40006 that covers or encapsulates the electronic device 1002 and the interposer components 33070, and is disposed over the redistribution stack of the RDLs 40026, 40030, and 40034 and the dielectric layers 40024, 40028, 40032, and 40036. At least some traces of the RDL 40026 extend into openings 40024o in the dielectric layer 40024 to electrically connect to conductive pads 40084 that are at least partially embedded in the dielectric layer 40024. Interconnections between traces of the RDL 40034 and the UBMs 40038 can be implemented as high density interconnections as explained in the foregoing with reference to FIG. 21, FIG. 22, FIG. 23, and FIG. 24, and interconnections between traces of the RDL 40026 and the conductive pads 40084 can be implemented as high density interconnections as explained in the foregoing with reference to FIG. 30, FIG. 31, and FIG. 32. At least some high density interconnections across different layers of the semiconductor device package 40050 can be substantially aligned over one another to allow more efficient routing of signals and provide a higher overall density of signal routing circuitry within the semiconductor device package 40050.

Figure 41:
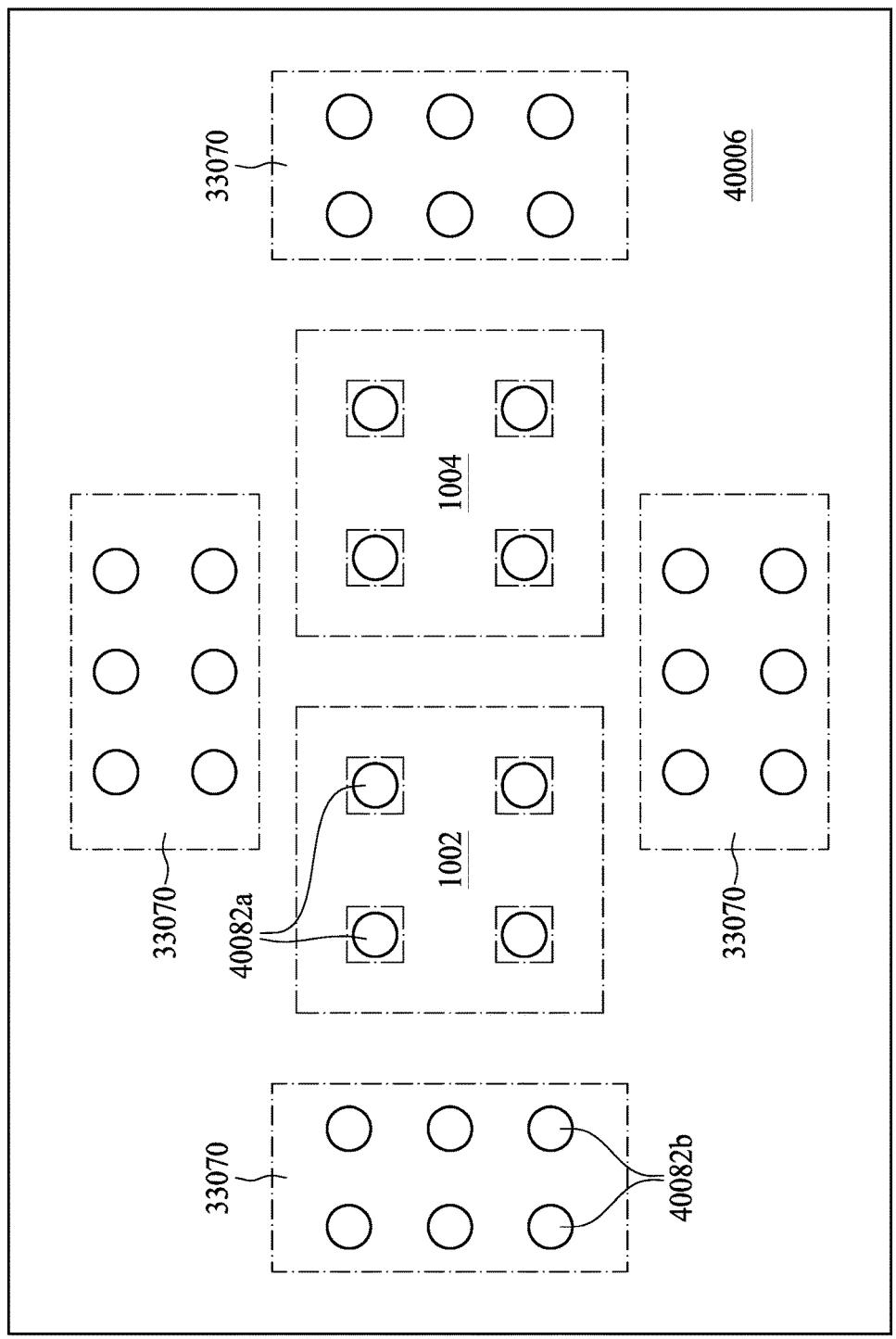
FIG. 41 is a cross-sectional view of a semiconductor device package taken along a plane S-S of FIG. 40, according to some embodiments of this disclosure.

Although the cross-sectional view of FIG. 40 shows the one electronic device 1002 in the semiconductor device package 40050, multiple electronic devices can be included in the semiconductor device package 40050. FIG. 41 is a top cross-sectional view of the semiconductor device package 40050 taken along a plane S-S of FIG. 40, according to some embodiments of this disclosure. The cross-sectional view shows multiple electronic devices, including the electronic device 1002 and an additional electronic device 1004, and also shows the interposer components 33070 as discrete components surrounding the electronic devices 1002 and 1004 and encapsulated in the package body 40006.

Figure 42:
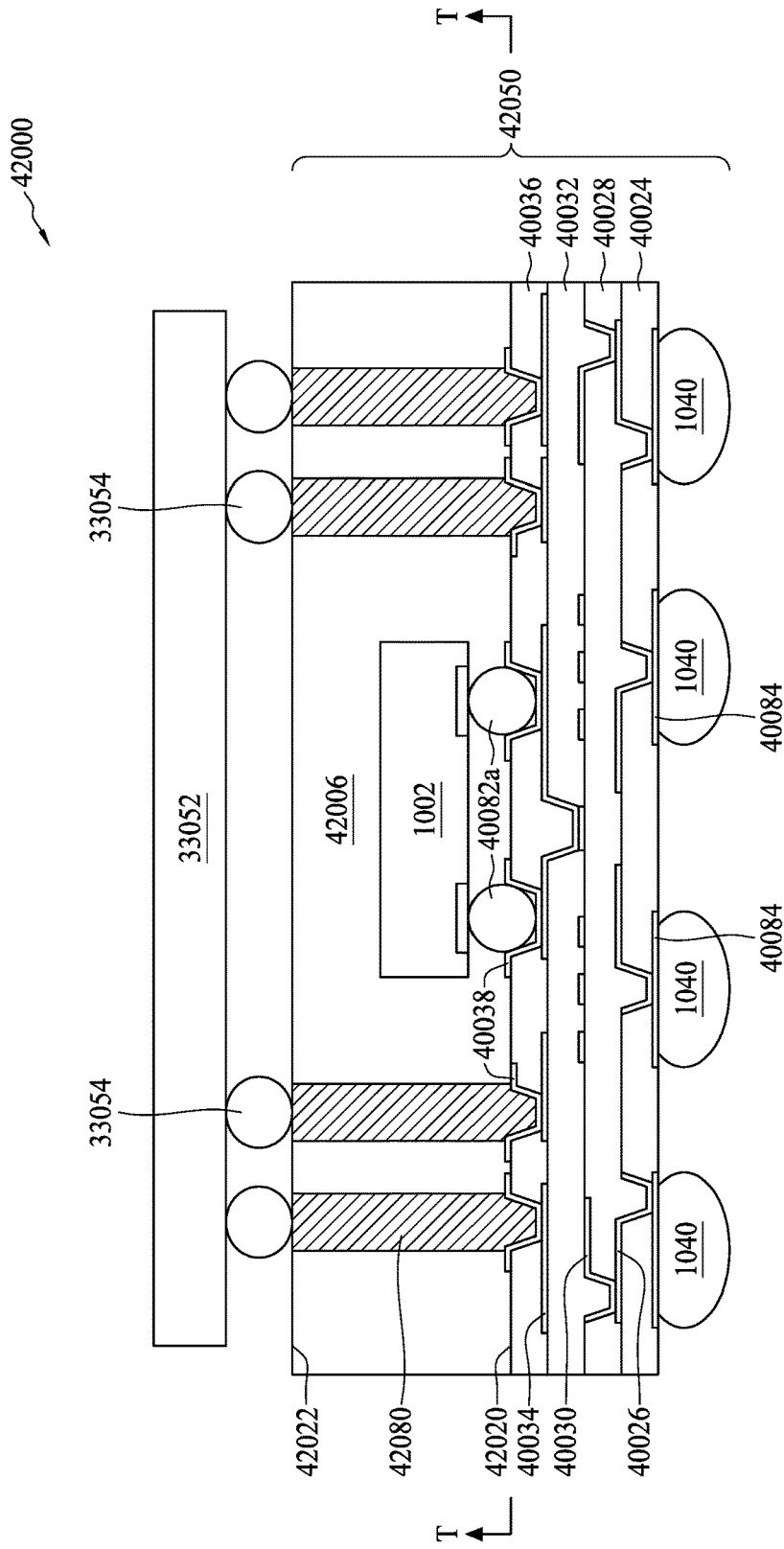
FIG. 42 shows a cross-sectional view of a stacked package assembly according to some embodiments of this disclosure.

Attention next turns to FIG. 42, which shows a cross-sectional view of a stacked package assembly 42000 according to some embodiments of this disclosure. The stacked package assembly 42000 includes a semiconductor device package 42050 and an electronic component 33052 disposed over the semiconductor device package 42050 and electrically connected to the semiconductor device package 42050 through connectors 33054. Certain components of the stacked package assembly 42000 and interconnections between the components can be similarly implemented as explained above for the stacked package assemblies 33000, 36000, 38000, and 40000, and repetition of detailed explanation is omitted. For example, and similar to the semiconductor device package 40050 of FIG. 40, the semiconductor device package 42050 also includes a redistribution stack of one or more RDLs 40026, 40030, and 40034 and one or more dielectric layers 40024, 40028, 40032, and 40036, UBMs 40038 are disposed over the dielectric layer 40036 and are electrically connect to traces of the RDL 40034 through the dielectric layer 40036, and traces of the RDL 40026 are electrically connected to conductive pads 40084 that are at least partially embedded in the dielectric layer 40024. An electronic device 1002 is electrically connected to the redistribution stack through connectors 40082a by, for example, flip-chip mounting. Interconnections between traces of the RDLs 40026, 40030, and 40034 can be implemented as high density interconnections as explained in the foregoing with reference to FIG. 12, FIG. 13, FIG. 14, FIG. 15, FIG. 16, FIG. 17, and FIG. 18, interconnections between traces of the RDL 40034 and the UBMs 40038 can be implemented as high density interconnections as explained in the foregoing with reference to FIG. 21, FIG. 22, FIG. 23, and FIG. 24, and interconnections between traces of the RDL 40026 and the conductive pads 40084 can be implemented as high density interconnections as explained in the foregoing with reference to FIG. 30, FIG. 31, and FIG. 32. At least some high density interconnections across different layers of the semiconductor device package 42050 can be substantially aligned over one another to allow more efficient routing of signals and provide a higher overall density of signal routing circuitry within the semiconductor device package 42050.

As illustrated in FIG. 42 and in place of interposer components, the semiconductor device package 42050 includes conductive posts 42080 extending between a front surface 42020 of a package body 42006 and a back surface 42022 of the package body 42006. At least a portion of a terminal end of each conductive post 42080 is exposed from the front surface 42020 of the package body 42006 and is electrically connected to a respective UBM 40038, and at least a portion of an opposite terminal end of each conductive post 42080 is exposed from the back surface 42022 of the package body 42006 and is electrically connected to the electronic component 33052 through a respective connector 33054. The conductive posts 42080 can be formed from, or can include, copper, a copper alloy, or another metal, another metal alloy, or another combination of metals or other conductive materials.

Figure 43:
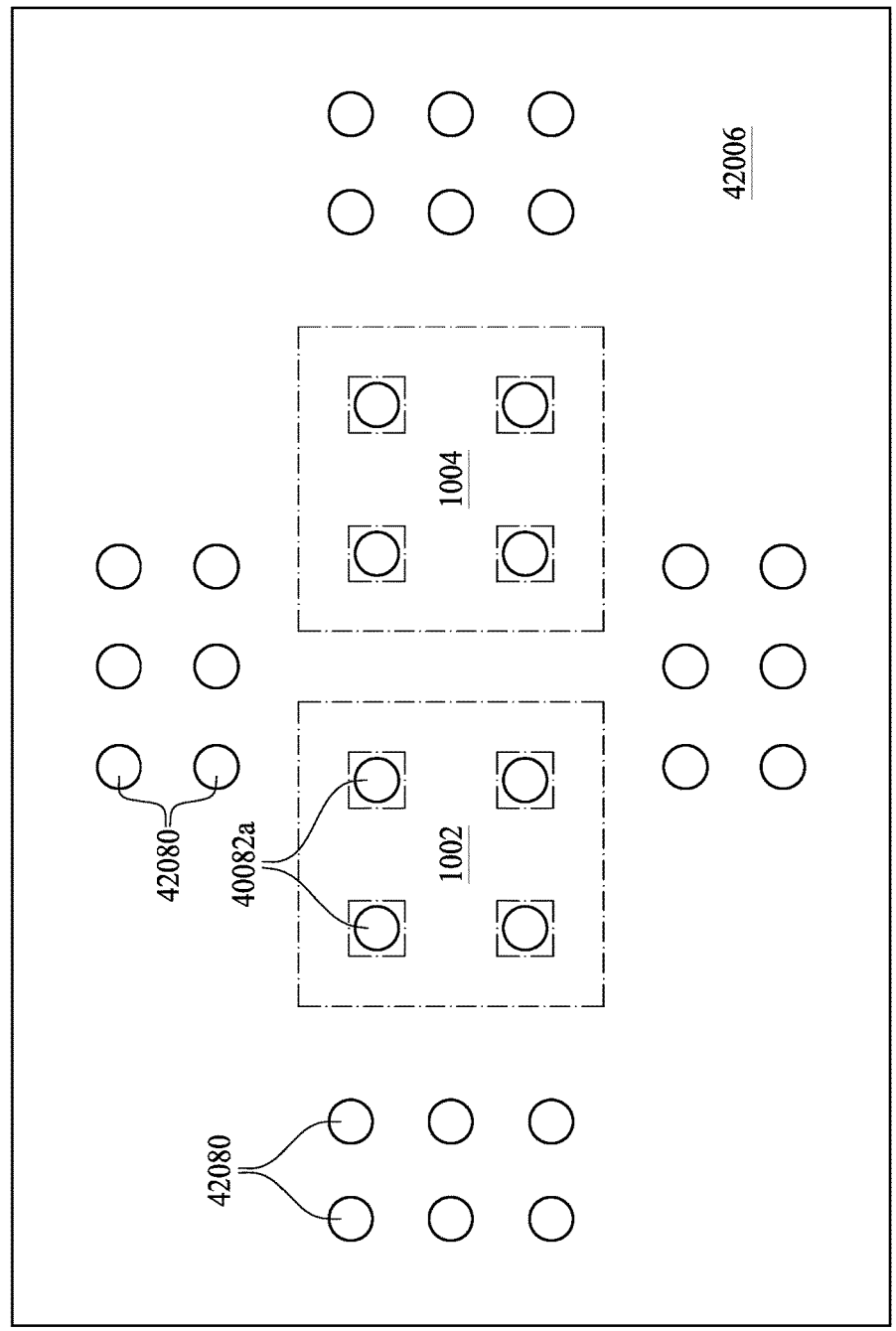
FIG. 43 is a cross-sectional view of a semiconductor device package taken along a plane T-T of FIG. 42, according to some embodiments of this disclosure.

Although the cross-sectional view of FIG. 42 shows the one electronic device 1002 in the semiconductor device package 42050, multiple electronic devices can be included in the semiconductor device package 42050. FIG. 43 is a top cross-sectional view of the semiconductor device package 42050 taken along a plane T-T of FIG. 42, according to some embodiments of this disclosure. The cross-sectional view shows multiple electronic devices, including the electronic device 1002 and an additional electronic device 1004, and also shows the conductive posts 42080 surrounding the electronic devices 1002 and 1004 and encapsulated in the package body 42006.

In additional embodiments of a stacked package assembly, a semiconductor device package includes a redistribution stack of one or more RDLs and one or more dielectric layers disposed over a front surface of a package body and a redistribution stack of one or more RDLs and one or more dielectric layers disposed over a back surface of the package body. RDLs disposed over the back surface of the package body can provide electrical pathways that are routed between conductive vias of interposer components (or conductive posts) and an electronic component disposed over the semiconductor device package. In such manner, an increase in flexibility in an arrangement and a spacing of connections to the electronic component can be attained, with reduced dependence upon an arrangement and a spacing of the conductive vias of the interposer components (or the conductive posts). Within the semiconductor device package, high density interconnections using RDLs provide a high density of signal, power, and ground traces connecting electronic devices within the package as well as a high density of traces providing connections external to the package, including connections to the electronic component disposed over the package.

Figure 44:
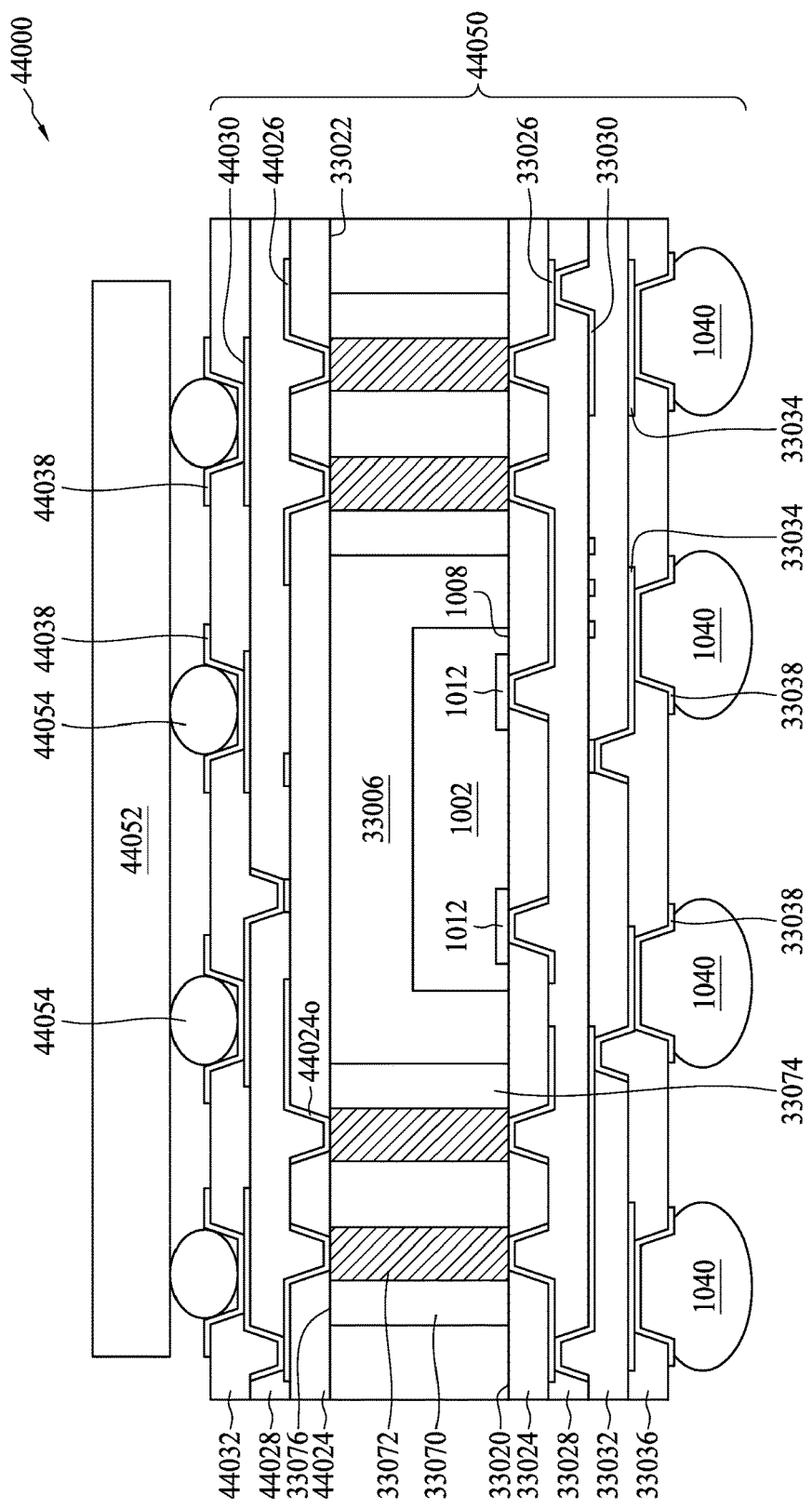
FIG. 44 shows a cross-sectional view of a stacked package assembly according to some embodiments of this disclosure.

Referring to FIG. 44, a cross-sectional view is shown of a stacked package assembly 44000 according to some embodiments of this disclosure. The stacked package assembly 44000 includes a semiconductor device package 44050 and an electronic component 44052 disposed over the semiconductor device package 44050 and electrically connected to the semiconductor device package 44050 through connectors 44054. Certain components of the stacked package assembly 44000 and interconnections between the components can be similarly implemented as explained above for the stacked package assemblies 33000, 36000, 38000, 40000, and 42000, and repetition of detailed explanation is omitted. For example and similar to the semiconductor device package 33050 shown in FIG. 33, the semiconductor device package 44050 shown in FIG. 44 also includes a redistribution stack of one or more RDLs 33026, 33030, and 33034 and one or more dielectric layers 33024, 33028, 33032, and 33036 disposed over an active surface 1008 of an electronic device 1002, lower surfaces 33074 of interposer components 33070, and a front surface 33020 of a package body 33006, and UBMs 33038 are disposed over the dielectric layer 33036 and are electrically connected to the RDL 33034 through the dielectric layer 33036. Interconnections between traces of the RDL 33026 and contact pads 1012 of the electronic device 1002 can be implemented as high density interconnections as explained in the foregoing with reference to FIG. 5, FIG. 6, FIG. 7, and FIG. 8, interconnections between traces of the RDLs 33026, 33030, and 33034 can be implemented as high density interconnections as explained in the foregoing with reference to FIG. 12, FIG. 13, FIG. 14, FIG. 15, FIG. 16, FIG. 17, and FIG. 18, interconnections between traces of the RDL 33034 and the UBMs 33038 can be implemented as high density interconnections as explained in the foregoing with reference to FIG. 21, FIG. 22, FIG. 23, and FIG. 24, and interconnections between traces of the RDL 33026 and conductive vias 33072 of the interposer components 33070 can be implemented as high density interconnections as explained in the foregoing with reference to FIG. 35.

As illustrated in FIG. 44, the semiconductor device package 44050 also includes a redistribution stack of one or more RDLs and one or more dielectric layers disposed over upper surfaces 33076 of the interposer components 33070 and a back surface 33022 of the package body 33006. As illustrated, a dielectric layer 44024 is disposed over the back surface 33022 of the package body 33006, an RDL 44026 is disposed over the dielectric layer 44024 and is electrically connected to the conductive vias 33072 of the interposer components 33070 through the dielectric layer 44024, a dielectric layer 44028 is disposed over the RDL 44026, an RDL 44030 is disposed over the dielectric layer 44028 and is electrically connected to the RDL 44026 through the dielectric layer 44028, a dielectric layer 44032 is disposed over the RDL 44030, and UBMs 44038 are disposed over the dielectric layer 44032 and are electrically connected to the RDL 44030 through the dielectric layer 44032. The electronic component 44052 is electrically connected to the UBMs 44038 through the connectors 44054. At least some traces of the RDL 44026 extend into openings 44024o in the dielectric layer 44024 to electrically connect to the conductive vias 33072 of the interposer components 33070. Certain components of the redistribution stack of the RDLs 44026 and 44030 and the dielectric layers 44024, 44028, and 44032 can be similarly implemented as explained in the foregoing, and repetition of detailed explanation is omitted. Interconnections between traces of the RDLs 44026 and 44030 can be implemented as high density interconnections as explained in the foregoing with reference to FIG. 12, FIG. 13, FIG. 14, FIG. 15, FIG. 16, FIG. 17, and FIG. 18, interconnections between traces of the RDL 44030 and the UBMs 44038 can be implemented as high density interconnections as explained in the foregoing with reference to FIG. 21, FIG. 22, FIG. 23, and FIG. 24, and interconnections between traces of the RDL 44026 and the conductive vias 33072 of the interposer components 33070 can be implemented as high density interconnections as explained in the foregoing with reference to FIG. 35. At least some high density interconnections across different layers of the semiconductor device package 44050 can be substantially aligned over one another to allow more efficient routing of signals and provide a higher overall density of signal routing circuitry within the semiconductor device package 44050.

As illustrated, the RDLs 44026 and 44030 provide electrical pathways that are routed between the conductive vias 33072 of the interposer components 33070 and the electronic component 44052, thereby increasing flexibility in an arrangement and a spacing of the UBMs 44038 that provide connections to the electronic component 44052. At least some of the connectors 44054 are disposed at least partially outside a lateral periphery of the electronic device 1002 and adjacent to a lateral periphery of the semiconductor device package 44050. It is noted that the connectors 44054, in general, can be laterally disposed within the lateral periphery of the electronic device 1002, outside of that periphery, or both, such that the semiconductor device package 44050 can have a three-dimensional fan-out configuration, a three-dimensional fan-in configuration, or a combination of a three-dimensional fan-out and a fan-in configuration.

While the two RDLs 44026 and 44030 and the three dielectric layers 44024, 44028, and 44032 are shown disposed over the back surface 33022 of the package body 33006 in FIG. 44, it is contemplated that less than two or more than two RDLs can be included, and less than three or more than three dielectric layers can be included in other embodiments. Also, although the cross-sectional view of FIG. 44 shows the one electronic device 1002 in the semiconductor device package 44050, multiple electronic devices can be included in the semiconductor device package 44050, in a similar manner to that shown, for example, in FIG. 34.

Figure 45:
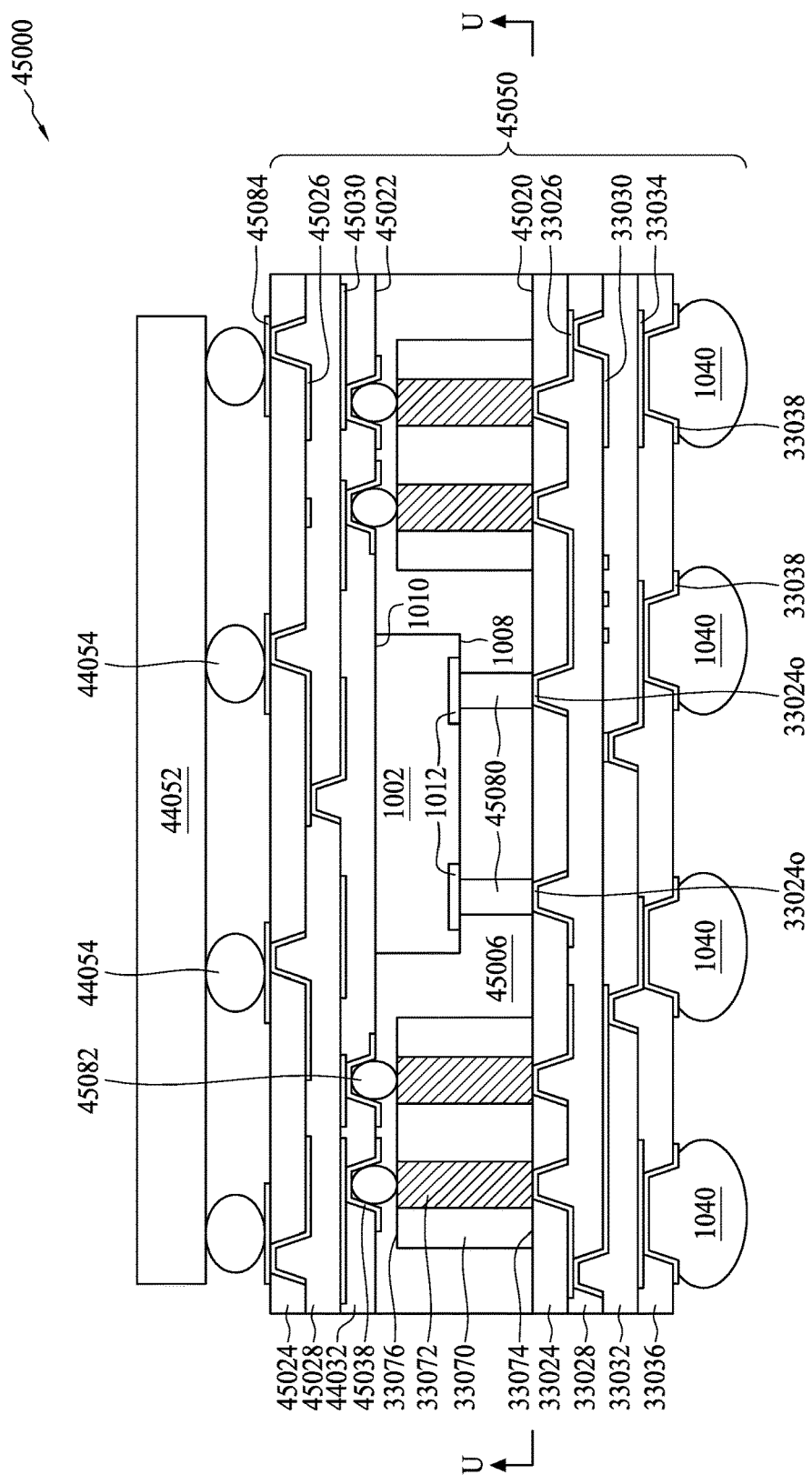
FIG. 45 shows a cross-sectional view of a stacked package assembly according to some embodiments of this disclosure.

Attention next turns to FIG. 45, which shows a cross-sectional view of a stacked package assembly 45000 according to some embodiments of this disclosure. The stacked package assembly 45000 includes a semiconductor device package 45050 and an electronic component 44052 disposed over the semiconductor device package 45050 and electrically connected to the semiconductor device package 45050 through connectors 44054. Certain components of the stacked package assembly 45000 and interconnections between the components can be similarly implemented as explained above for the stacked package assemblies 33000, 36000, 38000, 40000, 42000, and 44000, and repetition of detailed explanation is omitted. For example and similar to the semiconductor device package 33050 shown in FIG. 33, the semiconductor device package 45050 shown in FIG. 45 also includes a redistribution stack of one or more RDLs 33026, 33030, and 33034 and one or more dielectric layers 33024, 33028, 33032, and 33036 disposed over an active surface 1008 of an electronic device 1002, lower surfaces 33074 of interposer components 33070, and a front surface 45020 of a package body 45006, and UBMs 33038 are disposed over the dielectric layer 33036 and are electrically connected to the RDL 33034 through the dielectric layer 33036. Interconnections between traces of the RDLs 33026, 33030, and 33034 can be implemented as high density interconnections as explained in the foregoing with reference to FIG. 12, FIG. 13, FIG. 14, FIG. 15, FIG. 16, FIG. 17, and FIG. 18, interconnections between traces of the RDL 33034 and the UBMs 33038 can be implemented as high density interconnections as explained in the foregoing with reference to FIG. 21, FIG. 22, FIG. 23, and FIG. 24, and interconnections between traces of the RDL 33026 and conductive vias 33072 of the interposer components 33070 can be implemented as high density interconnections as explained in the foregoing with reference to FIG. 35.

As illustrated in FIG. 45, the electronic device 1002 is disposed adjacent to a back surface 45022 of the package body 45006 with its back surface 1010 exposed from the package body 45006, and the semiconductor device package 45050 includes conductive posts 45080 extending between respective contact pads 1012 of the electronic device 1002 and the front surface 45020 of the package body 45006. At least some of the traces of the RDL 33026 extend into openings 33024o in the dielectric layer 33024 to electrically connect to the electronic device 1002 through the conductive posts 45080. Interconnections between traces of the RDL 33026 and the conductive posts 45080 can be implemented as high density interconnections as explained in the foregoing with reference to FIG. 26, FIG. 27, and FIG. 28.

The semiconductor device package 45050 also includes a redistribution stack of one or more RDLs and one or more dielectric layers disposed over upper surfaces 33076 of the interposer components 33070 and the back surface 45022 of the package body 45006. Specifically, conductive pads 45084 are at least partially embedded in a dielectric layer 45024, an RDL 45026 is disposed over the dielectric layer 45024 and is electrically connected to the conductive pads 45084 through the dielectric layer 45024, a dielectric layer 45028 is disposed over the RDL 45026, an RDL 45030 is disposed over the dielectric layer 45028 and is electrically connected to the RDL 45026 through the dielectric layer 45028, a dielectric layer 45032 is disposed over the RDL 45030, and UBMs 45038 are disposed over the dielectric layer 45032 and are electrically connected to the RDL 45030 through the dielectric layer 45032. The interposer components 33070 are electrically connected to the redistribution stack by, for example, flip-chip mounting. Specifically, the semiconductor device package 45050 includes connectors 45082 extending between respective conductive vias 33072 of the interposer components 33070 and respective UBMs 45038. As illustrated, the electronic device 1002 is disposed with its back surface 1010 facing towards the UBMs 45038. Interconnections between traces of the RDLs 45026 and 45030 can be implemented as high density interconnections as explained in the foregoing with reference to FIG. 12, FIG. 13, FIG. 14, FIG. 15, FIG. 16, FIG. 17, and FIG. 18, interconnections between traces of the RDL 45030 and the UBMs 45038 can be implemented as high density interconnections as explained in the foregoing with reference to FIG. 21, FIG. 22, FIG. 23, and FIG. 24, and interconnections between traces of the RDL 45026 and the conductive pads 45084 can be implemented as high density interconnections as explained in the foregoing with reference to FIG. 30, FIG. 31, and FIG. 32. At least some high density interconnections across different layers of the semiconductor device package 45050 can be substantially aligned over one another to allow more efficient routing of signals and provide a higher overall density of signal routing circuitry within the semiconductor device package 45050.

As illustrated, the electronic component 44052 is electrically connected to the conductive pads 45084 through the connectors 44054. The RDLs 45026 and 45030 provide electrical pathways that are routed between the conductive vias 33072 of the interposer components 33070 and the electronic component 44052, thereby increasing flexibility in an arrangement and a spacing of the conductive pads 45084 that provide connections to the electronic component 44052.

Figure 46:
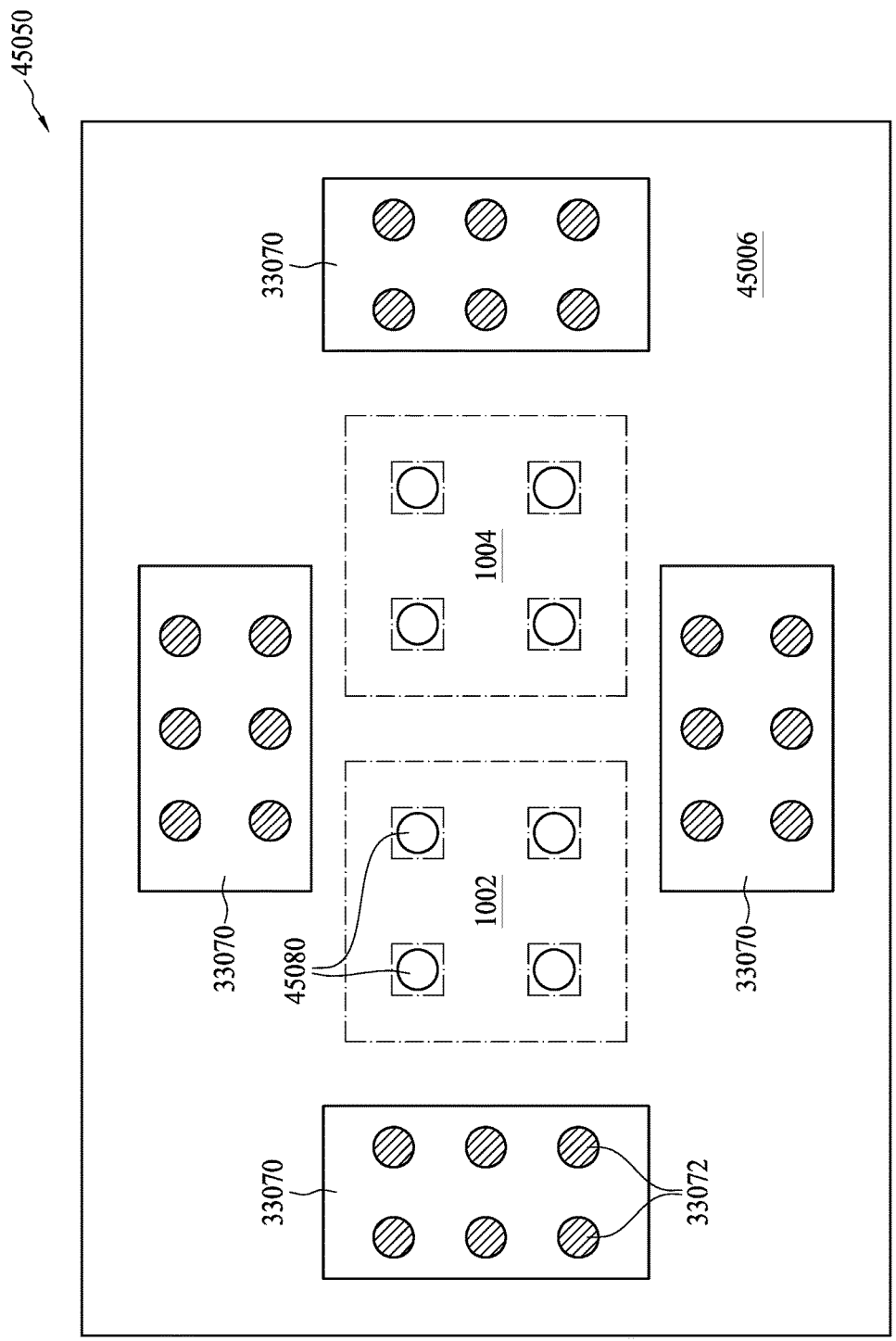
FIG. 46 is a cross-sectional view of a semiconductor device package taken along a plane U-U of FIG. 45, according to some embodiments of this disclosure.

While the two RDLs 45026 and 45030 and the three dielectric layers 45024, 45028, and 45032 are shown disposed over the back surface 45022 of the package body 45006 in FIG. 45, it is contemplated that less than two or more than two RDLs can be included, and less than three or more than three dielectric layers can be included in other embodiments. Also, although the cross-sectional view of FIG. 45 shows the one electronic device 1002 in the semiconductor device package 45050, multiple electronic devices can be included in the semiconductor device package 45050. FIG. 46 is a top cross-sectional view of the semiconductor device package 45050 taken along a plane U-U of FIG. 45, according to some embodiments of this disclosure. The cross-sectional view shows multiple electronic devices, including the electronic device 1002 and an additional electronic device 1004, and also shows the interposer components 33070 as discrete components surrounding the electronic devices 1002 and 1004 and encapsulated in the package body 45006.

Figure 47:
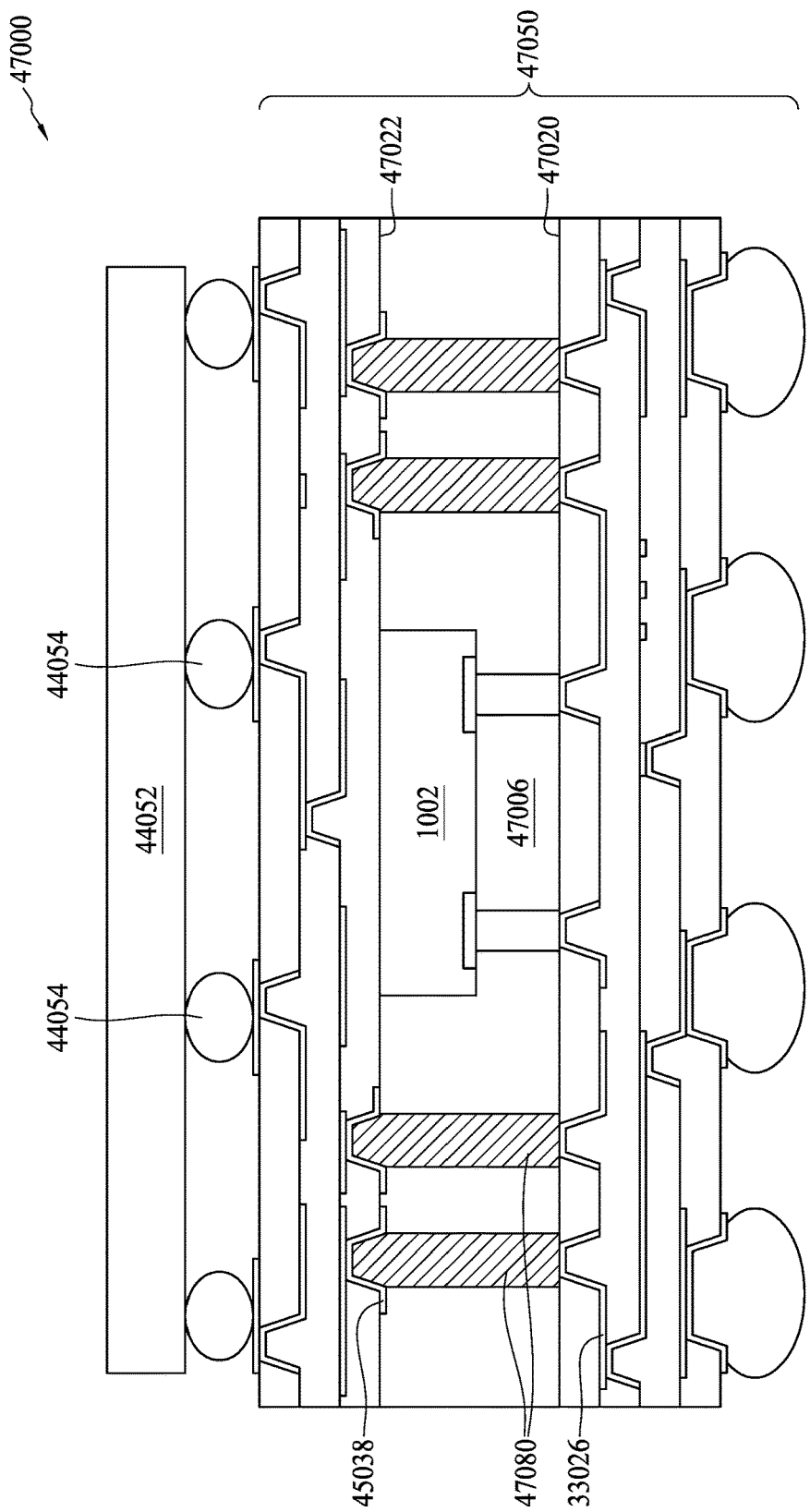
FIG. 47 shows a cross-sectional view of a stacked package assembly according to some embodiments of this disclosure.

Attention next turns to FIG. 47, which shows a cross-sectional view of a stacked package assembly 47000 according to some embodiments of this disclosure. The stacked package assembly 47000 includes a semiconductor device package 47050 and an electronic component 44052 disposed over the semiconductor device package 47050 and electrically connected to the semiconductor device package 47050 through connectors 44054. Certain components of the stacked package assembly 47000 and interconnections between the components can be similarly implemented as explained above for the stacked package assembly 45000, and repetition of detailed explanation is omitted.

As illustrated in FIG. 47 and in place of interposer components, the semiconductor device package 47050 includes conductive posts 47080 extending between a front surface 47020 of a package body 47006 and a back surface 47022 of the package body 47006. At least a portion of a terminal end of each conductive post 47080 is exposed from the front surface 47020 of the package body 47006 and is electrically connected to a trace of an RDL 33026, and an opposite terminal end of each conductive post 47080 is electrically connected to a respective UBM 45038. Interconnections between traces of the RDL 33026 and the conductive posts 47080 can be implemented as high density interconnections as explained in the foregoing with reference to FIG. 26, FIG. 27, and FIG. 28. At least some high density interconnections across different layers of the semiconductor device package 47050 can be substantially aligned over one another to allow more efficient routing of signals and provide a higher overall density of signal routing circuitry within the semiconductor device package 47050.

Although the cross-sectional view of FIG. 47 shows the one electronic device 1002 in the semiconductor device package 47050, multiple electronic devices can be included in the semiconductor device package 47050, in a similar manner as shown, for example, in FIG. 39.

Figure 48:
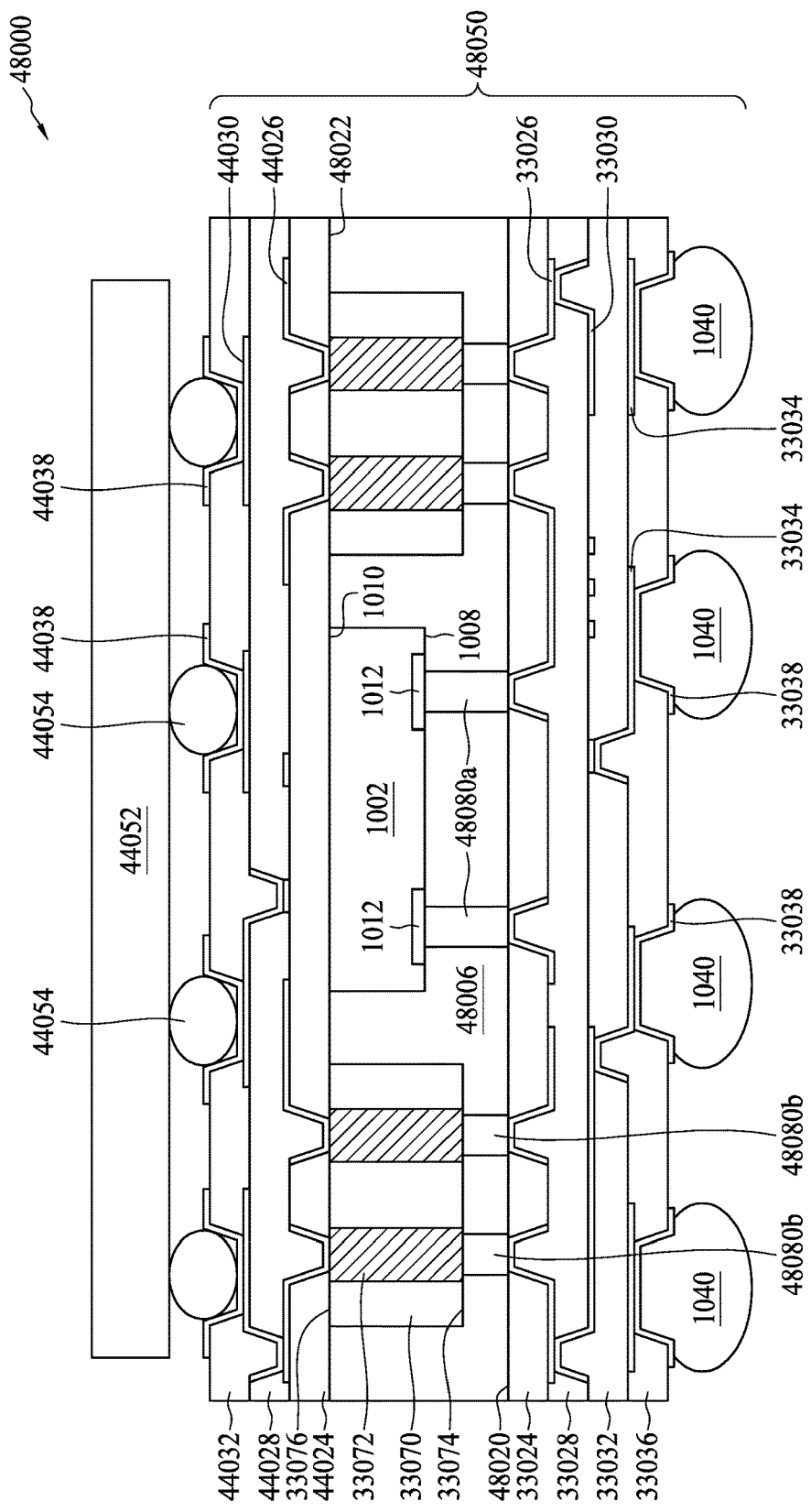
FIG. 48 shows a cross-sectional view of a stacked package assembly according to some embodiments of this disclosure.

Attention next turns to FIG. 48, which shows a cross-sectional view of a stacked package assembly 48000 according to some embodiments of this disclosure. The stacked package assembly 48000 includes a semiconductor device package 48050 and an electronic component 44052 disposed over the semiconductor device package 48050 and electrically connected to the semiconductor device package 48050 through connectors 44054. Certain components of the stacked package assembly 48000 and interconnections between the components can be similarly implemented as explained above for the stacked package assemblies 33000, 36000, 38000, 40000, 42000, 44000, 45000, and 47000, and repetition of detailed explanation is omitted. For example and similar to the semiconductor device package 44050 shown in FIG. 44, the semiconductor device package 48050 shown in FIG. 48 also includes a redistribution stack of one or more RDLs 33026, 33030, and 33034 and one or more dielectric layers 33024, 33028, 33032, and 33036 disposed over an active surface 1008 of an electronic device 1002, lower surfaces 33074 of interposer components 33070, and a front surface 48020 of a package body 48006, and UBMs 33038 are disposed over the dielectric layer 33036 and are electrically connected to the RDL 33034 through the dielectric layer 33036. Interconnections between traces of the RDLs 33026, 33030, and 33034 can be implemented as high density interconnections as explained in the foregoing with reference to FIG. 12, FIG. 13, FIG. 14, FIG. 15, FIG. 16, FIG. 17, and FIG. 18, and interconnections between traces of the RDL 33034 and the UBMs 33038 can be implemented as high density interconnections as explained in the foregoing with reference to FIG. 21, FIG. 22, FIG. 23.

Also similar to the semiconductor device package 44050 shown in FIG. 44, the semiconductor device package 48050 shown in FIG. 48 includes a redistribution stack of one or more RDLs 44026 and 44030 and one or more dielectric layers 44024, 44028, and 44032 disposed over a back surface 1010 of the electronic device 1002, upper surfaces 33076 of the interposer components 33070, and a back surface 48022 of the package body 48006. UBMs 44038 are disposed over the dielectric layer 44032 and are electrically connected to the RDL 44030 through the dielectric layer 44032, and traces of the RDL 44026 are electrically connected to conductive vias 33072 of the interposer components 33070 through the dielectric layer 44024. Interconnections between traces of the RDLs 44026 and 44030 can be implemented as high density interconnections as explained in the foregoing with reference to FIG. 12, FIG. 13, FIG. 14, FIG. 15, FIG. 16, FIG. 17, and FIG. 18, interconnections between traces of the RDL 44030 and the UBMs 44038 can be implemented as high density interconnections as explained in the foregoing with reference to FIG. 21, FIG. 22, FIG. 23, and FIG. 24, and interconnections between traces of the RDL 44026 and the conductive vias 33072 of the interposer components 33070 can be implemented as high density interconnections as explained in the foregoing with reference to FIG. 35.

As illustrated in FIG. 48, the electronic device 1002 and the interposer components 33070 are disposed adjacent to the back surface 48022 of the package body 48006 with their back surface 1010 and upper surfaces 33076 exposed from the package body 48006, and the semiconductor device package 48050 includes conductive posts 48080*a* extending between respective contact pads 1012 of the electronic device 1002 and the front surface 48020 of the package body 48006, as well as conductive posts 48080*b* extending between respective conductive vias 33072 of the interposer components 33070 and the front surface 48020 of the package body 48006. The RDL 33026 is electrically connected to the electronic device 1002 and the interposer components 33070 through the conductive posts 48080*a* and 48080*b*. Interconnections between traces of the RDL 33026 and the conductive posts 48080*a* and 48080*b* can be implemented as high density interconnections as explained in the foregoing with reference to FIG. 26, FIG. 27, and FIG. 28. At least some high density interconnections across different layers of the semiconductor device package 48050 can be substantially aligned over one another to allow more efficient routing of signals and provide a higher overall density of signal routing circuitry within the semiconductor device package 48050.

Although the cross-sectional view of FIG. 48 shows the one electronic device 1002 in the semiconductor device package 48050, multiple electronic devices can be included in the semiconductor device package 48050, in a similar manner as shown, for example, in FIG. 37.

Figure 49:
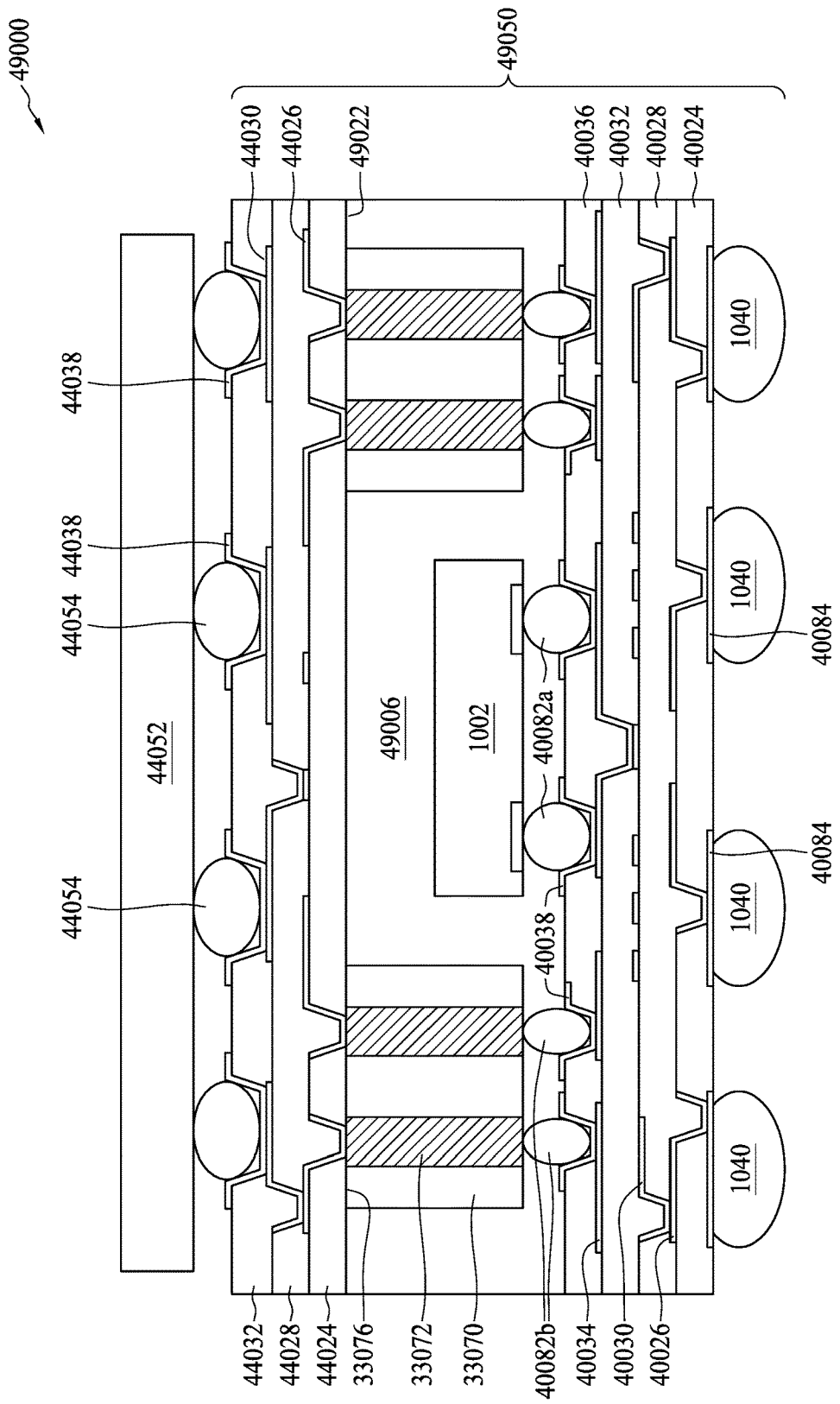
FIG. 49 shows a cross-sectional view of a stacked package assembly according to some embodiments of this disclosure.

Attention next turns to FIG. 49, which shows a cross-sectional view of a stacked package assembly 49000 according to some embodiments of this disclosure. The stacked package assembly 49000 includes a semiconductor device package 49050 and an electronic component 44052 disposed over the semiconductor device package 49050 and electrically connected to the semiconductor device package 49050 through connectors 44054. Certain components of the stacked package assembly 49000 and interconnections between the components can be similarly implemented as explained above for the stacked package assemblies 33000, 36000, 38000, 40000, 42000, 44000, 45000, 47000, and 48000, and repetition of detailed explanation is omitted. For example and similar to the semiconductor device package 40050 shown in FIG. 40, the semiconductor device package 49050 shown in FIG. 49 also includes an electronic device 1002 and interposer components 33070, which are disposed over a redistribution stack of one or more RDLs 40026, 40030, and 40034 and one or more dielectric layers 40024, 40028, 40032, and 40036, and are electrically connected to the redistribution stack by, for example, flip-chip mounting. UBMs 40038 are disposed over the dielectric layer 40036 and are electrically connected to the RDL 40034 through the dielectric layer 40036, and the electronic device 1002 and the interposer components 33070 are electrically connected to the UBMs 40038 through connectors 40082*a* and 40082*b*. The RDL 40026 is electrically connected to conductive pads 40084 that are at least partially embedded in the dielectric layer 40024. Interconnections between traces of the RDLs 40026, 40030, and 40034 can be implemented as high density interconnections as explained in the foregoing with reference to FIG. 12, FIG. 13, FIG. 14, FIG. 15, FIG. 16, FIG. 17, and FIG. 18, interconnections between traces of the RDL 40034 and the UBMs 40038 can be implemented as high density interconnections as explained in the foregoing with reference to FIG. 21, FIG. 22, FIG. 23, and FIG. 24, and interconnections between traces of the RDL 40026 and the conductive pads 40084 can be implemented as high density interconnections as explained in the foregoing with reference to FIG. 30, FIG. 31, and FIG. 32.

As illustrated in FIG. 49, the semiconductor device package 49050 also includes a redistribution stack of one or more RDLs and one or more dielectric layers disposed over upper surfaces 33076 of the interposer components 33070 and a back surface 49022 of a package body 49006. Specifically, a dielectric layer 44024 is disposed over the back surface 49022 of the package body 49006, an RDL 44026 is disposed over the dielectric layer 44024 and is electrically connected to conductive vias 33072 of the interposer components 33070 through the dielectric layer 44024, a dielectric layer 44028 is disposed over the RDL 44026, an RDL 44030 is disposed over the dielectric layer 44028 and is electrically connected to the RDL 44026 through the dielectric layer 44028, a dielectric layer 44032 is disposed over the RDL 44030, and UBMs 44038 are disposed over the dielectric layer 44032 and are electrically connected to the RDL 44030 through the dielectric layer 44032. The electronic component 44052 is electrically connected to the UBMs 44038 through the connectors 44054. Interconnections between traces of the RDLs 44026 and 44030 can be implemented as high density interconnections as explained in the foregoing with reference to FIG. 12, FIG. 13, FIG. 14, FIG. 15, FIG. 16, FIG. 17, and FIG. 18, interconnections between traces of the RDL 44030 and the UBMs 44038 can be implemented as high density interconnections as explained in the foregoing with reference to FIG. 21, FIG. 22, FIG. 23, and FIG. 24, and interconnections between traces of the RDL 44026 and the conductive vias 33072 of the interposer components 33070 can be implemented as high density interconnections as explained in the foregoing with reference to FIG. 35. At least some high density interconnections across different layers of the semiconductor device package 49050 can be substantially aligned over one another to allow more efficient routing of signals and provide a higher overall density of signal routing circuitry within the semiconductor device package 49050.

Although the cross-sectional view of FIG. 49 shows the one electronic device 1002 in the semiconductor device package 49050, multiple electronic devices can be included in the semiconductor device package 49050, in a similar manner as shown, for example, in FIG. 41.

Figure 50:
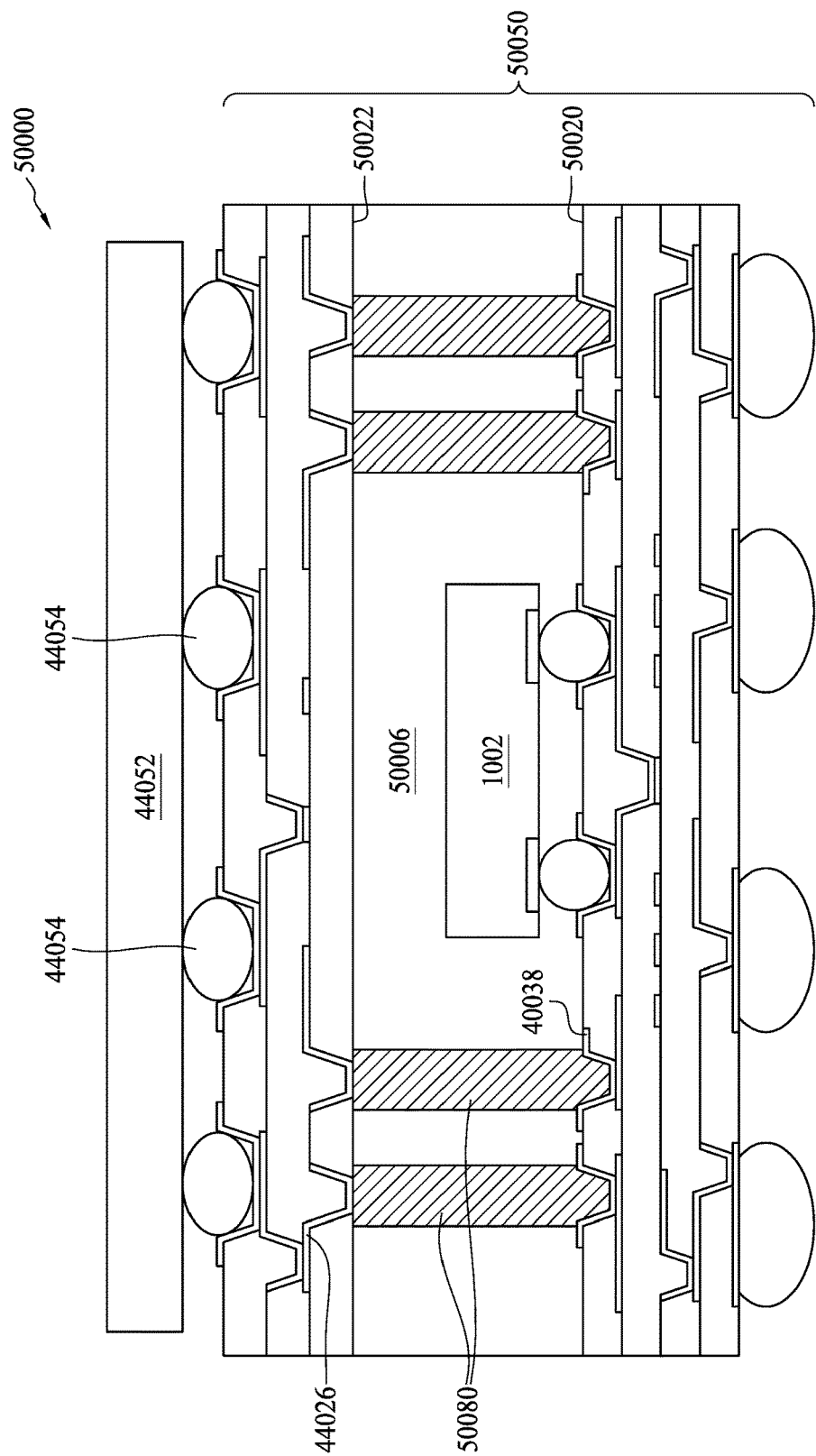
FIG. 50 shows a cross-sectional view of a stacked package assembly according to some embodiments of this disclosure.

Attention next turns to FIG. 50, which shows a cross-sectional view of a stacked package assembly 50000 according to some embodiments of this disclosure. The stacked package assembly 50000 includes a semiconductor device package 50050 and an electronic component 44052 disposed over the semiconductor device package 50050 and electrically connected to the semiconductor device package 50050 through connectors 44054. Certain components of the stacked package assembly 50000 and interconnections between the components can be similarly implemented as explained above for the stacked package 49000, and repetition of detailed explanation is omitted.

As illustrated in FIG. 50 and in place of interposer components, the semiconductor device package 50050 includes conductive posts 50080 extending between a front surface 50020 of a package body 50006 and a back surface 50022 of the package body 50006. At least a portion of a terminal end of each conductive post 50080 is exposed from the back surface 50022 of the package body 50006 and is electrically connected to a trace of an RDL 44026, and an opposite terminal end of each conductive post 50080 is electrically connected to a respective UBM 40038. Interconnections between traces of the RDL 44026 and the conductive posts 50080 can be implemented as high density interconnections as explained in the foregoing with reference to FIG. 26, FIG. 27, and FIG. 28. At least some high density interconnections across different layers of the semiconductor device package 50050 can be substantially aligned over one another to allow more efficient routing of signals and provide a higher overall density of signal routing circuitry within the semiconductor device package 50050.

Although the cross-sectional view of FIG. 50 shows one electronic device 1002 in the semiconductor device package 50050, multiple electronic devices can be included in the semiconductor device package 50050, in a similar manner as shown, for example, in FIG. 43.

Additional embodiments of this disclosure are directed to manufacturing processes of semiconductor device packages including high density interconnections. In some embodiments, high density interconnections are attained by forming traces extending into or through dielectric openings with capture pads omitted. The formation of such interconnections is carried out in manufacturing processes including wafer-level packaging processes and fan-out or fan-in packaging processes.

FIG. 51A through FIG. 51H show a sequence of stages of a manufacturing process of a semiconductor device package, according to some embodiments of this disclosure. The manufacturing process can be referred to as a "chip first, face down" process. The following manufacturing operations are explained with reference to the semiconductor device package 1000 of FIG. 1. However, it is contemplated that the manufacturing operations can be similarly carried out to form other semiconductor device packages that are differently configured. In addition, it is contemplated that the manufacturing operations can form an array of connected semiconductor device packages that can be separated, such as through singulation, to form multiple individual semiconductor device packages.

Figure 51A:
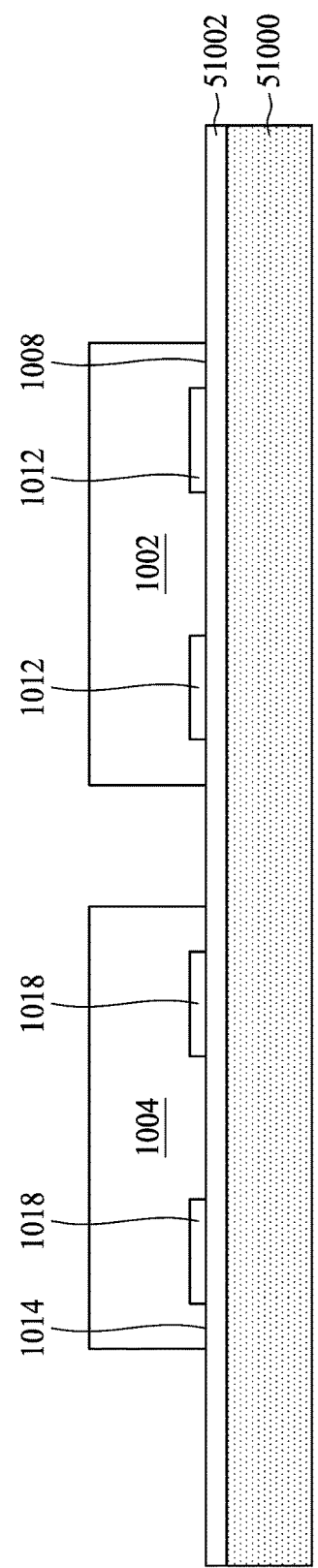
FIG. 51A, FIG. 51B, FIG. 51C, FIG. 51D, FIG. 51E, FIG. 51F, FIG. 51G, and FIG. 51H show a sequence of stages of a manufacturing process of a semiconductor device package, according to some embodiments of this disclosure.

As shown in FIG. 51A, a carrier 51000 and an adhesive layer 51002 disposed over the carrier 51000 are provided. The carrier 51000 can be any of a variety of suitable carriers, such as wafers or panels. Next, electronic devices 1002 and 1004 are disposed over the carrier 51000 and are affixed to the adhesive layer 51002 with their active surfaces 1008 and 1014 facing the adhesive layer 51002. The electronic device 1002 includes contact pads 1012 adjacent to the active surface 1008, and the electronic device 1004 includes contact pads 1018 adjacent to the active surface 1014. Positioning of the electronic devices 1002 and 1004 over the adhesive layer 51002 can be performed using, for example, a pick-and-place equipment or a die-attach equipment.

Figure 51B:
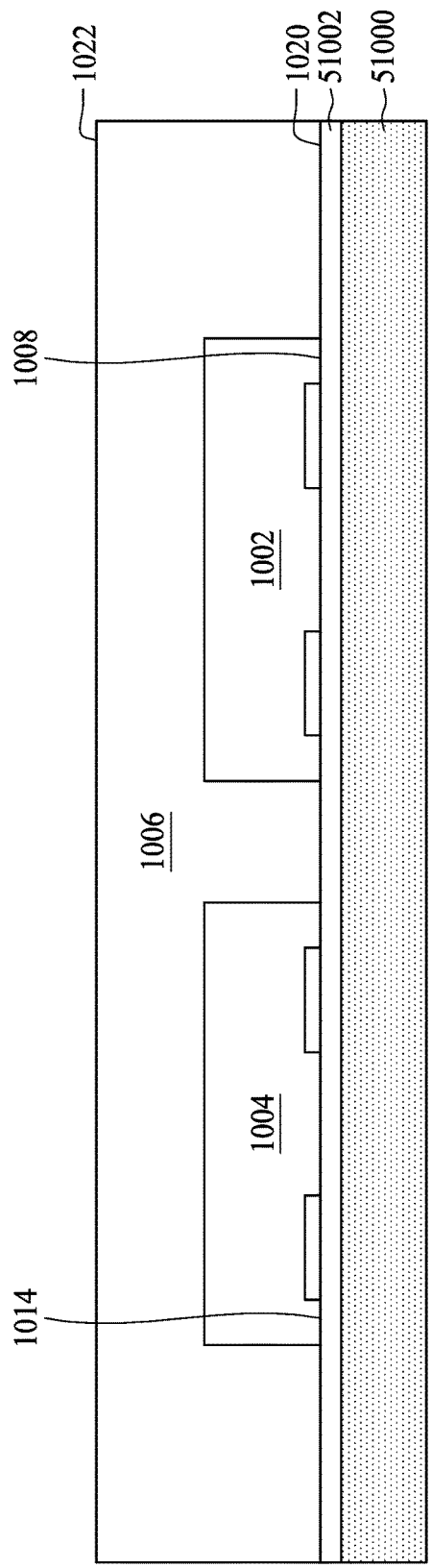

Next and referring to FIG. 51B, a package body 1006 is formed to cover or encapsulate the electronic devices 1002 and 1004, with their active surfaces 1008 and 1014 at least partially exposed from or uncovered by the package body 1006. The package body 1006 can be formed from, or can include, a molding material, and can be formed using any of a variety of molding techniques, such as transfer molding, injection molding, or compression molding. The package body 1006 includes a front surface 1020 and a back surface 1022 opposite to the front surface 1020.

Figure 51C:
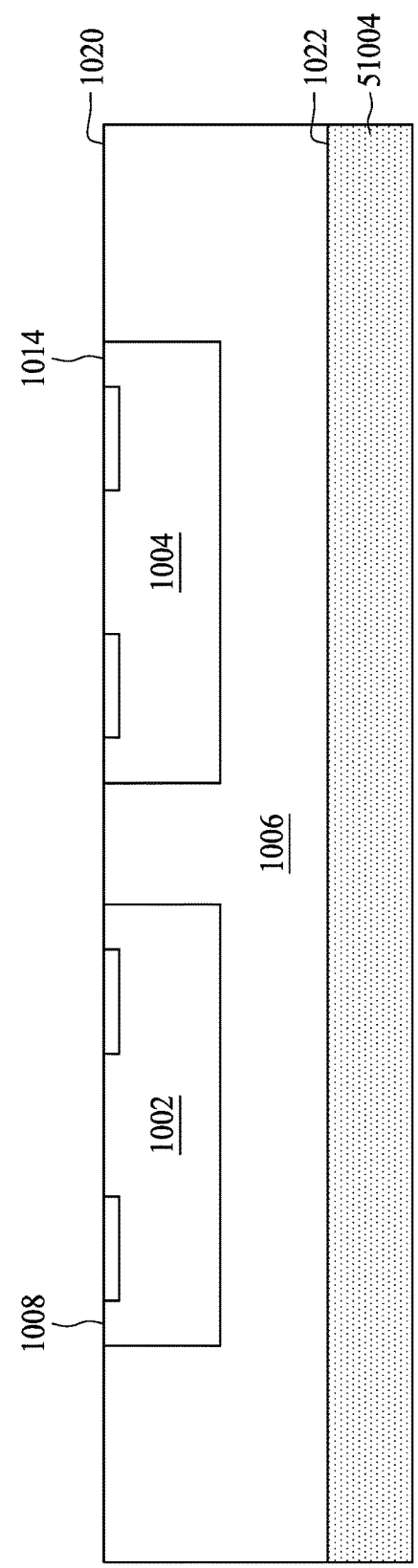

Next and referring to FIG. 51C, the package body 1006 along with the encapsulated electronic devices 1002 and 1004 are separated from the carrier 51000 and the adhesive layer 51002, and are reoriented and disposed over a carrier 51004, with the active surfaces 1008 and 1014 of the electronic devices 1002 and 1004 facing away from the carrier 51004, and the back surface 1022 of the package body 1006 facing the carrier 51004.

Next, a redistribution stack is formed over the active surfaces 1008 and 1014 of the electronic devices 1002 and 1004 and the front surface 1020 of the package body 1006.

Figure 51D:
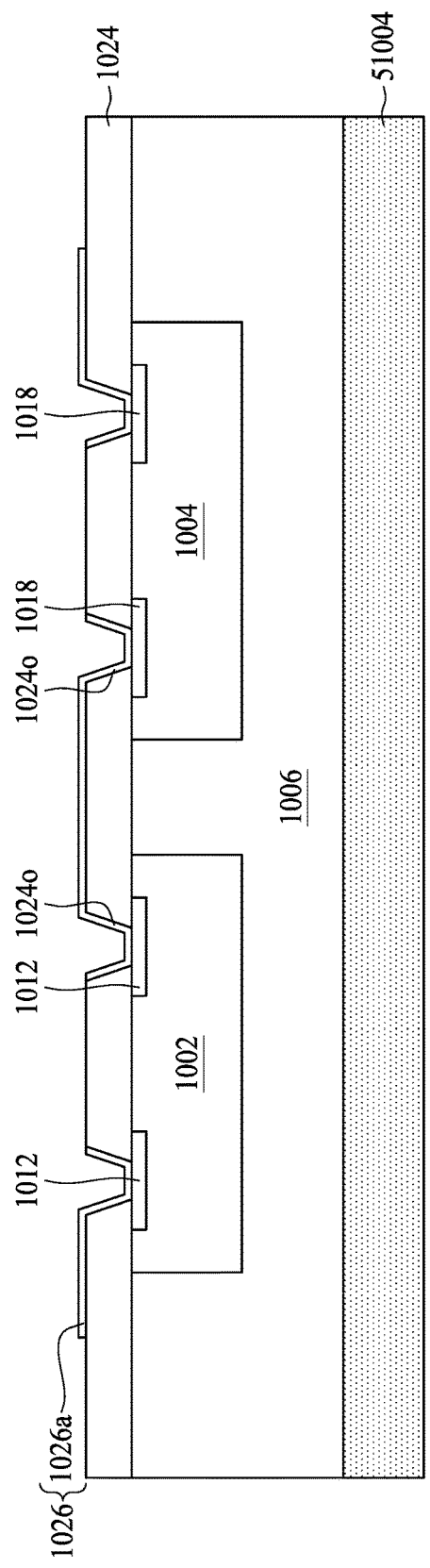

As shown in FIG. 51D, a dielectric layer 1024 is formed over the electronic devices 1002 and 1004 and the package body 1006, and an RDL 1026 is formed over the dielectric layer 1024. The RDL 1026 includes multiple traces, including a trace 1026a, and at least some of the traces of the RDL 1026 extend into openings 1024o in the dielectric layer 1024 to electrically connect to the contact pads 1012 and 1018 of the electronic devices 1002 and 1004 to provide high density contact pad-to-RDL interconnections. The RDL 1026 can be formed from, or can include, copper, a copper alloy, or another metal, another metal alloy, or another combination of metals or other conductive materials. The dielectric layer 1024 can be formed from, or can include, a dielectric material that is polymeric or non-polymeric. For example, the dielectric layer 1024 can be formed from polyimide, polybenzoxazole, a benzocyclobutene-based polymer, or a combination thereof. For certain embodiments, the dielectric layer 1024 can be formed from a dielectric material that is photoimageable or photoactive, or from a printable dielectric material.

Attention next turns to FIG. 52A through FIG. 52J, which show a sequence of stages of forming a high density contact pad-to-RDL interconnection according to some embodiments of this disclosure. For ease of presentation, the following manufacturing operations are explained with reference to an interconnection between the contact pad 1012 and the trace 1026a. However, it is contemplated that the manufacturing operations can be similarly carried out to form interconnections between additional traces of the RDL 1026 and the contact pads 1012 and 1018 of the electronic devices 1002 and 1004.

Figure 52A:
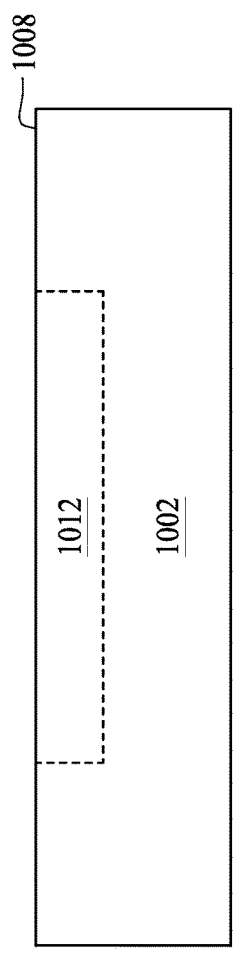
Figure 52B:
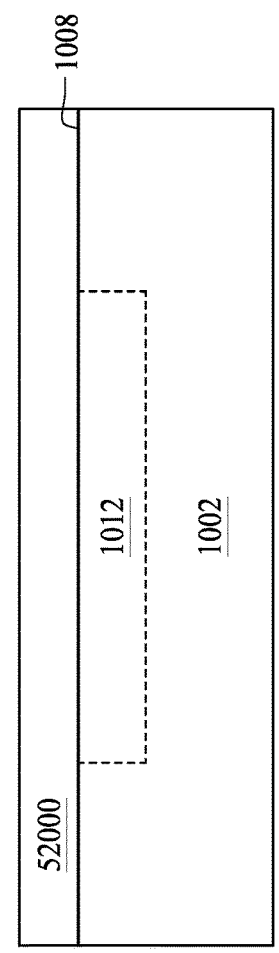

As shown in FIG. 52A, the electronic device 1002 is provided and includes the contact pad 1012 adjacent to its active surface 1008. Next and referring to FIG. 52B, a dielectric layer 52000 is formed over the active surface 1008 of the electronic device 1002. The dielectric layer 52000 can be formed by applying a dielectric material using any of a variety of coating or deposition techniques, such as spinning or spraying.

Figure 52C:
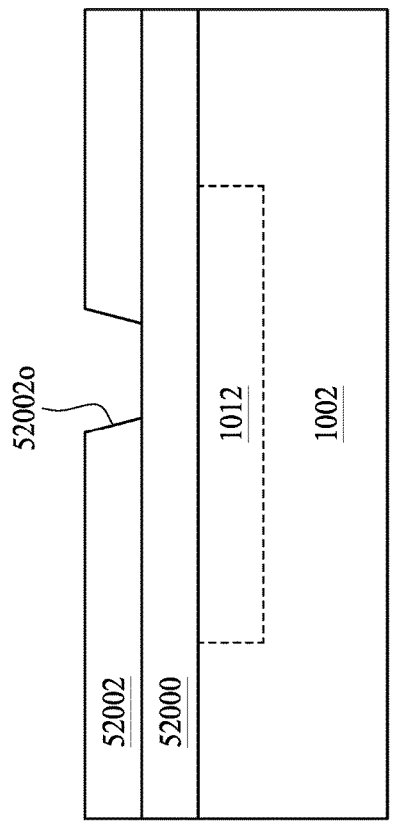

Next and referring to FIG. 52C, a patterned photoresist layer 52002 is formed over the dielectric layer 52000 and defines an opening 52002o aligned with the contact pad 1012. The patterned photoresist layer 52002 can be formed by applying a photoresist, followed by photolithography to form the opening 52002o in the patterned photoresist layer 52002.

Figure 52D:
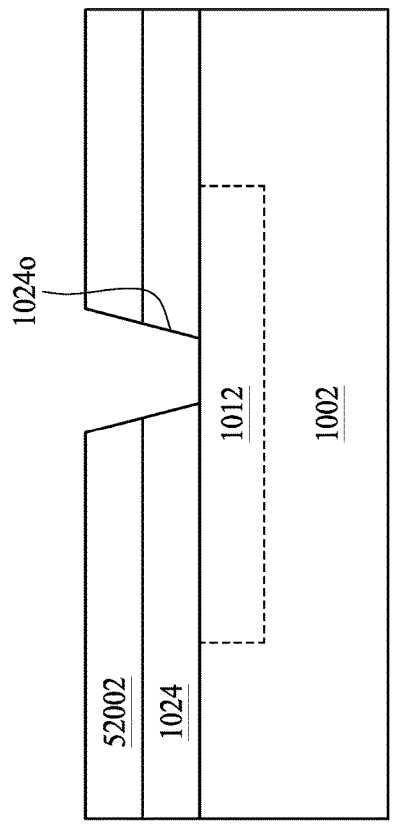

Etching of the dielectric layer 52000 is performed using the patterned photoresist layer 52002 as a mask, thereby forming the dielectric layer 1024 and the opening 1024o in the dielectric layer 1024 as shown in FIG. 52D. Etching of the dielectric layer 52000 can be performed using dry etching or another suitable material removal technique. The opening 1024o formed in the dielectric layer 1024 exposes a portion of the contact pad 1012. For certain embodiments, the dielectric layer 1024 can be formed from a dielectric material that is photoimageable or photoactive, and can be patterned to form the opening 1024o by exposure to light through an optical mask, without requiring the patterned photoresist layer 52002. In such embodiments, the dielectric layer 1024 can be formed by directly patterning the dielectric layer 52000 and omitting the stages shown in FIG. 52C and FIG. 52D.

As shown in FIG. 52E, the patterned photoresist layer 52002 is removed by stripping, and next, as shown in FIG. 52F, a seed layer 52004 is formed over the dielectric layer 1024 and extends into the opening 1024o and is formed over the exposed portion of the contact pad 1012. The seed layer 52004 can be formed from, or can include, titanium, copper, a combination of titanium and copper, or another metal, a metal alloy, or another combination of metals or other conductive materials, and can be formed by sputtering or another suitable deposition technique.

Figure 52G:
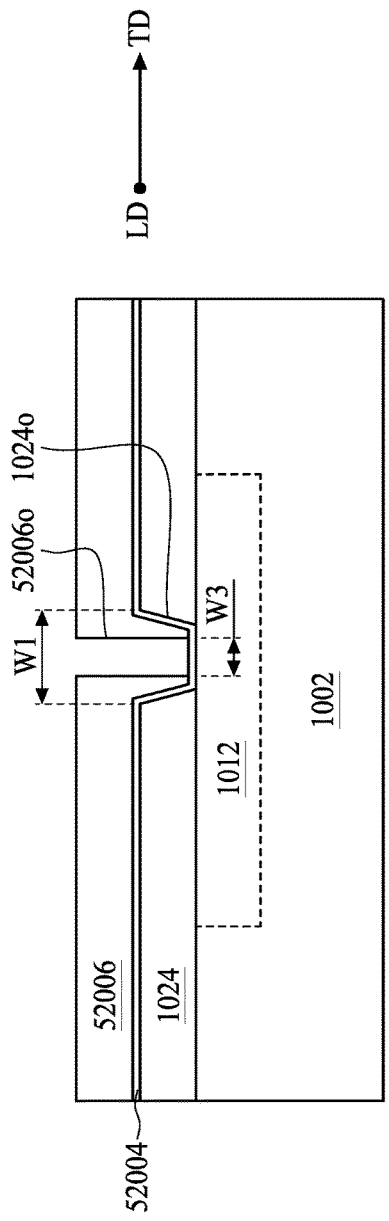

Next and referring to FIG. 52G, a patterned photoresist layer 52006 is formed over the seed layer 52004 and defines an opening 52006o aligned with the opening 1024o. The patterned photoresist layer 52006 can be formed by applying a photoresist, followed by photolithography to form the opening 52006o in the patterned photoresist layer 52006. As shown in FIG. 52G, the opening 1024o has a maximum width w1 along a transverse direction TD, the opening 52006o has a maximum width w3 along the transverse direction TD, and the maximum width w3 of the opening 52006o is no greater than or less than the maximum width w1 of the opening 1024o. In some embodiments, the maximum width w3 of the opening 52006o is no greater than about 9/10, no greater than about 4/5, no greater than about 7/10, no greater than about 3/5, no greater than about 1/2, no greater than about 2/5, or no greater than about 1/3 of the maximum width w1 of the opening 1024o.

Figure 52H:
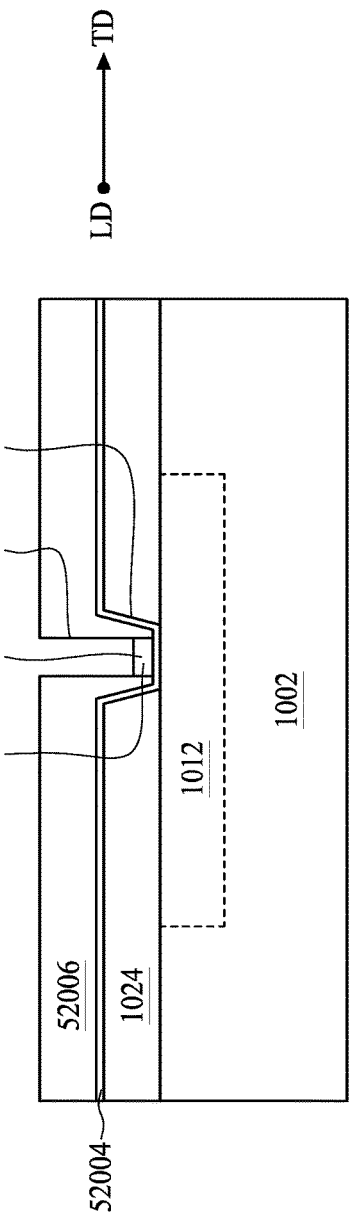

Next and referring to FIG. 52H, the trace 1026a is formed in the opening 52006o of the patterned photoresist layer 52006 and includes a portion 5004 extending into the opening 1024o of the dielectric layer 1024. The trace 1026a can be formed by plating or another suitable deposition technique.

As shown in FIG. 52I, the patterned photoresist layer 52006 is removed by stripping, and, next, exposed portions of the seed layer 52004 are removed by etching or another suitable material removal technique. A remaining portion of the seed layer 52004 disposed below the trace 1026a can be considered to be a part of the trace 1026a in some embodiments. Referring to FIG. 52I, the portion 5004 of the trace 1026a in the opening 1024o has the maximum width w3 along the transverse direction TD which is no greater than or less than the maximum width w1 of the opening 1024o along the transverse direction TD. As illustrated, the portion 5004 of the trace 1026a is disposed between and spaced from opposing sidewalls of the dielectric layer 1024 forming the opening 1024o. In some embodiments, the maximum width w3 of the portion 5004 is no greater than about 9/10, no greater than about 4/5, no greater than about 7/10, no greater than about 3/5, no greater than about 1/2, no greater than about 2/5, or no greater than about 1/3 of the maximum width w1 of the opening 1024o. FIG. 52J shows another cross-sectional view of the resulting contact pad-to-RDL interconnection taken along a longitudinal direction LD orthogonal to the transverse direction TD. As illustrated, the trace 1026a includes a portion 5002 extending over the dielectric layer 1024 along the longitudinal direction LD adjacent to the opening 1024o, and the portion 5004 in the opening 1024o and extending between the portion 5002 and the exposed portion of the contact pad 1012.

Figure 51E:
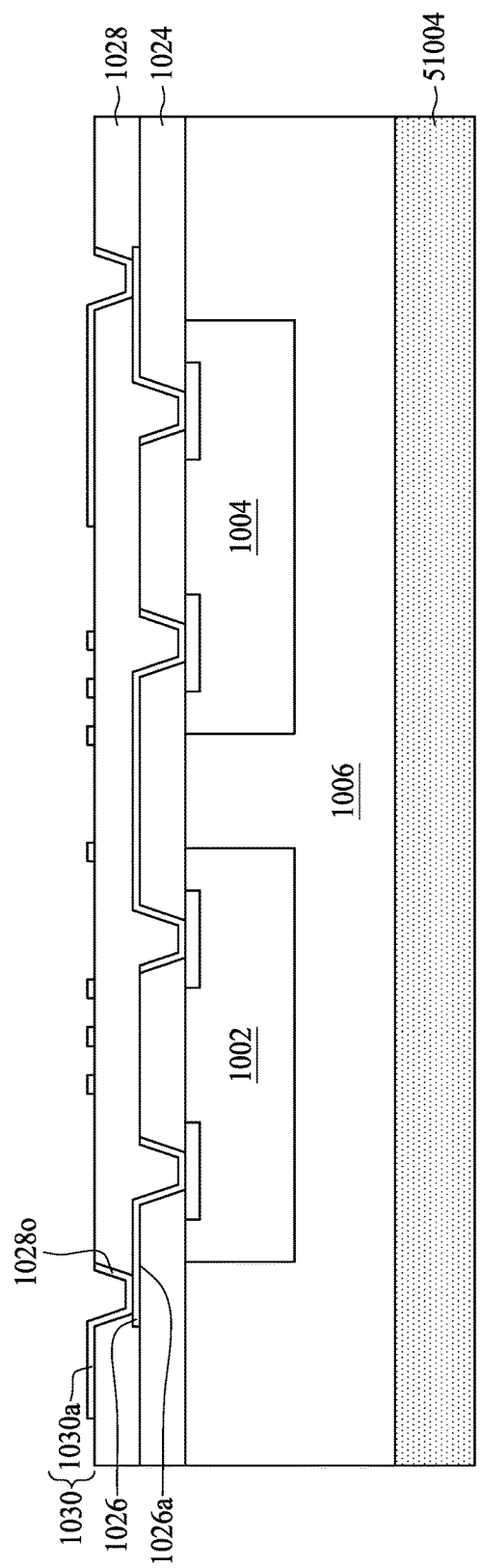

Formation of the redistribution stack next continues with reference to FIG. 51E. As illustrated, a dielectric layer 1028 is formed over the RDL 1026 and the dielectric layer 1024, and an RDL 1030 is formed over the dielectric layer 1028. The RDL 1030 includes multiple traces, including a trace 1030a, and at least some of the traces of the RDL 1030 extend into openings 1028o in the dielectric layer 1028 to electrically connect to the traces of the RDL 1026 to provide high density RDL-to-RDL interconnections. The RDL 1030 and the dielectric layer 1028 can be formed from similar materials as explained above for the RDL 1026 and the dielectric layer 1024.

Attention next turns to FIG. 53A through FIG. 53H, which show a sequence of stages of forming a high density RDL-to-RDL interconnection according to some embodiments of this disclosure. For ease of presentation, the following manufacturing operations are explained with reference to an interconnection between the trace 1030a and the trace 1026a. However, it is contemplated that the manufacturing operations can be similarly carried out to form additional interconnections between traces of the RDLs 1026 and 1030.

Figure 53C:
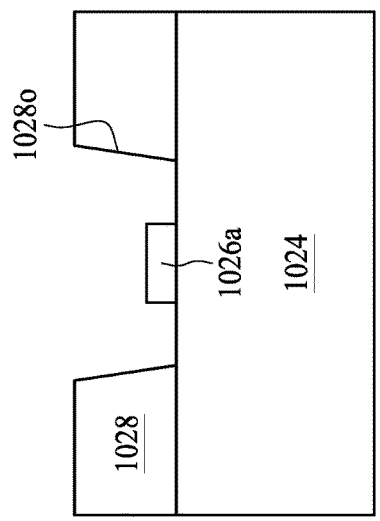

As shown in FIG. 53A, the trace 1026a extends over the dielectric layer 1024. Next and referring to FIG. 53B, a dielectric layer 53000 is formed over the trace 1026a and the dielectric layer 1024. The dielectric layer 53000 can be formed by applying a dielectric material using any of a variety of coating or deposition techniques, such as spinning or spraying. The dielectric layer 53000 is next patterned to form the dielectric layer 1028 and the opening 1028o in the dielectric layer 1028, as shown in FIG. 53C. The opening 1028o formed in the dielectric layer 1028 exposes a portion of the trace 1026a. Patterning of the dielectric layer 53000 can be performed by etching using a patterned photoresist layer as a mask, or by direct patterning of a dielectric material that is photoimageable or photoactive.

Figure 53D:
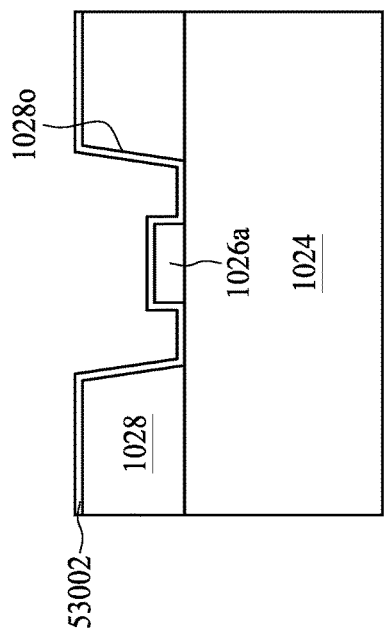

Next, as shown in FIG. 53D, a seed layer 53002 is formed over the dielectric layer 1028 and extends into the opening 1028o and is formed over the exposed portion of the trace 1026a. The seed layer 53002 can be formed from, or can include, titanium, copper, a combination of titanium and copper, or another metal, a metal alloy, or another combination of metals or other conductive materials, and can be formed by sputtering or another suitable deposition technique.

Figure 53E:
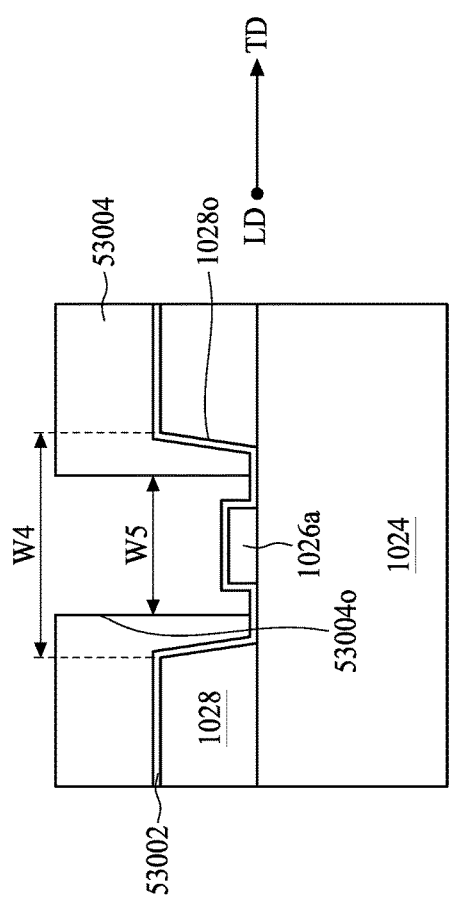

Next and referring to FIG. 53E, a patterned photoresist layer 53004 is formed over the seed layer 53002 and defines an opening 53004o aligned with the opening 1028o. The patterned photoresist layer 53004 can be formed by applying a photoresist, followed by photolithography to form the opening 53004o in the patterned photoresist layer 53004. As shown in FIG. 53E, the opening 1028o has a maximum width w4 along a transverse direction TD, the opening 53004o has a maximum width w5 along the transverse direction TD, and the maximum width w5 of the opening 53004o is no greater than or less than the maximum width w4 of the opening 1028o. In some embodiments, the maximum width w5 of the opening 53004o is no greater than about 9/10, no greater than about 4/5, no greater than about 7/10, no greater than about 3/5, no greater than about 1/2, no greater than about 2/5, or no greater than about 1/3 of the maximum width w4 of the opening 1028o.

Figure 53F:
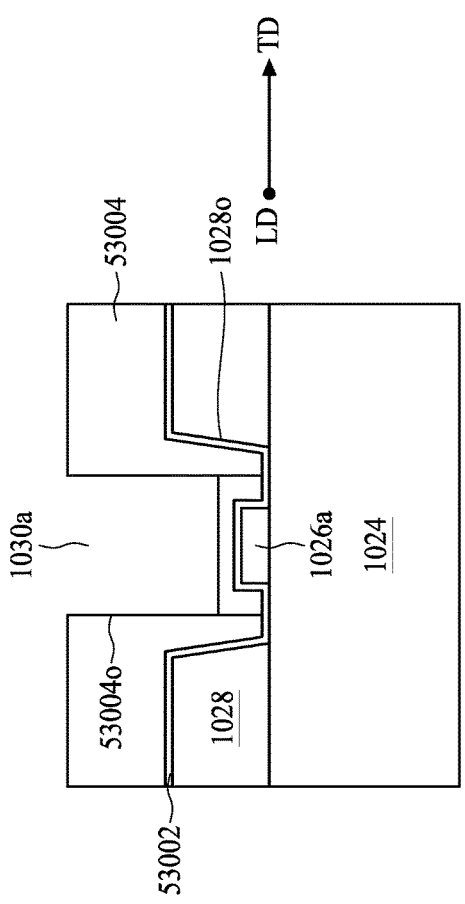

Next and referring to FIG. 53F, the trace 1030a is formed in the opening 53004o of the patterned photoresist layer 53004 and includes a portion 1204 extending into the opening 1028o of the dielectric layer 1028. The trace 1030a can be formed by plating or another suitable deposition technique.

Figure 53G:
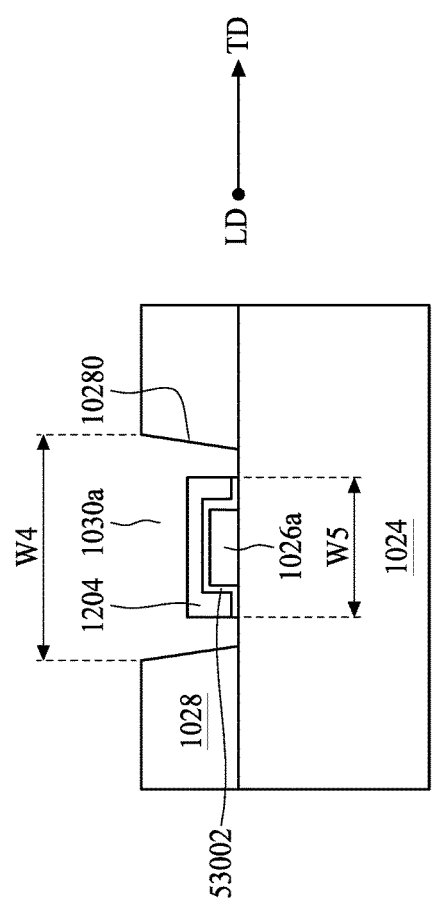
Figure 53H:
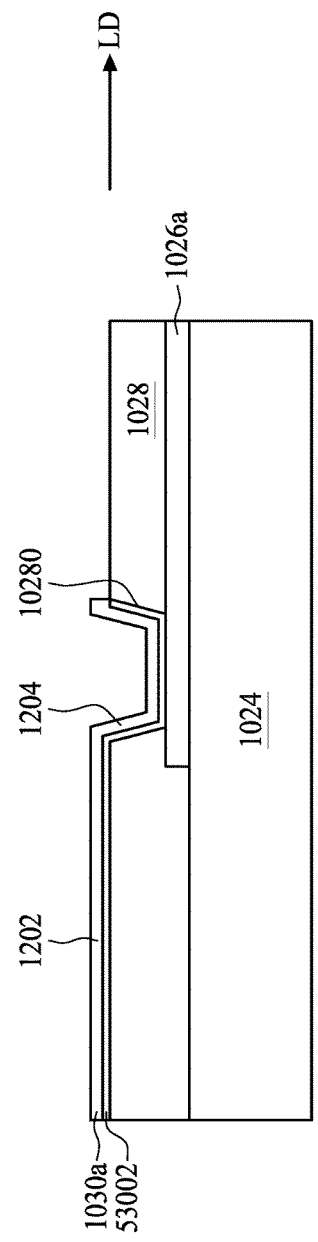

As shown in FIG. 53G, the patterned photoresist layer 53004 is removed by stripping, and, next, exposed portions of the seed layer 53002 are removed by etching or another suitable material removal technique. A remaining portion of the seed layer 53002 disposed below the trace 1030a can be considered to be a part of the trace 1030a in some embodiments. Referring to FIG. 53G, the portion 1204 of the trace 1030a in the opening 1028o has the maximum width w5 along the transverse direction TD which is no greater than or less than the maximum width w4 of the opening 1028o along the transverse direction TD. As illustrated, the portion 1204 of the trace 1030*a* is disposed between and spaced from opposing sidewalls of the dielectric layer 1028 forming the opening 1028*o*. In some embodiments, the maximum width w5 of the portion 1204 is no greater than about ⁹⁄₁₀, no greater than about ⅘, no greater than about ⁷⁄₁₀, no greater than about ⅗, no greater than about ½, no greater than about ⅖, or no greater than about ⅓ of the maximum width w4 of the opening 1028*o*. FIG. 53H shows another cross-sectional view of the resulting RDL-to-RDL interconnection taken along a longitudinal direction LD orthogonal to the transverse direction TD. As illustrated, the trace 1030*a* includes a portion 1202 extending over the dielectric layer 1028 along the longitudinal direction LD adjacent to the opening 1028*o*, and the portion 1204 in the opening 1028*o* and extending between the portion 1202 and the exposed portion of the trace 1026*a*.

Figure 51F:
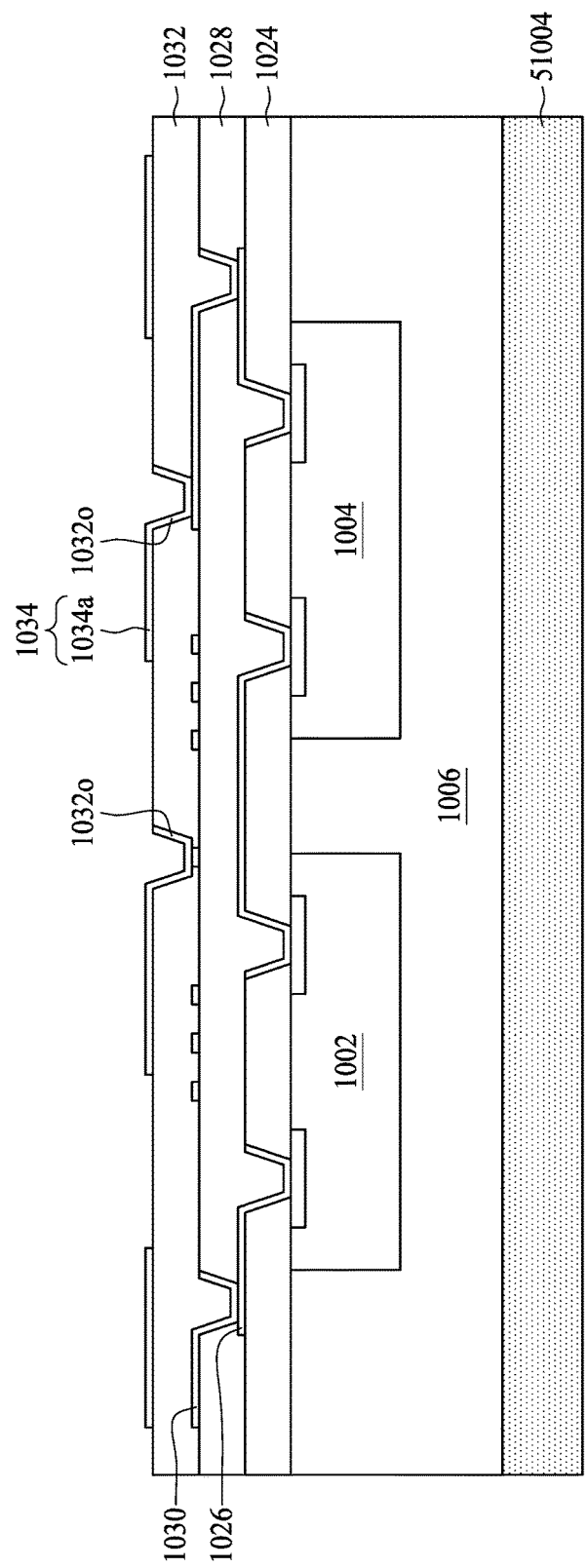

Formation of the redistribution stack next continues with reference to FIG. 51F. As illustrated, a dielectric layer 1032 is formed over the RDL 1030 and the dielectric layer 1028, and an RDL 1034 is formed over the dielectric layer 1032. The RDL 1034 includes multiple traces, including a trace 1034*a*, and at least some of the traces of the RDL 1034 extend into openings 1032*o* in the dielectric layer 1032 to electrically connect to the traces of the RDL 1030 to provide high density RDL-to-RDL interconnections. Formation of such RDL-to-RDL interconnections can be performed similarly as explained in the foregoing with reference to FIG. 53A through FIG. 53H. The RDL 1034 and the dielectric layer 1032 can be formed from similar materials as explained above for the RDL 1026 and the dielectric layer 1024.

Figure 51G:
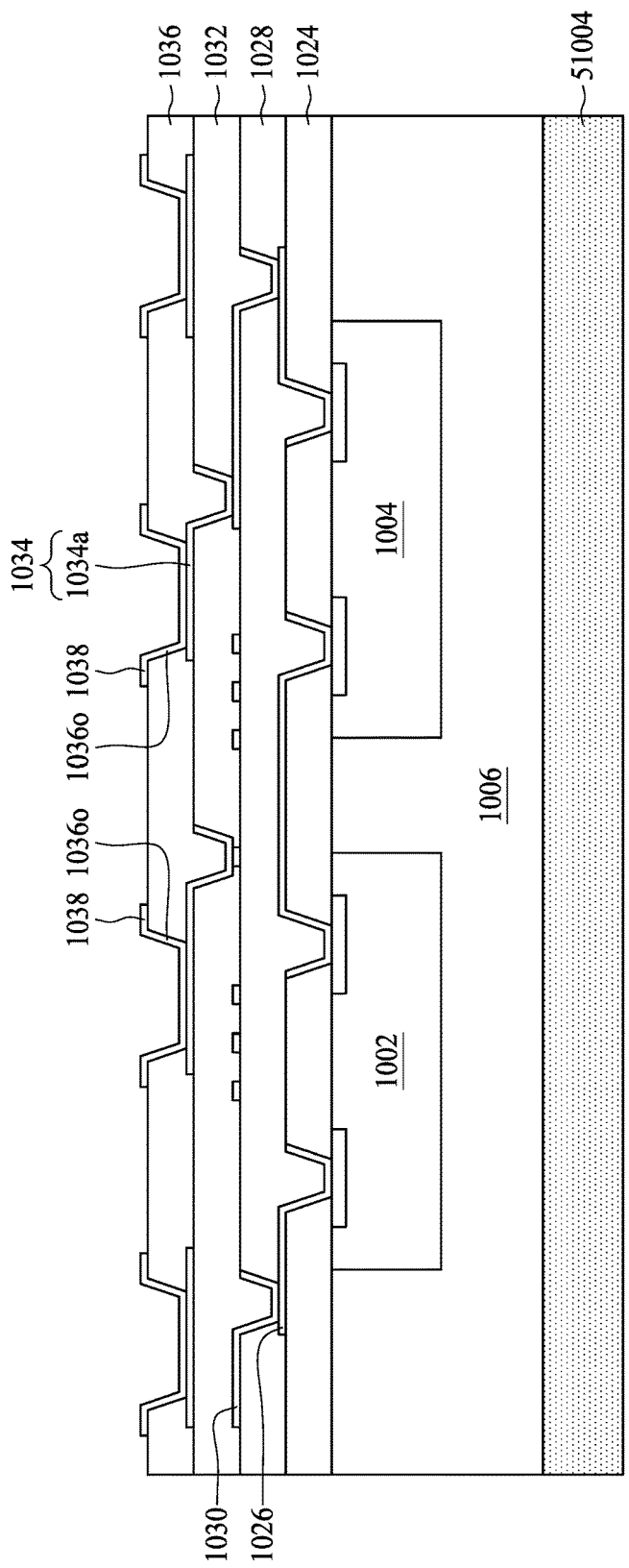

Referring next to FIG. 51G, a dielectric layer 1036 is formed over the RDL 1034 and the dielectric layer 1032, and UBMs 1038 are formed over the dielectric layer 1036 and extend into openings 1036*o* in the dielectric layer 1036 to electrically connect to the traces of the RDL 1034 to provide high density RDL-to-UBM interconnections. The dielectric layer 1036 can be formed from similar materials as explained above for the dielectric layer 1024. The UBMs 1038 can be formed from, or can include, a metal, a metal alloy, or another combination of metals or other conductive materials.

Attention next turns to FIG. 54A through FIG. 54G, which show a sequence of stages of forming a high density RDL-to-UBM interconnection according to some embodiments of this disclosure. For ease of presentation, the following manufacturing operations are explained with reference to an interconnection between the trace 1034*a* and the UBM 1038. However, it is contemplated that the manufacturing operations can be similarly carried out to form interconnections between additional traces of the RDL 1034 and the UBMs 1038.

Figure 54A:
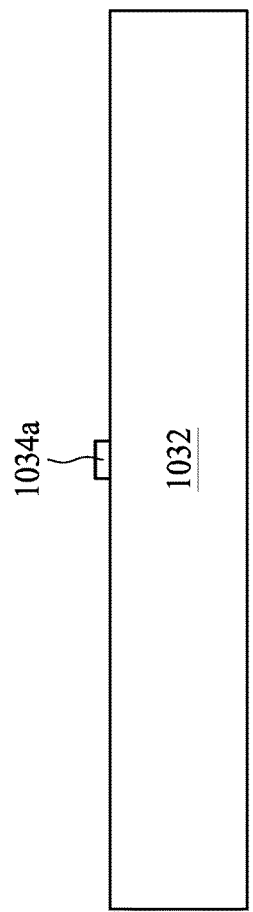
FIG. 54A, FIG. 54B, FIG. 54C, FIG. 54D, FIG. 54E, FIG. 54F, and FIG. 54G show a sequence of stages of forming a high density RDL-to-UBM interconnection according to some embodiments of this disclosure.
Figure 54B:
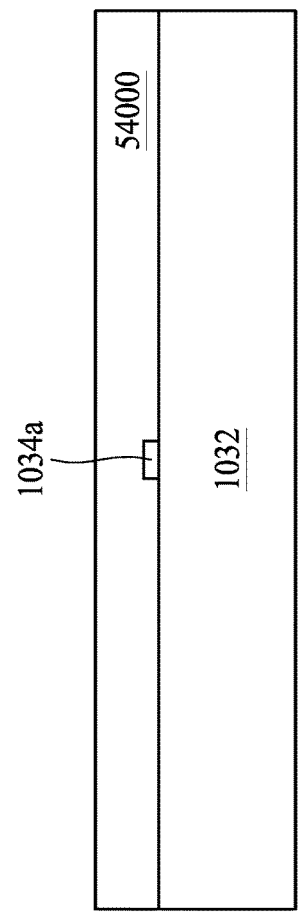
Figure 54C:
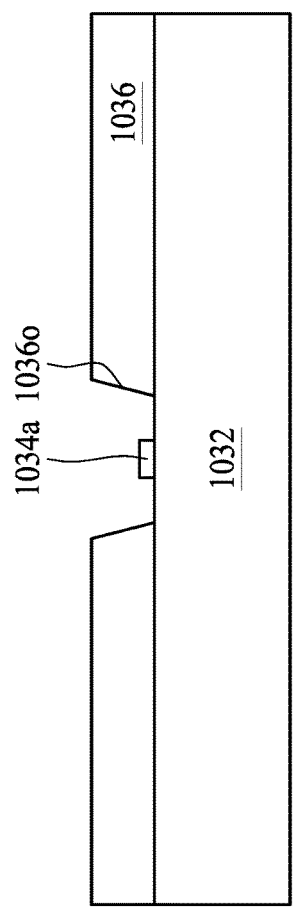

As shown in FIG. 54A, the trace 1034*a* extends over the dielectric layer 1032. Next and referring to FIG. 54B, a dielectric layer 54000 is formed over the trace 1034*a* and the dielectric layer 1032. The dielectric layer 54000 can be formed by applying a dielectric material using any of a variety of coating or deposition techniques, such as spinning or spraying. The dielectric layer 54000 is next patterned to form the dielectric layer 1036 and the opening 1036*o* in the dielectric layer 1036, as shown in FIG. 54C. The opening 1036*o* formed in the dielectric layer 1036 exposes a portion of the trace 1034*a*. Patterning of the dielectric layer 54000 can be performed by etching using a patterned photoresist layer as a mask, or by direct patterning of a dielectric material that is photoimageable or photoactive. As illustrated, the exposed portion of the trace 1034*a* is disposed between and spaced from opposing sidewalls of the dielectric layer 1036 forming the opening 1036*o*.

Figure 54D:
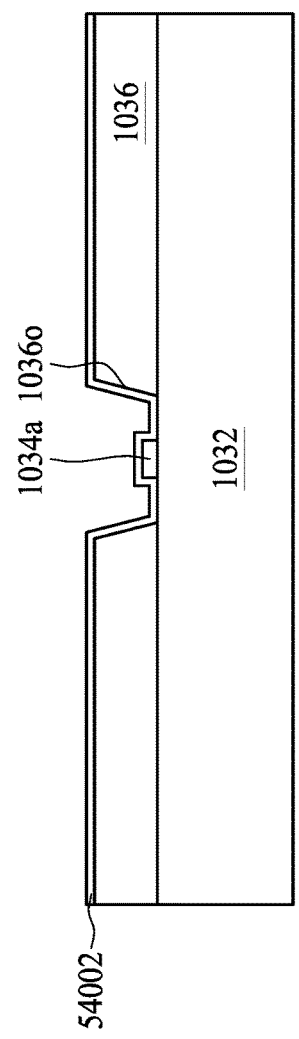

Next, as shown in FIG. 54D, a seed layer 54002 is formed over the dielectric layer 1036 and extends into the opening 1036*o* and is formed over the exposed portion of the trace 1034*a*. The seed layer 54002 can be formed from, or can include, titanium, copper, a combination of titanium and copper, or another metal, a metal alloy, or another combination of metals or other conductive materials, and can be formed by sputtering or another suitable deposition technique.

Figure 54E:
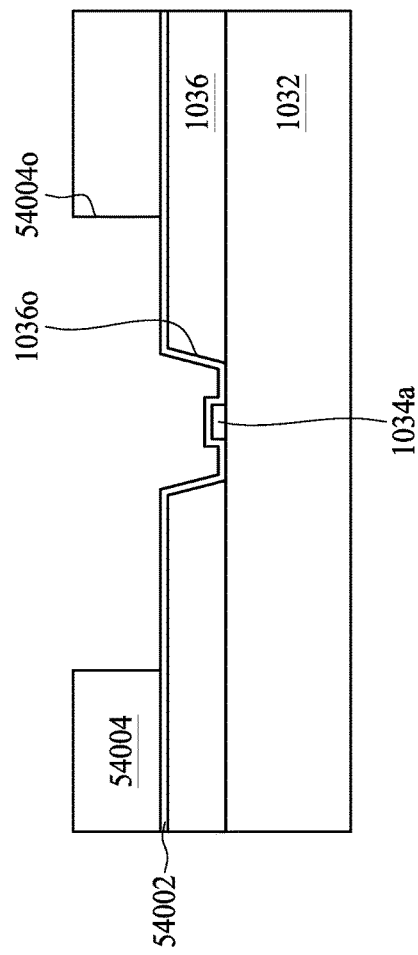

Next and referring to FIG. 54E, a patterned photoresist layer 54004 is formed over the seed layer 54002 and defines an opening 54004*o* aligned with the opening 1036*o*. The patterned photoresist layer 54004 can be formed by applying a photoresist, followed by photolithography to form the opening 54004*o* in the patterned photoresist layer 54004.

Figure 54F:
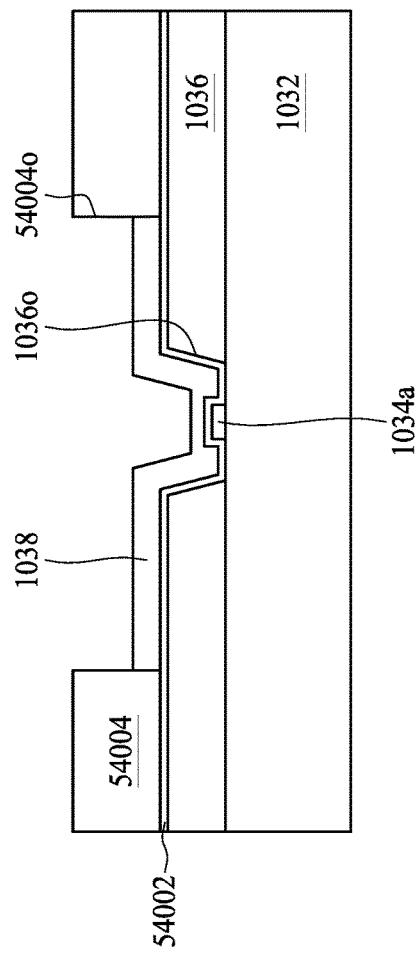

Next and referring to FIG. 54F, the UBM 1038 is formed in the opening 54004*o* of the patterned photoresist layer 54004 and extends into the opening 1036*o* of the dielectric layer 1036. The UBM 1038 can be formed by plating or another suitable deposition technique.

Figure 54G:
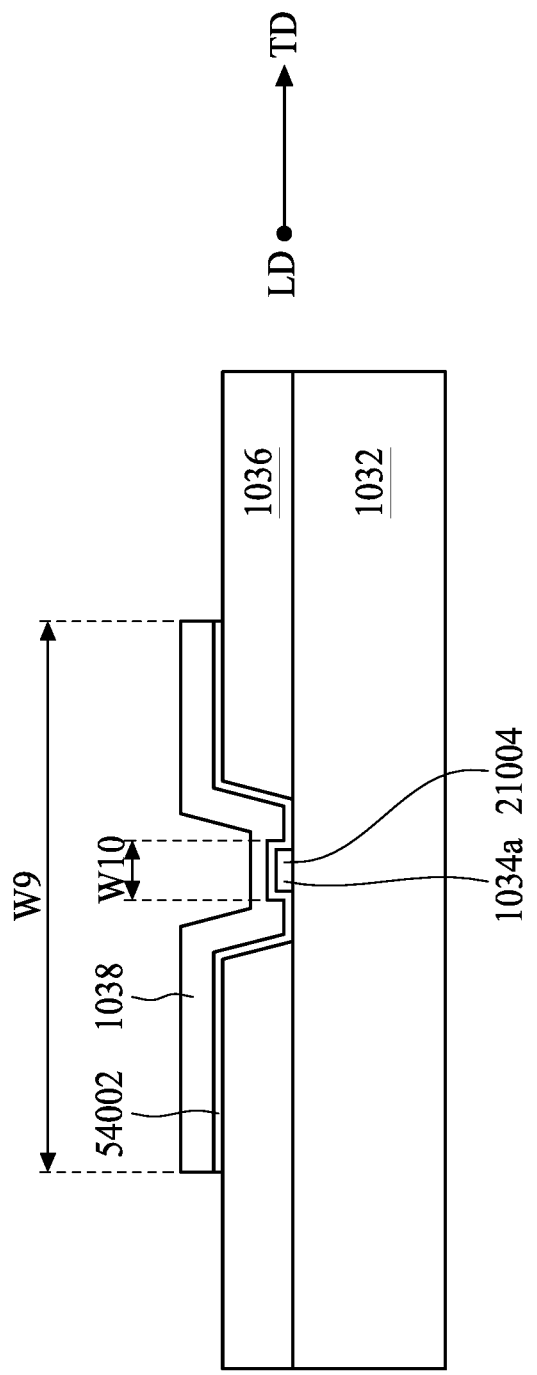

As shown in FIG. 54G, the patterned photoresist layer 54004 is removed by stripping, and, next, exposed portions of the seed layer 54002 are removed by etching or another suitable material removal technique. A remaining portion of the seed layer 54002 disposed below the UBM 1038 can be considered to be a part of the UBM 1038 in some embodiments. Referring to FIG. 54G, the trace 1034*a* extends along a longitudinal direction LD adjacent to a projection area of the UBM 1038 onto the trace 1034*a* and the dielectric layer 1032, and the trace 1034*a* includes a portion 21004 that overlaps the projection area of the UBM 1038. The UBM 1038 has a maximum width w9 along a transverse direction TD orthogonal to the longitudinal direction LD, and a maximum width w10 of the overlapping portion 21004 of the trace 1034*a* is no greater than about ⅓ of the maximum width w9 of the UBM 1038, such as no greater than about ¼, no greater than about ⅕, or no greater than about ⅙ of the maximum width w9 of the UBM 1038.

Figure 51H:
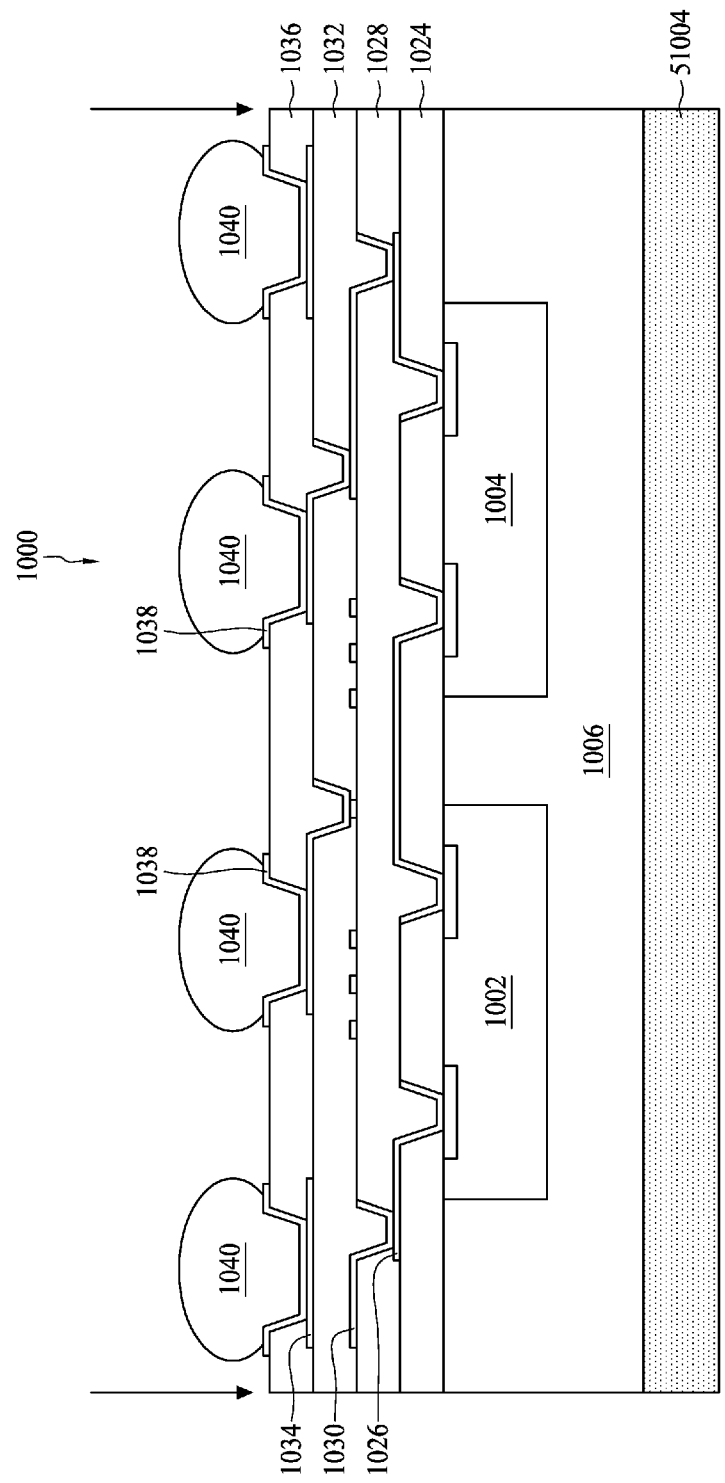

Referring next to FIG. 51H, electrical contacts 1040, such as in the form of conductive bumps, are formed over the UBMs 1038, and, for embodiments in which an array of connected semiconductor device packages are formed, singulation is performed (as shown by arrows in FIG. 51H) to form individual semiconductor device packages, including the semiconductor device package 1000.

FIG. 55A through FIG. 55F show a sequence of stages of a manufacturing process of a semiconductor device package, according to some embodiments of this disclosure. The manufacturing process can be referred to as a "chip first, face up" process. The following manufacturing operations are explained with reference to the semiconductor device package 25000 of FIG. 25. However, it is contemplated that the manufacturing operations can be similarly carried out to form other semiconductor device packages that are differently configured. In addition, it is contemplated that the manufacturing operations can form an array of connected semiconductor device packages that can be separated, such as through singulation, to form multiple individual semiconductor device packages. Certain of the following manufacturing operations can be similarly performed as explained in the foregoing, and repetition of detailed explanation is omitted.

Figure 55A:
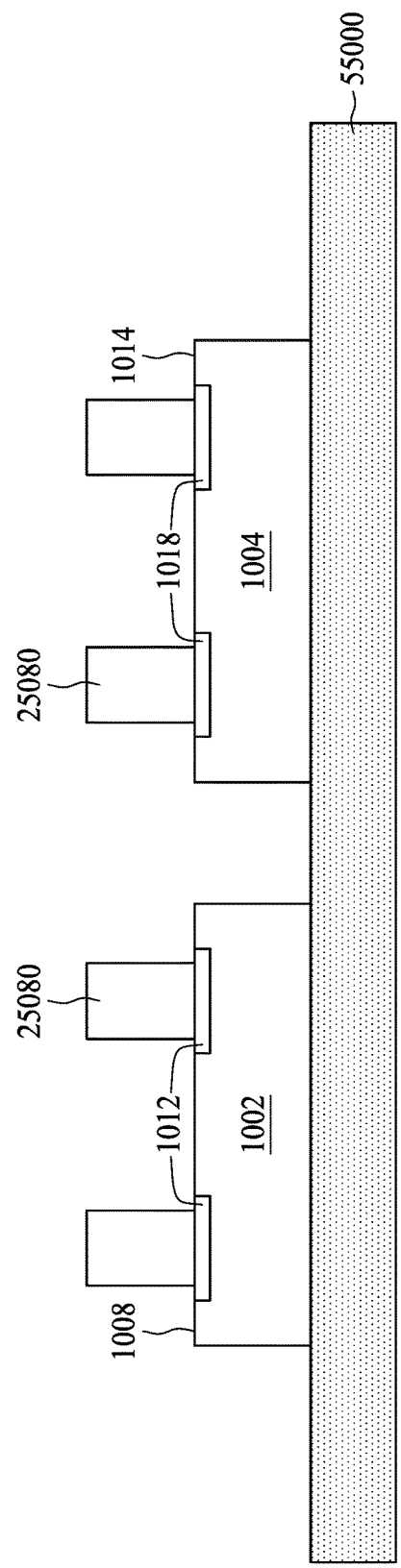
FIG. 55A, FIG. 55B, FIG. 55C, FIG. 55D, FIG. 55E, and FIG. 55F show a sequence of stages of a manufacturing process of a semiconductor device package, according to some embodiments of this disclosure.

As shown in FIG. 55A, a carrier 55000 is provided. Next, electronic devices 1002 and 1004 are disposed over the carrier 55000 with their active surfaces 1008 and 1014 facing away from the carrier 55000. Conductive posts 25080 are disposed over the electronic devices 1002 and 1004 and extend from respective contact pads 1012 and 1018 of the electronic devices 1002 and 1004.

Figure 55B:
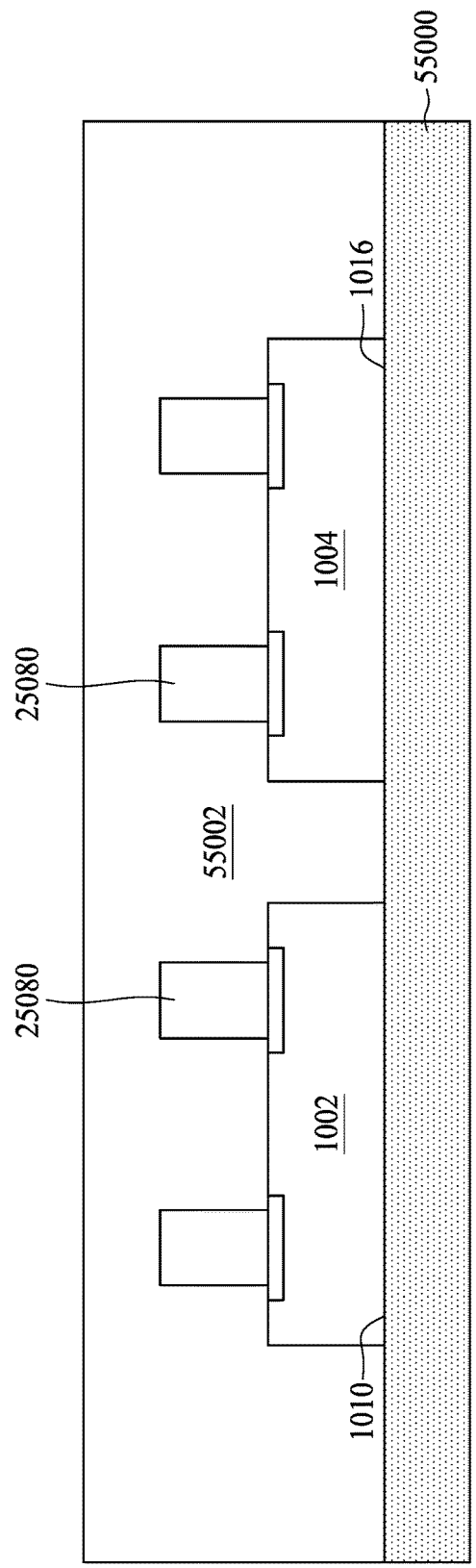
Figure 55C:
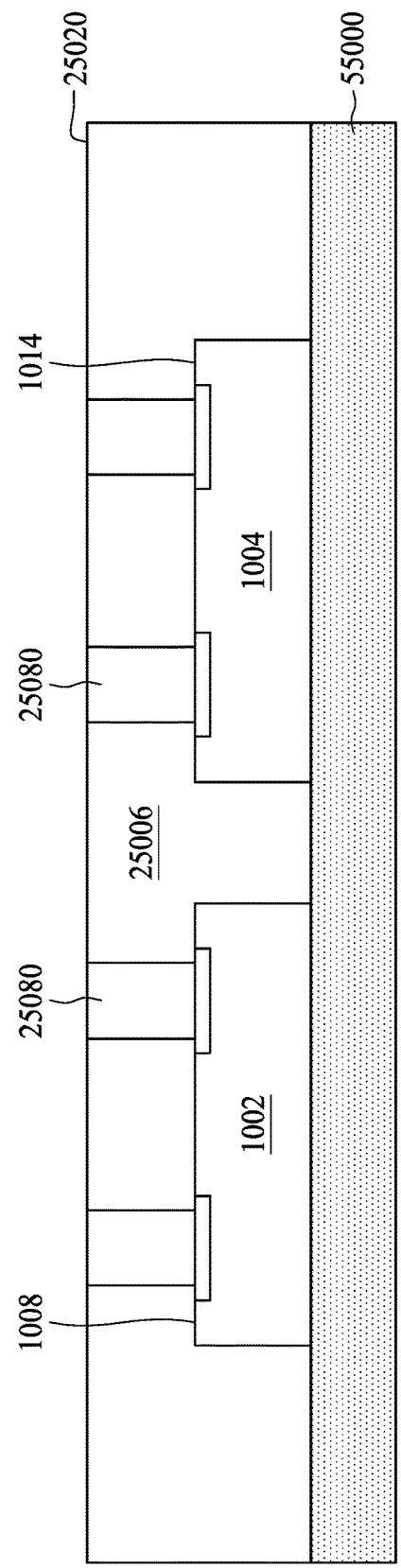

Next and referring to FIG. 55B, a package body 55002 is formed to cover or encapsulate the conductive posts 25080 and the electronic devices 1002 and 1004, with their back surfaces 1010 and 1016 at least partially exposed from or uncovered by the package body 55002. The package body 55002 is next subjected to grinding, lapping, or another suitable material removal technique, thereby forming a package body 25006 as shown in FIG. 55C. The package body 25006 includes a front surface 25020, and at least a portion of a terminal end of each conductive post 25080 is exposed from the front surface 25020 of the package body 25006.

Figure 55D:
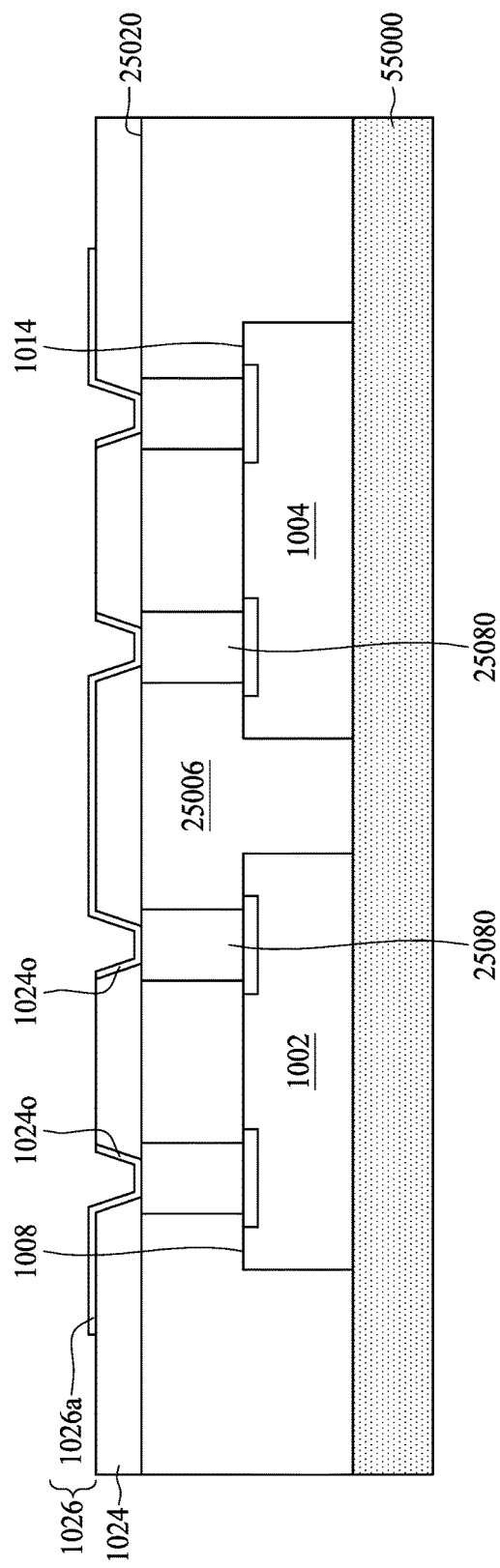

Next, a redistribution stack is formed over the active surfaces 1008 and 1014 of the electronic devices 1002 and 1004 and the front surface 25020 of the package body 25006. As shown in FIG. 55D, a dielectric layer 1024 is formed over the package body 25006, and an RDL 1026 is formed over the dielectric layer 1024. The RDL 1026 includes multiple traces, including a trace 1026a, and at least some of the openings of the RDL 1026 extend into openings 1024o in the dielectric layer 1024 to electrically connect to the electronic devices 1002 and 1004 through the conductive posts 25080 to provide high density conductive post-to-RDL interconnections.

Attention next turns to FIG. 56A through FIG. 56F, which show a sequence of stages of forming a high density conductive post-to-RDL interconnection according to some embodiments of this disclosure. For ease of presentation, the following manufacturing operations are explained with reference to an interconnection between the trace 1026a and the conductive post 25080 disposed over the electronic device 1002. However, it is contemplated that the manufacturing operations can be similarly carried out to form interconnections between additional traces of the RDL 1026 and the conductive posts 25080 disposed over the electronic devices 1002 and 1004.

Figure 56A:
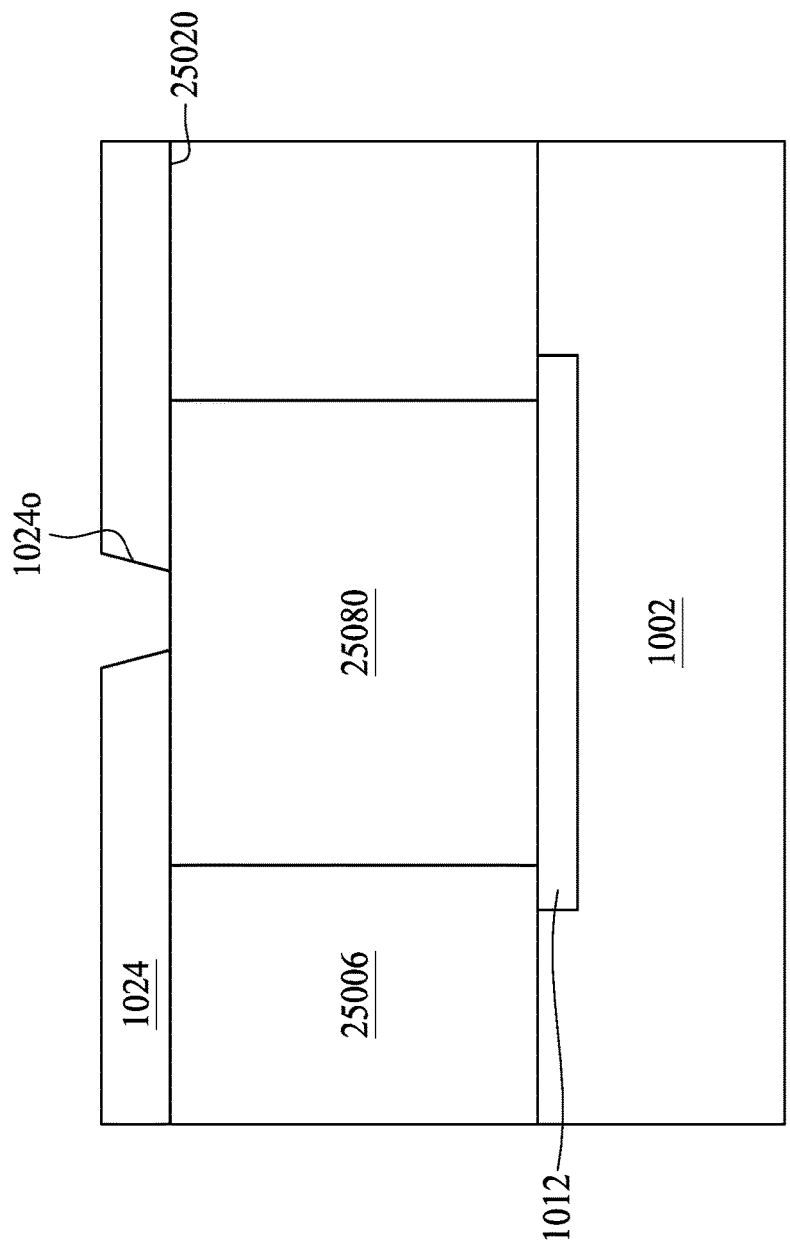
FIG. 56A, FIG. 56B, FIG. 56C, FIG. 56D, FIG. 56E, and FIG. 56F show a sequence of stages of forming a high density conductive post-to-RDL interconnection according to some embodiments of this disclosure.

As shown in FIG. 56A, the electronic device 1002 is provided, and the conductive post 25080 extends through the package body 25006 and between the contact pad 1012 of the electronic device 1002 and the front surface 25020 of the package body 25006. The dielectric layer 1024 is formed over the conductive post 25080 and the package body 25006, and the opening 1024o is formed in the dielectric layer 1024 to expose a portion of the terminal end of the conductive post 25080.

Figure 56B:
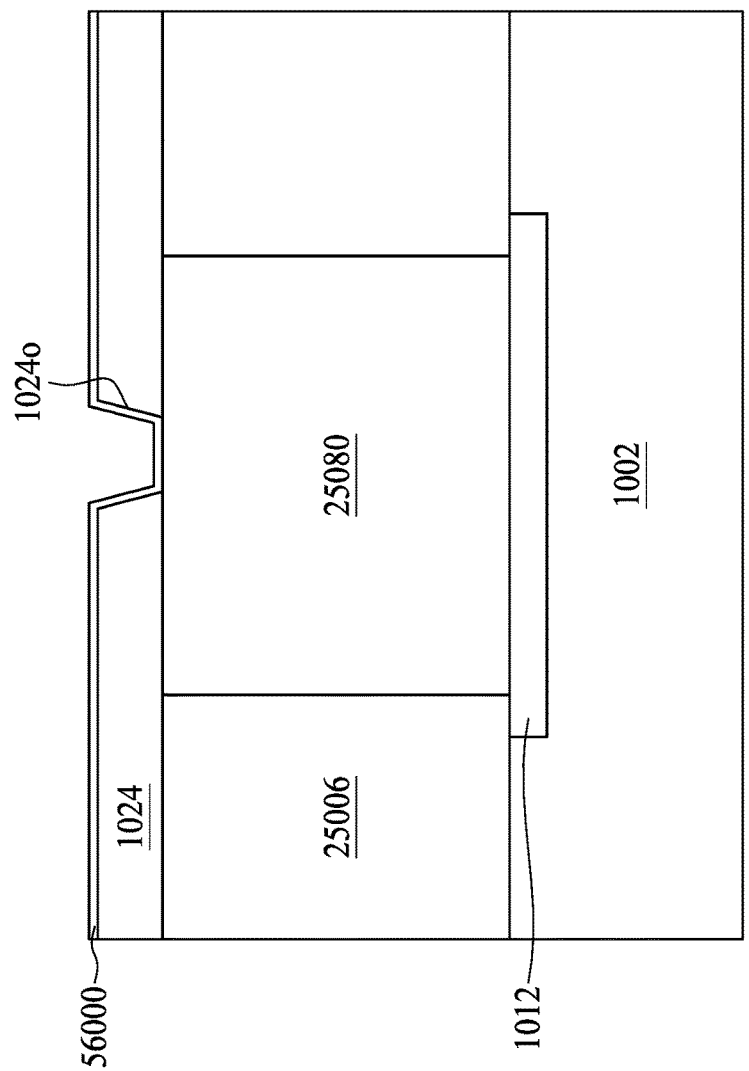

Next, as shown in FIG. 56B, a seed layer 56000 is formed over the dielectric layer 1024 and extends into the opening 1024o and is formed over the exposed portion of the terminal end of the conductive post 25080.

Figure 56C:
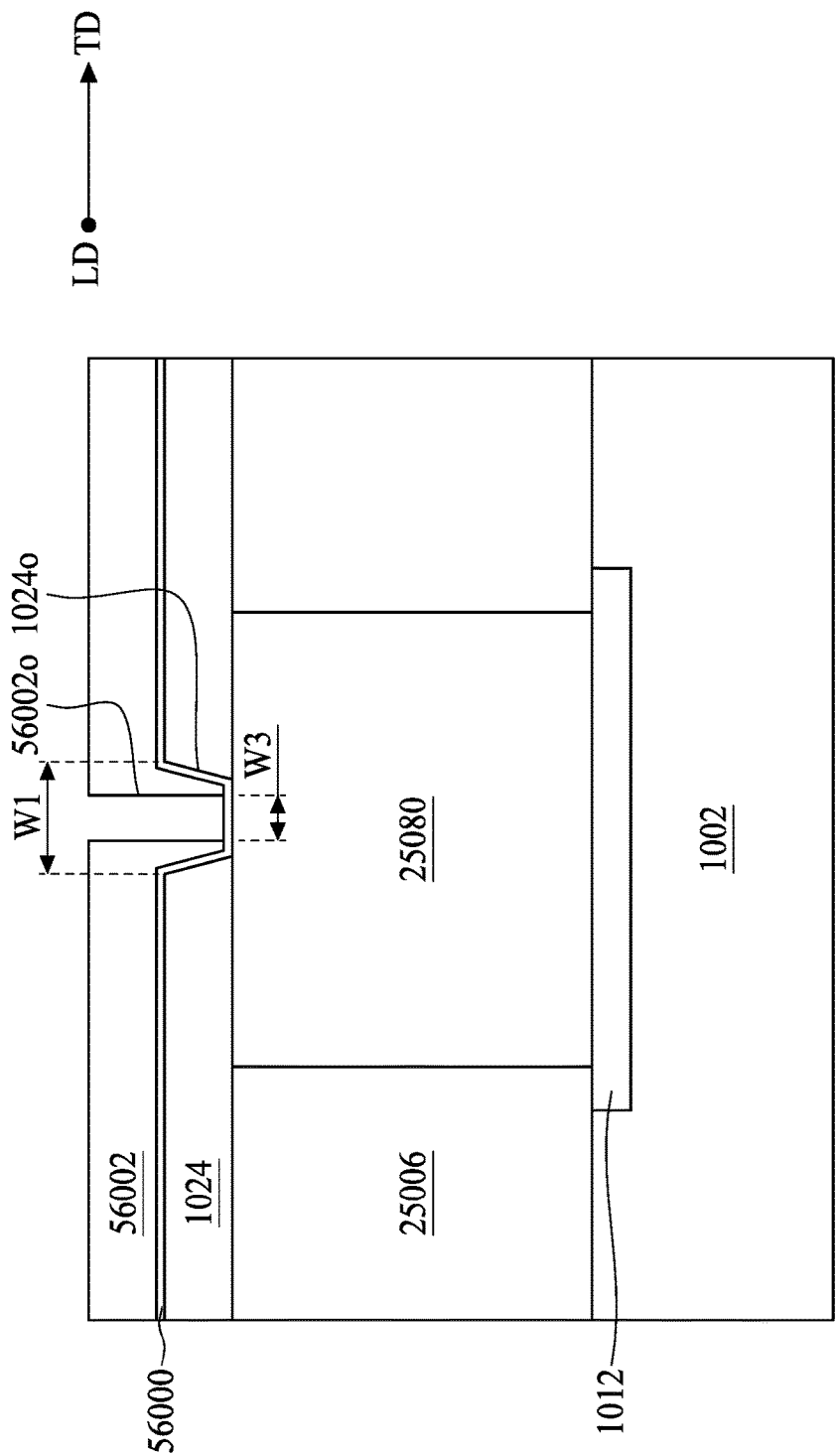

Next and referring to FIG. 56C, a patterned photoresist layer 56002 is formed over the seed layer 56000 and defines an opening 56002o aligned with the opening 1024o. As shown in FIG. 56C, the opening 1024o has a maximum width w1 along a transverse direction TD, the opening 56002o has a maximum width w3 along the transverse direction TD, and the maximum width w3 of the opening 56002o is no greater than or less than the maximum width w1 of the opening 1024o. In some embodiments, the maximum width w3 of the opening 56002o is no greater than about 9/10, no greater than about 4/5, no greater than about 7/10, no greater than about 3/5, no greater than about 1/2, no greater than about 2/5, or no greater than about 1/3 of the maximum width w1 of the opening 1024o.

Figure 56D:
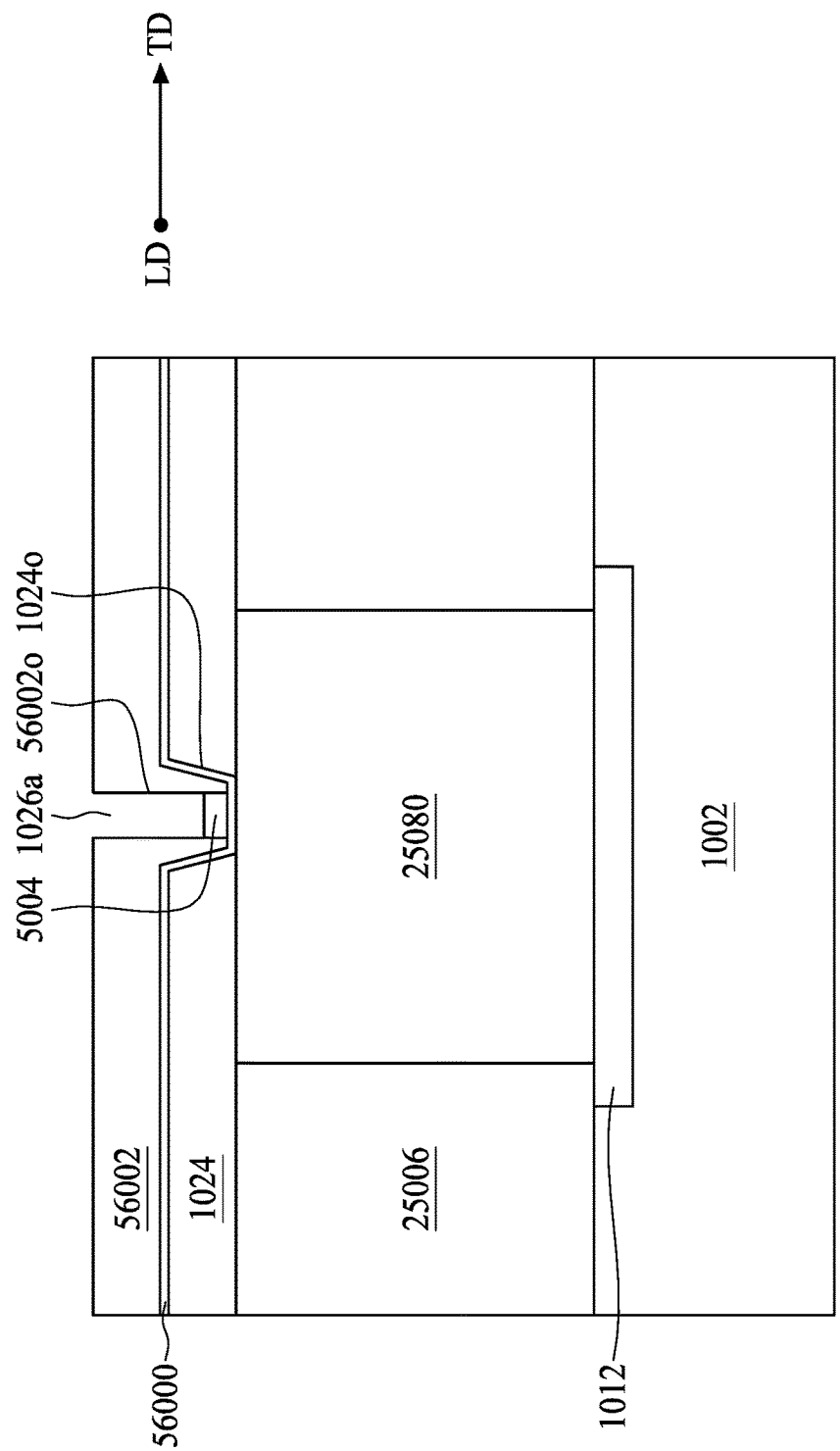

Next and referring to FIG. 56D, the trace 1026a is formed in the opening 56002o of the patterned photoresist layer 56002 and includes a portion 5004 extending into the opening 1024o of the dielectric layer 1024.

Figure 56E:
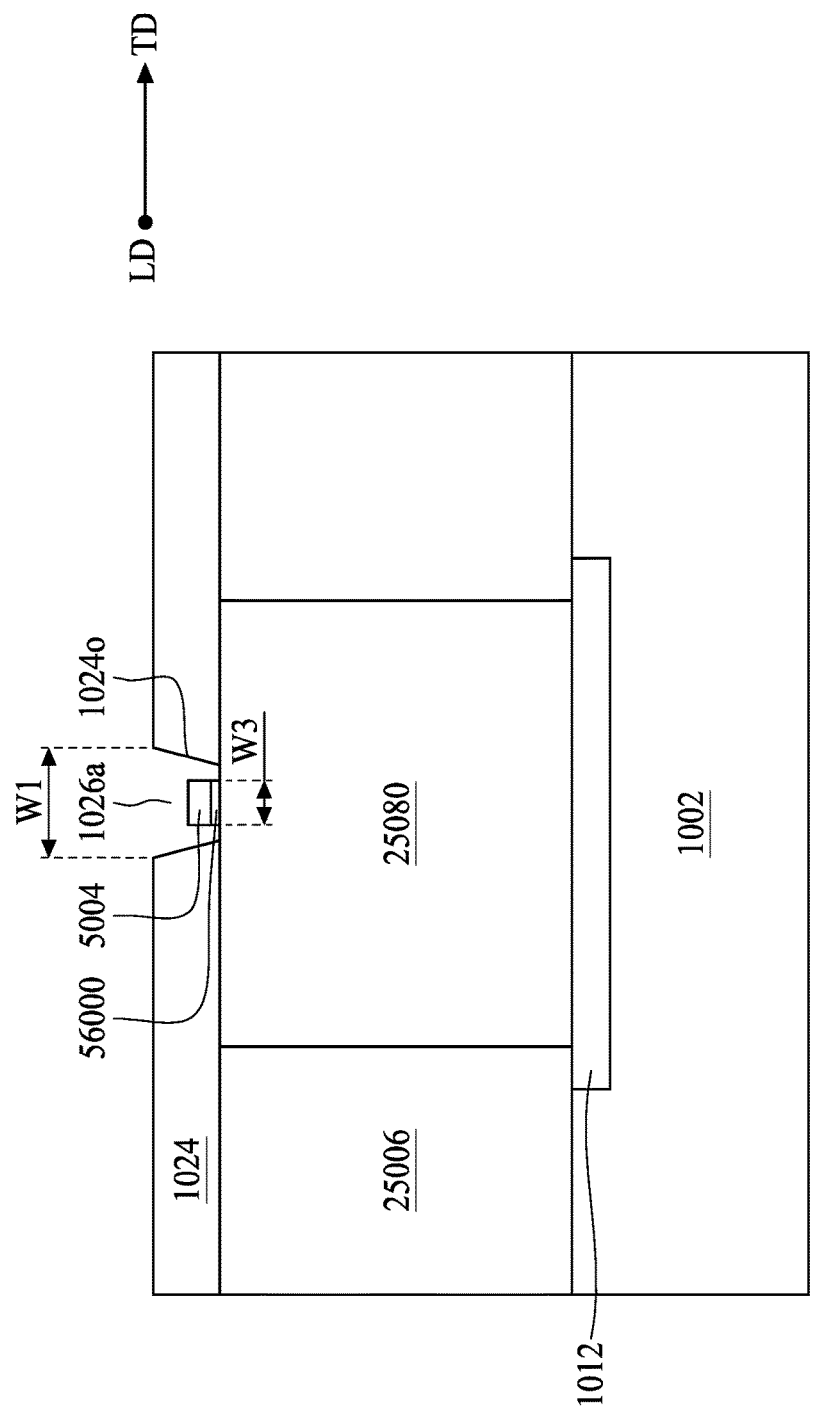
Figure 56F:
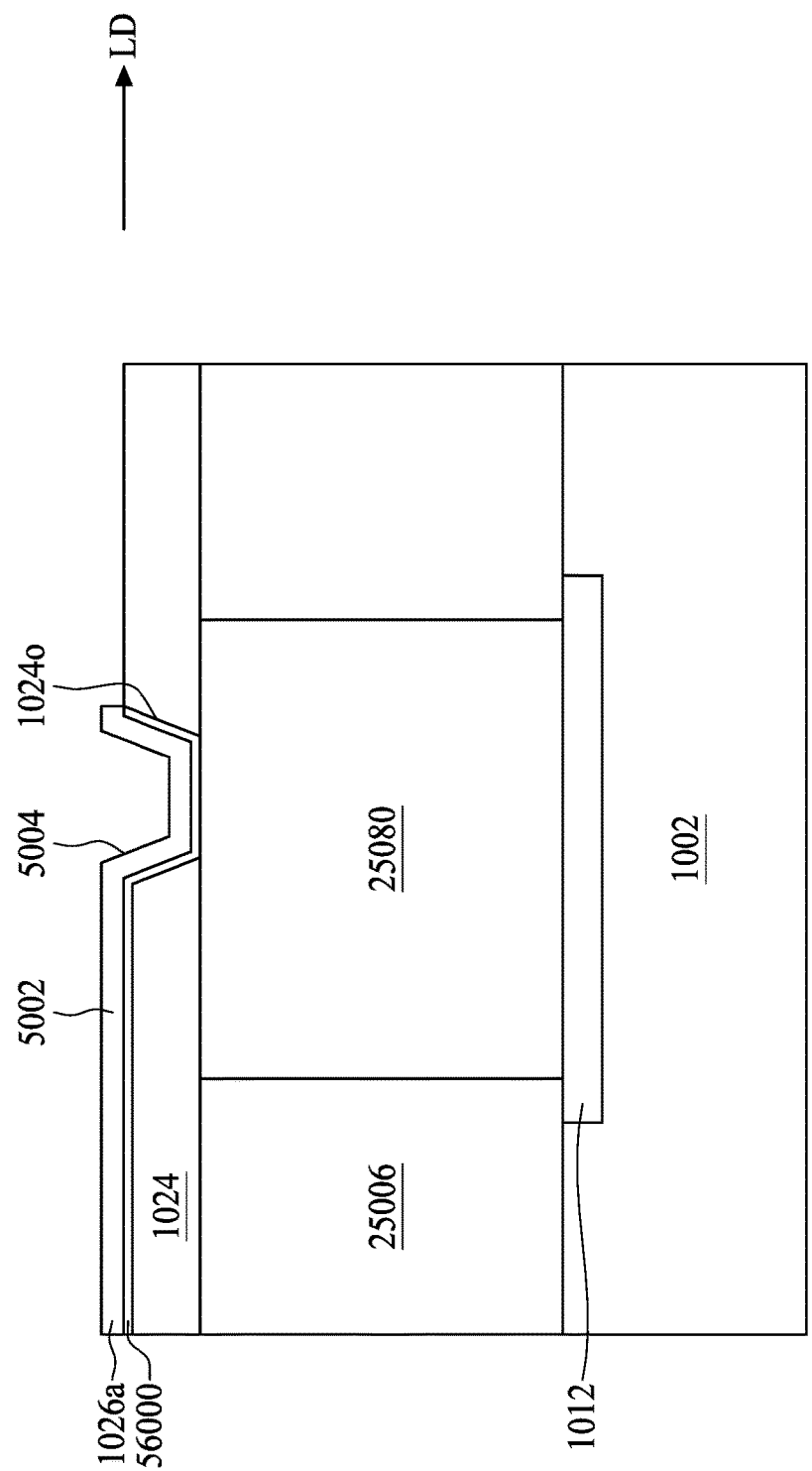

As shown in FIG. 56E, the patterned photoresist layer 56002 is removed by stripping, and, next, exposed portions of the seed layer 56000 are removed by etching or another suitable material removal technique. A remaining portion of the seed layer 56000 disposed below the trace 1026a can be considered to be a part of the trace 1026a in some embodiments. Referring to FIG. 56E, the portion 5004 of the trace 1026a in the opening 1024o has the maximum width w3 along the transverse direction TD which is no greater than or less than the maximum width w1 of the opening 1024o along the transverse direction TD. As illustrated, the portion 5004 of the trace 1026a is disposed between and spaced from opposing sidewalls of the dielectric layer 1024 forming the opening 1024o. In some embodiments, the maximum width w3 of the portion 5004 is no greater than about 9/10, no greater than about 4/5, no greater than about 7/10, no greater than about 3/5, no greater than about 1/2, no greater than about 2/5, or no greater than about 1/3 of the maximum width w1 of the opening 1024o. FIG. 56F shows another cross-sectional view of the resulting conductive post-to-RDL interconnection taken along a longitudinal direction LD orthogonal to the transverse direction TD. As illustrated, the trace 1026a includes a portion 5002 extending over the dielectric layer 1024 along the longitudinal direction LD adjacent to the opening 1024o, and the portion 5004 in the opening 1024o and extending between the portion 5002 and the exposed portion of the conductive post 25080.

Figure 55E:
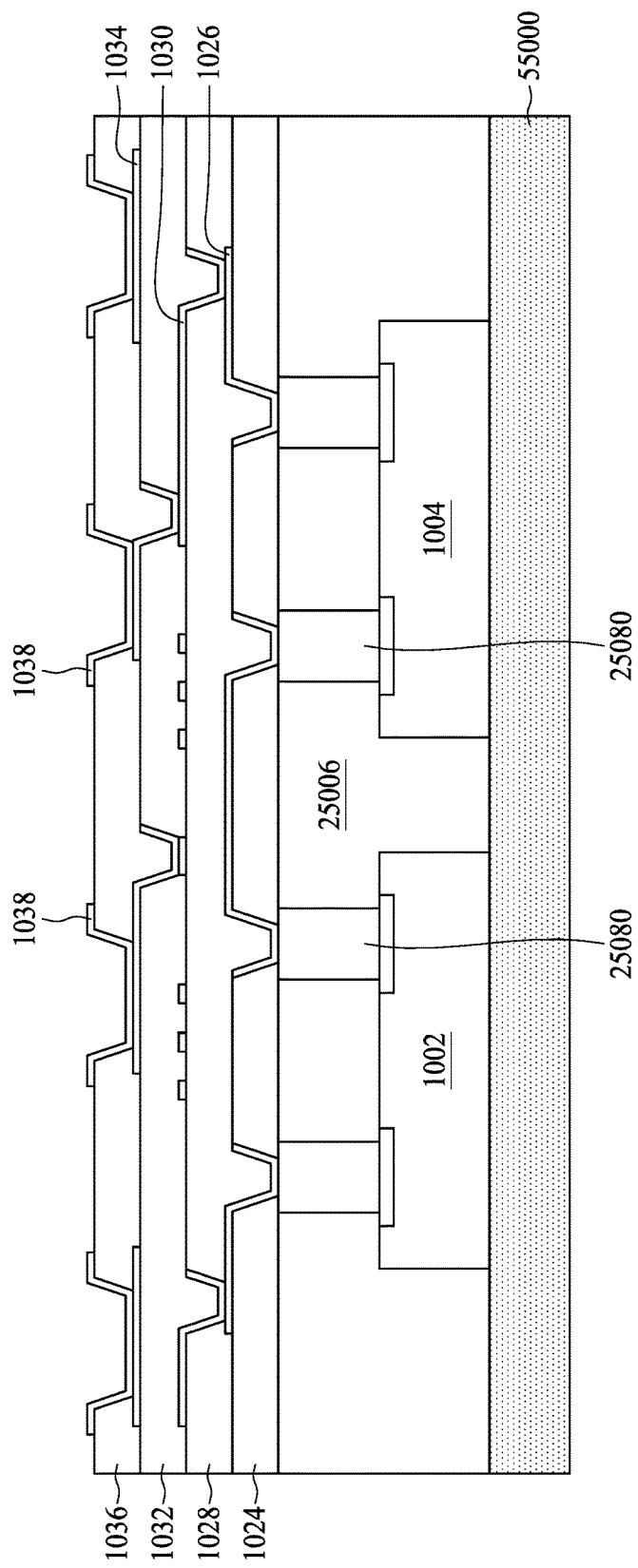

Formation of the redistribution stack next continues with reference to FIG. 55E. As illustrated, a dielectric layer 1028 is formed over the RDL 1026 and the dielectric layer 1024, and an RDL 1030 is formed over the dielectric layer 1028. Next, a dielectric layer 1032 is formed over the RDL 1030 and the dielectric layer 1028, and an RDL 1034 is formed over the dielectric layer 1032. Next, a dielectric layer 1036 is formed over the RDL 1034 and the dielectric layer 1032, and UBMs 1038 are formed over the dielectric layer 1036.

Figure 55F:
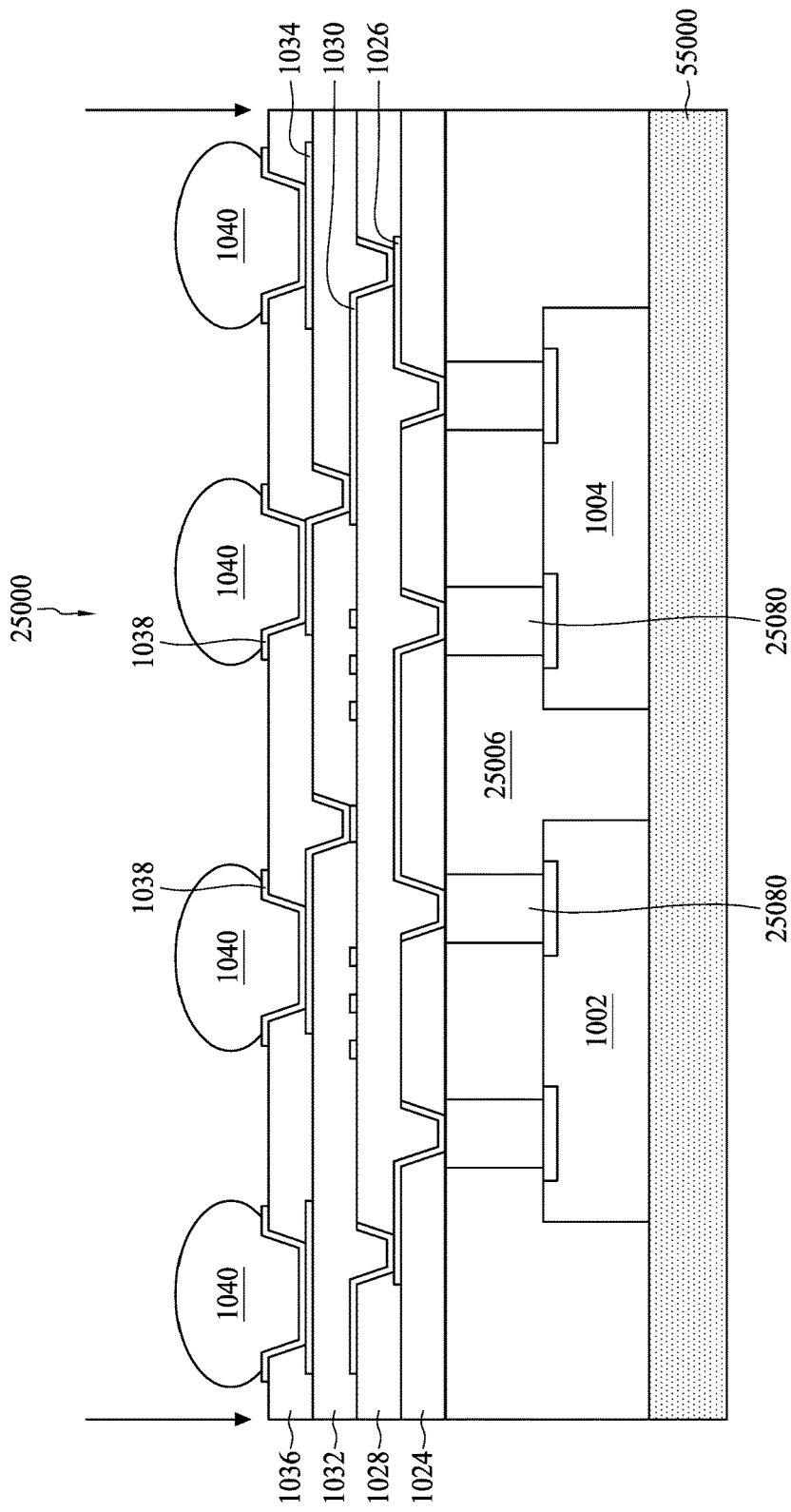

Referring next to FIG. 55F, electrical contacts 1040, such as in the form of conductive bumps, are formed over the UBMs 1038, and, for embodiments in which an array of connected semiconductor device packages are formed, singulation is performed (as shown by arrows in FIG. 55F) to form individual semiconductor device packages, including the semiconductor device package 25000.

FIG. 57A through FIG. 57F show a sequence of stages of a manufacturing process of a semiconductor device package, according to some embodiments of this disclosure. The manufacturing process can be referred to as a "chip last" process. The following manufacturing operations are explained with reference to the semiconductor device package 29000 of FIG. 29. However, it is contemplated that the manufacturing operations can be similarly carried out to form other semiconductor device packages that are differently configured. In addition, it is contemplated that the manufacturing operations can form an array of connected semiconductor device packages that can be separated, such as through singulation, to form multiple individual semiconductor device packages. Certain of the following manufacturing operations can be similarly performed as explained in the foregoing, and repetition of detailed explanation is omitted.

Figure 57A:
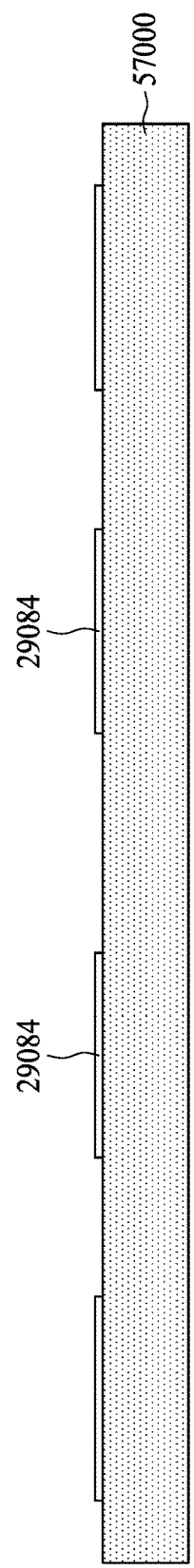
FIG. 57A, FIG. 57B, FIG. 57C, FIG. 57D, FIG. 57E, and FIG. 57F show a sequence of stages of a manufacturing process of a semiconductor device package, according to some embodiments of this disclosure.

As shown in FIG. 57A, a carrier 57000 is provided. Next, a redistribution stack is formed over the carrier 57000. Referring to FIG. 57A, conductive pads 29084 are formed over the carrier 57000. The conductive pads 29084 can be formed from, or can include, copper, a copper alloy, or another metal, another metal alloy, or another combination of metals or other conductive materials, and can be formed by plating within openings of a patterned photoresist layer or another suitable deposition technique.

Figure 57B:
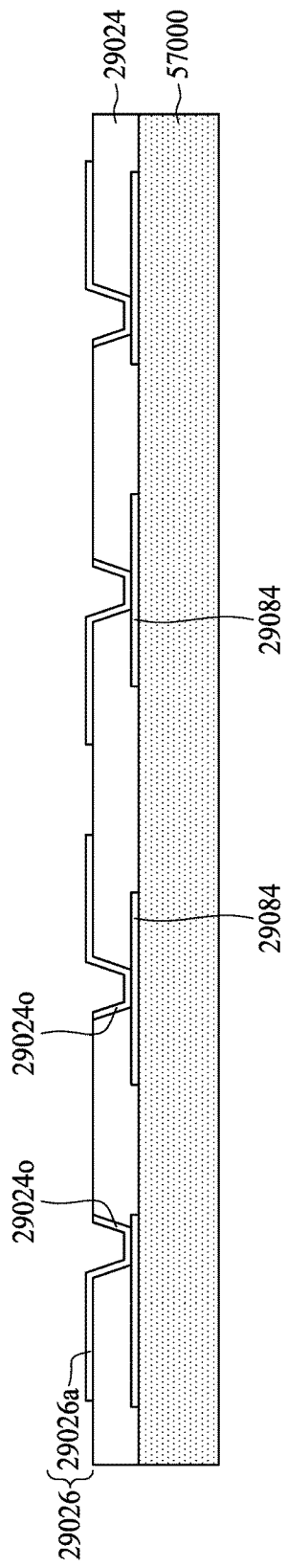

Next and referring to FIG. 57B, a dielectric layer 29024 is formed over the conductive pads 29084 and the carrier 57000, and an RDL 29026 is formed over the dielectric layer 29024. The RDL 29026 includes multiple traces, including a trace 29026a, and at least some of the traces of the RDL 29026 extend into openings 29024o in the dielectric layer 29024 to electrically connect to the conductive pads 29084 to provide high density conductive pad-to-RDL interconnections.

Attention next turns to FIG. 58A through FIG. 58F, which show a sequence of stages of forming a high density conductive pad-to-RDL interconnection according to some embodiments of this disclosure. For ease of presentation, the following manufacturing operations are explained with reference to an interconnection between the trace 29026a and the conductive pad 29084. However, it is contemplated that the manufacturing operations can be similarly carried out to form interconnections between additional traces of the RDL 29026 and the conductive pads 29084.

Figure 58A:
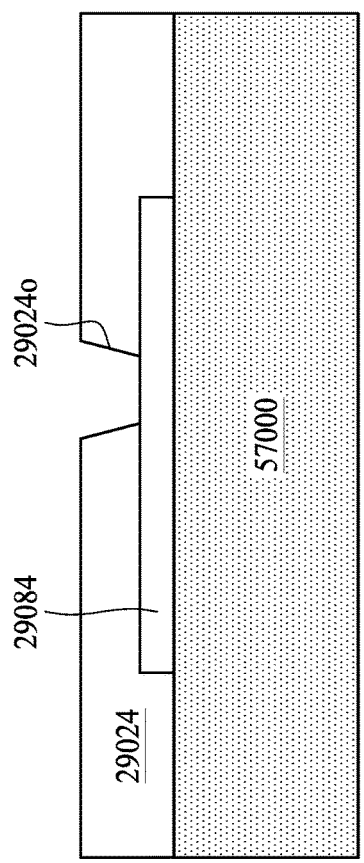

As shown in FIG. 58A, the conductive pad 29084 is formed over the carrier 57000. Next, the dielectric layer 29024 is formed over the conductive pad 29084 and the carrier 57000, and the opening 29024o is formed in the dielectric layer 29024 to expose a portion of the conductive pad 29084.

Figure 58B:
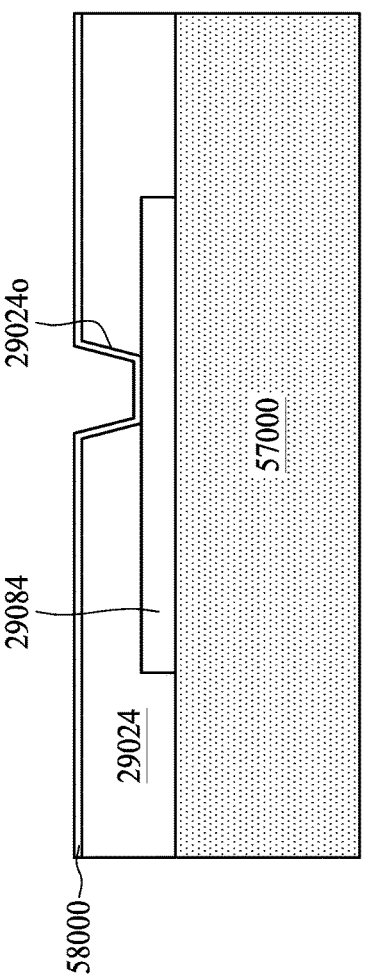

Next, as shown in FIG. 58B, a seed layer 58000 is formed over the dielectric layer 29024 and extends into the opening 29024o and is formed over the exposed portion of the conductive pad 29084.

Next and referring to FIG. 58C, a patterned photoresist layer 58002 is formed over the seed layer 58000 and defines an opening 58002o aligned with the opening 29024o. As shown in FIG. 58C, the opening 29024o has a maximum width w12 along a transverse direction TD, the opening 58002o has a maximum width w13 along the transverse direction TD, and the maximum width w13 of the opening 58002o is no greater than or less than the maximum width w12 of the opening 29024o. In some embodiments, the maximum width w13 of the opening 58002o is no greater than about 9/10, no greater than about 4/5, no greater than about 7/10, no greater than about 3/5, no greater than about 1/2, no greater than about 2/5, or no greater than about 1/3 of the maximum width w12 of the opening 29024o.

Next and referring to FIG. 58D, the trace 29026a is formed in the opening 58002o of the patterned photoresist layer 58002 and includes a portion 29004 extending into the opening 29024o of the dielectric layer 29024.

Figure 58E:
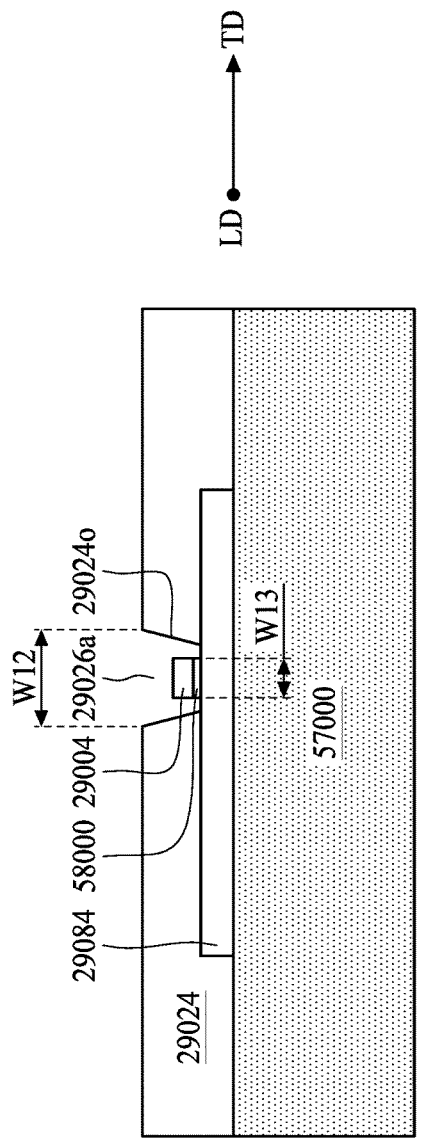
Figure 58F:
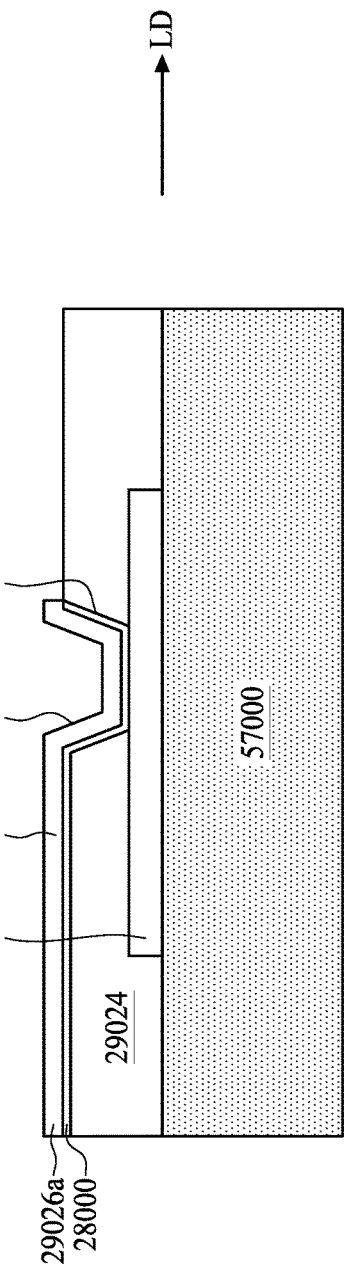

As shown in FIG. 58E, the patterned photoresist layer 58002 is removed by stripping, and, next, exposed portions of the seed layer 58000 are removed by etching or another suitable material removal technique. A remaining portion of the seed layer 58000 disposed below the trace 29026a can be considered to be a part of the trace 29026a in some embodiments. Referring to FIG. 58E, the portion 29004 of the trace 29026a in the opening 29024o has the maximum width w13 along the transverse direction TD which is no greater than or less than the maximum width w12 of the opening 29024o along the transverse direction TD. As illustrated, the portion 29004 of the trace 29026a is disposed between and spaced from opposing sidewalls of the dielectric layer 29024 forming the opening 29024o. In some embodiments, the maximum width w13 of the portion 29004 is no greater than about 9/10, no greater than about 4/5, no greater than about 7/10, no greater than about 3/5, no greater than about 1/2, no greater than about 2/5, or no greater than about 1/3 of the maximum width w12 of the opening 29024o. FIG. 58F shows another cross-sectional view of the resulting conductive pad-to-RDL interconnection taken along a longitudinal direction LD orthogonal to the transverse direction TD. As illustrated, the trace 29026a includes a portion 29002 extending over the dielectric layer 29024 along the longitudinal direction LD adjacent to the opening 29024o, and the portion 29004 in the opening 29024o and extending between the portion 29002 and the exposed portion of the conductive pad 29084.

Figure 57C:
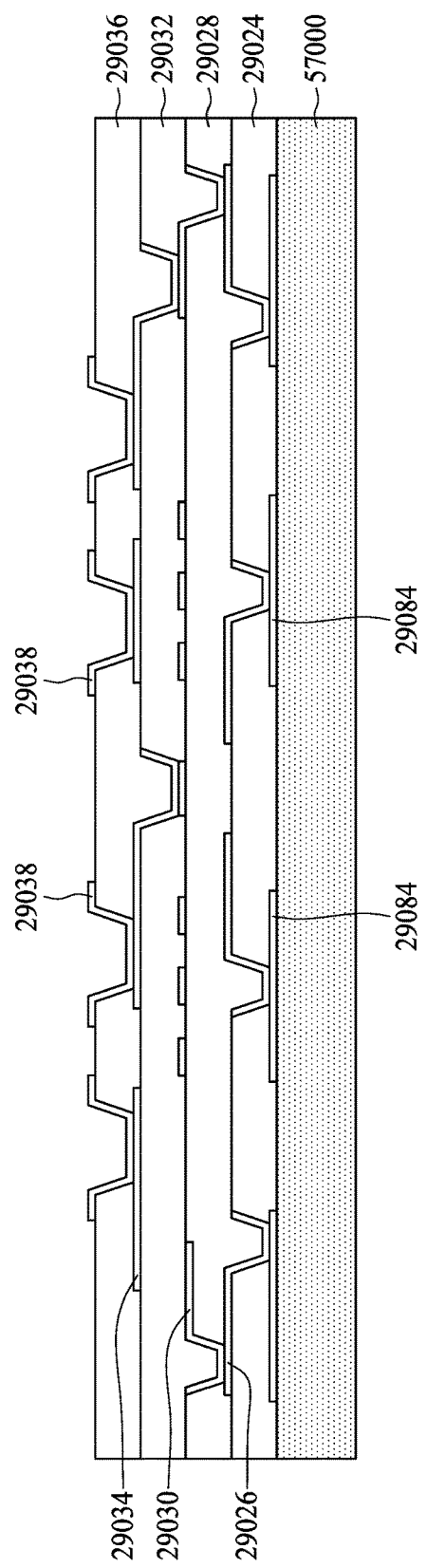

Formation of the redistribution stack next continues with reference to FIG. 57C. As illustrated, a dielectric layer 29028 is formed over the RDL 29026 and the dielectric layer 29024, and an RDL 29030 is formed over the dielectric layer 29028. Next, a dielectric layer 29032 is formed over the RDL 29030 and the dielectric layer 29028, and an RDL 29034 is formed over the dielectric layer 29032. Next, a dielectric layer 29036 is formed over the RDL 29034 and the dielectric layer 29032, and UBMs 29038 are formed over the dielectric layer 29036.

Figure 57D:
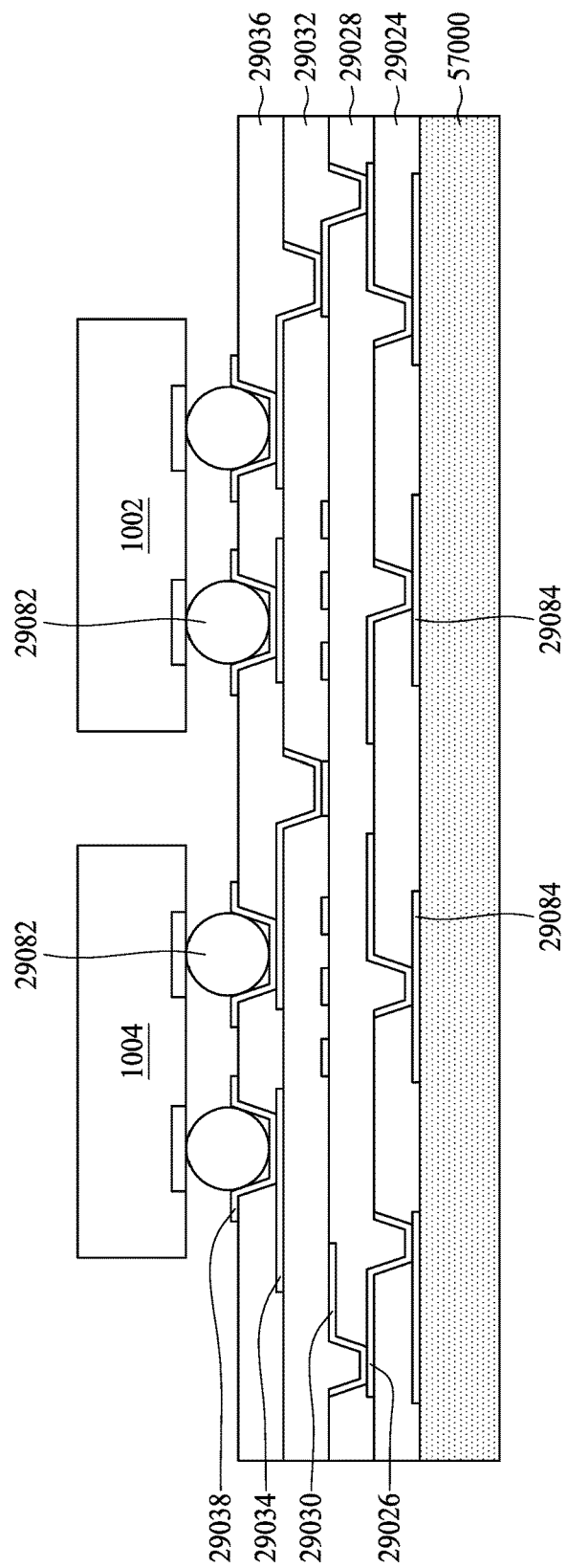

Referring next to FIG. 57D, electronic devices 1002 and 1004 are disposed over the redistribution stack of the RDLs 29026, 29030, and 29034 and the dielectric layers 29024, 29028, 29032, and 29036, and are electrically connected to the UBMs 29038 through connectors 29082 by, for example, flip-chip mounting.

Figure 57E:
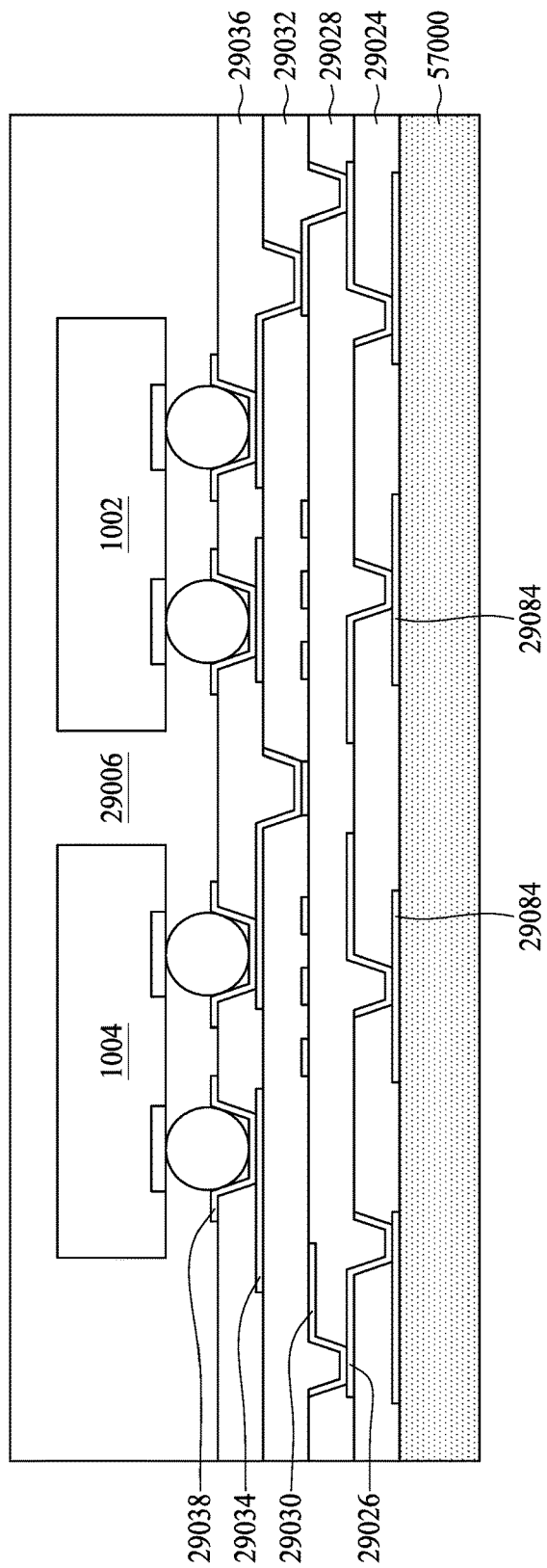

Next and referring to FIG. 57E, a package body 29006 is formed to cover or encapsulate the electronic devices 1002 and 1004, and is disposed over the redistribution stack of the RDLs 29026, 29030, and 29034 and the dielectric layers 29024, 29028, 29032, and 29036.

Figure 57F:
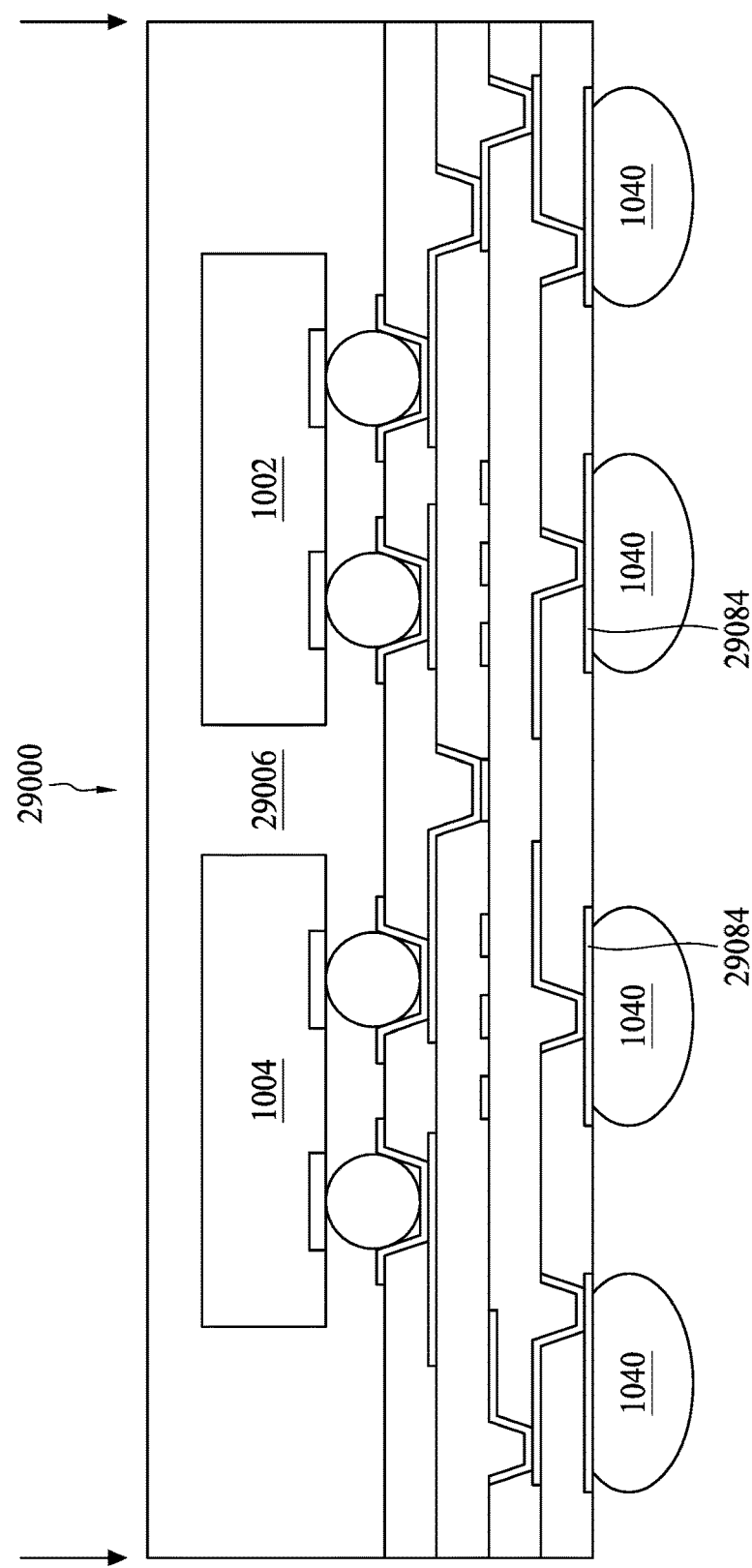

Next and referring to FIG. 57F, the package body 29006 and the redistribution stack are separated from the carrier 57000. Electrical contacts 1040, such as in the form of conductive bumps, are formed over the conductive pads 29084, and, for embodiments in which an array of connected semiconductor device packages are formed, singulation is performed (as shown by arrows in FIG. 57F) to form individual semiconductor device packages, including the semiconductor device package 29000.

Additional embodiments of this disclosure are directed to manufacturing processes of three-dimensional semiconductor device packages including high density interconnections, such as for stacked package assemblies or PoP assemblies. In some embodiments, high density interconnections are attained by forming traces extending into or through dielectric openings with capture pads omitted.

FIG. 59A through FIG. 59H show a sequence of stages of a manufacturing process of a stacked package assembly, according to some embodiments of this disclosure. The manufacturing process can be referred to as a "chip first, face down" process. The following manufacturing operations are explained with reference to the semiconductor device package 33050 and the stacked package assembly 33000 of FIG. 33. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 59A:
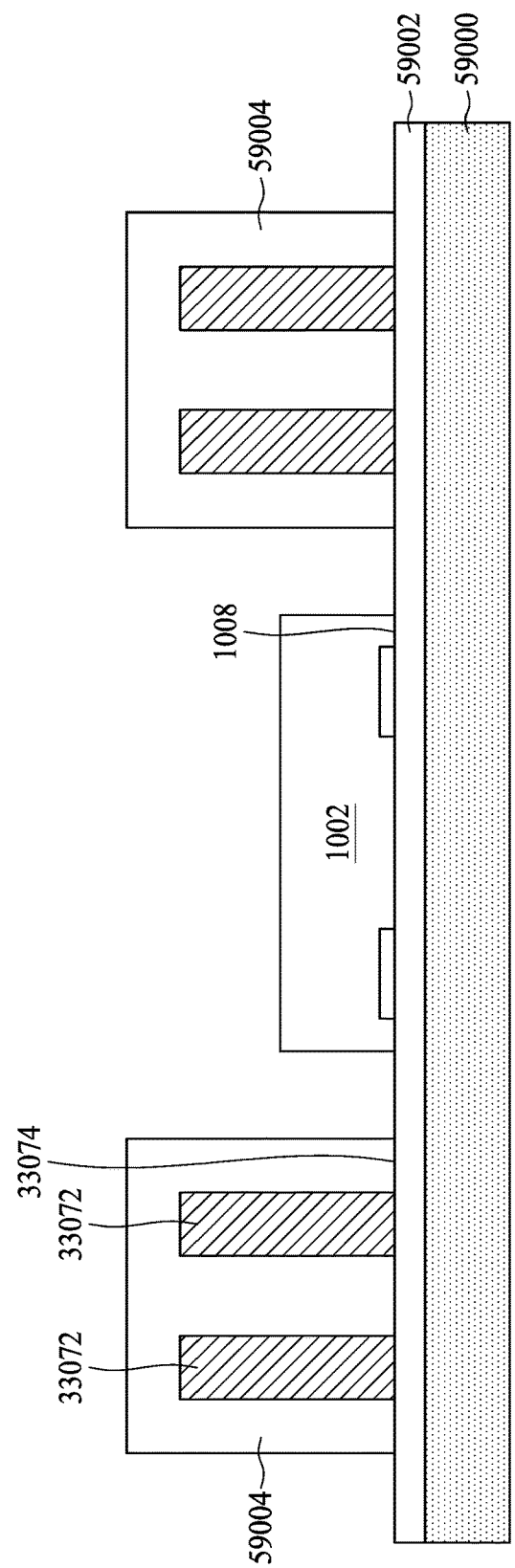
FIG. 59A, FIG. 59B, FIG. 59C, FIG. 59D, FIG. 59E, FIG. 59F, FIG. 59G, and FIG. 59H show a sequence of stages of a manufacturing process of a stacked package assembly, according to some embodiments of this disclosure.

As shown in FIG. 59A, a carrier 59000 and an adhesive layer 59002 disposed over the carrier 59000 are provided. Next, an electronic device 1002 and interposer components 59004 are disposed over the carrier 59000 and are affixed to the adhesive layer 59002. The electronic device 1002 is affixed to the adhesive layer 59002 with its active surface 1008 facing towards the adhesive layer 59002. Each interposer component 59004 includes conductive vias 33072 including terminal ends exposed from a lower surface 33074 of the interposer component 59004, and each interposer component 59004 is affixed to the adhesive layer 59002 with its lower surface 33074 facing towards the adhesive layer 59002.

Figure 59B:
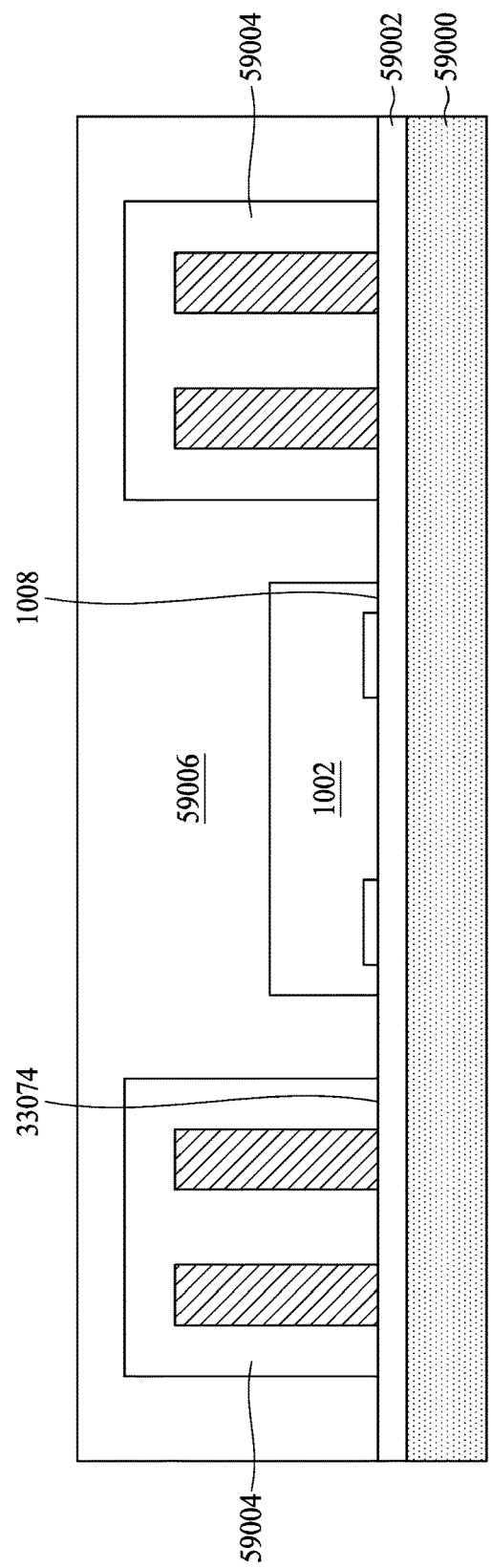
Figure 59C:
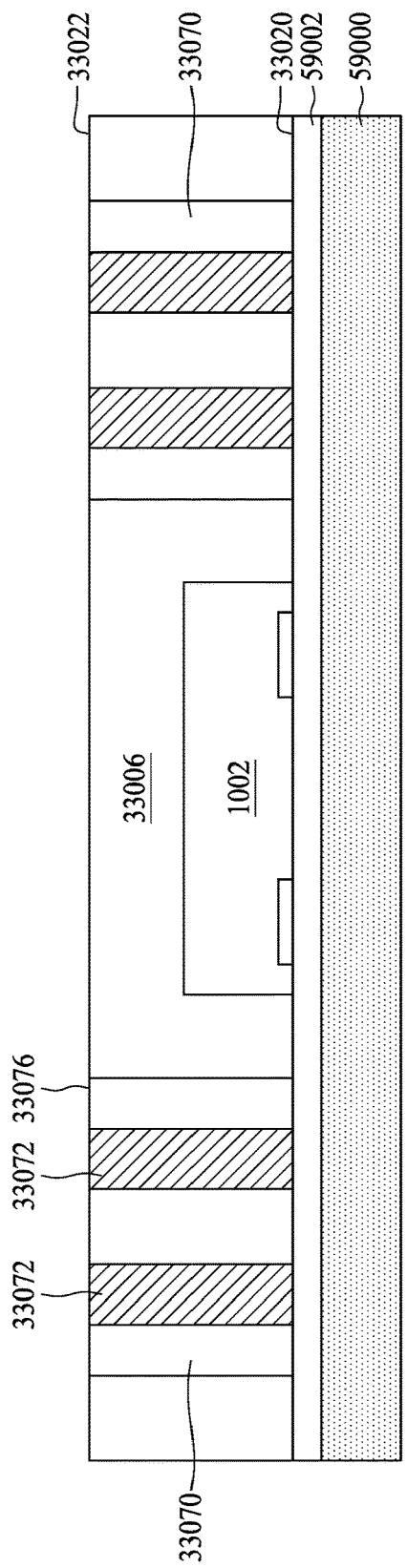

Next and referring to FIG. 59B, a package body 59006 is formed to cover or encapsulate the electronic device 1002 and the interposer components 59004, with their active surface 1008 and lower surfaces 33074 at least partially exposed from or uncovered by the package body 59006. The package body 59006 and the interposer components 59004 are next subjected to grinding, lapping, or another suitable material removal technique, thereby forming a package body 33006 and interposer components 33070 as shown in FIG. 59C. The package body 33006 includes a front surface 33020 and a back surface 33022, and terminal ends of the conductive vias 33072 adjacent to an upper surface 33076 of each interposer component 33070 are at least partially exposed from the back surface 33022 of the package body 33006.

Figure 59D:
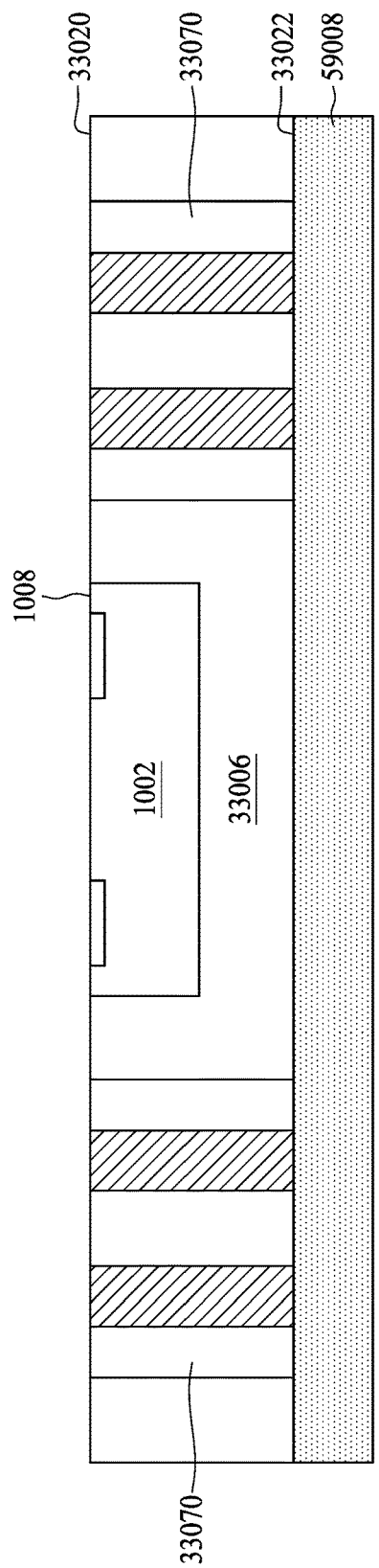

Next and referring to FIG. 59D, the package body 33006 along with the encapsulated electronic device 1002 and the encapsulated interposer components 33070 are separated from the carrier 59000 and the adhesive layer 59002, and are reoriented and disposed over a carrier 59008, with the active surface 1008 of the electronic device 1002 and the front surface 33020 of the package body 33006 facing away from the carrier 59008, and the back surface 33022 of the package body 33006 facing towards the carrier 59008.

Figure 59E:
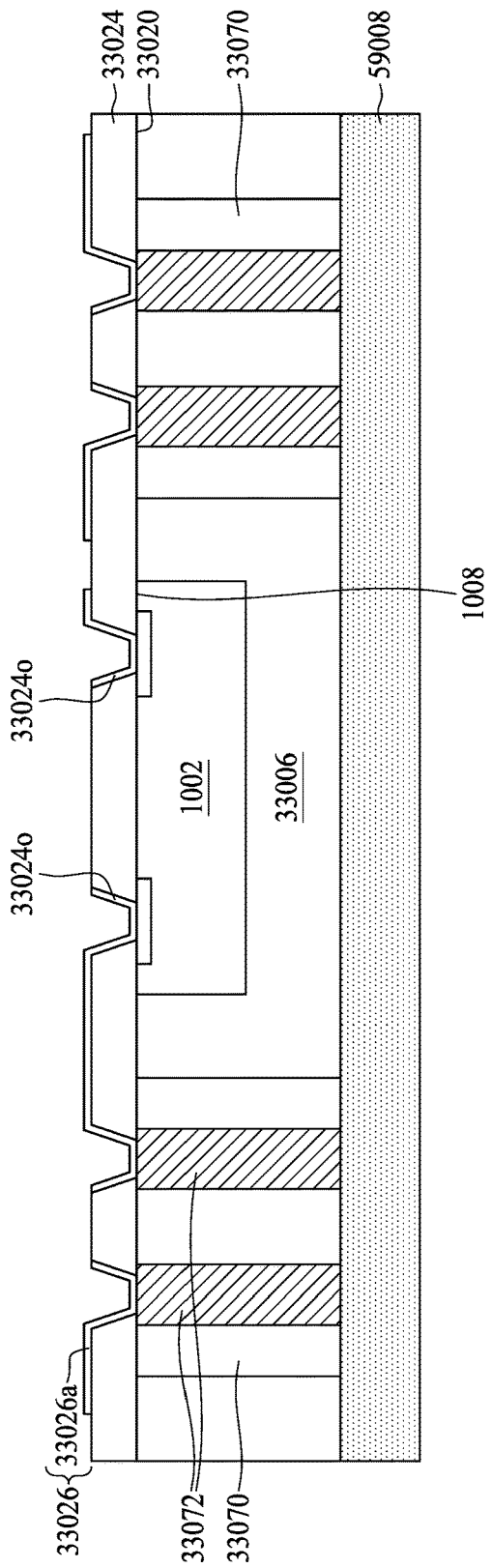

Next, a redistribution stack is formed over the active surface 1008 of the electronic device 1002 and the front surface 33020 of the package body 33006. As shown in FIG. 59E, a dielectric layer 33024 is formed over the electronic device 1002 and the package body 33006, and an RDL 33026 is formed over the dielectric layer 33024. The RDL 33026 includes multiple traces, including a trace 33026a, and at some of the traces of the RDL 33026 extend into openings 33024o in the dielectric layer 33024 to electrically connect to the conductive vias 33072 of the interposer components 33070 to provide high density conductive via-to-RDL interconnections.

Attention next turns to FIG. 60A through FIG. 60F, which show a sequence of stages of forming a high density conductive via-to-RDL interconnection according to some embodiments of this disclosure. For ease of presentation, the following manufacturing operations are explained with reference to an interconnection between the trace 33026a and the conductive via 33072. However, it is contemplated that the manufacturing operations can be similarly carried out to form interconnections between additional traces of the RDL 33026 and the conductive vias 33072.

As shown in FIG. 60A, the interposer component 33070 including the conductive via 33072 is provided. Next, the dielectric layer 33024 is formed over the interposer component 33070, and the opening 33024o is formed in the dielectric layer 33024 to expose a portion of a terminal end of the conductive via 33072.

Next, as shown in FIG. 60B, a seed layer 60000 is formed over the dielectric layer 33024 and extends into the opening 33024o and is formed over the exposed portion of the conductive via 33072.

Figure 60C:
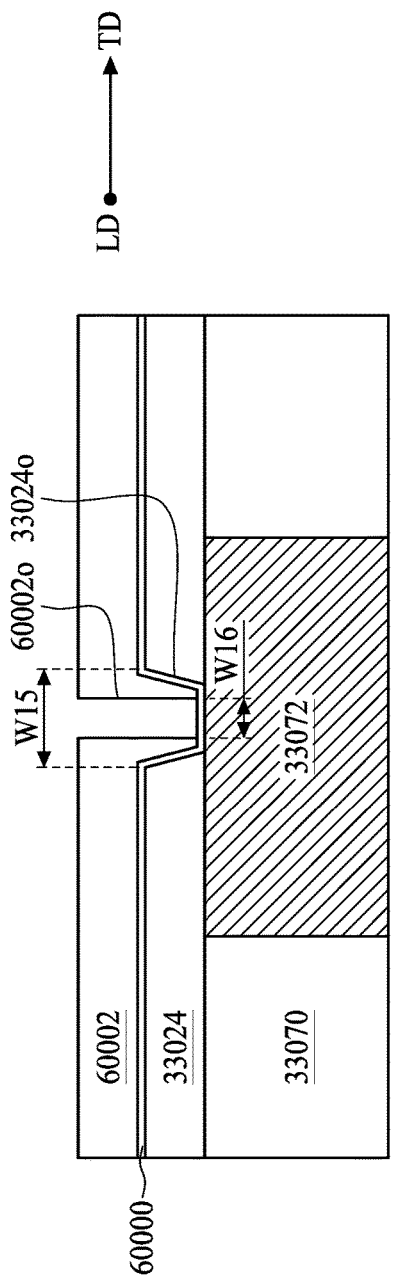

Next and referring to FIG. 60C, a patterned photoresist layer 60002 is formed over the seed layer 60000 and defines an opening 60002o aligned with the opening 33024o. As shown in FIG. 60C, the opening 33024o has a maximum width w15 along a transverse direction TD, the opening 60002o has a maximum width w16 along the transverse direction TD, and the maximum width w16 of the opening 60002o is no greater than or less than the maximum width w15 of the opening 33024o. In some embodiments, the maximum width w16 of the opening 60002o is no greater than about 9/10, no greater than about 4/5, no greater than about 7/10, no greater than about 3/5, no greater than about 1/2, no greater than about 2/5, or no greater than about 1/3 of the maximum width w15 of the opening 33024o.

Figure 60D:
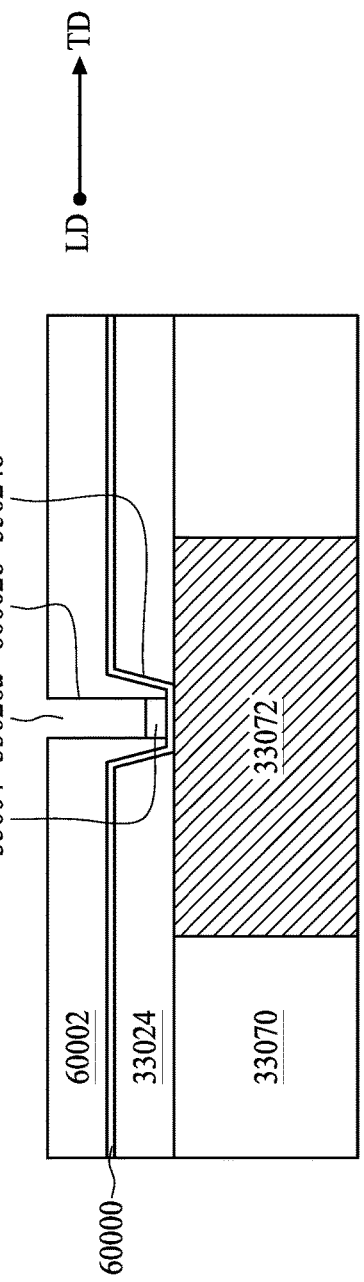

Next and referring to FIG. 60D, the trace 33026a is formed in the opening 60002o of the patterned photoresist layer 60002 and includes a portion 35004 extending into the opening 33024o of the dielectric layer 33024.

Figure 60E:
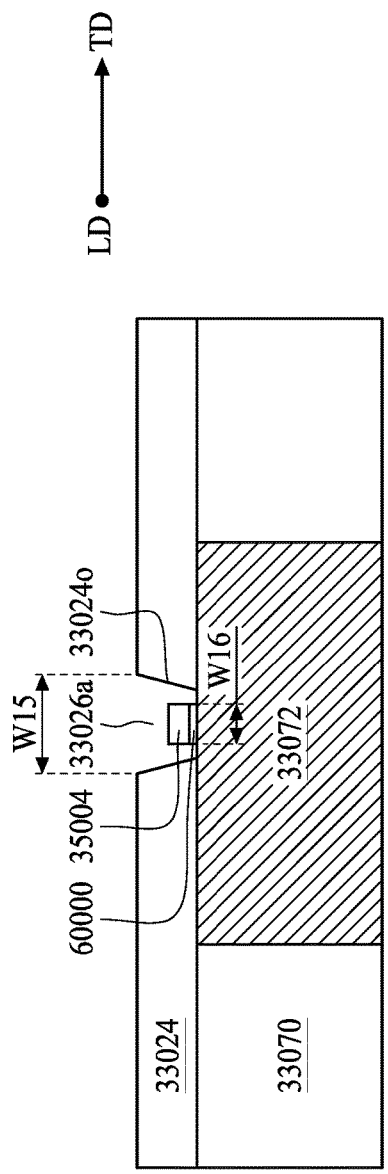
Figure 60F:
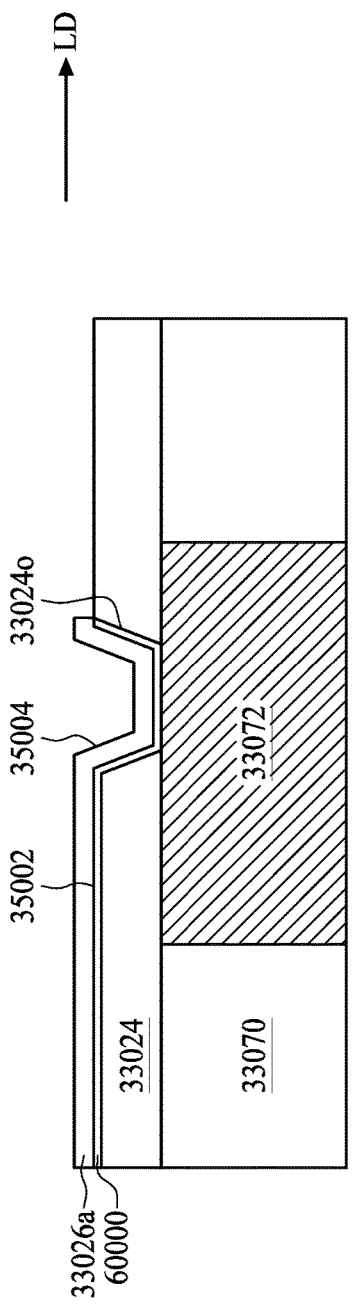

As shown in FIG. 60E, the patterned photoresist layer 60002 is removed by stripping, and, next, exposed portions of the seed layer 60000 are removed by etching or another suitable material removal technique. A remaining portion of the seed layer 60000 disposed below the trace 33026a can be considered to be a part of the trace 33026a in some embodiments. Referring to FIG. 60E, the portion 35004 of the trace 33026a in the opening 33024o has the maximum width w16 along the transverse direction TD which is no greater than or less than the maximum width w15 of the opening 33024o along the transverse direction TD. As illustrated, the portion 35004 of the trace 33026a is disposed between and spaced from opposing sidewalls of the dielectric layer 33024 forming the opening 33024o. In some embodiments, the maximum width w16 of the portion 35004 is no greater than about 9/10, no greater than about 4/5, no greater than about 7/10, no greater than about 3/5, no greater than about 1/2, no greater than about 2/5, or no greater than about 1/3 of the maximum width w15 of the opening 33024o. FIG. 60F shows another cross-sectional view of the resulting conductive via-to-RDL interconnection taken along a longitudinal direction LD orthogonal to the transverse direction TD. As illustrated, the trace 33026a includes a portion 35002 extending over the dielectric layer 33024 along the longitudinal direction LD adjacent to the opening 33024o, and the portion 35004 in the opening 33024o and extending between the portion 35002 and the exposed portion of the conductive via 33072.

Figure 59F:
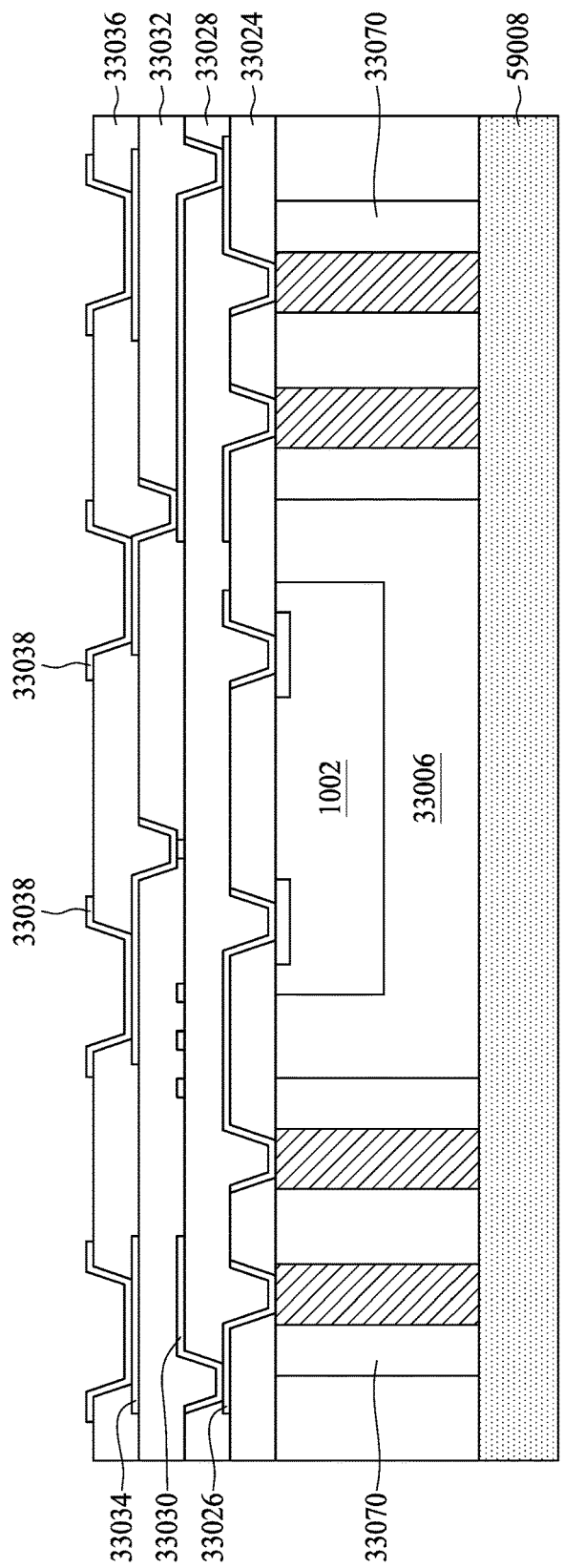

Formation of the redistribution stack next continues with reference to FIG. 59F. As illustrated, a dielectric layer 33028 is formed over the RDL 33026 and the dielectric layer 33024, and an RDL 33030 is formed over the dielectric layer 33028. Next, a dielectric layer 33032 is formed over the RDL 33030 and the dielectric layer 33028, and an RDL 33034 is formed over the dielectric layer 33032. Next, a dielectric layer 33036 is formed over the RDL 33034 and the dielectric layer 33032, and UBMs 33038 are formed over the dielectric layer 33036.

Figure 59G:
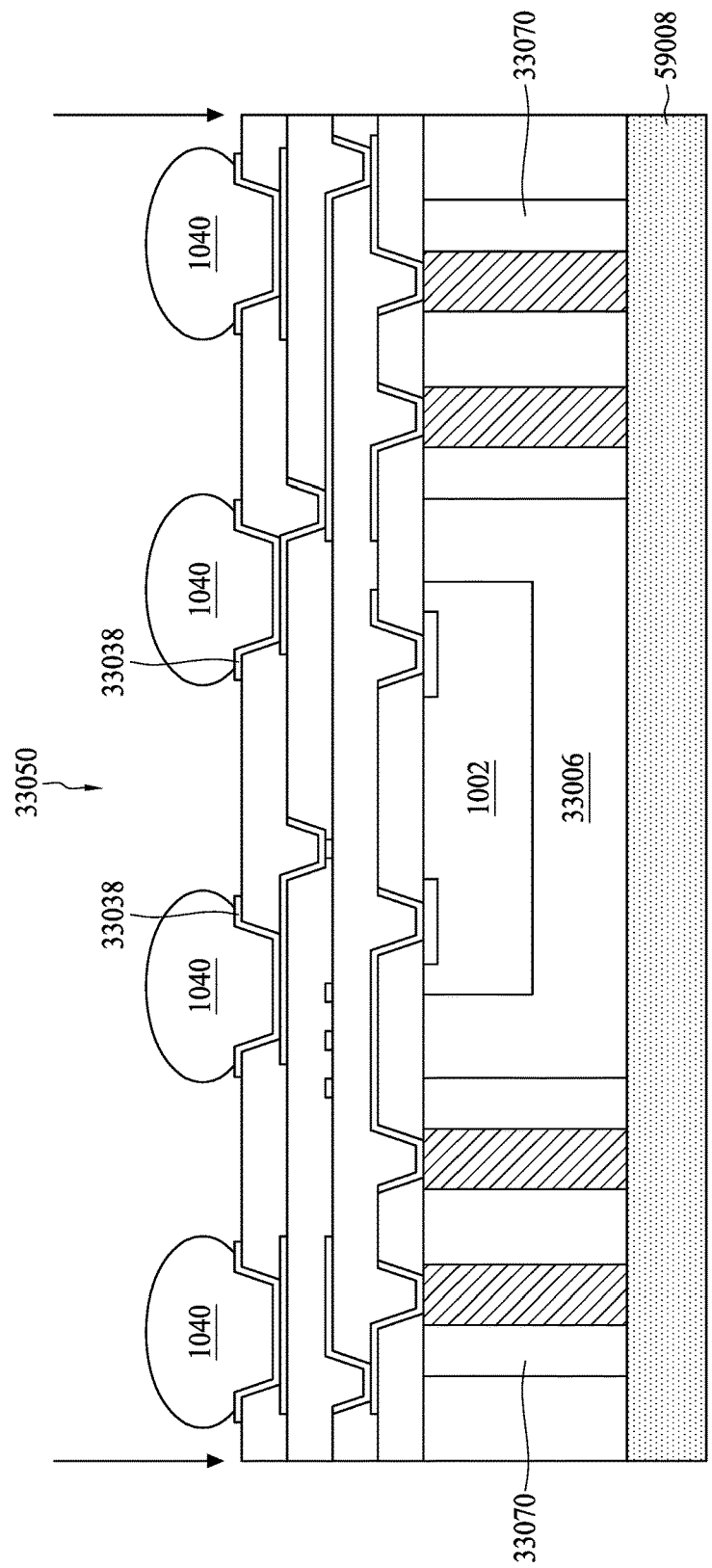
Figure 59H:
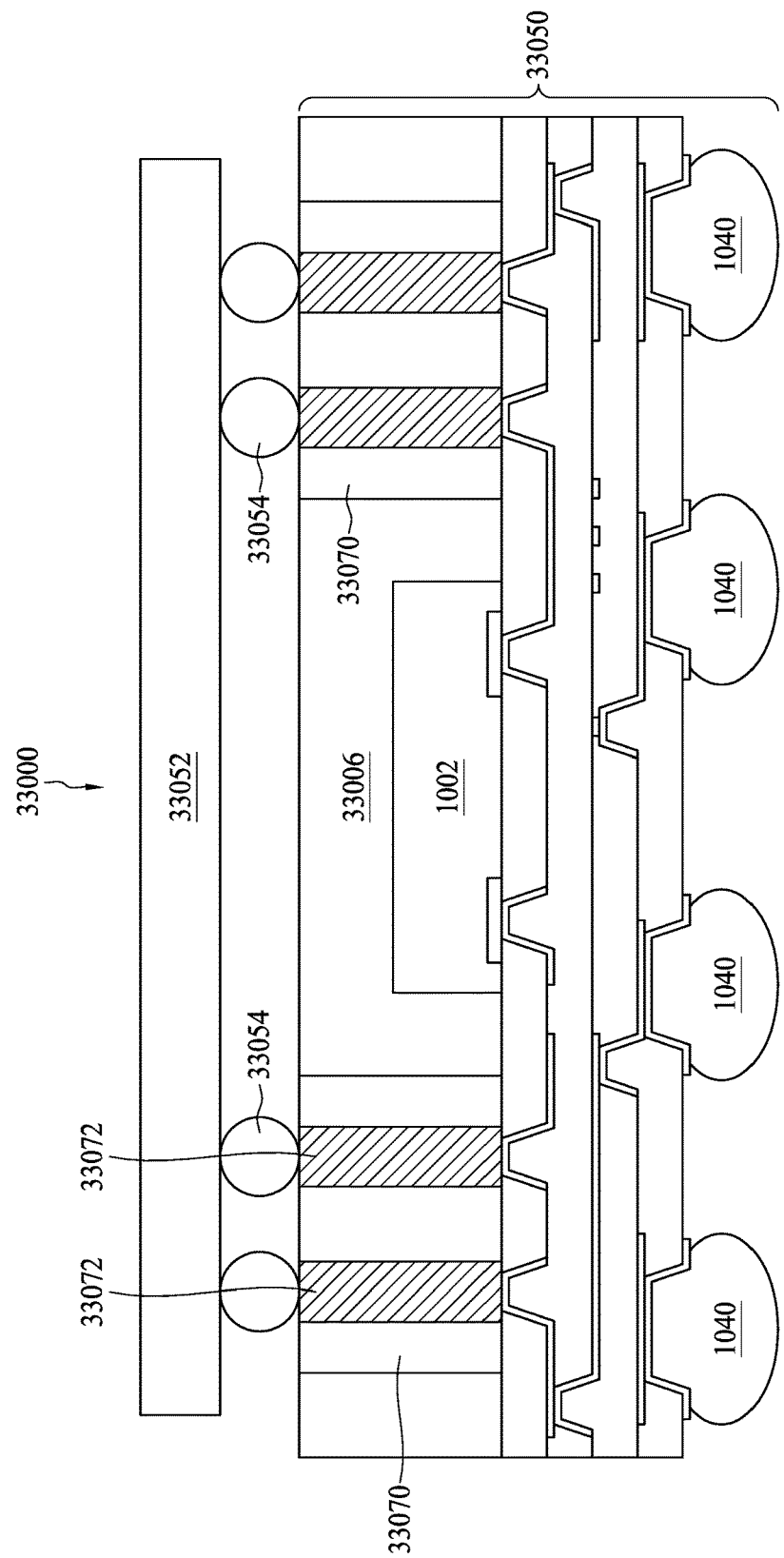

Referring next to FIG. 59G, electrical contacts 1040, such as in the form of conductive bumps, are formed over the UBMs 33038, and, for embodiments in which an array of connected semiconductor device packages are formed, singulation is performed (as shown by arrows in FIG. 59G) to form individual semiconductor device packages, including the semiconductor device package 33050. As shown in FIG. 59H, an electronic component 33052 is then electrically connected to the interposer components 33070 of the semiconductor device package 33050 through connectors 33054, thereby forming the stacked package assembly 33000.

FIG. 61A through FIG. 61E show a sequence of stages of a manufacturing process of a stacked package assembly, according to some embodiments of this disclosure. The manufacturing process can be referred to as a "chip first, face up" process. The following manufacturing operations are explained with reference to the semiconductor device package 36050 and the stacked package assembly 36000 of FIG. 36. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 61A:
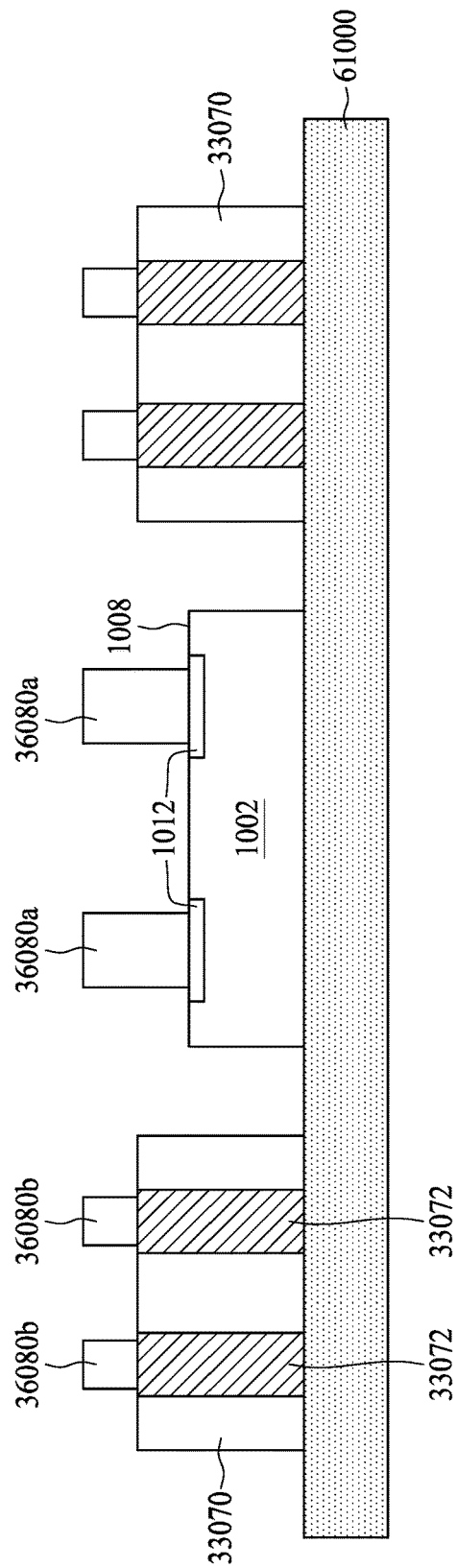
FIG. 61A, FIG. 61B, FIG. 61C, FIG. 61D, and FIG. 61E show a sequence of stages of a manufacturing process of a stacked package assembly, according to some embodiments of this disclosure.

As shown in FIG. 61A, a carrier 61000 is provided. Next, an electronic device 1002 and interposer components 33070 are disposed over the carrier 61000. The electronic device 1002 is disposed over the carrier 61000 with its active surface 1008 facing away from the carrier 61000. Conductive posts 36080*a* are disposed over the electronic device 1002 and extend from respective contact pads 1012 of the electronic device 1002. Conductive posts 36080*b* are disposed over the interposer components 33070 and extend from respective conductive vias 33072 of the interposer components 33070.

Figure 61B:
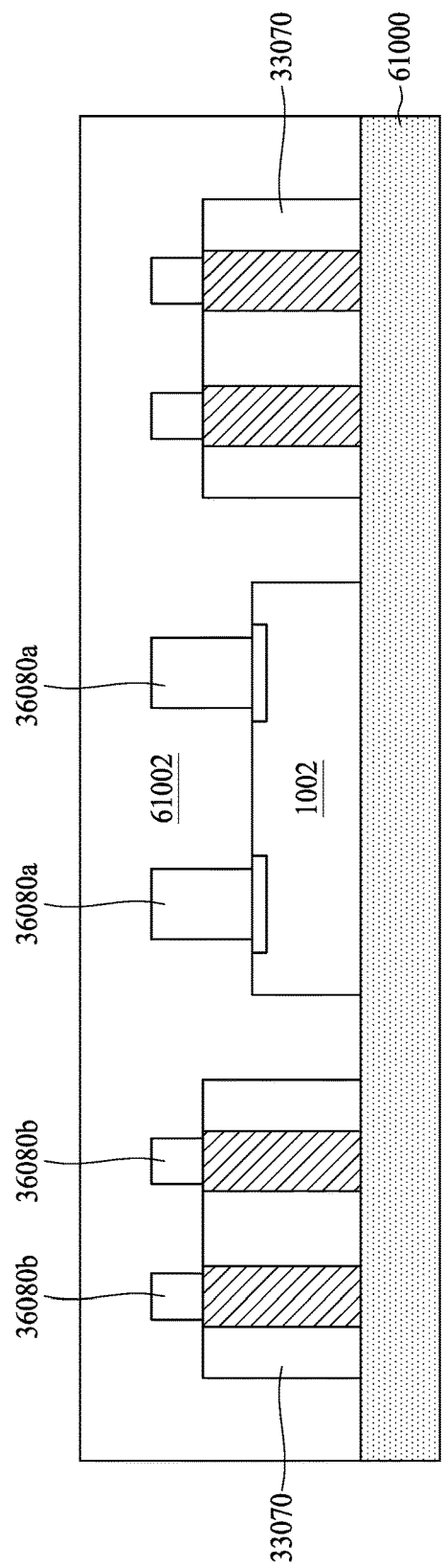
Figure 61C:
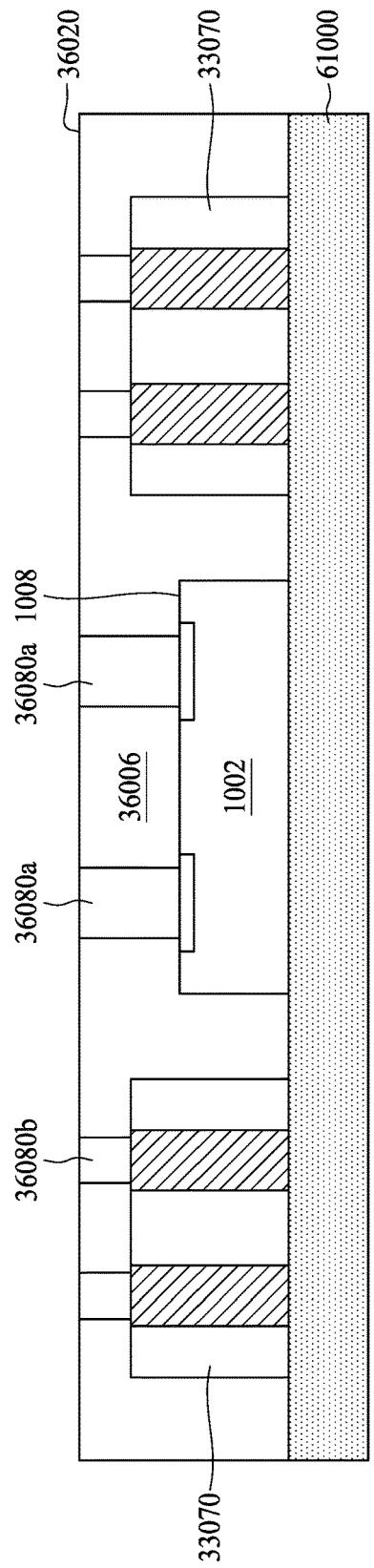

Next and referring to FIG. 61B, a package body 61002 is formed to cover or encapsulate the conductive posts 36080*a* and 36080*b*, the electronic device 1002, and the interposer components 33070. The package body 61002 is next subjected to grinding, lapping, or another suitable material removal technique, thereby forming a package body 36006 as shown in FIG. 61C. The package body 36006 includes a front surface 36020, and at least a portion of a terminal end of each conductive post 36080*a* or 36080*b* is exposed from the front surface 36020 of the package body 36006.

Figure 61D:
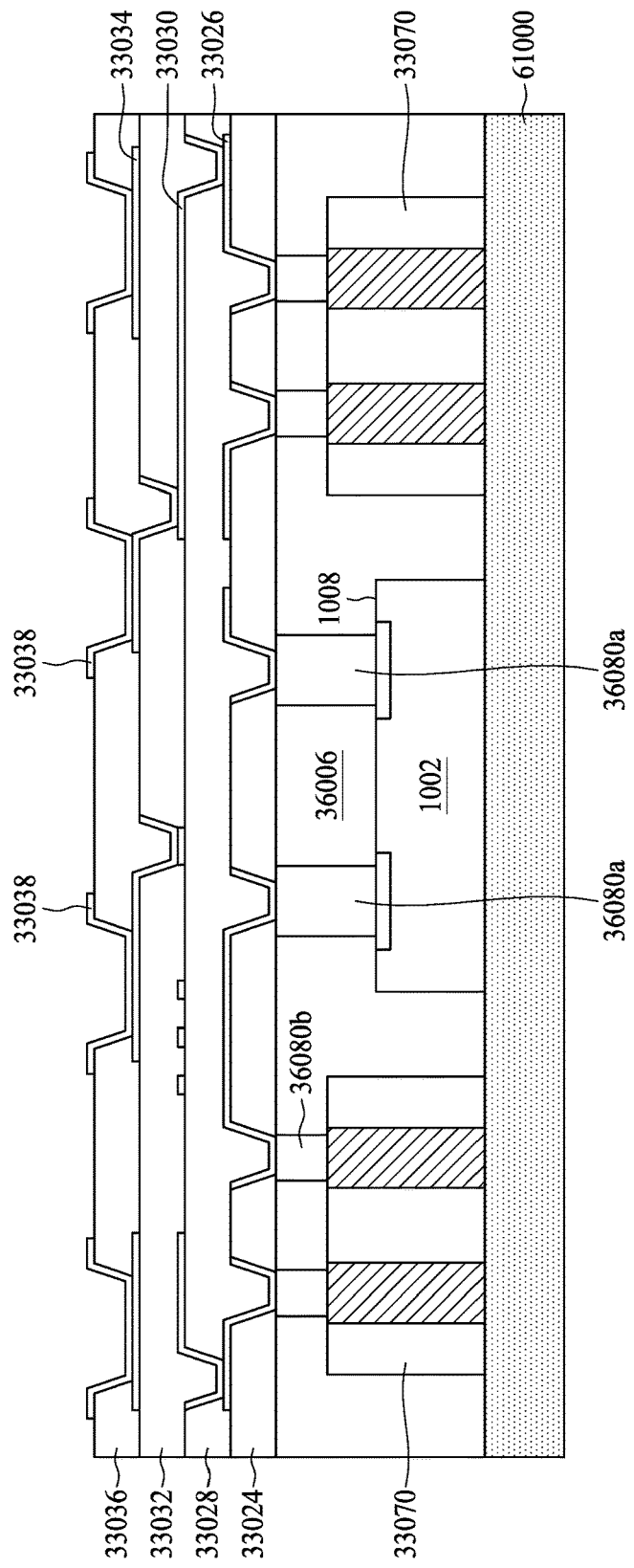

Next, a redistribution stack is formed over the active surface 1008 of the electronic device 1002 and the front surface 36020 of the package body 36006. As shown in FIG. 61D, a dielectric layer 33024 is formed over the electronic device 1002 and the package body 36006, and an RDL 33026 is formed over the dielectric layer 33024. Next, a dielectric layer 33028 is formed over the RDL 33026 and the dielectric layer 33024, and an RDL 33030 is formed over the dielectric layer 33028. Next, a dielectric layer 33032 is formed over the RDL 33030 and the dielectric layer 33028, and an RDL 33034 is formed over the dielectric layer 33032. Next, a dielectric layer 33036 is formed over the RDL 33034 and the dielectric layer 33032, and UBMs 33038 are formed over the dielectric layer 33036.

Figure 61E:
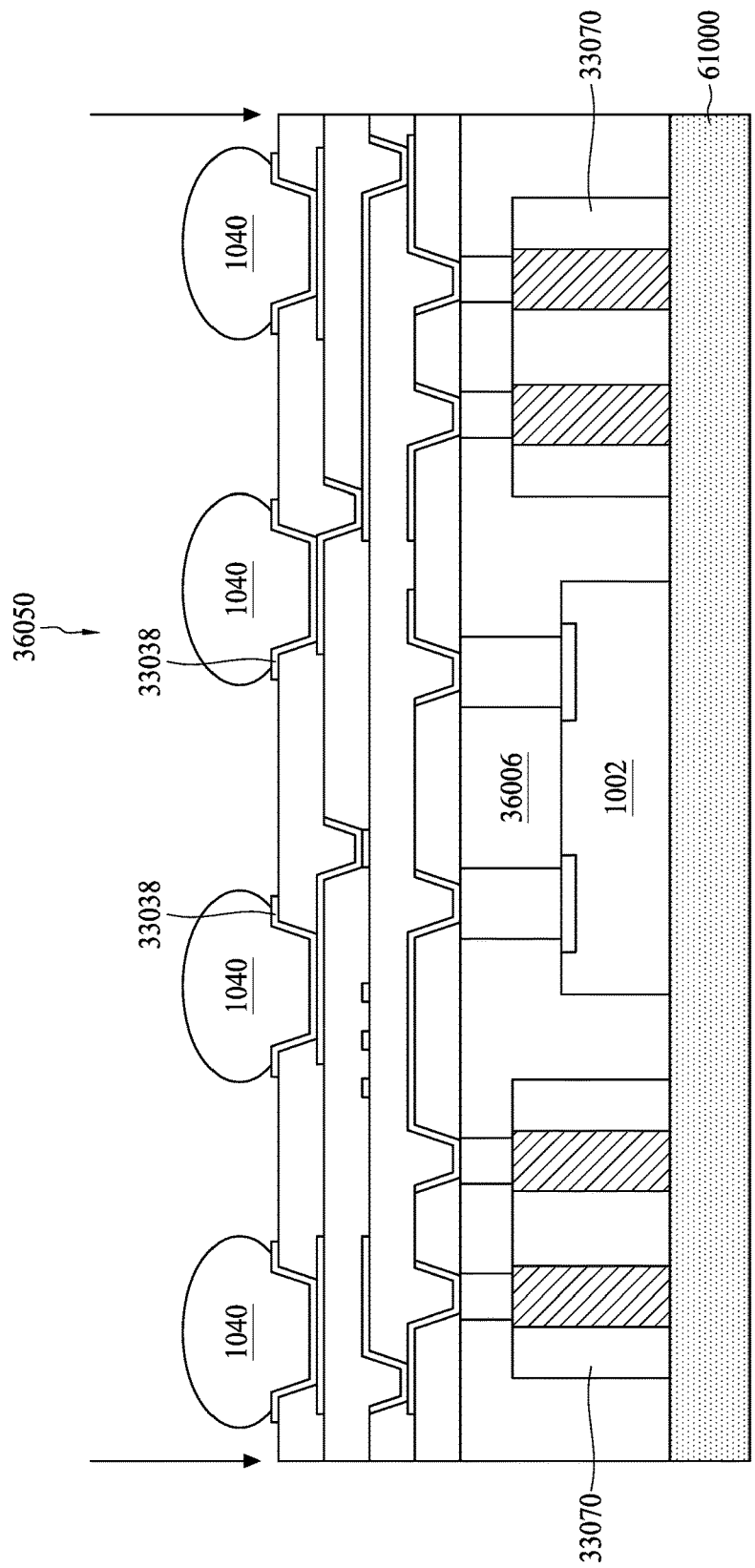

Referring next to FIG. 61E, electrical contacts 1040, such as in the form of conductive bumps, are formed over the UBMs 33038, and, for embodiments in which an array of connected semiconductor device packages are formed, singulation is performed (as shown by arrows in FIG. 61E) to form individual semiconductor device packages, including the semiconductor device package 36050. An electronic component 33052 is then electrically connected to the semiconductor device package 36050, thereby forming the stacked package assembly 36000 of FIG. 36.

Figure 62A:
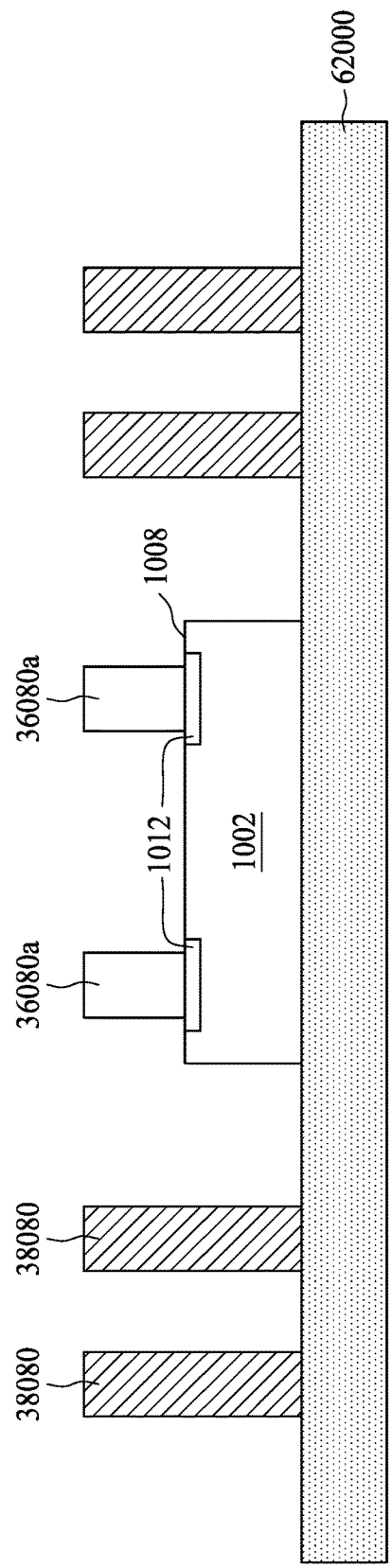
FIG. 62A, FIG. 62B, and FIG. 62C show a sequence of stages of a manufacturing process of a stacked package assembly, according to some embodiments of this disclosure.
Figure 62B:
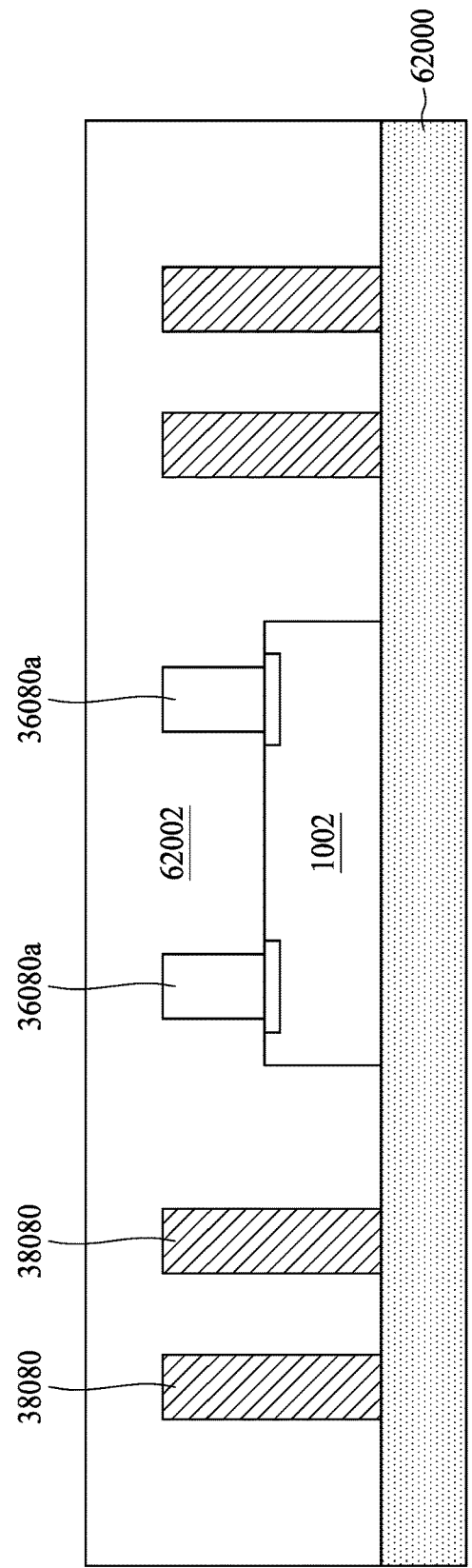
Figure 62C:
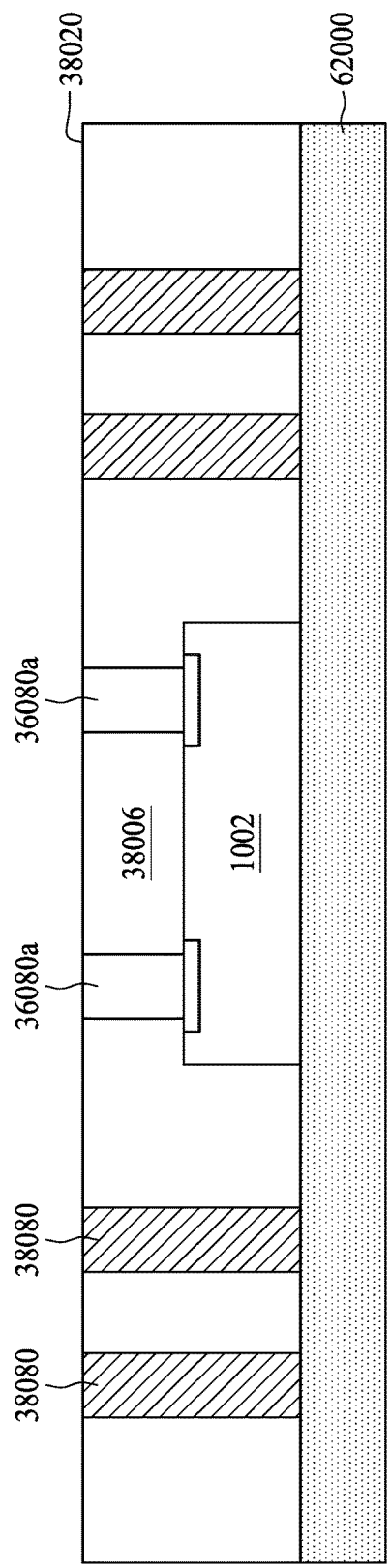

FIG. 62A through FIG. 62C show a sequence of stages of a manufacturing process of a stacked package assembly, according to some embodiments of this disclosure. The manufacturing process can be referred to as a "chip first, face up" process. The following manufacturing operations are explained with reference to the semiconductor device package 38050 and the stacked package assembly 38000 of FIG. 38. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

As shown in FIG. 62A, a carrier 62000 is provided. Next, an electronic device 1002 and conductive posts 38080 are disposed over the carrier 62000. The electronic device 1002 is disposed over the carrier 62000 with its active surface 1008 facing away from the carrier 62000. Conductive posts 36080*a* are disposed over the electronic device 1002 and extend from respective contact pads 1012 of the electronic device 1002. The conductive posts 38080 can be formed over the carrier 62000, such as by plating within openings of a patterned photoresist layer or another suitable deposition technique.

Next and referring to FIG. 62B, a package body 62002 is formed to cover or encapsulate the conductive posts 36080*a* and 38080 and the electronic device 1002. The package body 62002 is next subjected to grinding, lapping, or another suitable material removal technique, thereby forming a package body 38006 as shown in FIG. 62C. The package body 38006 includes a front surface 38020, and at least a portion of a terminal end of each conductive post 36080*a* or 38080 is exposed from the front surface 38020 of the package body 38006. Subsequent manufacturing operations can be similarly performed as explained in the foregoing with reference to FIG. 61A through FIG. 61E, thereby forming the semiconductor device package 38050 and the stacked package assembly 38000 of FIG. 38.

FIG. 63A through FIG. 63E show a sequence of stages of a manufacturing process of a stacked package assembly, according to some embodiments of this disclosure. The manufacturing process can be referred to as a "chip last" process. The following manufacturing operations are explained with reference to the semiconductor device package 40050 and the stacked package assembly 40000 of FIG. 40. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 63A:
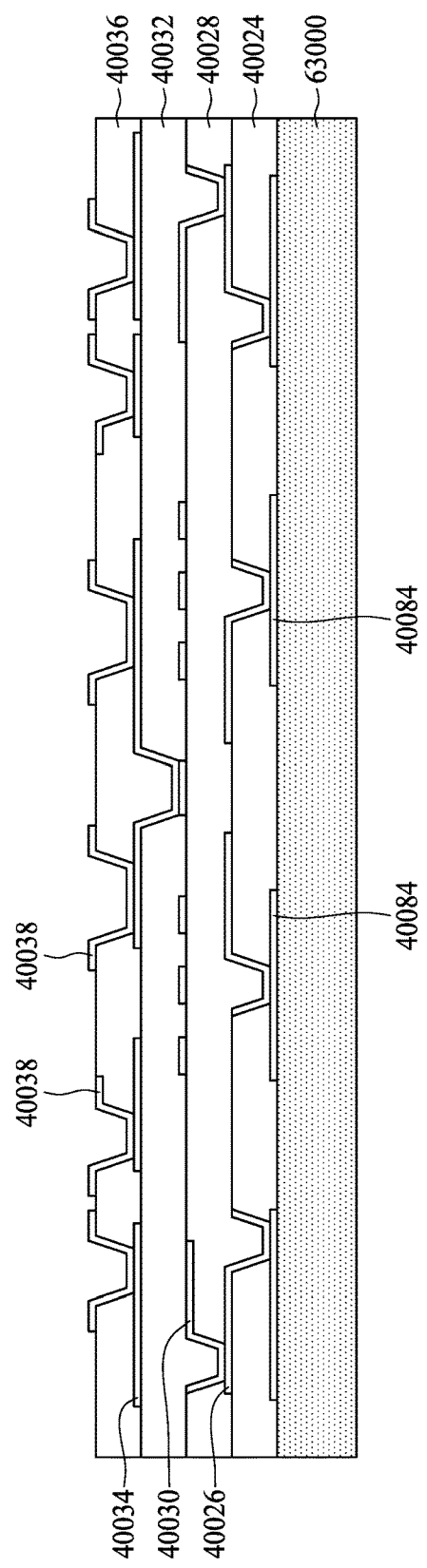
FIG. 63A, FIG. 63B, FIG. 63C, FIG. 63D, and FIG. 63E show a sequence of stages of a manufacturing process of a stacked package assembly, according to some embodiments of this disclosure.

As shown in FIG. 63A, a carrier 63000 is provided. Next, a redistribution stack is formed over the carrier 63000. Referring to FIG. 63A, conductive pads 40084 are formed over the carrier 63000. Next, a dielectric layer 40024 is formed over the conductive pads 40084 and the carrier 63000, and an RDL 40026 is formed over the dielectric layer 40024. Next, a dielectric layer 40028 is formed over the RDL 40026 and the dielectric layer 40024, and an RDL 40030 is formed over the dielectric layer 40028. Next, a dielectric layer 40032 is formed over the RDL 40030 and the dielectric layer 40028, and an RDL 40034 is formed over the dielectric layer 40032. Next, a dielectric layer 40036 is formed over the RDL 40034 and the dielectric layer 40032, and UBMs 40038 are formed over the dielectric layer 40036.

Figure 63B:
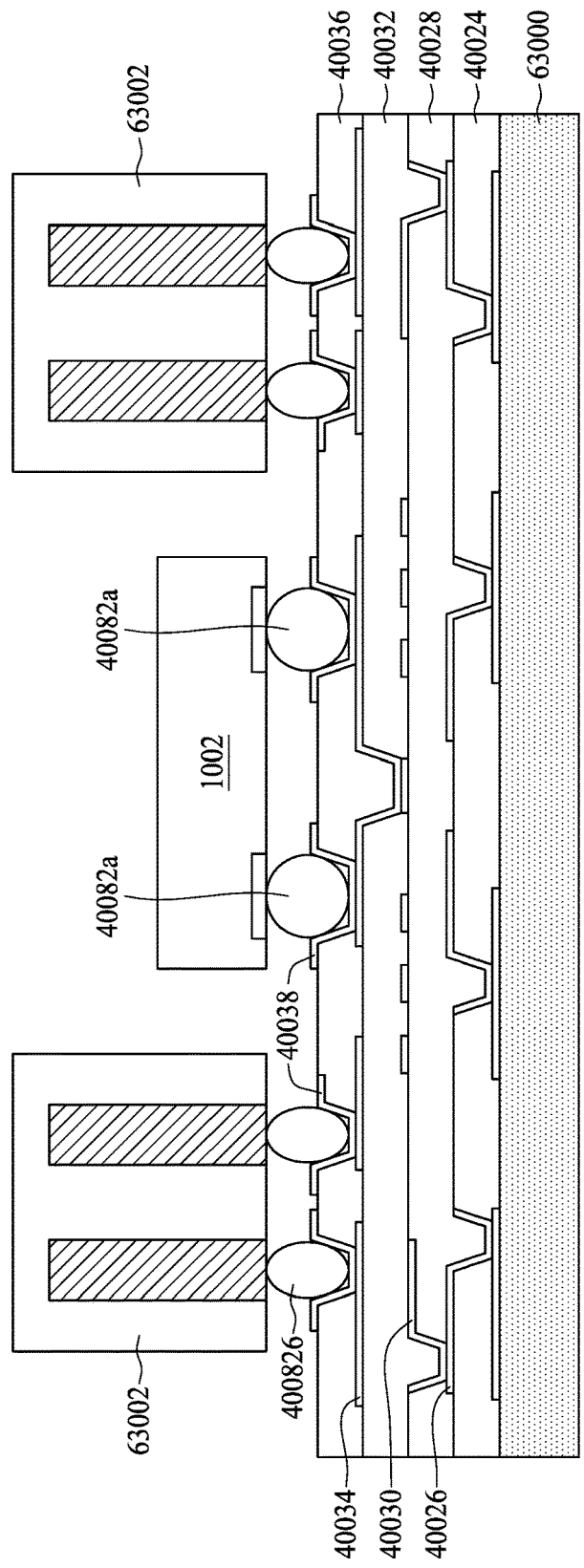

Referring next to FIG. 63B, an electronic device 1002 and interposer components 63002 are disposed over the redistribution stack of the RDLs 40026, 40030, and 40034 and the dielectric layers 40024, 40028, 40032, and 40036, and are electrically connected to the UBMs 40038 through connectors 40082*a* and 40082*b* by, for example, flip-chip mounting.

Figure 63C:
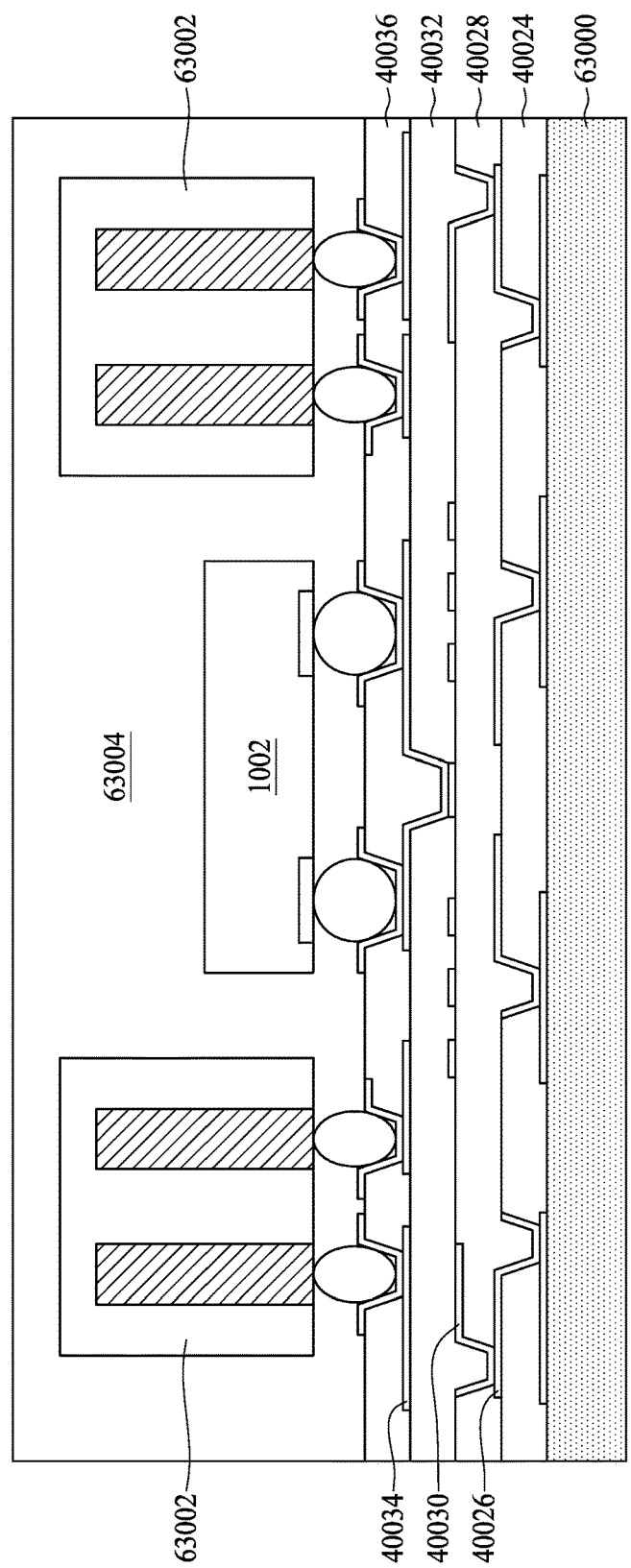
Figure 63D:
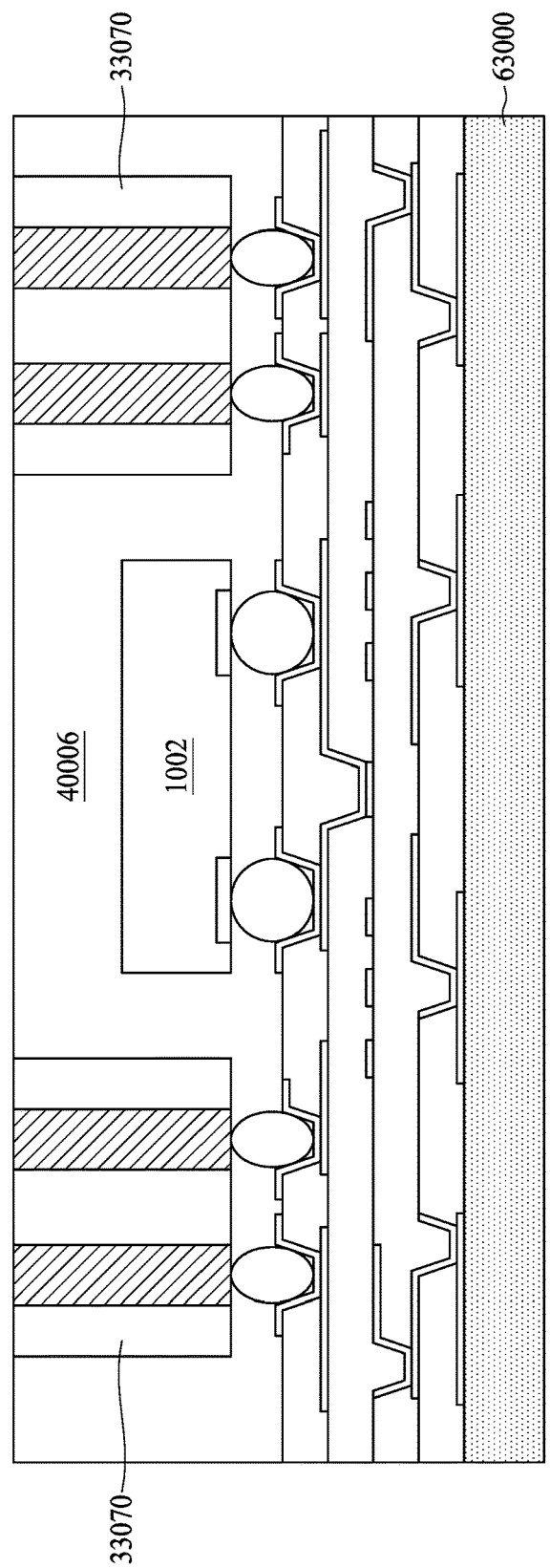

Next and referring to FIG. 63C, a package body 63004 is formed to cover or encapsulate the electronic device 1002 and the interposer components 63002, and is disposed over the redistribution stack of the RDLs 40026, 40030, and 40034 and the dielectric layers 40024, 40028, 40032, and 40036. The package body 63004 and the interposer components 63002 are next subjected to grinding, lapping, or another suitable material removal technique, thereby forming a package body 40006 and interposer components 33070 as shown in FIG. 63D.

Figure 63E:
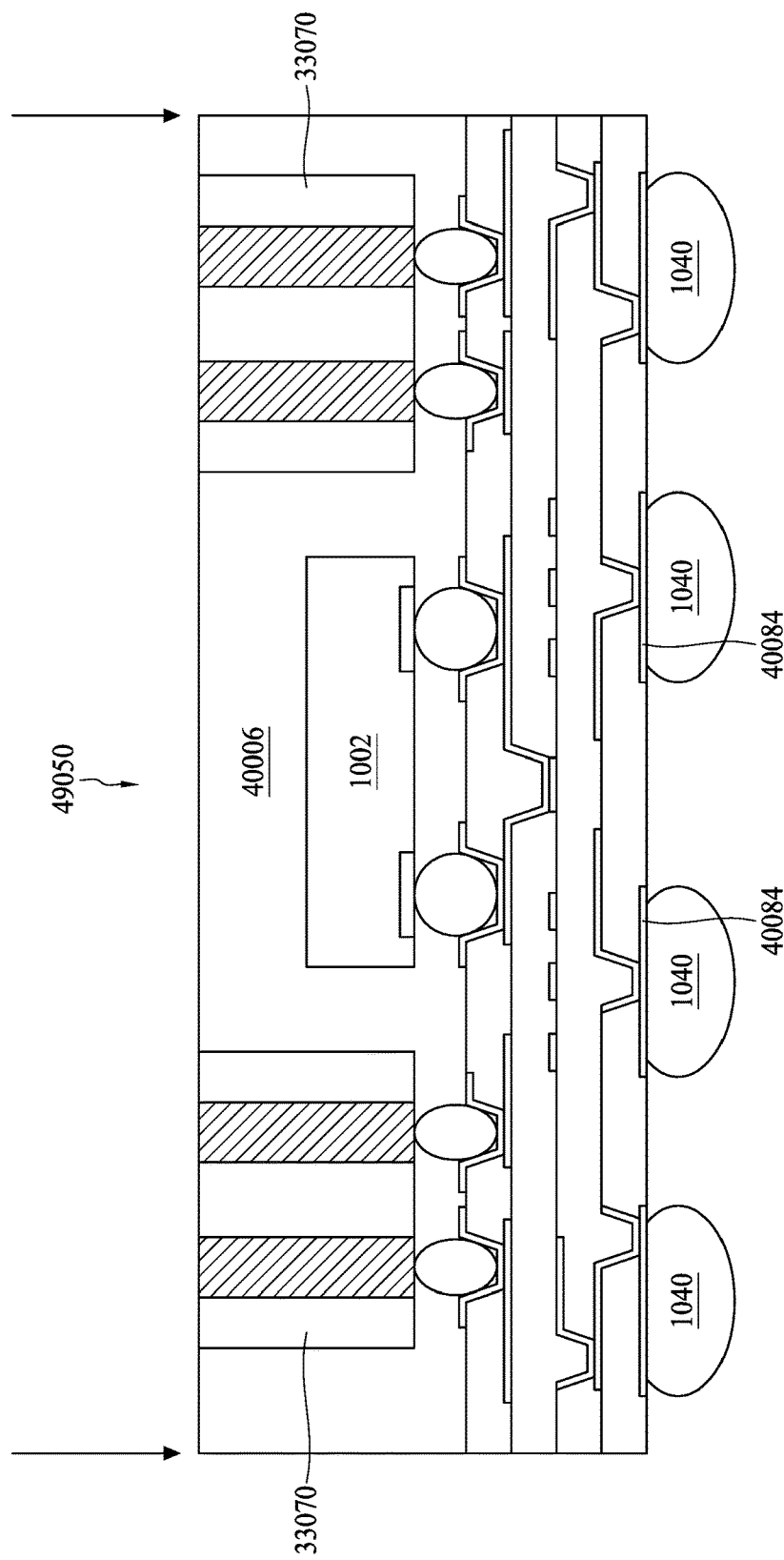

Next and referring to FIG. 63E, the package body 40006 and the redistribution stack are separated from the carrier 63000. Electrical contacts 1040, such as in the form of conductive bumps, are formed over the conductive pads 40084, and, for embodiments in which an array of connected semiconductor device packages are formed, singulation is performed (as shown by arrows in FIG. 63E) to form individual semiconductor device packages, including the semiconductor device package 40050. An electronic component 33052 is then electrically connected to the semiconductor device package 40050, thereby forming the stacked package assembly 40000 of FIG. 40.

FIG. 64A through FIG. 64D show a sequence of stages of a manufacturing process of a stacked package assembly, according to some embodiments of this disclosure. The manufacturing process can be referred to as a "chip last" process. The following manufacturing operations are explained with reference to the semiconductor device package 42050 and the stacked package assembly 42000 of FIG. 42. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 64A:
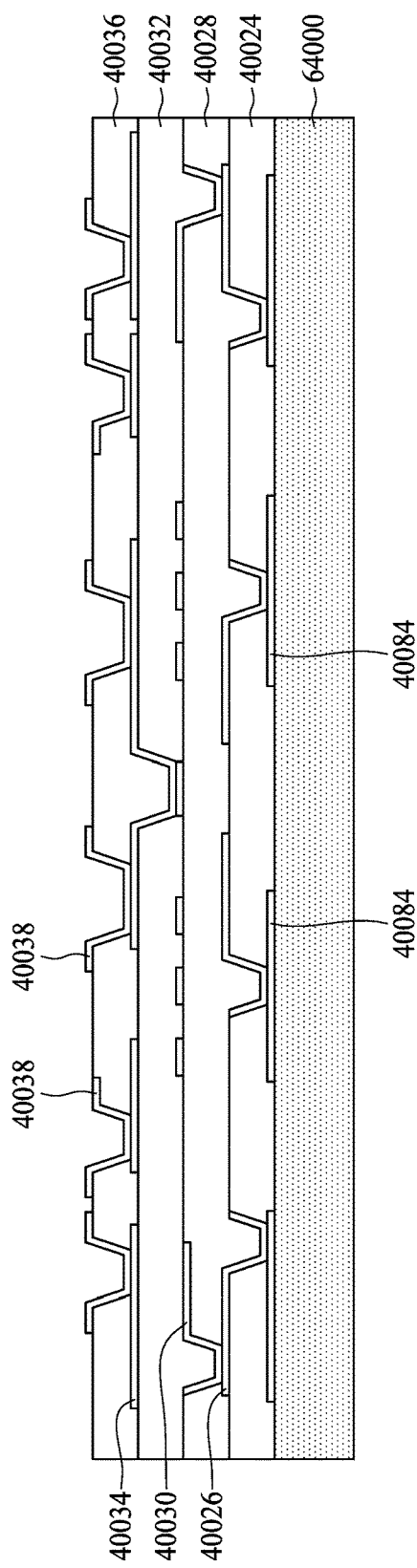
FIG. 64A, FIG. 64B, FIG. 64C, and FIG. 64D show a sequence of stages of a manufacturing process of a stacked package assembly, according to some embodiments of this disclosure.

As shown in FIG. 64A, a carrier 64000 is provided. Next, a redistribution stack is formed over the carrier 64000, including conductive pads 40084, RDLs 40026, 40030, and 40034, dielectric layers 40024, 40028, 40032, and 40036, and UBMs 40038.

Figure 64B:
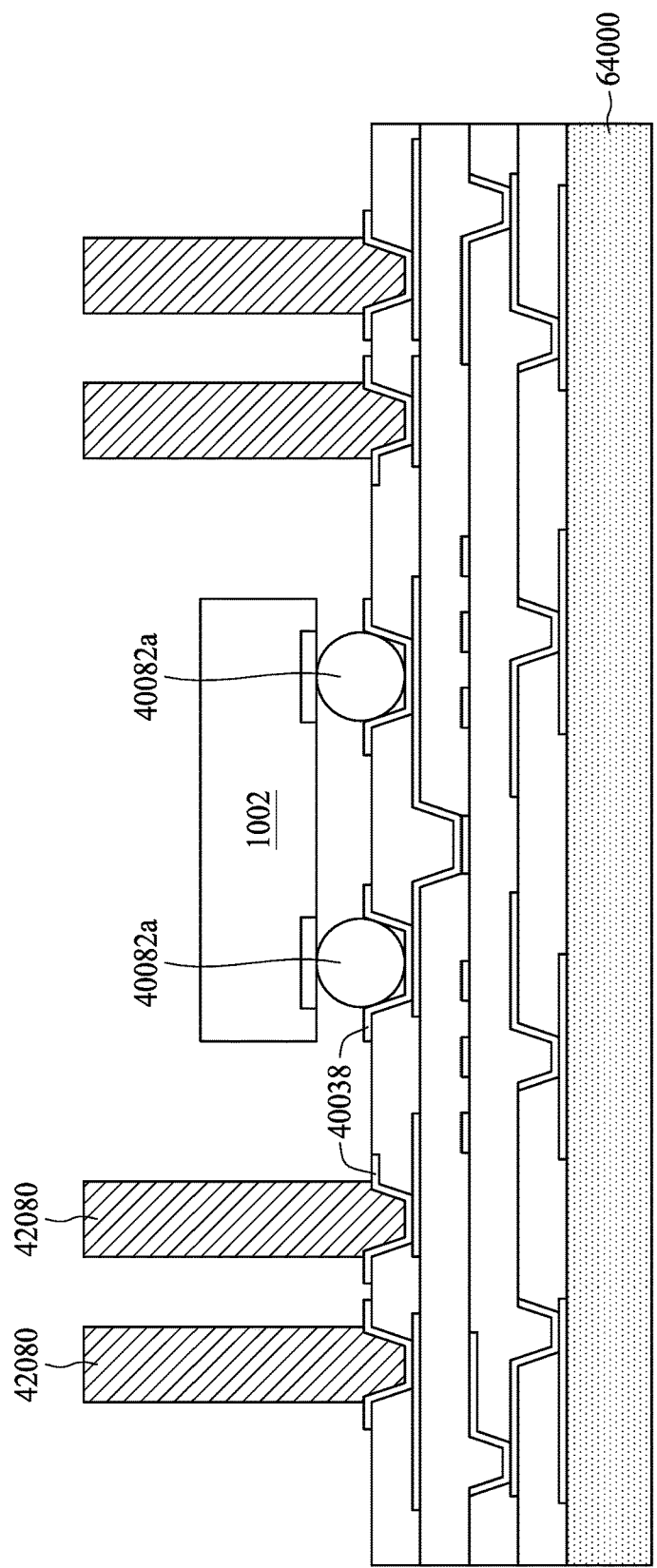

Referring next to FIG. 64B, an electronic device 1002 is disposed over the redistribution stack, and is electrically connected to the UBMs 40038 through connectors 40082a by, for example, flip-chip mounting. Also, conductive posts 42080 are disposed over the redistribution stack, and are electrically connected to the UBMs 40038. The conductive posts 42080 can be formed over the UBMs 40038, such as by plating within openings of a patterned photoresist layer or another suitable deposition technique. It is also contemplated that the conductive posts 42080 can be pre-formed and then electrically connected to the UBMs 40038, such as using solder or a conductive adhesive.

Figure 64C:
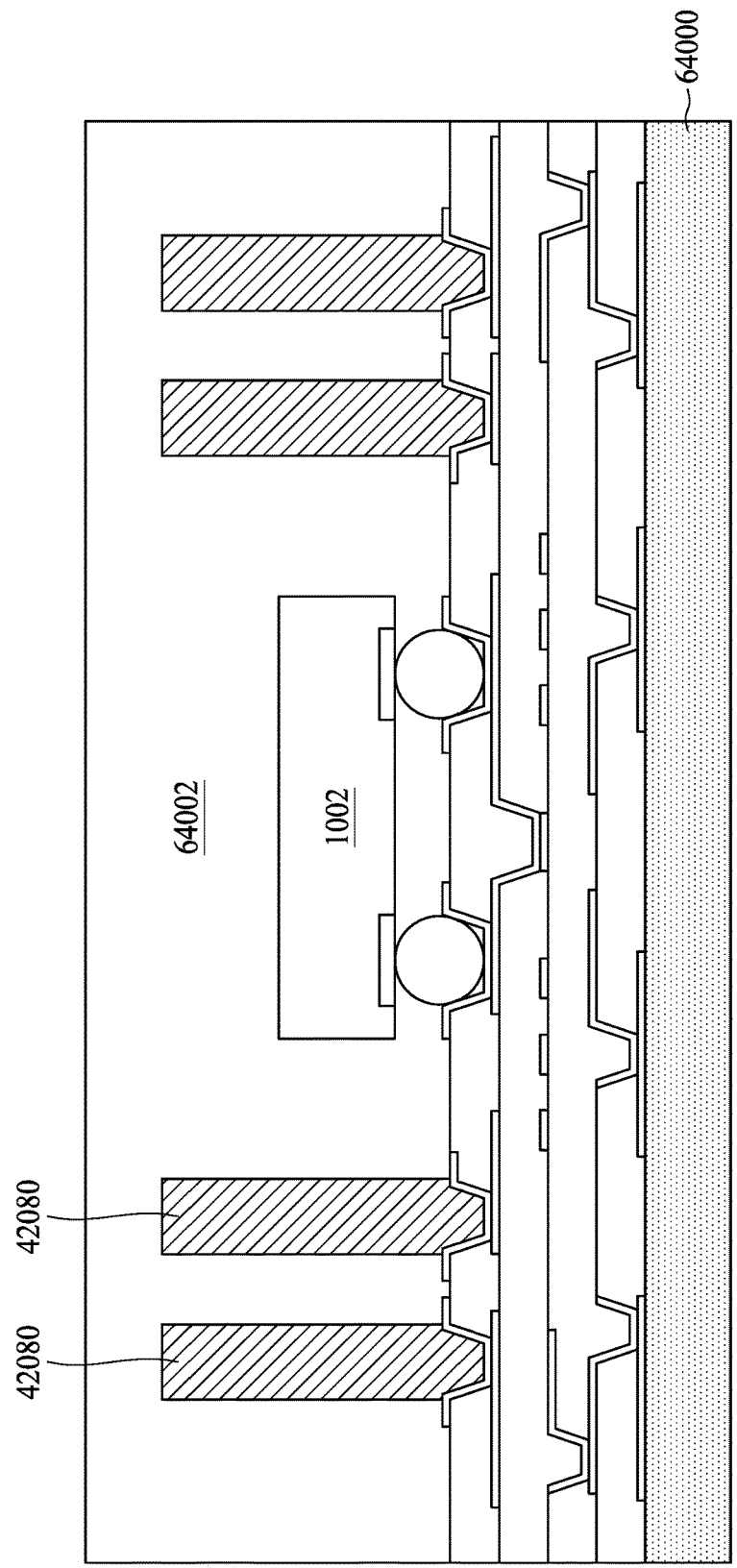
Figure 64D:
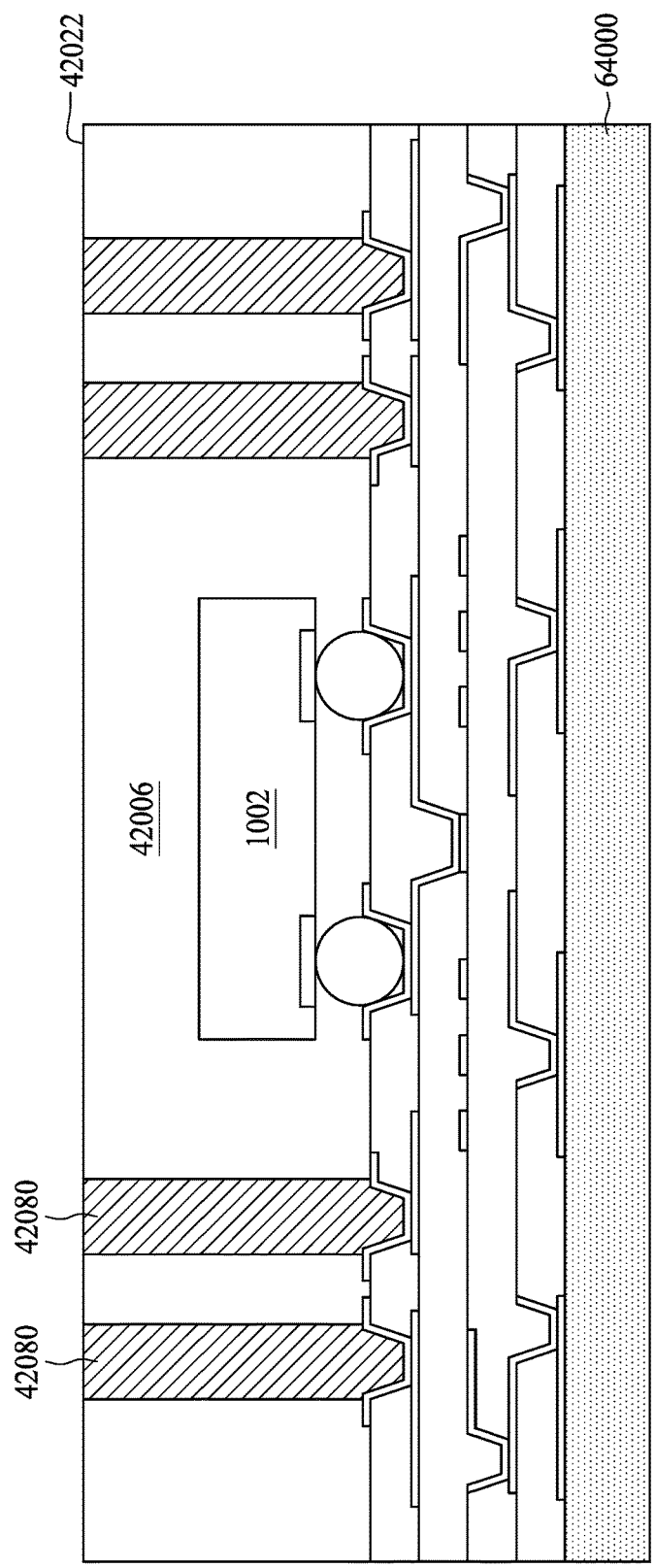

Next and referring to FIG. 64C, a package body 64002 is formed to cover or encapsulate the electronic device 1002 and the conductive posts 42080, and is disposed over the redistribution stack. The package body 64002 is next subjected to grinding, lapping, or another suitable material removal technique, thereby forming a package body 42006 as shown in FIG. 64D. The package body 42006 includes a back surface 42022, and at least a portion of a terminal end of each conductive post 42080 is exposed from the back surface 42022 of the package body 42006. Subsequent manufacturing operations can be similarly performed as explained in the foregoing with reference to FIG. 63A through FIG. 63E, thereby forming the semiconductor device package 42050 and the stacked package assembly 42000 of FIG. 42.

FIG. 65A through FIG. 65D show a sequence of stages of a manufacturing process of a stacked package assembly, according to some embodiments of this disclosure. The following manufacturing operations are explained with reference to the semiconductor device package 44050 and the stacked package assembly 44000 of FIG. 44. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 65A:
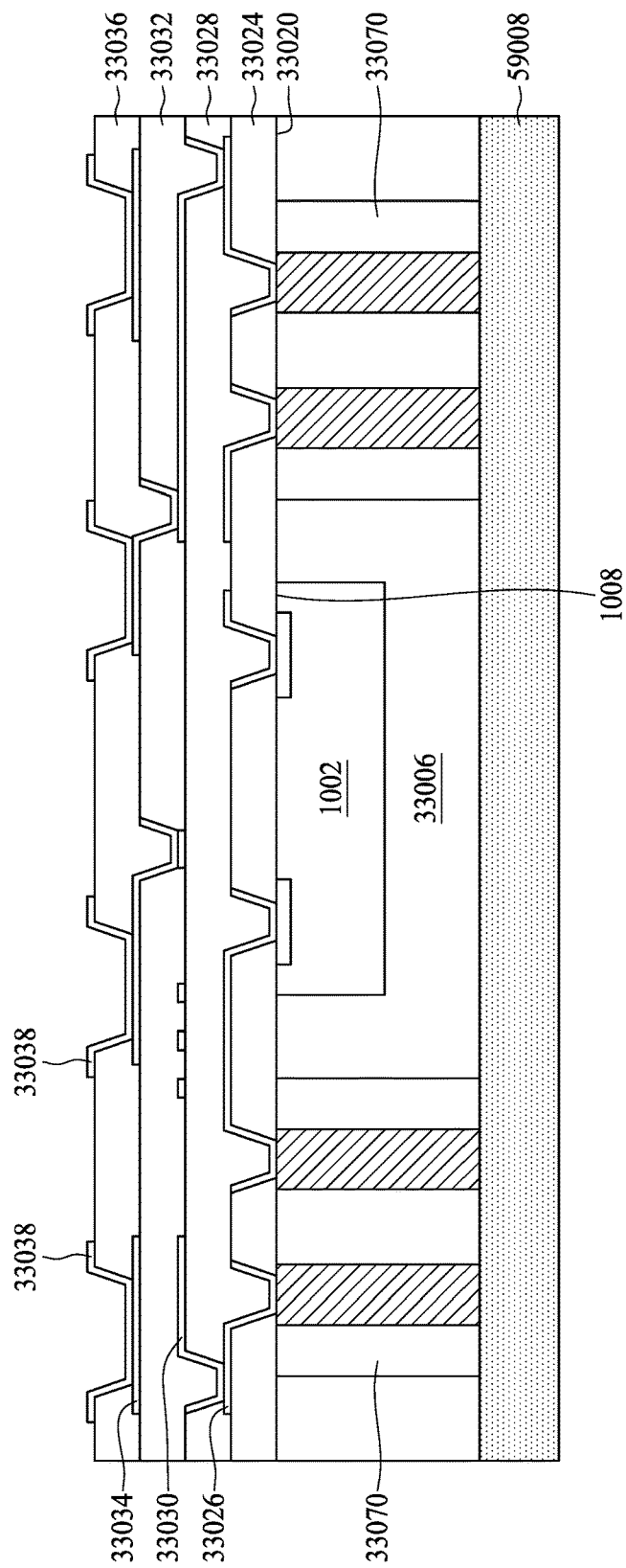
FIG. 65A, FIG. 65B, FIG. 65C, and FIG. 65D show a sequence of stages of a manufacturing process of a stacked package assembly, according to some embodiments of this disclosure.

Referring to FIG. 65A, initial manufacturing operations can be similarly performed as explained in the foregoing with reference to FIG. 59A through FIG. 59F to form a redistribution stack over an active surface 1008 of an electronic device 1002 and a front surface 33020 of a package body 33006. As shown in FIG. 65A, the redistribution stack includes RDLs 33026, 33030, and 33034, dielectric layers 33024, 33028, 33032, and 33036, and UBMs 33038.

Figure 65B:
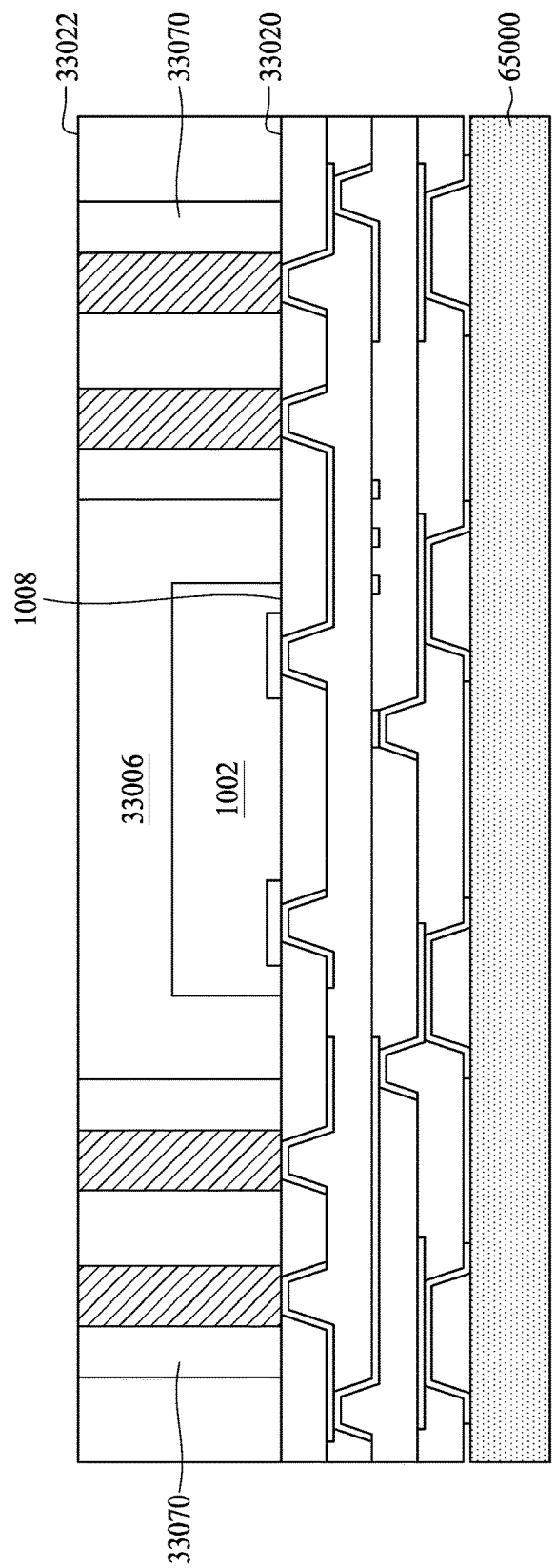

Next and referring to FIG. 65B, the redistribution stack, the package body 33006, the encapsulated electronic device 1002, and encapsulated interposer components 33070 are separated from a carrier 59008, and are reoriented and disposed over a carrier 65000, with the active surface 1008 of the electronic device 1002 and the front surface 33020 of the package body 33006 facing towards the carrier 65000, and a back surface 33022 of the package body 33006 facing away from the carrier 65000.

Figure 65C:
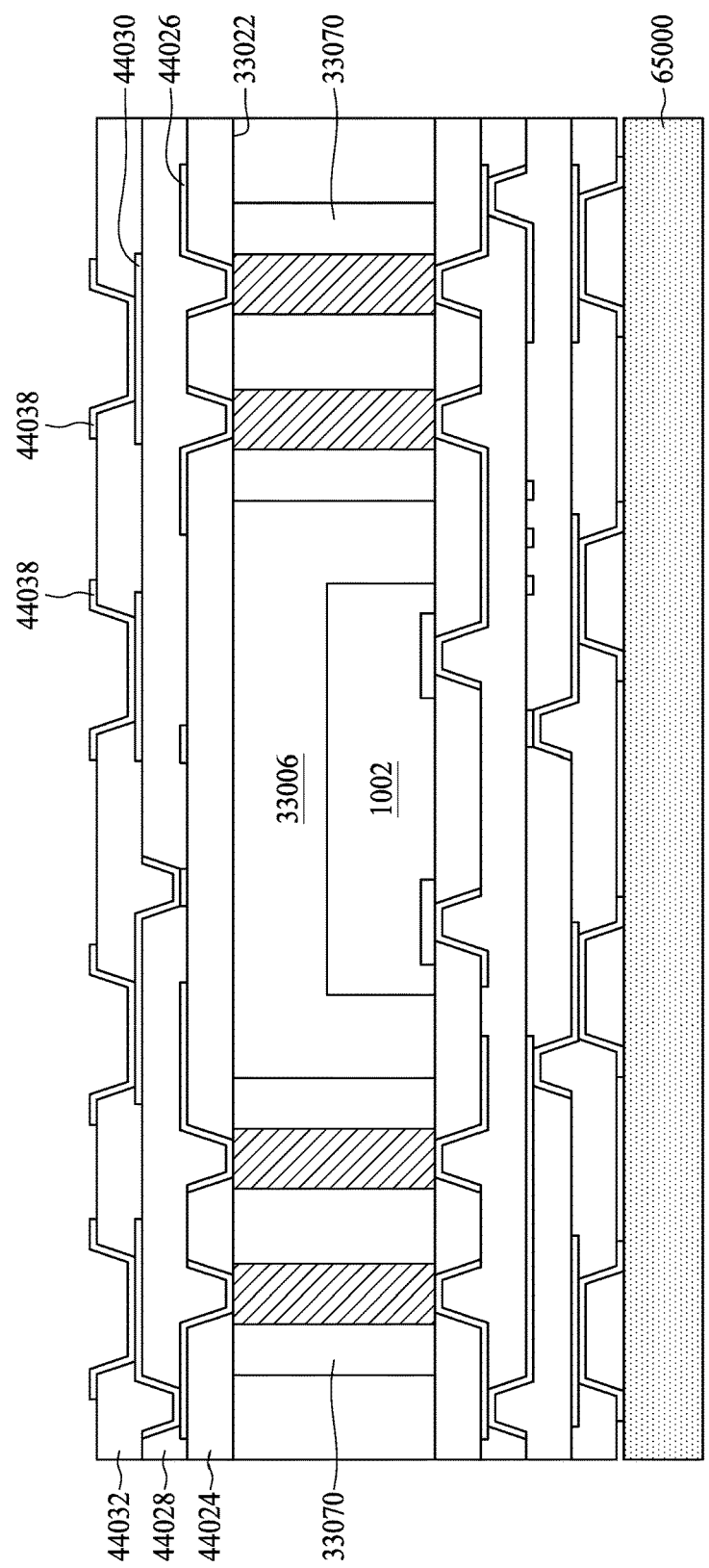

Next, another redistribution stack is formed over the back surface 33022 of the package body 33006. As shown in FIG. 65C, a dielectric layer 44024 is formed over the back surface 33022 of the package body 33006, and an RDL 44026 is formed over the dielectric layer 44024. Next, a dielectric layer 44028 is formed over the RDL 44026 and the dielectric layer 44024, and an RDL 44030 is formed over the dielectric layer 44028. Next, a dielectric layer 44032 is formed over the RDL 44030 and the dielectric layer 44028, and UBMs 44038 are formed over the dielectric layer 44032.

Figure 65D:
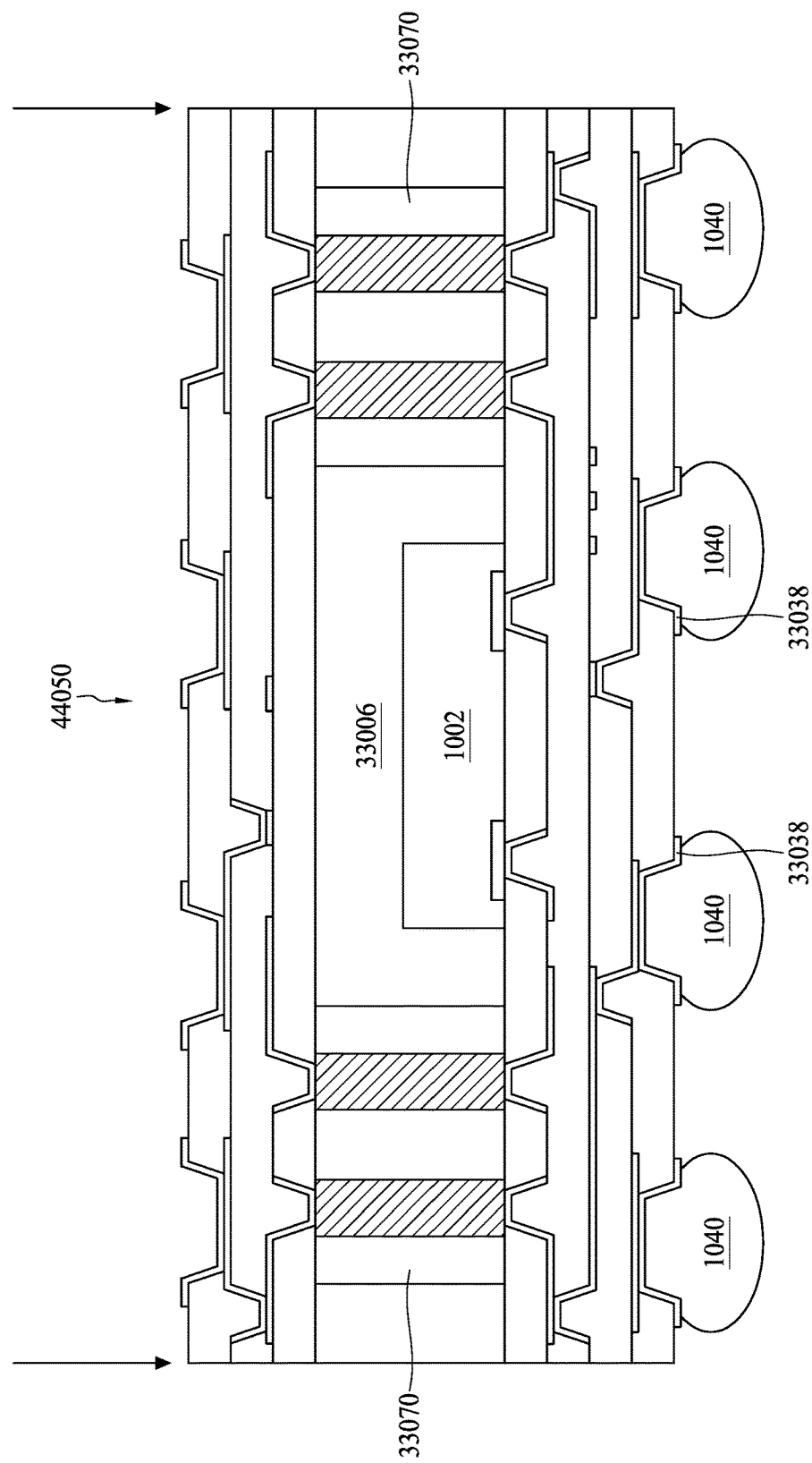

Next and referring to FIG. 65D, the package body 33006 and the redistribution stacks are separated from the carrier 65000. Electrical contacts 1040, such as in the form of conductive bumps, are formed over the UBMs 33038, and, for embodiments in which an array of connected semiconductor device packages are formed, singulation is performed (as shown by arrows in FIG. 65D) to form individual semiconductor device packages, including the semiconductor device package 44050. An electronic component 44052 is then electrically connected to the semiconductor device package 44050, thereby forming the stacked package assembly 44000 of FIG. 44.

FIG. 66A through FIG. 66F show a sequence of stages of a manufacturing process of a stacked package assembly, according to some embodiments of this disclosure. The following manufacturing operations are explained with reference to the semiconductor device package 45050 and the stacked package assembly 45000 of FIG. 45. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 66A:
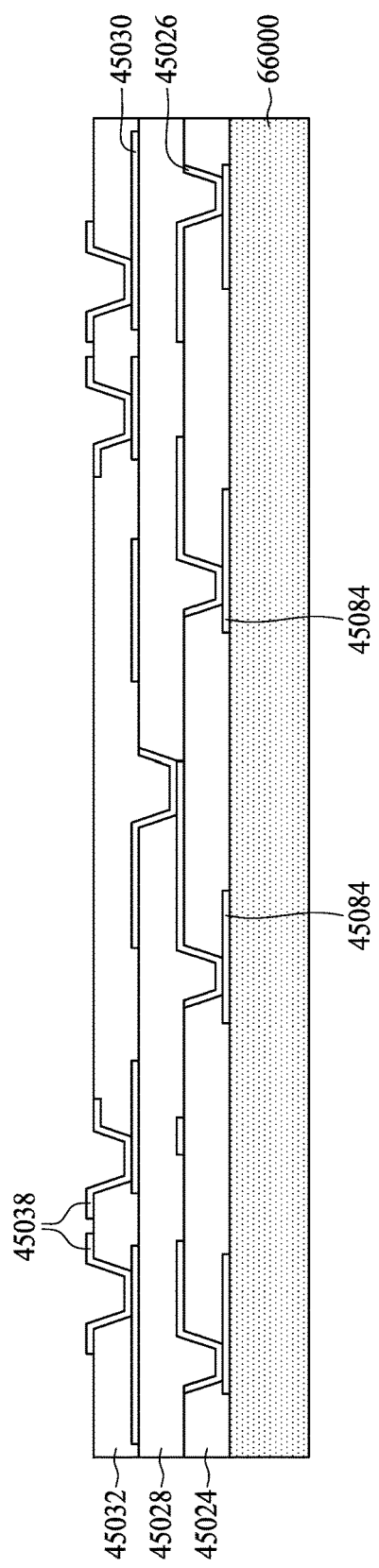
FIG. 66A, FIG. 66B, FIG. 66C, FIG. 66D, FIG. 66E, and FIG. 66F show a sequence of stages of a manufacturing process of a stacked package assembly, according to some embodiments of this disclosure.

As shown in FIG. 66A, a carrier 66000 is provided. Next, a redistribution stack is formed over the carrier 66000. As illustrated, conductive pads 45084 are formed over the carrier 66000. Next, a dielectric layer 45024 is formed over the conductive pads 45084 and the carrier 66000, and an RDL 45026 is formed over the dielectric layer 45024. Next, a dielectric layer 45028 is formed over the RDL 45026 and the dielectric layer 45024, and an RDL 45030 is formed over the dielectric layer 45028. Next, a dielectric layer 45032 is formed over the RDL 45030 and the dielectric layer 45028, and UBMs 45038 are formed over the dielectric layer 45032.

Figure 66B:
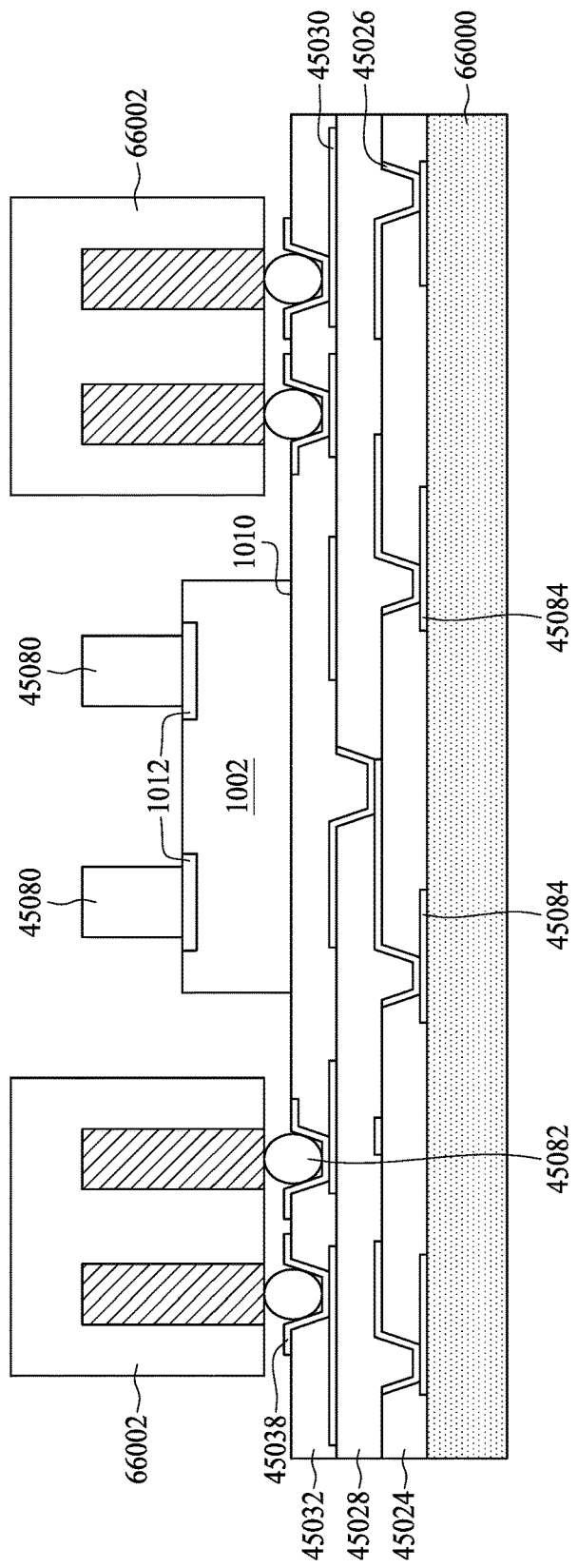

Referring next to FIG. 66B, an electronic device 1002 is disposed over the redistribution stack of the RDLs 45026 and 45030 and the dielectric layers 45024, 45028, and 45032, with its back surface 1010 facing towards the redistribution stack. Conductive posts 45080 are disposed over the electronic device 1002, and extend from respective contact pads 1012 of the electronic device 1002. Also, interposer components 66002 are disposed over the redistribution stack, and are electrically connected to the UBMs 45038 through connectors 45082 by, for example, flip-chip mounting.

Figure 66C:
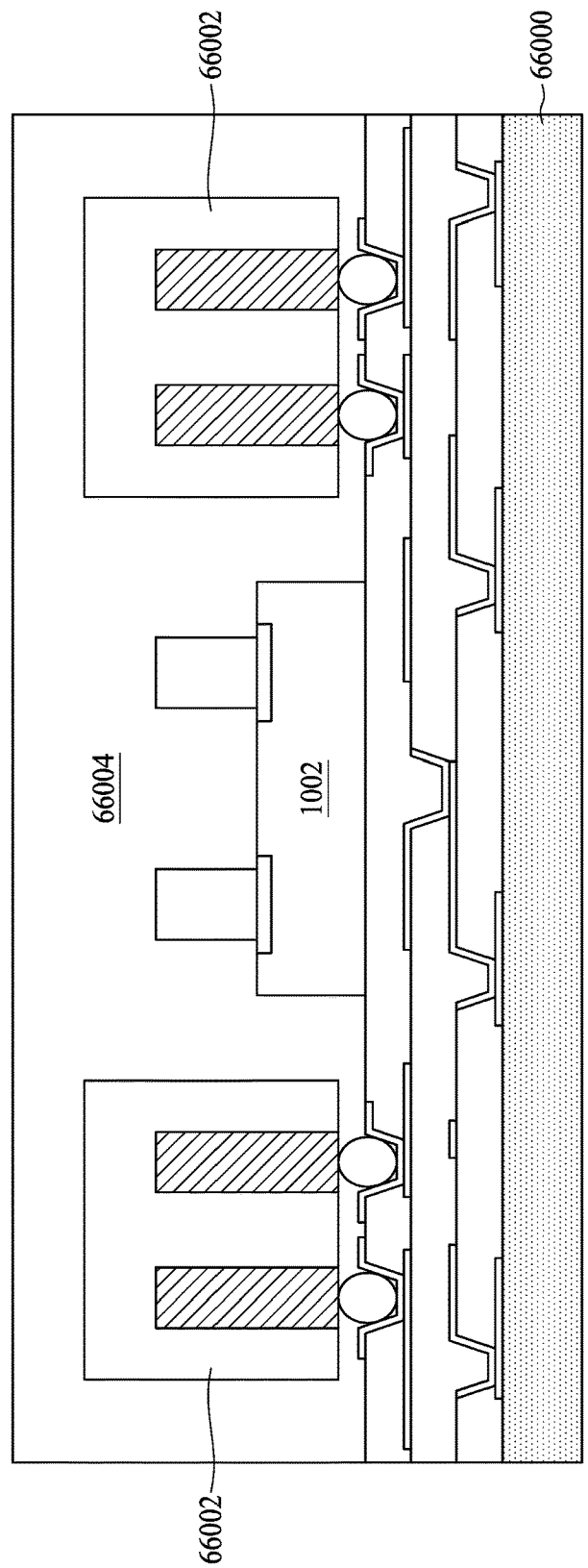
Figure 66D:
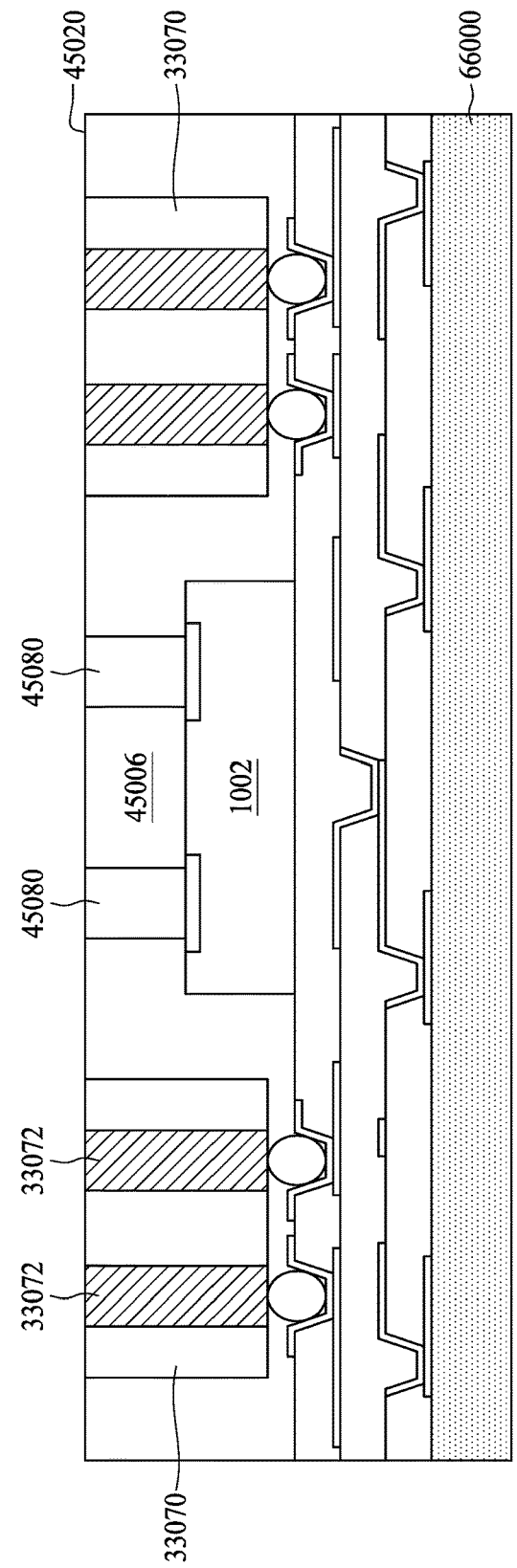

Next and referring to FIG. 66C, a package body 66004 is formed to cover or encapsulate the electronic device 1002 and the interposer components 66002, and is disposed over the redistribution stack. The package body 66004 and the interposer components 66002 are next subjected to grinding, lapping, or another suitable material removal technique, thereby forming a package body 45006 and interposer components 33070 as shown in FIG. 66D. The package body 45006 includes a front surface 45020, and terminal ends of conductive vias 33072 of the interposer components 33070 and terminal ends of the conductive posts 45080 are at least partially exposed from the front surface 45020 of the package body 45006.

Figure 66E:
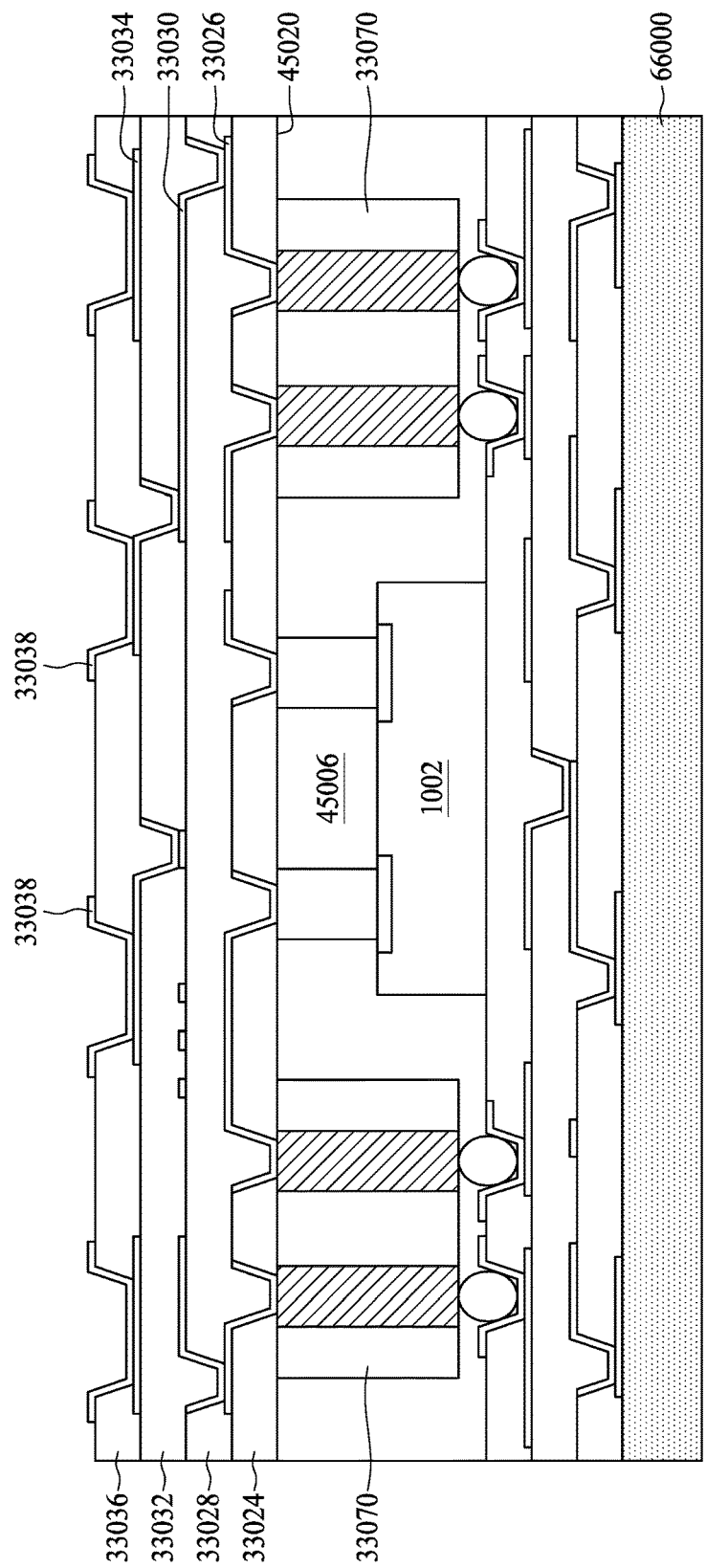

Next, another redistribution stack is formed over the front surface 45020 of the package body 45006. As shown in FIG. 66E, a dielectric layer 33024 is formed over the front surface 45020 of the package body 45006, and an RDL 33026 is formed over the dielectric layer 33024. Next, a dielectric layer 33028 is formed over the RDL 33026 and the dielectric layer 33024, and an RDL 33030 is formed over the dielectric layer 33028. Next, a dielectric layer 33032 is formed over the RDL 33030 and the dielectric layer 33028, and an RDL 33034 is formed over the dielectric layer 33032. Next, a dielectric layer 33036 is formed over the RDL 33034 and the dielectric layer 33032, and UBMs 33038 are formed over the dielectric layer 33036.

Figure 66F:
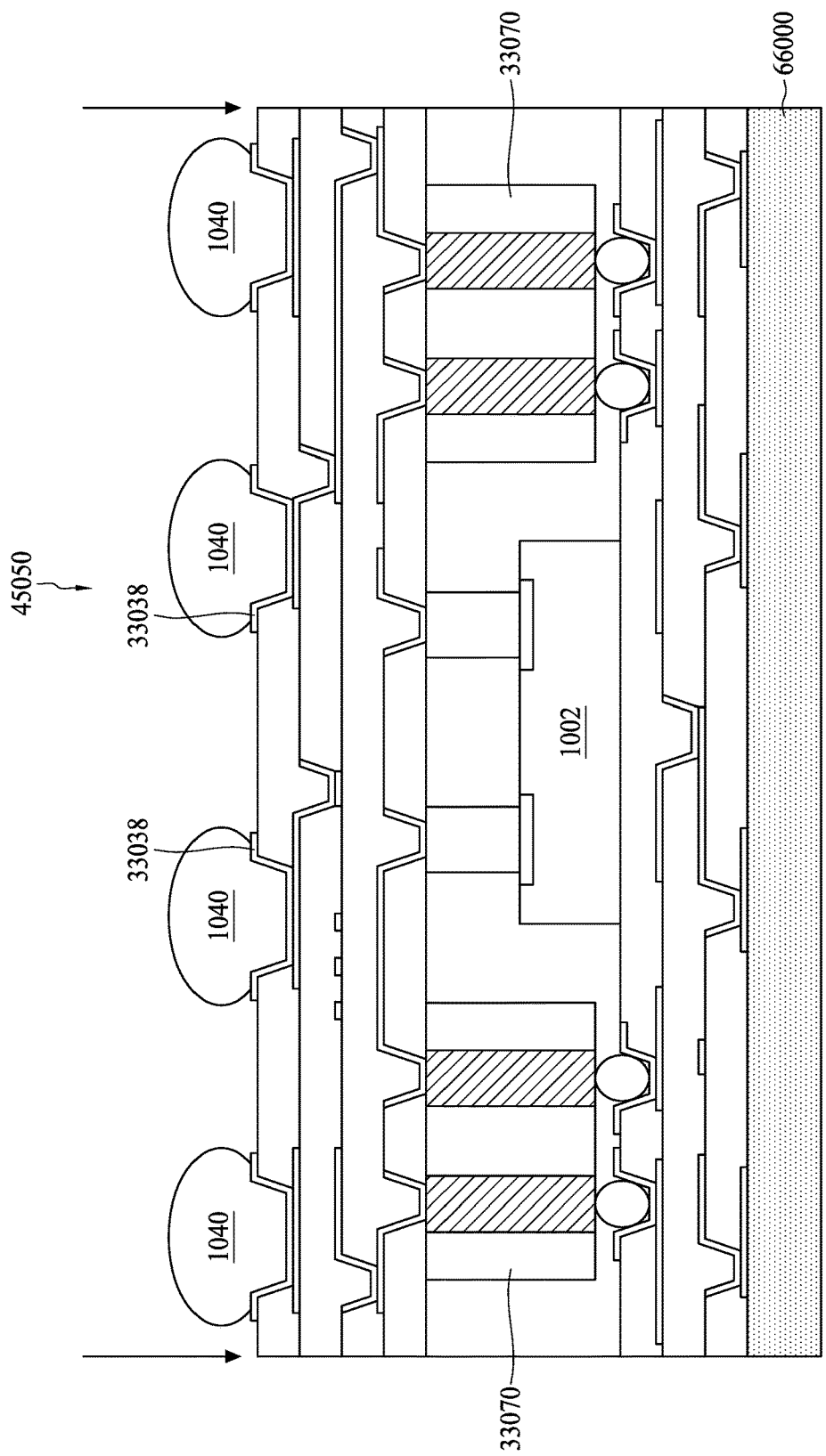

Next and referring to FIG. 66F, electrical contacts 1040, such as in the form of conductive bumps, are formed over the UBMs 33038, and, for embodiments in which an array of connected semiconductor device packages are formed, singulation is performed (as shown by arrows in FIG. 66F) to form individual semiconductor device packages, including the semiconductor device package 45050. An electronic component 44052 is then electrically connected to the semiconductor device package 45050, thereby forming the stacked package assembly 45000 of FIG. 45.

FIG. 67A through FIG. 67D show a sequence of stages of a manufacturing process of a stacked package assembly, according to some embodiments of this disclosure. The following manufacturing operations are explained with reference to the semiconductor device package 47050 and the stacked package assembly 47000 of FIG. 47. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 67A:
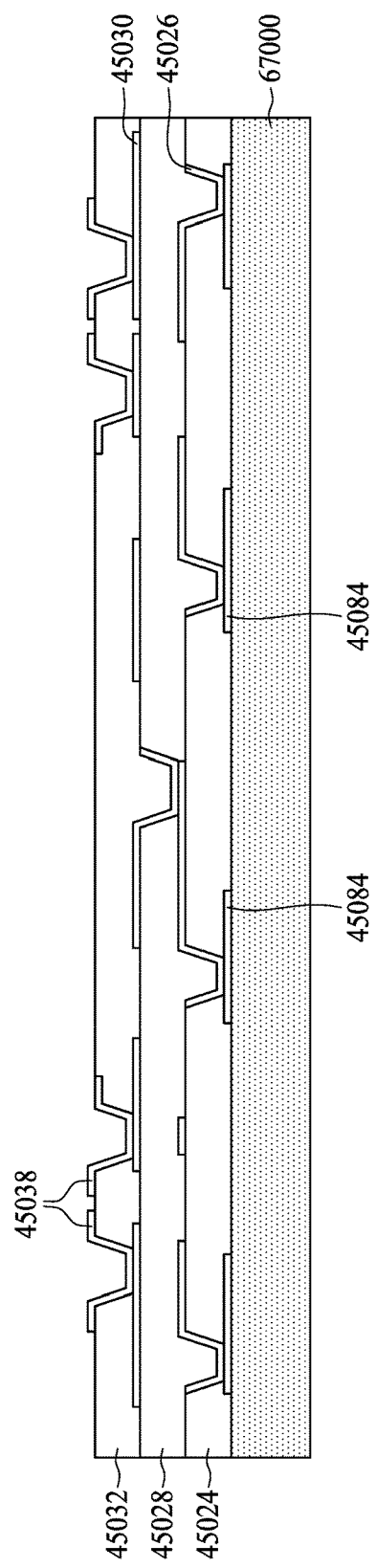
FIG. 67A, FIG. 67B, FIG. 67C, and FIG. 67D show a sequence of stages of a manufacturing process of a stacked package assembly, according to some embodiments of this disclosure.

As shown in FIG. 67A, a carrier 67000 is provided. Next, a redistribution stack is formed over the carrier 67000, including conductive pads 45084, RDLs 45026 and 45030, dielectric layers 45024, 45028, and 45032, and UBMs 45038.

Figure 67B:
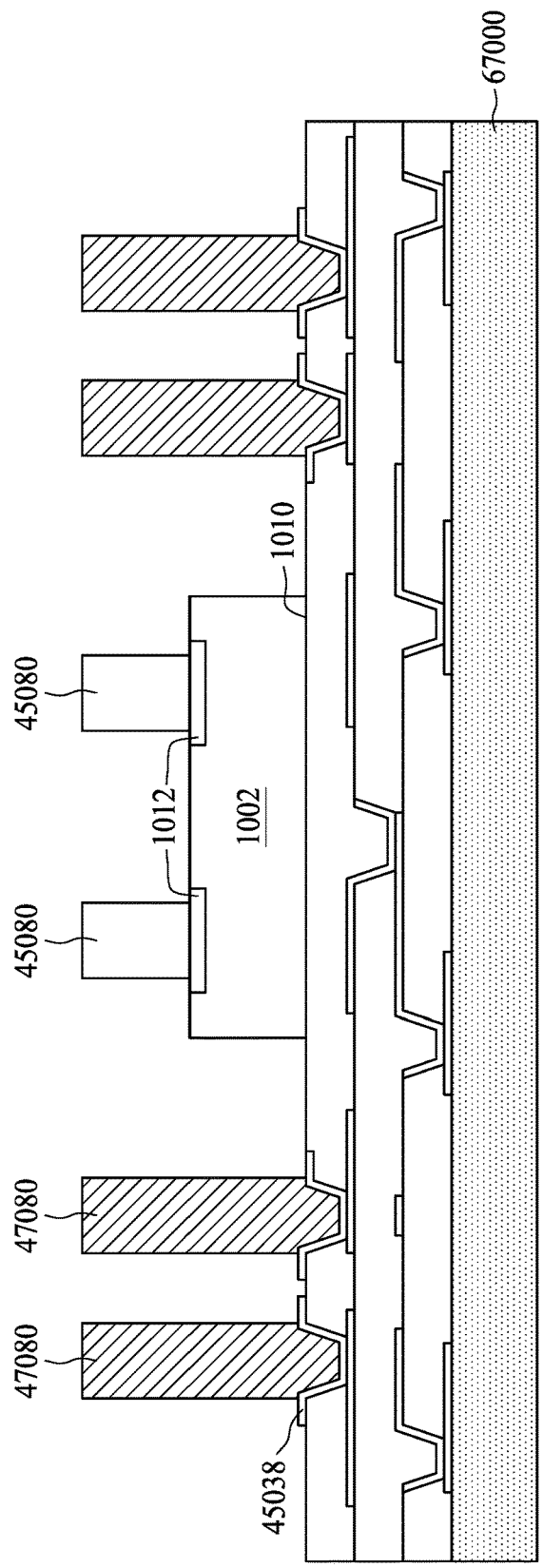

Referring next to FIG. 67B, an electronic device 1002 is disposed over the redistribution stack, with its back surface 1010 facing towards the redistribution stack, and conductive posts 45080 extend from respective contact pads 1012 of the electronic device 1002. Also, conductive posts 47080 are disposed over the redistribution stack, and are electrically connected to the UBMs 45038. The conductive posts 47080 can be formed over the UBMs 45038, such as by plating within openings of a patterned photoresist layer or another suitable deposition technique. It is also contemplated that the conductive posts 47080 can be pre-formed and then electrically connected to the UBMs 45038, such as using solder or a conductive adhesive.

Figure 67C:
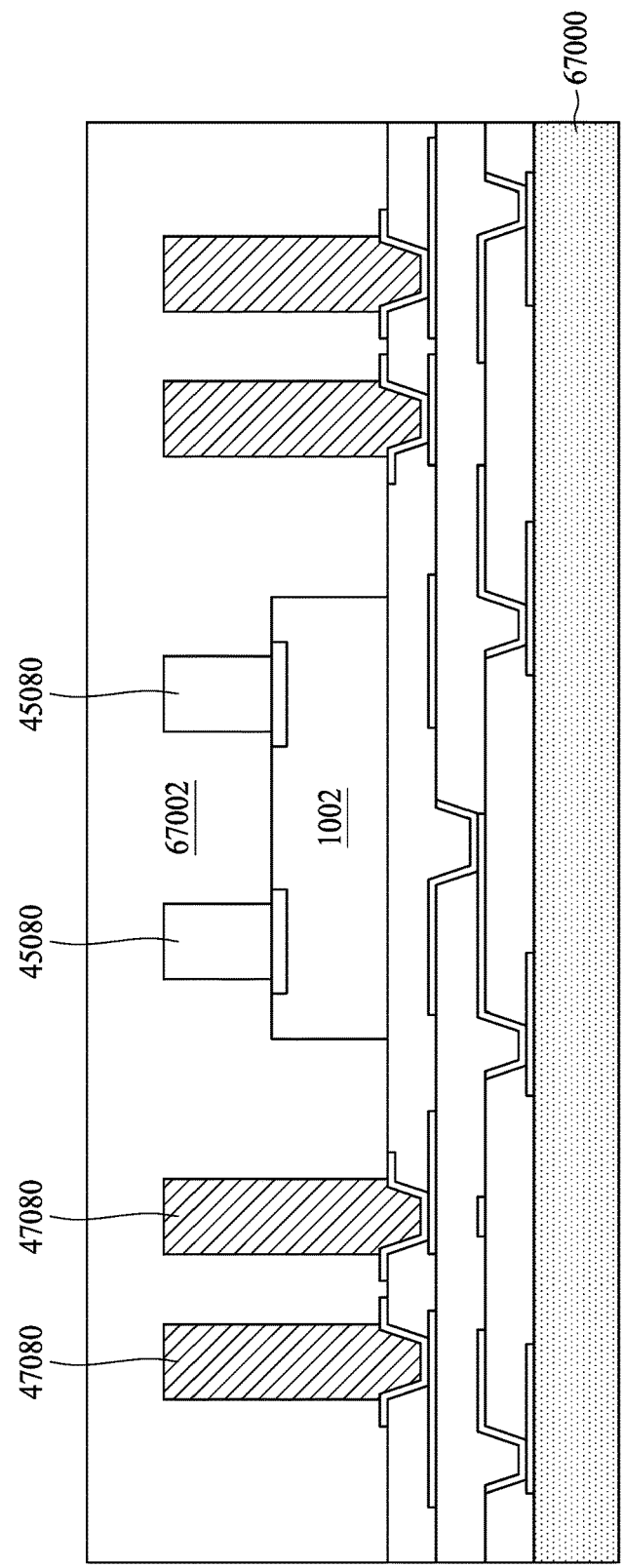
Figure 67D:
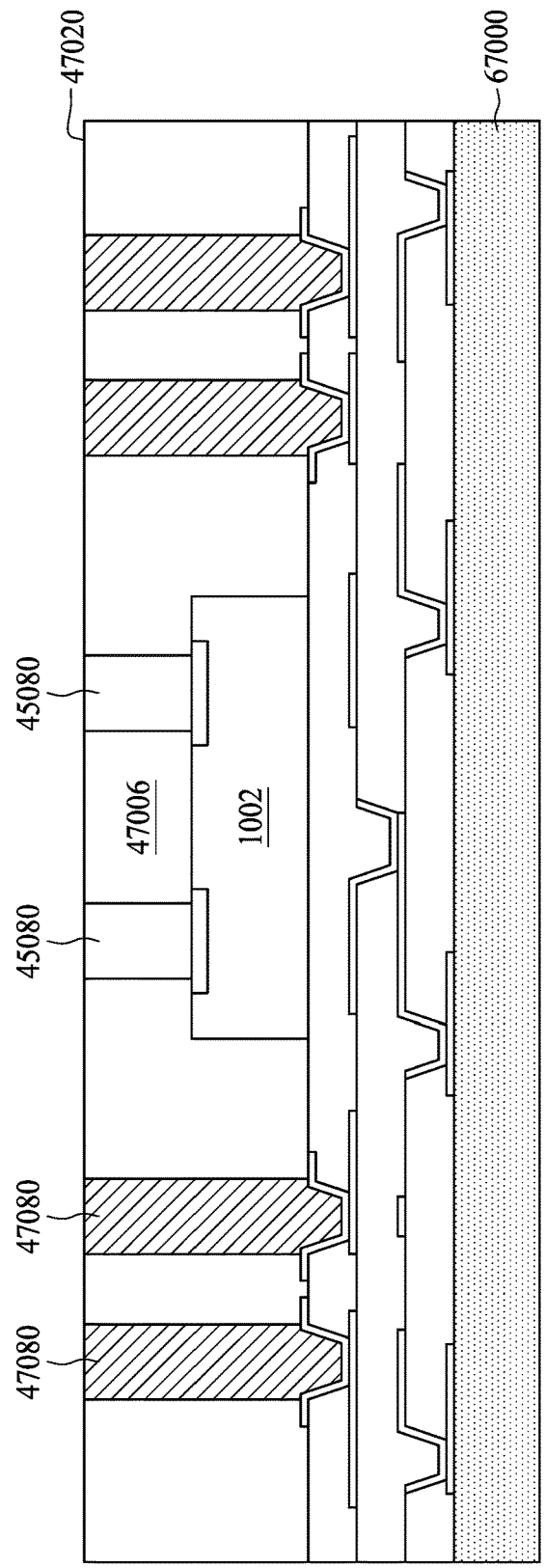

Next and referring to FIG. 67C, a package body 67002 is formed to cover or encapsulate the electronic device 1002 and the conductive posts 45080 and 47080, and is disposed over the redistribution stack. The package body 67002 is next subjected to grinding, lapping, or another suitable material removal technique, thereby forming a package body 47006 as shown in FIG. 67D. The package body 47006 includes a front surface 47020, and terminal ends of the conductive posts 45080 and 47080 are at least partially exposed from the front surface 47020 of the package body 47006. Subsequent manufacturing operations can be similarly performed as explained in the foregoing with reference to FIG. 66A through FIG. 66F, thereby forming the semiconductor device package 47050 and the stacked package assembly 47000 of FIG. 47.

FIG. 68A through FIG. 68D show a sequence of stages of a manufacturing process of a stacked package assembly, according to some embodiments of this disclosure. The following manufacturing operations are explained with reference to the semiconductor device package 48050 and the stacked package assembly 48000 of FIG. 48. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Figure 68A:
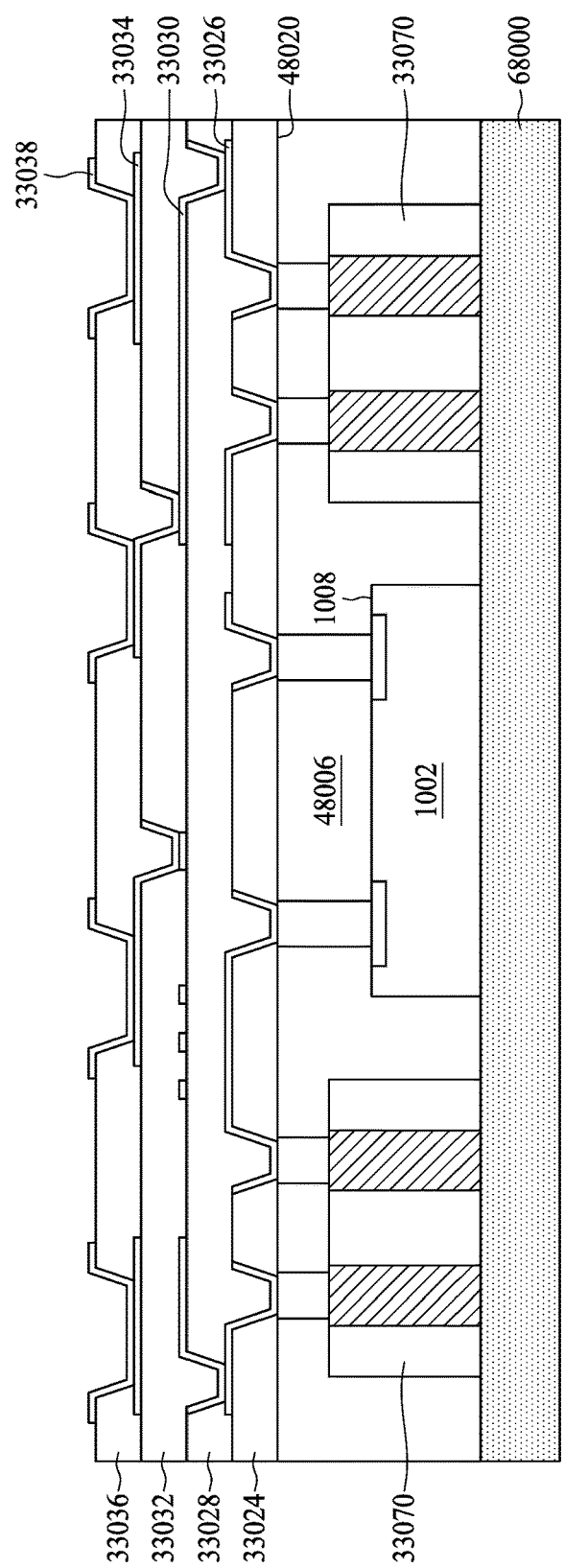
FIG. 68A, FIG. 68B, FIG. 68C, and FIG. 68D show a sequence of stages of a manufacturing process of a stacked package assembly, according to some embodiments of this disclosure.

Referring to FIG. 68A, initial manufacturing operations can be similarly performed as explained in the foregoing with reference to FIG. 61A through FIG. 61D to form a redistribution stack over an active surface 1008 of an electronic device 1002 and a front surface 48020 of a package body 48006. As shown in FIG. 68A, the redistribution stack includes RDLs 33026, 33030, and 33034, dielectric layers 33024, 33028, 33032, and 33036, and UBMs 33038.

Figure 68B:
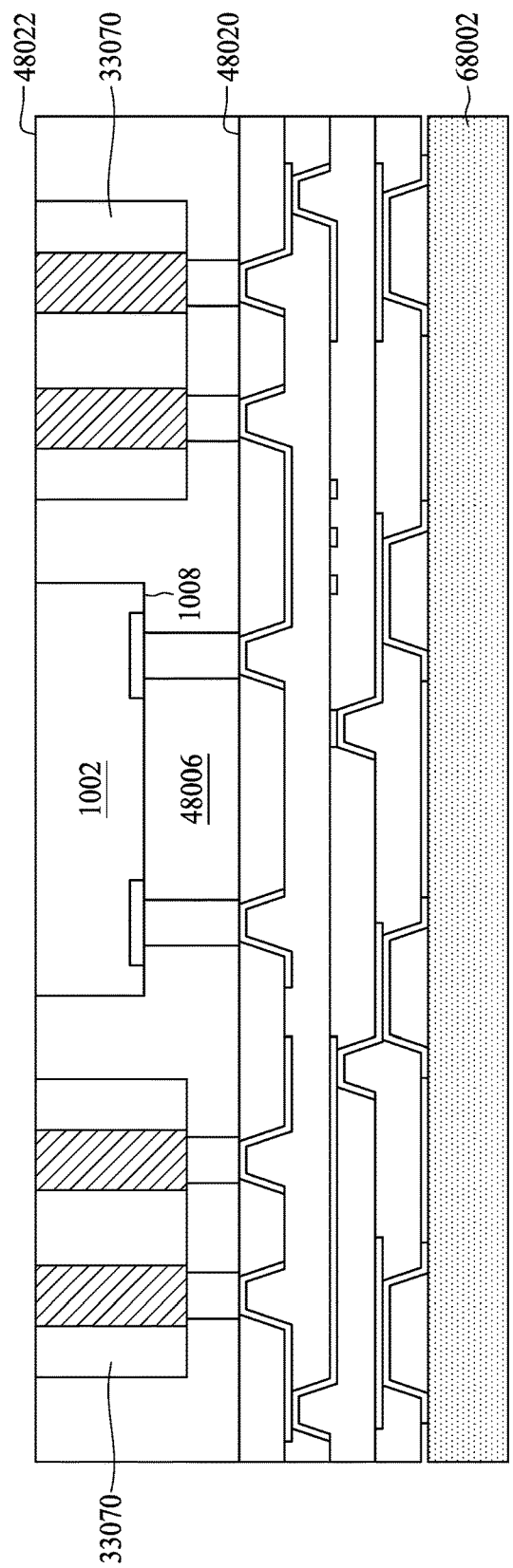

Next and referring to FIG. 68B, the redistribution stack, the package body 48006, the encapsulated electronic device 1002, and encapsulated interposer components 33070 are separated from a carrier 68000, and are reoriented and disposed over a carrier 68002, with the active surface 1008 of the electronic device 1002 and the front surface 48020 of the package body 48006 facing towards the carrier 68002, and a back surface 48022 of the package body 48006 facing away from the carrier 68002.

Figure 68C:
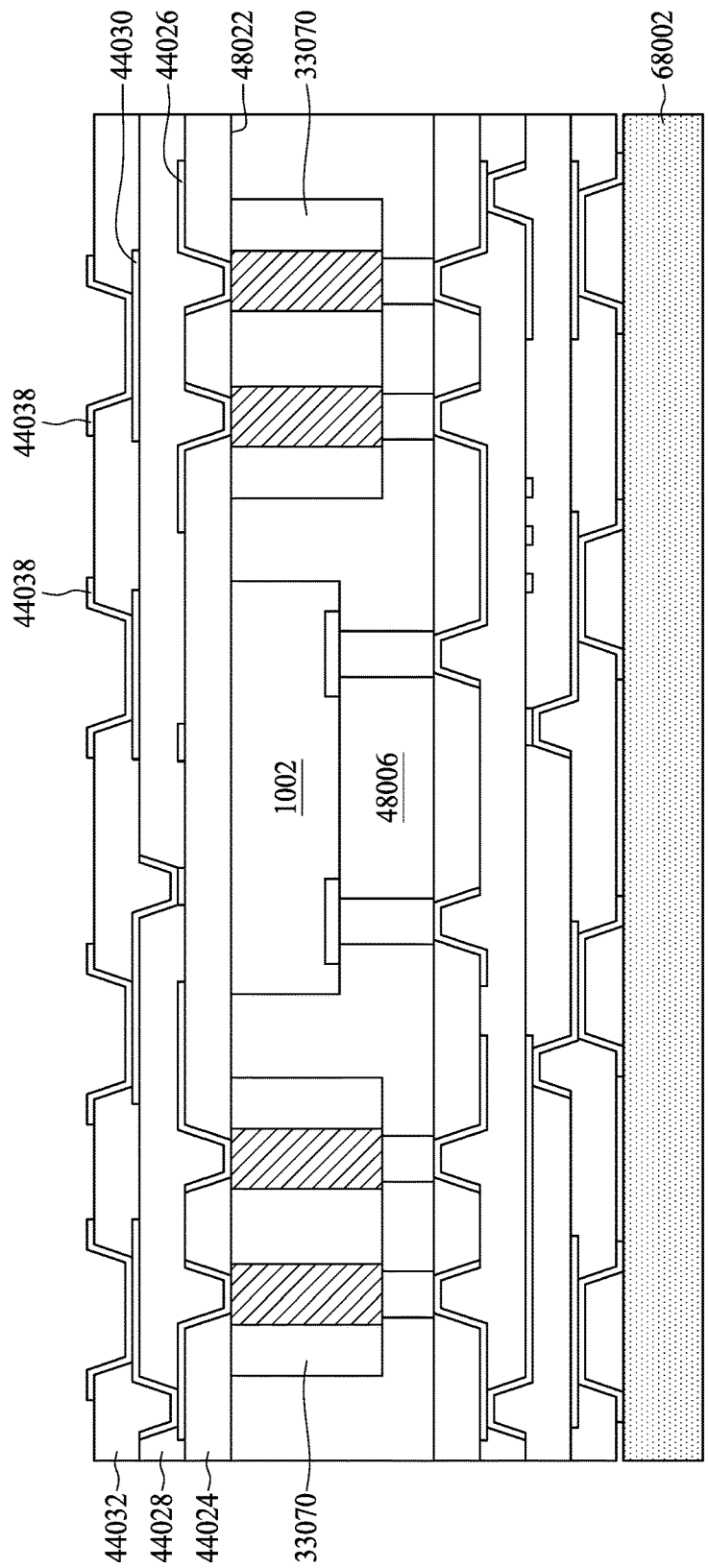

Next and referring to FIG. 68C, another redistribution stack is formed over the back surface 48022 of the package body 48006, including RDLs 44026 and 44030, dielectric layers 44024, 44028, and 44032, and UBMs 44038.

Figure 68D:
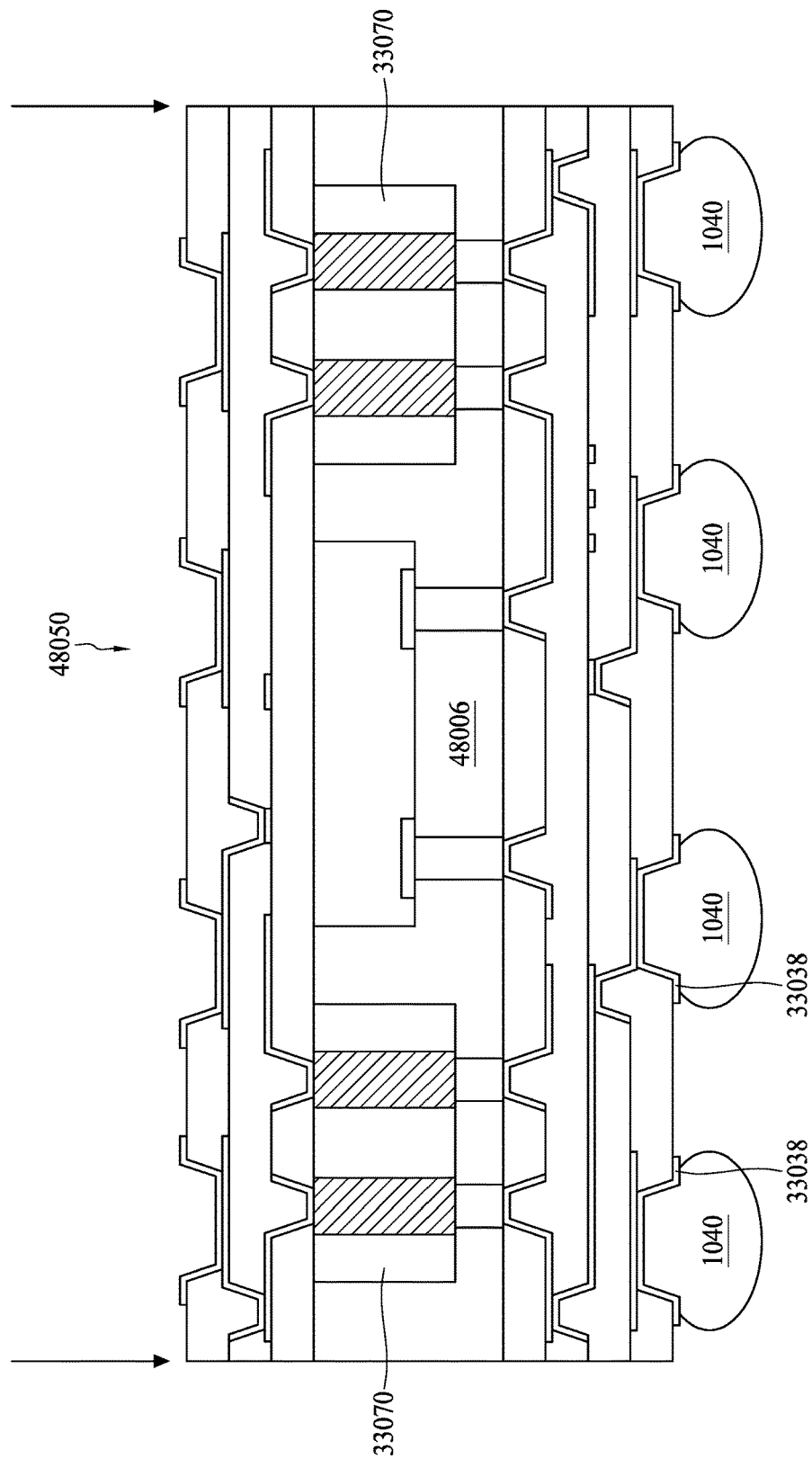

Next and referring to FIG. 68D, the package body 48006 and the redistribution stacks are separated from the carrier 68002. Electrical contacts 1040, such as in the form of conductive bumps, are formed over the UBMs 33038, and, for embodiments in which an array of connected semiconductor device packages are formed, singulation is performed (as shown by arrows in FIG. 68D) to form individual semiconductor device packages, including the semiconductor device package 48050. An electronic component 44052 is then electrically connected to the semiconductor device package 48050, thereby forming the stacked package assembly 48000 of FIG. 48.

Figure 69A:
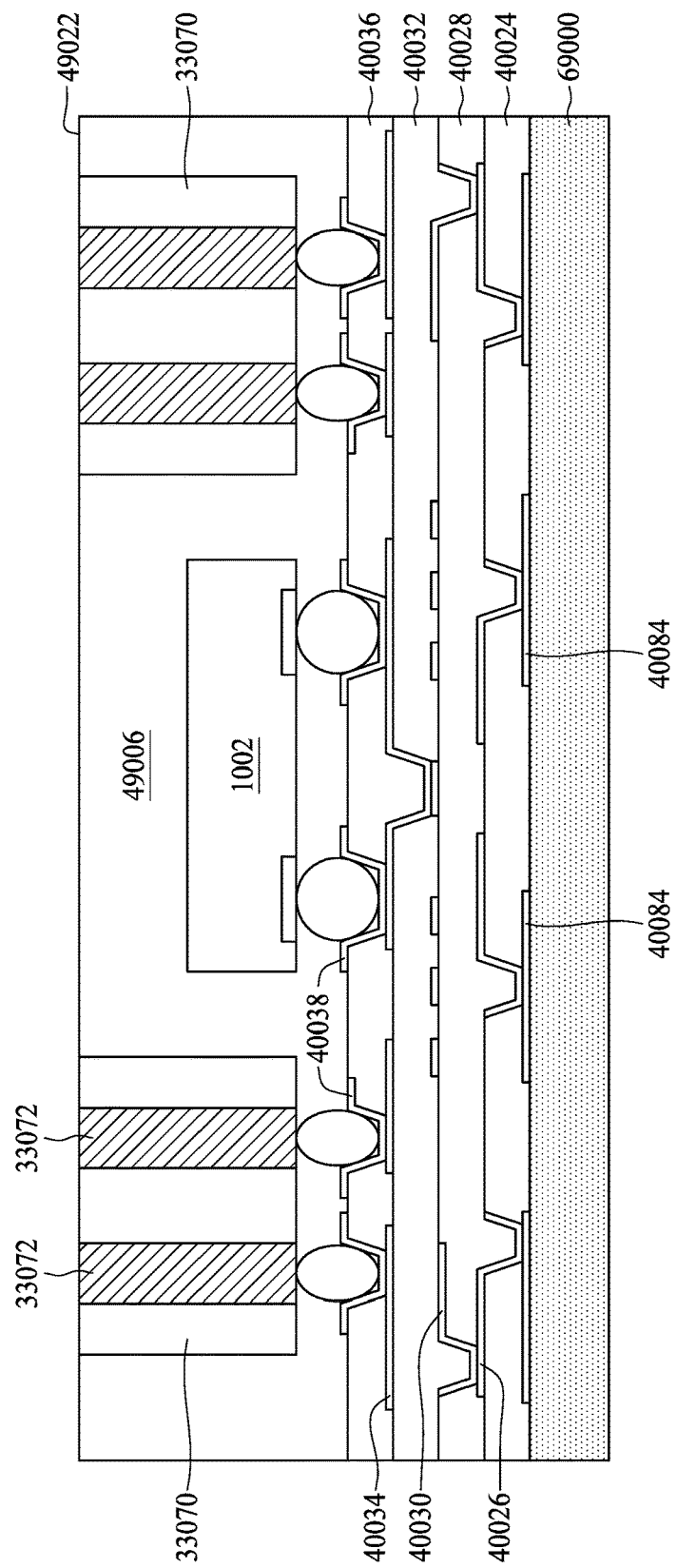
FIG. 69A, FIG. 69B, and FIG. 69C show a sequence of stages of a manufacturing process of a stacked package assembly, according to some embodiments of this disclosure.
Figure 69B:
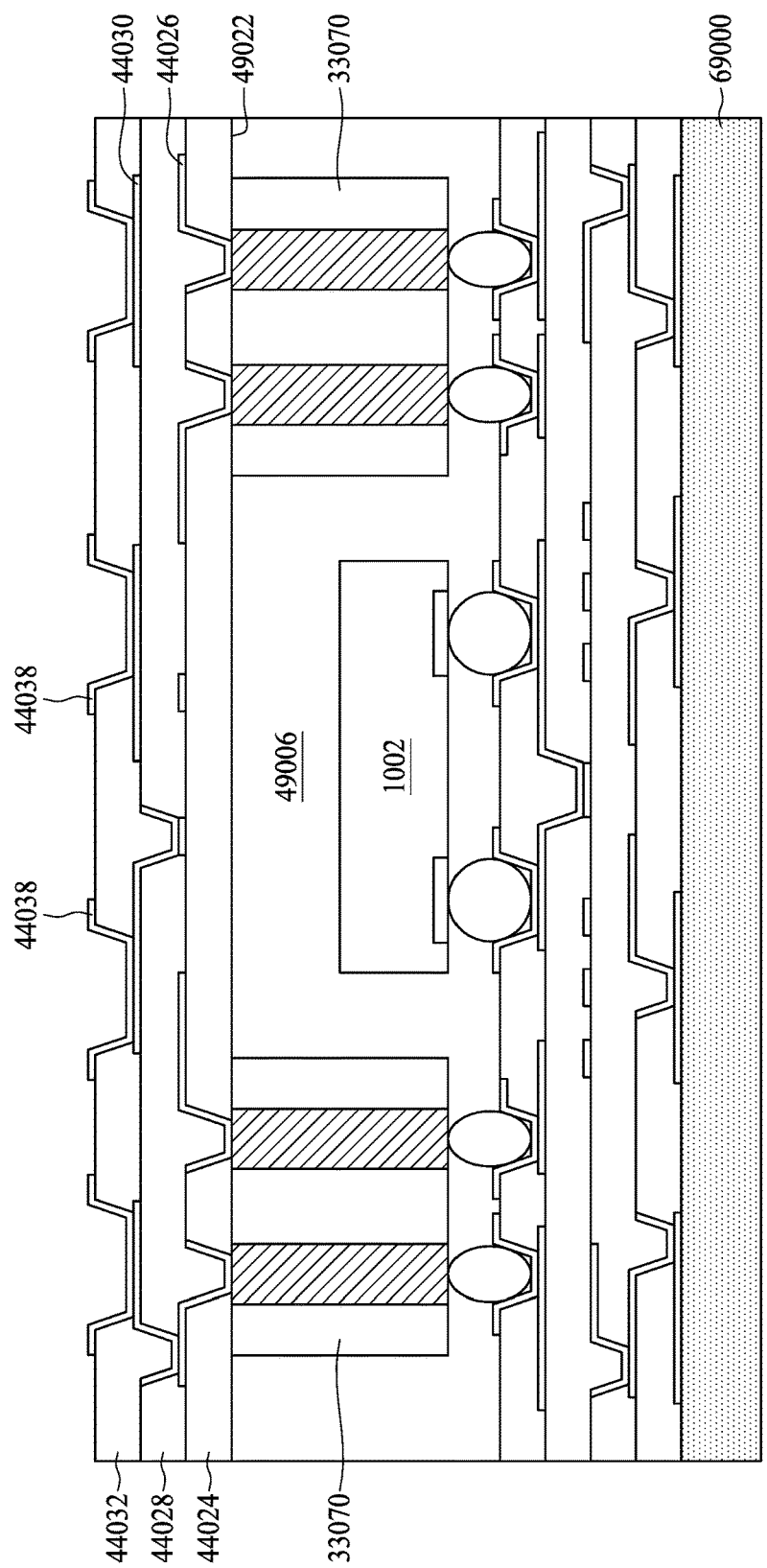
Figure 69C:
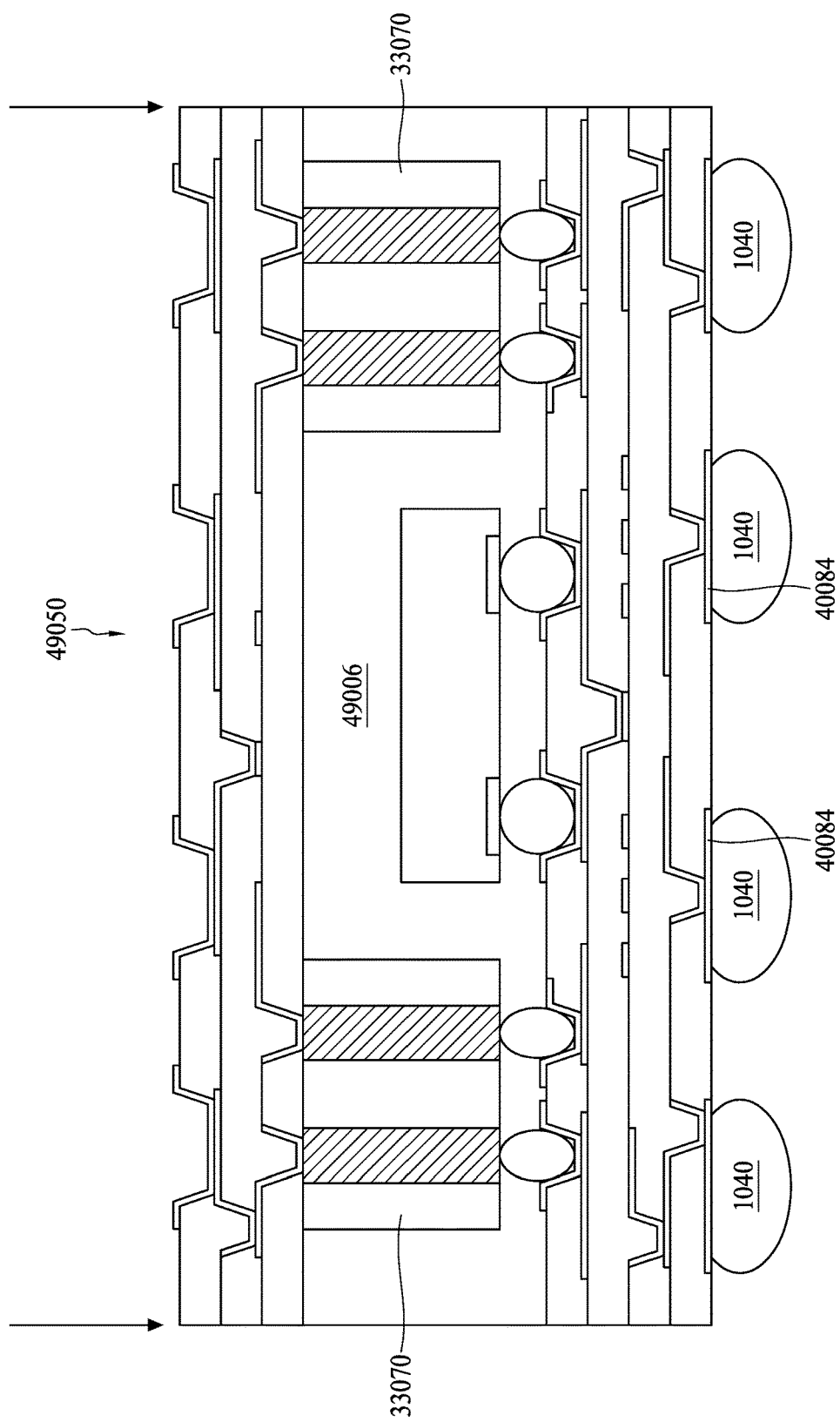

FIG. 69A through FIG. 69C show a sequence of stages of a manufacturing process of a stacked package assembly, according to some embodiments of this disclosure. The following manufacturing operations are explained with reference to the semiconductor device package 49050 and the stacked package assembly 49000 of FIG. 49. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Referring to FIG. 69A, initial manufacturing operations can be similarly performed as explained in the foregoing with reference to FIG. 63A through FIG. 63D to form a redistribution stack over a carrier 69000. As shown in FIG. 69A, the redistribution stack includes conductive pads 40084, RDLs 40026, 40030, and 40034, dielectric layers 40024, 40028, 40032, and 40036, and UBMs 40038. A package body 49006 is formed to cover or encapsulate an electronic device 1002 and interposer components 33070, and is disposed over the redistribution stack. The package body 49006 includes a back surface 49022, and terminal ends of conductive vias 33072 of the interposer components 33070 are at least partially exposed from the back surface 49022 of the package body 49006.

Next and referring to FIG. 69B, another redistribution stack is formed over the back surface 49022 of the package body 49006, including RDLs 44026 and 44030, dielectric layers 44024, 44028, and 44032, and UBMs 44038.

Next and referring to FIG. 69C, the package body 49006 and the redistribution stacks are separated from the carrier 69000. Electrical contacts 1040, such as in the form of conductive bumps, are formed over the conductive pads 40084, and, for embodiments in which an array of connected semiconductor device packages are formed, singulation is performed (as shown by arrows in FIG. 69C) to form individual semiconductor device packages, including the semiconductor device package 49050. An electronic component 44052 is then electrically connected to the semiconductor device package 49050, thereby forming the stacked package assembly 49000 of FIG. 49.

Figure 70:
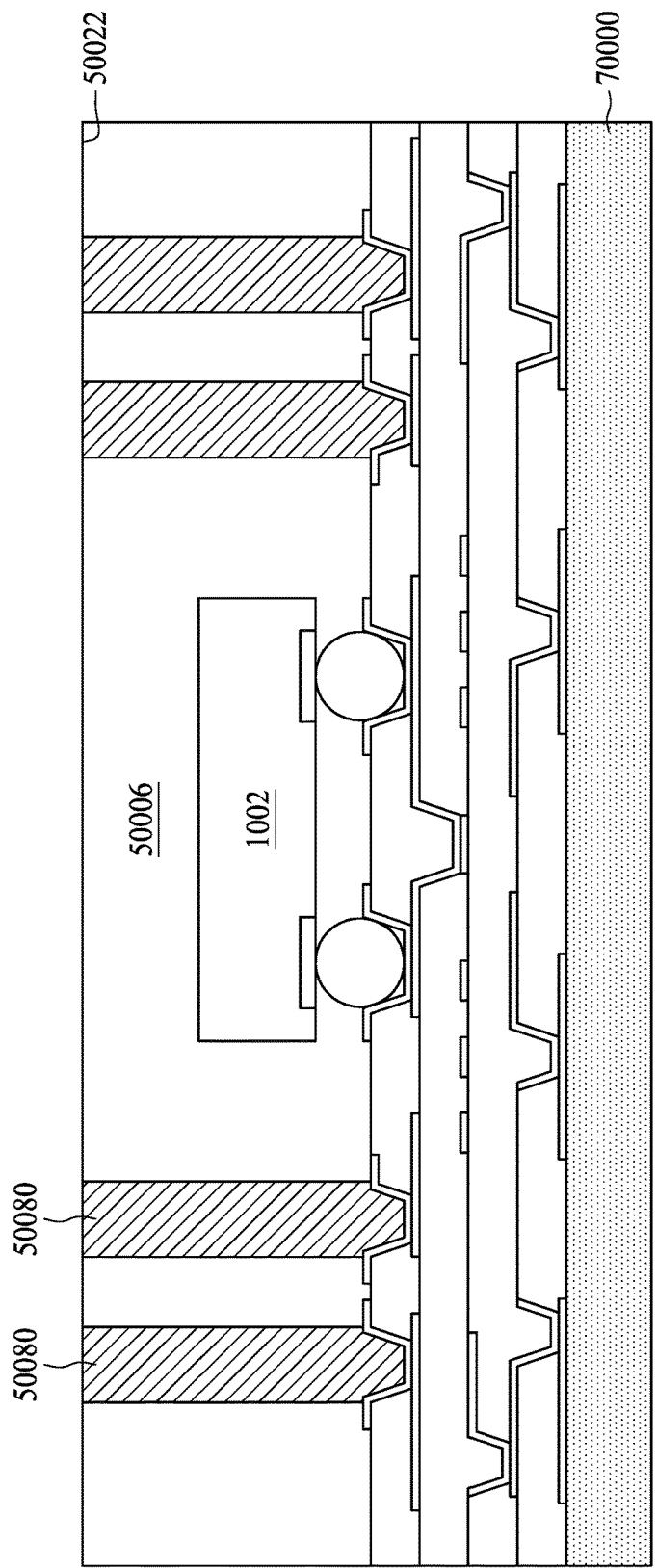
FIG. 70 shows a stage of a manufacturing process of a stacked package assembly, according to some embodiments of this disclosure.

FIG. 70 shows a stage of a manufacturing process of a stacked package assembly, according to some embodiments of this disclosure. The following manufacturing operations are explained with reference to the semiconductor device package 50050 and the stacked package assembly 50000 of FIG. 50. However, it is contemplated that the manufacturing operations can be similarly carried out to form other stacked package assemblies that are differently configured. Certain of the following manufacturing operations can be similarly performed as explained in the foregoing, and repetition of detailed explanation is omitted.

Referring to FIG. 70, initial manufacturing operations can be similarly performed as explained in the foregoing with reference to FIG. 64A through FIG. 64D to form a redistribution stack over a carrier 70000. A package body 50006 is formed to cover or encapsulate an electronic device 1002 and conductive posts 50080, and is disposed over the redistribution stack. The conductive posts 50080 can be formed over the redistribution stack, such as by plating within openings of a patterned photoresist layer or another suitable deposition technique. It is also contemplated that the conductive posts 50080 can be pre-formed and then electrically connected to the redistribution stack, such as using solder or a conductive adhesive. The package body 50006 includes a back surface 50022, and terminal ends of the conductive posts 50080 are at least partially exposed from the back surface 50022 of the package body 50006. Subsequent manufacturing operations can be similarly performed as explained in the foregoing with reference to FIG. 69A through FIG. 69C, thereby forming the semiconductor device package 50050 and the stacked package assembly 50000 of FIG. 50.

As used herein, the singular terms "a," "an," and "the" may include plural referents unless the context clearly dictates otherwise. Thus, for example, reference to an electronic device may include multiple electronic devices unless the context clearly dictates otherwise.

Spatial descriptions, such as "above," "below," "up," "left," "right," "down," "top," "bottom," "vertical," "horizontal," "side," "higher," "lower," "upper," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" or "about" the same as or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a characteristic or quantity can be deemed to be "substantially" uniform if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

In the description of some embodiments, a component provided "on," "over," or "below" another component can encompass cases where the former component is directly adjoining (e.g., in physical contact with) the latter component, as well as cases where one or more intervening components are located between the former component and the latter component.

As used herein, the terms "connect," "connected," "connecting," and "connection" refer to an operational coupling or linking. Connected components can be directly coupled to one another or can be indirectly coupled to one another, such as via another set of components.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package comprising:
    an electronic device including an active surface and a contact pad adjacent to the active surface; and
    a redistribution stack including
        a dielectric layer disposed over the active surface and defining a first opening exposing at least a portion of the contact pad; and
        a redistribution layer (RDL) disposed over the dielectric layer and including a first trace,
        wherein the first trace includes a first portion extending over the dielectric layer along a first longitudinal direction adjacent to the first opening, and a second portion disposed in the first opening and extending between the first portion of the first trace and the exposed portion of the contact pad,
        wherein the second portion of the first trace has a maximum width along a first transverse direction orthogonal to the first longitudinal direction, and the maximum width of the second portion of the first trace is no greater than 3 times of a width of the first portion of the first trace.

2. The semiconductor device package of claim 1, wherein the maximum width of the second portion of the first trace is no greater than 2.5 times of the width of the first portion of the first trace.

3. The semiconductor device package of claim 1, wherein the maximum width of the second portion of the first trace is substantially the same as the width of the first portion of the first trace.

4. The semiconductor device package of claim 1, wherein the first opening in the dielectric layer has a maximum width along the first transverse direction, and the maximum width of the second portion of the first trace is less than the maximum width of the first opening.

5. The semiconductor device package of claim 1, wherein a projection area of the first trace onto the contact pad is no greater than 15% of a total area of the contact pad.

6. The semiconductor device package of claim 1, wherein the RDL further includes at least two additional traces extending over the dielectric layer and overlapping the contact pad disposed below the additional traces.

7. The semiconductor device package of claim 1, further comprising a package body encapsulating portions of the electronic device, wherein the package body includes a front surface and a back surface opposite to the front surface, the active surface of the electronic device is at least partially exposed from the front surface of the package body, and the redistribution stack is disposed over the front surface of the package body.

8. The semiconductor device package of claim 7, wherein the electronic device is a first electronic device, the semiconductor device package further comprises a second electronic device, wherein the package body encapsulates portions of the second electronic device, and the RDL electrically connects the first electronic device to the second electronic device.

9. The semiconductor device package of claim 7, further comprising an interposer component including a lower surface, an upper surface, and a conductive via extending from the lower surface to the upper surface, wherein the package body encapsulates portions of the interposer component, the lower surface of the interposer component is at least partially exposed from the front surface of the package body, the upper surface of the interposer component is at least partially exposed from the back surface of the package body, and the RDL electrically connects the electronic device to the interposer component.

10. The semiconductor device package of claim 9, wherein the dielectric layer defines a second opening exposing at least a portion of the conductive via, the RDL includes a second trace, the second trace includes a first portion extending over the dielectric layer along a second longitudinal direction adjacent to the second opening, and a second portion disposed in the second opening and extending between the first portion of the second trace and the exposed portion of the conductive via, the second portion of the second trace has a maximum width along a second transverse direction orthogonal to the second longitudinal direction, and the maximum width of the second portion of the second trace is no greater than 3 times of a width of the first portion of the second trace.

11. The semiconductor device package of claim 9, wherein the redistribution stack is a first redistribution stack, the semiconductor device package further comprises a second redistribution stack disposed over the back surface of the package body.

12. A semiconductor device package comprising:
    an electronic device including an active surface and a contact pad adjacent to the active surface;
    a package body encapsulating portions of the electronic device, wherein the package body includes a front surface and a back surface opposite to the front surface;

a conductive post extending between the contact pad of the electronic device and the front surface of the package body; and a redistribution stack including
  a dielectric layer disposed over the front surface of the package body and defining a first opening exposing at least a portion of a terminal end of the conductive post; and
  an RDL disposed over the dielectric layer and including a first trace,
  wherein the first trace includes a first portion extending over the dielectric layer, and a second portion disposed in the first opening and extending between the first portion of the first trace and the exposed portion of the terminal end of the conductive post,
  wherein the first portion of the first trace extends over the dielectric layer along a longitudinal direction adjacent to the first opening, the second portion of the first trace has a maximum width along a transverse direction orthogonal to the longitudinal direction, and the maximum width of the second portion of the first trace is no greater than 3 times of a width of the first portion of the first trace.

13. The semiconductor device package of claim 12, wherein a projection area of the first trace onto the terminal end of the conductive post is no greater than 15% of a total area of the terminal end of the conductive post.

14. The semiconductor device package of claim 12, wherein a projection area of the first trace onto the terminal end of the conductive post is no greater than 10% of a total area of the terminal end of the conductive post.

15. The semiconductor device package of claim 12, wherein the RDL further includes at least two additional traces extending over the dielectric layer and overlapping the terminal end of the conductive post disposed below the additional traces.

16. The semiconductor device package of claim 12, wherein the electronic device is a first electronic device, the semiconductor device package further comprises a second electronic device, wherein the package body encapsulates portions of the second electronic device, and the RDL electrically connects the first electronic device to the second electronic device.

17. The semiconductor device package of claim 12, wherein the conductive post is a first conductive post, the semiconductor device package further comprises a second conductive post and an interposer component, wherein the interposer component includes a conductive via, the package body encapsulates portions of the interposer component, the second conductive post extends between the conductive via of the interposer component and the front surface of the package body, and the RDL electrically connects the electronic device to the interposer component.

18. The semiconductor device package of claim 17, wherein the dielectric layer defines a second opening exposing at least a portion of a terminal end of the second conductive post, the RDL includes a second trace, the second trace includes a first portion extending over the dielectric layer, and a second portion disposed in the second opening and extending between the first portion of the second trace and the exposed portion of the terminal end of the second conductive post, and a projection area of the second trace onto the terminal end of the second conductive post is no greater than 15% of a total area of the terminal end of the second conductive post.

19. The semiconductor device package of claim 17, wherein the redistribution stack is a first redistribution stack, the semiconductor device package further comprises a second redistribution stack disposed over the back surface of the package body.

20. The semiconductor device package of claim 12, wherein the conductive post is a first conductive post, the semiconductor device package further comprises a second conductive post extending between the front surface of the package body and the back surface of the package body, and the RDL electrically connects the electronic device to the second conductive post.

21. The semiconductor device package of claim 20, wherein the redistribution stack is a first redistribution stack, the semiconductor device package further comprises a second redistribution stack disposed over the back surface of the package body.

22. The semiconductor device package of claim 12, further comprising an interposer component including a lower surface, an upper surface, and a conductive via extending from the lower surface to the upper surface, wherein the package body encapsulates portions of the interposer component, the lower surface of the interposer component is at least partially exposed from the front surface of the package body, and the RDL electrically connects the electronic device to the interposer component.

23. The semiconductor device package of claim 22, wherein the redistribution stack is a first redistribution stack, the semiconductor device package further comprises a second redistribution stack disposed over the back surface of the package body.

24. A semiconductor device package comprising:
  a package body including a front surface and a back surface opposite to the front surface; and
  a redistribution stack adjacent to the front surface of the package body and including
    a first RDL including a first trace;
    a dielectric layer disposed over the first RDL; and
    a second RDL including a second trace extending over the dielectric layer and electrically connected to the first trace through the dielectric layer,
    wherein a width of the first trace is substantially uniform along at least a length of the first trace overlapping the second trace disposed over the first trace, and
    the dielectric layer defines an opening exposing a portion of the first trace, the second trace includes a first portion extending over the dielectric layer along a longitudinal direction adjacent to the opening, and a second portion disposed in the opening and extending between the first portion of the second trace and the exposed portion of the first trace, the second portion of the second trace has a maximum width along a transverse direction orthogonal to the longitudinal direction, and the maximum width of the second portion of the second trace is no greater than 3 times of a width of the first portion of the second trace.

25. The semiconductor device package of claim 24, wherein the second portion of the second trace covers a top surface and opposing side surfaces of the exposed portion of the first trace.

26. The semiconductor device package of claim 24, wherein the second trace is electrically connected to the first trace through the opening in the dielectric layer, the first trace extends along a direction adjacent to the opening, and the longitudinal direction forms an intersecting angle with the direction that the first trace extends along.

27. The semiconductor device package of claim 26, wherein the intersecting angle is different from 0° and different from 180°.

28. The semiconductor device package of claim 24, wherein the redistribution stack is a first redistribution stack, the semiconductor device package further comprises a second redistribution stack adjacent to the back surface of the package body.

29. The semiconductor device package of claim 28, further comprising an interposer component, wherein the interposer component includes a conductive via, the package body encapsulates portions of the interposer component, and the first redistribution stack is electrically connected to the second redistribution stack through the conductive via of the interposer component.

30. The semiconductor device package of claim 28, further comprising a conductive post extending between the front surface of the package body and the back surface of the package body, and the first redistribution stack is electrically connected to the second redistribution stack through the conductive post.

31. A semiconductor device package comprising:
a package body including a front surface and a back surface opposite to the front surface; and
a redistribution stack adjacent to the front surface of the package body and including
an RDL including a trace;
a dielectric layer disposed over the RDL; and
an under bump metallization (UBM) disposed over the dielectric layer and electrically connected to the trace through the dielectric layer,
wherein a portion of the trace overlaps a projection area of the UBM onto the RDL, the trace extends along a longitudinal direction adjacent to the projection area, the overlapping portion of the trace has a maximum width along a transverse direction orthogonal to the longitudinal direction, the UBM has a maximum width along the transverse direction, and the maximum width of the overlapping portion of the trace is no greater than ⅓ of the maximum width of the UBM.

32. The semiconductor device package of claim 31, wherein the maximum width of the overlapping portion of the trace is no greater than ¼ of the maximum width of the UBM.

33. The semiconductor device package of claim 31, wherein the RDL further includes at least two additional traces extending within the projection area of the UBM.

34. The semiconductor device package of claim 31, wherein the maximum width of the overlapping portion of the trace is no greater than 3 times of a width of a remaining portion of the trace disposed outside of the projection area of the UBM.

35. The semiconductor device package of claim 31, further comprising a connector and an electronic device including a contact pad, wherein the package body encapsulates portions of the electronic device and the connector, and the connector extends between the contact pad of the electronic device and the UBM.

36. The semiconductor device package of claim 31, wherein the redistribution stack is a first redistribution stack, the semiconductor device package further comprises a second redistribution stack adjacent to the back surface of the package body.

37. The semiconductor device package of claim 36, further comprising an interposer component, wherein the interposer component includes a conductive via, the package body encapsulates portions of the interposer component, and the first redistribution stack is electrically connected to the second redistribution stack through the conductive via of the interposer component.

38. The semiconductor device package of claim 36, further comprising a conductive post extending between the front surface of the package body and the back surface of the package body, and the first redistribution stack is electrically connected to the second redistribution stack through the conductive post.

39. A semiconductor device package comprising:
a package body including a front surface and a back surface opposite to the front surface; and
a redistribution stack adjacent to the front surface of the package body and including
a dielectric layer;
a conductive pad at least partially embedded in the dielectric layer; and
an RDL including a trace extending over the dielectric layer and electrically connected to the conductive pad through an opening in the dielectric layer,
wherein the opening in the dielectric layer exposes a portion of the conductive pad, the trace includes a first portion extending over the dielectric layer along a longitudinal direction adjacent to the opening, and a second portion disposed in the opening and extending between the first portion of the trace and the exposed portion of the conductive pad, the second portion of the trace has a maximum width along a transverse direction orthogonal to the longitudinal direction, and the maximum width of the second portion of the trace is no greater than 3 times of a width of the first portion of the trace.

40. The semiconductor device package of claim 39, wherein a projection area of the trace onto the conductive pad is no greater than 15% of a total area of the conductive pad.

41. The semiconductor device package of claim 39, wherein a projection area of the trace onto the conductive pad is no greater than 10% of a total area of the conductive pad.

42. The semiconductor device package of claim 39, wherein the RDL further includes at least two additional traces extending over the dielectric layer and overlapping the conductive pad disposed below the additional traces.

43. The semiconductor device package of claim 39, further comprising a connector and an electronic device including a contact pad, wherein the package body encapsulates portions of the electronic device and the connector, and the connector extends between the contact pad of the electronic device and the redistribution stack.

44. The semiconductor device package of claim 39, wherein the redistribution stack is a first redistribution stack, the semiconductor device package further comprises a second redistribution stack adjacent to the back surface of the package body.

45. The semiconductor device package of claim 44, further comprising an interposer component, wherein the interposer component includes a conductive via, the package body encapsulates portions of the interposer component, and the first redistribution stack is electrically connected to the second redistribution stack through the conductive via of the interposer component.

46. The semiconductor device package of claim 44, further comprising a conductive post extending between the front surface of the package body and the back surface of the package body, and the first redistribution stack is electrically connected to the second redistribution stack through the conductive post.

\* \* \* \* \*